United States Patent
Joao

(10) Patent No.: US 12,393,238 B2
(45) Date of Patent: Aug. 19, 2025

(54) BATTERY POWER MANAGEMENT APPARATUS AND METHOD FOR ELECTRIC VEHICLES AND/OR HYBRID VEHICLES

(71) Applicant: Raymond Anthony Joao, Yonkers, NY (US)

(72) Inventor: Raymond Anthony Joao, Yonkers, NY (US)

( * ) Notice: Subject to any disclaimer, the term of this patent is extended or adjusted under 35 U.S.C. 154(b) by 0 days.

(21) Appl. No.: 17/994,287

(22) Filed: Nov. 26, 2022

(65) Prior Publication Data

US 2023/0090155 A1    Mar. 23, 2023

Related U.S. Application Data

(63) Continuation-in-part of application No. 17/827,843, filed on May 30, 2022, which is a continuation-in-part of application No. 17/592,540, filed on Feb. 4, 2022.
(Continued)

(51) Int. Cl.
| | |
|---|---|
| *G06F 1/20* | (2006.01) |
| *B60L 1/00* | (2006.01) |
| *H05K 7/20* | (2006.01) |

(52) U.S. Cl.
CPC ............... *G06F 1/20* (2013.01); *B60L 1/00* (2013.01); *H05K 7/20863* (2013.01); *H05K 7/20872* (2013.01); *H05K 7/20881* (2013.01)

(58) Field of Classification Search
CPC ... G06F 1/20; B60L 1/00; B60L 50/75; B60L 53/12; B60L 53/14; B60L 1/02;
(Continued)

(56) References Cited

U.S. PATENT DOCUMENTS

| | | | |
|---|---|---|---|
| 10,521,780 B1 * | 12/2019 | Hopkins, III | G06Q 20/12 |
| 10,839,378 B1 * | 11/2020 | Srinivasan | G06Q 20/401 |

(Continued)

FOREIGN PATENT DOCUMENTS

| | | | | |
|---|---|---|---|---|
| WO | WO-2019035111 A1 * | 2/2019 | | G06F 16/2379 |
| WO | WO-2019104375 A1 * | 6/2019 | | C01B 3/047 |
| WO | WO-2020041477 A1 * | 2/2020 | | G06F 16/2315 |

OTHER PUBLICATIONS

Sun, H., Hua, S., Zhou, E., Pi, B., Sun, J., Yamashita, K. (2018). "Using Ethereum Blockchain in Internet of Things: A Solution for Electric Vehicle Battery Refueling". Lecture Notes in Computer Science(), vol. 10974. Springer, Cham. https://doi.org/10.1007/978-3-319-94478-4_1 (Year: 2018).*
(Continued)

*Primary Examiner* — Calvin Cheung
(74) *Attorney, Agent, or Firm* — Raymond A. Joao, Esq.

(57) ABSTRACT

An apparatus including a computer, wherein the computer is specially programmed to process, and processes, information for or regarding a blockchain of a blockchain platform or network, and further wherein the computer processes information for processing a transaction on or involving the blockchain or processes information for creating or for mining a new block for, for adding to, or for inserting into, the blockchain, wherein the computer is located in, on, or at, a vehicle, a vehicle battery, wherein the vehicle battery supplies electrical power to the computer; and a cooling system, wherein the cooling system provides cooled air or liquid, on, at, or in the vicinity of, the computer, and further wherein the vehicle battery supplies electrical power to the cooling system.

22 Claims, 22 Drawing Sheets

Related U.S. Application Data

(60) Provisional application No. 63/299,924, filed on Jan. 15, 2022, provisional application No. 63/215,900, filed on Jun. 28, 2021, provisional application No. 63/162,124, filed on Mar. 17, 2021.

(58) Field of Classification Search
CPC ........... H05K 7/20863; H05K 7/20872; H05K 7/20881; Y02T 10/70; Y02T 10/7072; Y02T 90/12; Y02T 90/14
See application file for complete search history.

(56) References Cited

U.S. PATENT DOCUMENTS

| | | | |
|---|---|---|---|
| 11,180,048 B1* | 11/2021 | Lu | B60L 55/00 |
| 2015/0054460 A1 | 2/2015 | Epstein et al. | |
| 2020/0110453 A1* | 4/2020 | Wells | B60L 53/60 |
| 2020/0143668 A1* | 5/2020 | Gin | G08G 1/091 |
| 2020/0213329 A1* | 7/2020 | Simons | H04L 9/3297 |
| 2020/0346634 A1* | 11/2020 | Holz | B60W 20/40 |
| 2021/0091956 A1* | 3/2021 | Mullett | G06F 8/71 |
| 2021/0114472 A1* | 4/2021 | Stephens | B60L 53/64 |
| 2022/0016990 A1* | 1/2022 | Epstein | H04L 9/50 |

OTHER PUBLICATIONS

Madhusudan Singh, Shiho Kim, "Branch based blockchain technology in intelligent vehicle", Computer Networks, vol. 145, 2018, pp. 219-231, ISSN 1389-1286, https://doi.org/10.1016/j.comnet.2018.08.016. (https://www.sciencedirect.com/science/article/pii/S1389128618308399) (Year: 2018).*

F. Jameel, M. A. Javed, S. Zeadally and R. Jantti, "Efficient Mining Cluster Selection for Blockchain-Based Cellular V2X Communications," in IEEE Transactions on Intelligent Transportation Systems, vol. 22, No. 7, pp. 4064-4072, Jul. 2021, doi: 10.1109/TITS.2020.3006176. (Year: 2021).*

KR 20200053736 A with English translation; date filed Nov. 8, 2018; date published May 19, 2020. (Year: 2020).*

DE 202019106440 U1 with English translation; date filed Nov. 19, 2019; date published Jan. 7, 2020. (Year: 2020).*

* cited by examiner

BATTERY POWER MANAGEMENT APPARATUS AND METHOD FOR ELECTRIC VEHICLES AND/OR HYBRID VEHICLES

RELATED APPLICATIONS

This application is a continuation-in-part application of U.S. patent application Ser. No. 17/827,843, filed May 30, 2022, and entitled "BATTERY POWER MANAGEMENT APPARATUS AND METHOD FOR ELECTRIC VEHICLES AND/OR HYBRID VEHICLES", the subject matter and teachings of which are hereby incorporated by reference herein in their entirety, which application is a continuation-in-part application of U.S. patent application Ser. No. 17/592,540, filed Feb. 4, 2022, and entitled "BATTERY POWER MANAGEMENT APPARATUS AND METHOD FOR ELECTRIC VEHICLES AND/OR HYBRID VEHICLES", the subject matter and teachings of which are hereby incorporated by reference herein in their entirety. This application also claims the benefit of the priority of U.S. Provisional Patent Application Ser. No. 63/299,924, filed Jan. 15, 2022, and entitled "BATTERY POWER MANAGEMENT APPARATUS AND METHOD FOR ELECTRIC VEHICLES AND/OR HYBRID VEHICLES", the subject matter and teachings of which are hereby incorporated by reference herein in their entirety. U.S. patent application Ser. No. 17/592,540 claims the benefit of the priority of U.S. Provisional Patent Application Ser. No. 63/162,124, filed Mar. 17, 2021, and entitled "BATTERY POWER MANAGEMENT APPARATUS AND METHOD FOR ELECTRIC VEHICLES AND/OR HYBRID VEHICLES", the subject matter and teachings of which are hereby incorporated by reference herein in their entirety. U.S. patent application Ser. No. 17/827,843 claims the benefit of the priority of U.S. Provisional Patent Application Ser. No. 63/215,900, filed Jun. 28, 2021, and entitled "BATTERY POWER MANAGEMENT APPARATUS AND METHOD FOR ELECTRIC VEHICLES AND/OR HYBRID VEHICLES", the subject matter and teachings of which are hereby incorporated by reference herein in their entirety.

FIELD OF THE INVENTION

The present invention pertains to a battery power management apparatus and methods for electric vehicles and/or for hybrid vehicles and, in particular, to a battery power management apparatus and methods for electric vehicles and/or for hybrid vehicles which can facilitate the management of, the monitoring of, the maintenance of, and/or the recharging of, a battery or batteries, or a power source, of an electric vehicle and/or of a hybrid vehicle.

BACKGROUND OF THE INVENTION

Electric vehicles and hybrid vehicles can provide many advantages in providing clean and relatively cheap transportation in and/or for vehicles of any and/or all types or kinds, including, but not limited to, automobiles, cars, sport utility vehicles (SUVs), recreational vehicles, mobile homes, buses, trucks, trains, subway trains, drones of any and/or sizes, kinds, or types, boats, ships, marine vessels, aircraft, airplanes, jets, helicopters, satellites, and/or any or all types or kinds of vehicles, manned vehicles, unmanned vehicles, and/or autonomous vehicles. The use of electric vehicles and/or hybrid vehicles can also reduce the use and/or reliance upon gasoline, diesel fuel, oil, and/or any other fuels, which have come to be known as causing pollution.

While it is submitted that electric vehicles and/or hybrid vehicles might dispense with the need for, and the reliance on, fuels which are used typically used in connection with internal combustion engines, and are perceived as being cleaner for the environment and possibly cheaper to operate, the batteries used in such electric vehicles and/or hybrid vehicles do have limited energy storage capabilities, which results in limited traveling or driving ranges, and need to be recharged regularly. There is no doubt that home or public charging stations have been made available, and that recharging technologies exist and/or are continually being developed.

It is submitted that none of the foregoing and/or other existing or developing technologies, however, can recharge an electric vehicle and/or a hybrid vehicle when, on a long distance trip, a recharging station is not available, or in instances when an electrical power system and/or an electrical power grid fails or becomes inoperable. Without an appropriate and effective means for managing, monitoring, maintaining, and/or recharging, a battery or batteries, or any other power source, of an electric vehicle and/or of a hybrid vehicle under adverse conditions, it is submitted that electric vehicles and/or hybrid vehicles may be limited in their use or range of use as a substitute for internal combustion engine-powered vehicles.

SUMMARY OF THE INVENTION

The present invention pertains to a battery power management apparatus and methods for electric vehicles and/or for hybrid vehicles and, in particular, to a battery power management apparatus and methods for electric vehicles and/or for hybrid vehicles which can facilitate the management of, the monitoring of, the maintenance of, and/or the recharging of, a battery or batteries, or a power source, of an electric vehicle and/or of a hybrid vehicle, which overcomes the shortfalls of the prior art.

The present invention can be utilized to facilitate the monitoring of, and/or the recharging of, a battery or batteries of an electric vehicle and/or a hybrid vehicle by using any one of, any one or more of, or any combination of, a wide variety of vehicle battery recharging methods and/or technologies, and/or by using position or location information of or regarding an electric vehicle and/or a hybrid vehicle, and/or by using navigation information and/or trip planning information regarding a use of an electric vehicle or a hybrid vehicle, and/or by using information regarding a current state or electrical charge in a battery or batteries.

The present invention provides an apparatus and methods which can be utilized in connection with, or in connection with, any type or kind of land, sea, air, or space, vehicle, and/or with, or in connection with, any manned, unmanned, or autonomous, vehicle, including, but not limited to, automobiles, cars, sport utility vehicles (SUVs), recreational vehicles (RVs), mobile homes, motor homes, buses, trucks, tractor trailers, trains, subway trains, drones of any and/or sizes, kinds, or types, boats, ships, marine vessels, aircraft, airplanes, jets. helicopters, spacecraft, satellites, and/or any or all types or kinds of vehicles, so as to, and/or in order to, provide for the recharging of a battery or batteries of the same, and/or so as to provide for the use of the same, and/or to provide for the uninterrupted use of the same by serving to ensure access to battery recharging facilities and/or services based on a vehicle's position or location, travel plan, and/or charge state of a vehicle's battery or batteries.

The present invention includes a central processing computer and distributed ledger and Blockchain technology system which includes a central processing computer or central processing computer system and a distributed ledger and Blockchain technology system. The central processing computer can be any computer or computer system or can be any server computer or any computer or computer system which can be used in a communication network.

The central processing computer can provide control over the present invention and can perform any of the various processing services and/or functions described herein as being performed by the present invention. The central processing computer may be a single computer or system of computers and/or may include a plurality of computers or computer systems which are utilized in conjunction with one another. The central processing computer can provide services for any of the other communications devices and/or computers and/or computer systems, and/or for any of the various systems, described herein as being associated with any of the users, individuals, persons, or entities, system operators, goods or products providers, and/or service providers, who or which utilize the present invention.

The present invention also includes a user communication device or computer which is or can be associated with, or which can be used by, any one or more of any of the herein-described users, individuals, persons, or entities, system operators, goods or products providers, and/or service providers, who or which utilize the present invention.

The user communication device(s) can communicate with, and/or can operate in conjunction with, the central processing computer/distributed ledger/Blockchain technology system and/or any of the other communication devices, computers, and/or computer systems, and/or systems, described herein as being associated with, or used by, any of the users, individuals, persons, or entities, system operators, goods or products providers, and/or service providers, who or which utilize the present invention.

The present invention also includes a vehicle computer which is located in, on, at, or associated with, an electric vehicle or a hybrid vehicle which can be utilized in connection with, or in conjunction with, the present invention. The vehicle computer can include any number of computers, computer systems, and/or computer modules, and/or the vehicle computer can control and/or monitor and/or all aspects of vehicle operation, movement, functionality, and/or travels. For example, in autonomous and/or self driving vehicles, the vehicle computer can control, monitor, and/or oversee, any and/or all operations, movements, functionalities, and/or travels, of the vehicle. The vehicle can also be remotely controlled and/or monitored via the vehicle computer.

In the case of electric vehicles, hybrid vehicles, manned vehicles, unmanned vehicles, self-driving vehicles, and/or autonomous vehicles, the respective vehicle computer can control, can monitor, and/or can include or be integrated with, any and/or all systems, devices, components, driving systems, propulsion systems, braking systems, steering systems, cooling systems, communications systems, battery recharging systems, navigation systems, radar systems, sonar systems, anti-collision systems, collision avoidance systems, pedestrian avoidance systems, emergency braking systems, cruise control systems, air conditioning systems, heating systems, electric motors, electric driving motors, battery systems, power systems, fuels cells, fuel cell systems, fuel storage systems, energy storage systems, internal combustion engine control and/or monitoring systems, fuel tank systems, fuel cell fuel storage or tank systems, transmission systems, eaxles, eaxle systems, axle systems, differential systems, battery power management systems, autopilot systems, self-driving systems and/or equipment, and/or any other systems, equipment, components, and/or devices, in, of, or associated with, the respective vehicle, whether or not the same is located in, on, or at, the vehicle, which are needed, required, or desired, for use and/or operation and/or functioning, of the respective vehicle.

The vehicle computer(s) can communicate with, and/or can operate in conjunction with, the central processing computer/distributed ledger/Blockchain technology system and/or any of the other communication devices, computers, and/or computer systems, and/or any of the various systems, described herein as being associated with, or used by, any of the users, individuals, persons, or entities, system operators, goods or products providers, and/or service providers, who or which utilize the present invention. The vehicle computer can be wirelessly connected to the central processing computer/distributed ledger/Blockchain technology system. The vehicle computer can also be connected to the central processing computer/distributed ledger/Blockchain technology system in a wired manner and/or in any other appropriate manner.

The present invention can also include a vehicle battery/recharging system which can be located in, on, or at, the vehicle. The vehicle battery/recharging system can be connected to, or linked with, the vehicle computer. The battery/recharging system can also be located remote from, and/or separate and apart from, the vehicle and/or can be linked to, or connected to, the vehicle, the vehicle computer, and/or the central processing computer/distributed ledger/Blockchain technology system, via a wired connection and/or a wireless connection, and/or via any combination of a wired and/or a wireless connection.

The vehicle battery/recharging system includes the battery or batteries of the vehicle and recharging equipment, devices, or components, for recharging the battery or batteries of the vehicle. The recharging equipment, devices, or components, can include, but not be limited to recharging equipment, devices, or components, which can be used in connection with a plug-in battery recharging system or device, an electric road ("eroad") electric rail and vehicle deployable conducting arm battery recharging system or device, an eroad inductive charging battery recharging system or device, an electronic pad or parking lot or stall inductive charging battery recharging system or device, and/or any battery recharging equipment, devices, or components, including, but not limited to, AC to DC recharging equipment, rectifiers, capacitors or energy storage devices, inductive coils and capacitors, transformers, rectifiers, charge measurement devices, charge cut-off or safety equipment, and/or any other equipment, devices, or components, known to or by those having ordinary skill in the art or field of electric vehicle battery recharging or other battery recharging, and/or in the art or field or hybrid vehicle battery recharging or other battery recharging.

The vehicle battery/recharging system can also include one or more fuel cells, such as, but not limited to, hydrogen fuel cells or any other suitable type or kind of fuel cells and a supply storage tank for supplying the fuel to and/or for each fuel cell of the fuel cells. Any suitable type or kind of fuel cell or fuels cells can be utilized in any of the herein-described electric vehicles or hybrid vehicles. The vehicle battery/recharging system can be connected to the vehicle computer via a wired link or connection, via a wireless link or connection or link, and/or via any combination of the same. The vehicle battery/recharging system can be connected to or linked to the central processing computer/distributed ledger/Blockchain technology system via a wireless link or connection, and/or a wired link or connection, and/or via any combination of a wireless and/or a wired link or connection.

The vehicle battery/recharging system can also be connected to or linked to the herein-described electric road/vehicle recharging system computer, and/or to the herein-described electric road/vehicle recharging system(s), via a wireless connection, and/or a wired link or connection, and/or via any combination of a wireless and/or a wired link or connection. Any number of vehicle battery/recharging systems can be used for, in, on, or at, a respective vehicle. In this manner, battery power back-up system redundancy can be facilitated by using two or more vehicle battery/recharging systems in, on, at, or for, each respective vehicle to provide back up batteries and/or fuel cells along with respective recharging equipment and/or a fuel supply for the same.

The present invention can also include a navigation information system computer which can be linked to or connected with the central processing computer/distributed ledger/Blockchain technology system via a wired link or connection, via a wireless link or connection, and/or via any combination of a wired and/or a wireless link or connection. The navigation information system computer can provide navigation instructions from any location to a destination, weather information, traffic information, news information, information regarding recharging stations or locations, information regarding eroad recharging locations and the respective recharging systems utilized therein, thereat, or in association therewith, video and/or audio information obtained from various places or locations, as can, for example, be obtained via the video camera monitoring system described herein and/or which can be obtained from or by other sources. The navigation information system can include servers or other suitable computers, receivers, transmitters, databases and/or external information sources for acquiring, obtaining, and/or storing, navigation information, map information, and/or weather, traffic, and/or news information, any and/or all of which information can be obtained via its respective source or respective information provider and/or which can be, or which can include, real-time information, past or historic information, present information, future information, and/or predicted information. The navigation information system can also be linked to, or accessed by, any of the herein-described user communication devices and/or vehicle computers.

The present invention also includes an electric road/vehicle recharging system computer which can be linked to or connected with the central processing computer/distributed ledger/Blockchain technology system via a wired link or connection, via a wireless link or connection, and/or via any combination of a wireless and/or a wired link or connection. An electric road/vehicle recharging system computer can be associated with, or assigned to, each electric road recharging system, each plug-in recharging system, each recharging location or venue, and/or each fuel cell refueling location or venue, and/or any combination of the same. Each electric road/vehicle recharging system computer can be utilized in order to control, monitor, and/or oversee, the operation and/or functioning of each electric road recharging system, each plug-in recharging system, each recharging location or venue, and/or each fuel cell refueling location or venue, and/or any combination of the same, to which it is associated or assigned. The electric road/vehicle recharging system computer can also be linked to the central processing computer/distributed ledger/Blockchain technology system via a wired link or connection, via a wireless link or connection, and/or via any combination of a wireless and/or a wired link or connection. The electric road/vehicle recharging system computer can also be linked to any of the herein-described user communication devices, to any of the herein-described vehicle computers, to any of the herein-described vehicle battery/recharging systems, and/or to any of the navigation information system computers, via a wireless link or connection, via a wired link or connection, and/or via any combination of a wireless and/or a wired link or connection. The electric road/vehicle recharging system computer can also be linked to any of the herein-described electric road/vehicle recharging system(s) to which it is associated or assigned, via a wired link or connection, via a wireless link or connection, and/or via any combination of a wired and/or a wireless link or connection.

The present invention also includes an electric road/vehicle charging system(s) which can be any suitable electric vehicle recharging system or any suitable hybrid vehicle recharging system. The vehicle battery/recharging system can be located in, on, or at, the vehicle. The electric road/vehicle charging system(s) can be connected to, or linked with, the electric road/vehicle recharging system computer. The electric road/vehicle charging system(s) is, or can also be, linked to the central processing computer/distributed ledger/Blockchain technology system via a wired link or connection, via a wireless link or connection, and/or via any combination of a wireless and/or a wired link or connection.

Each electric road/vehicle charging system(s) can be, or can include, a plug-in battery recharging station or a plurality of plug-in battery recharging stations, and/or a battery recharging pad, parking space, or parking lot, which can recharge batteries of electric vehicles and/or hybrid vehicles by induction charging and/or by plug-in charging, inductive charging stations.

Each electric road/vehicle charging system(s) can be, or can include, an electric road ("eroad") or an eroad section, which is equipped with a suitable electric rail or other suitable conductor which is used for recharging a battery or batteries of a vehicle via a metal conductor which can deployed from beneath the vehicle and which can come into contact with the electric rail or conductor while the vehicle travels over the same, and which can thereby recharge the battery or batteries of the vehicle, as the vehicle travels on or along the eroad or eroad segment, and/or the eroad or erode segment can be equipped with a suitable overhead conducting line, wire, or structure, or a suitable roadside-based or guardrail-based conducting line, wire, or structure, for connecting to or with a metal conductor which can extend from the vehicle and which can come into contact with the same, and which can thereby recharge the battery or batteries of the vehicle as the vehicle travels on or along the eroad or eroad segment, and/or each eroad or eroad segment can be equipped with an electric inductive (or induction) coil or electric inductive (or induction) coil structure, which can be suitably placed within the eroad or eroad segment, or which can be embedded within the eroad or eroad segment, or which can be embedded beneath a portion or the eroad or eroad segment so as to be covered by at least some of the road material, or which can be positioned on the surface of the eroad or eroad segment, or on the top of the surface of the eroad or eroad segment, and which electric inductive coil generates a magnetic field when energized by an alternating current (AC) power source which, in turn, induces an AC voltage and current flow in an induction coil in or of the vehicle and/or of the vehicle battery/recharging system. The induced alternating current (AC) voltage and current is then rectified to a direct current (DC) voltage and current which can be used to recharge the battery or batteries of the vehicle.

Each electric road/vehicle charging system(s) can be, or can include, fuel cell fuel storage tanks and dispensing equipment for refilling fuel cell fuel storage tanks in vehicles. Each electric road/vehicle charging system(s) can be, or can include, any other suitable elective vehicle or hybrid vehicle battery recharging equipment, system, or device, or any fuel cell fuel storage and dispensing equipment, system, or device.

The electric road/vehicle charging system(s) can also be, or can include, mobile recharging stations or mobile recharging platforms which can be suitably equipped for, and which can be utilized for mobile plug-in recharging, and/or for mobile inductive recharging, and/or for any other mobile recharging. In this regard, any drone or any automobile, truck, or other mobile equipment or platform, which can be equipped with any suitable battery recharging power source and/or recharging source, as well as with any needed, required, or desired, plug-in, inductive, or other, battery recharging equipment, can also be utilized as an electric road/vehicle charging system(s) and/or as a component of the same. In this regard, for example, regarding drones or recharging vehicles of any type or kind can be used to recharge electric vehicle batteries while the vehicle is in motion, stopped, or stranded. In this regard, emergency roadside service battery recharging can also be effectuated by the electric road/vehicle charging system(s) of the present invention. As and for some example uses of a mobile an electric road/vehicle charging system(s), a drone can be deployed to land on and recharge a vehicle being driven in rural areas via inductive recharging or plug-in recharging, a recharging truck can be used to drive along with and inductively recharge the batteries of a vehicle or vehicles driving adjacent the same, and/or a service vehicle can drive to and recharge the battery of a vehicle in need of a recharge.

The present invention can also include a video camera monitoring system or any number of video camera monitoring systems. The video camera monitoring system can include any number of cameras, video cameras, or video recording cameras, which can be deployed and/or located on, along, adjacent to, or in the vicinity of, roads, roadways, streets, electric roads ("eroads"), road segments, eroad segments, eroad segments containing battery recharging equipment and/or fuel cell refueling equipment, highways, parkways, expressways, thoroughfares, intersections, parking lots, shopping centers, sports venues, strip malls, commercial buildings, electric vehicle or hybrid vehicle battery charging stations, buildings, residential buildings, stores, airports, train stations, bus stations, bridges, tunnels, toll plazas, parking lots, parking garages, commercial parking lots, driveways, and/or structures of any type or kind, or can be located on mobile recharging vehicles and/or drones, and/or can be located or situated at any other location of interest, and/or can be mounted or placed on or at any suitable structure, any and/or all of which can be of interest to owners or operators of electric vehicles or hybrid vehicles and/or any other users of the present invention.

The video camera monitoring system can also be linked to the central processing computer/distributed ledger/Blockchain technology system via a wired link or connection, via a wireless link or connection, and/or via any combination of a wireless and/or a wired link or connection. The video camera monitoring system can also be linked to any of the herein-described user communication devices, to any of the herein-described vehicle computers, to any of the herein-described vehicle battery/recharging systems, to any of the navigation information system computers, to any of the herein-described electric road/vehicle recharging system computers, and/or to any of the herein-described electric road/vehicle recharging system(s), via a wireless link or connection, via a wired link or connection, and/or via any combination of a wireless and/or a wired link or connection.

The present invention can also include an RFID reader system or any number of RFID reader systems, each of which can read any number of RFID tags which can be utilized in connection with, or in conjunction with, the present invention. The RFID reader system(s) can be utilized in or for any number of a variety ways as described herein and/or otherwise. The RFID reader system(s) can be connected to, and/or linked with, the central processing computer/distributed ledger/Blockchain technology system, using any suitable and/or appropriate wired connection, wireless connection, or any combination of same, on, via, or using, any suitable and/or appropriate communication network or any combination of communication networks. Each RFID reader of the RFID reader system(s) can be connected to, and/or linked with, the central processing computer/distributed ledger/Blockchain technology system, using any suitable and/or appropriate wired connection, wireless connection, or any combination of same, on, via, or using, any suitable and/or appropriate communication network or any combination of communication networks.

The RFID tags can be passive RFID tags, active RFID tags, or can be RFID tags which have both passive and active features and/or functionality.

The RFID reader system(s) can communicate with, and/or can operate in conjunction with, the central processing computer/distributed ledger/Blockchain technology system and/or any of the other communication devices, computers, and/or computer systems, described herein as being associated with, or used by, any of the users, individuals, persons, or entities, who or which utilize the present invention.

Each user, each electric vehicle owner, each hybrid vehicle owner, each vehicle, each user communication device, each vehicle computer, each vehicle batter/recharging system and/or each component of the same, each battery of each vehicle, each navigation information system computer, each electric road/vehicle recharging system computer, each electric road ("eroad"), each electric road ("eroad") segment, each plug-in recharging system, equipment, or device, each inductive recharging system, equipment, or device, each electric road/vehicle recharging system and/or each component of the same, each video camera of the video camera monitoring systems, each drone, or each mobile recharging vehicle, described herein as being utilized in connection with, or in conjunction with, the present invention, can have an RFID tag or multiple RFID tags assigned thereto or associated therewith.

Each electric vehicle owner, each hybrid vehicle owner, each vehicle, each user communication device, each vehicle computer, each vehicle batter/recharging system and/or each component of the same, each battery of each vehicle, each navigation information system computer, each electric road/vehicle recharging system computer, each electric road ("eroad"), each electric road ("eroad") segment, each plug-in recharging system, equipment, or device, each inductive recharging system, equipment, or device, each electric road/vehicle recharging system and/or each component of the same, each video camera of the video camera monitoring systems, each drone, or each mobile recharging vehicle, described herein as being utilized in connection with, or in conjunction with, the present invention, can have an RFID reader system or multiple RFID reader systems assigned thereto or associated therewith.

The RFID tags can be utilized as a distinct identifier of and for each user, each electric vehicle owner, each hybrid vehicle owner, each vehicle, each user communication device, each vehicle computer, each vehicle batter/recharging system, and/or each component of the same, each battery of each vehicle, each navigation information system computer, each electric road/vehicle recharging system computer, each electric road ("eroad"), each electric road ("eroad") segment, each plug-in recharging system, equipment, or device, each inductive recharging system, equipment, or device, each electric road/vehicle recharging system and/or each component of the same, each video camera of the video camera monitoring systems, each drone, or each mobile recharging vehicle, who or which utilizes the present invention, or which is utilized in connection with, or in conjunction with, the present invention.

The RFID reader system can be linked or connected with the central processing computer/distributed ledger/Blockchain technology system, and/or with any of the user communication devices, the vehicle computers, the vehicle battery/recharging systems, the navigation information system computers, the electric road/vehicle recharging system computers, the electric road/vehicle recharging systems, the video camera monitoring systems, and/or any other RFID reader systems, described herein.

The central processing computer/distributed ledger/Blockchain technology system(s), the user communication devices, the vehicle computers, the vehicle battery/recharging systems, the navigation information system computers, the electric road/vehicle recharging system computers, the electric road/vehicle recharging systems, the video camera monitoring systems, and/or the RFID reader systems, can be, or can include, any computer or communication device, including, but not limited to, a personal computer, a home computer, a server computer, a computer capable of being utilized in a network, a hand-held computer, a palmtop computer, a laptop computer, a personal communication device, a cellular telephone, a wireless telephone, wireless communication device, a mobile telephone, a digital television, an interactive television, a digital television, a personal digital assistant, a telephone, a digital telephone, a television, an interactive television, a beeper, a pager, and/or a watch or a Smart watch, and/or any wearable device, computer, or communication device.

Each of the central processing computer/distributed ledger/Blockchain technology system(s), the user communication devices, the vehicle computers, the vehicle battery/recharging systems, the navigation information system computers, the electric road/vehicle recharging system computers, the electric road/vehicle recharging systems, the video camera monitoring systems, and/or the RFID reader systems, can transmit information to, as well as receive information from, any of the computers, communication devices, or systems described herein.

In this regard, each of the computers, communication devices, or systems described herein, can communicate with, process information transmitted from or received from, and/or share data and/or information with, each other and/or with any other computers, communication devices, or systems described herein and/or utilized in conjunction with the present invention. In this manner, data and/or information transfer can occur with or between any of the computers, communication devices, or systems with or between any other computers, communication devices, or systems. Further, any of the computers, communication devices, or systems, described herein can communicate with any other computers, communication devices, or systems in a bi-directional manner. In this manner, any of the computer(s) or communication device(s), can communicate with any other computer(s) or communication device(s), in a bi-directional manner.

The present invention can be utilized on, and/or over, the Internet and/or the World Wide Web. The present invention can also utilize wireless Internet and/or World Wide Web services, equipment and/or devices. The central processing computer/distributed ledger/Blockchain technology system(s) can also have a web site or web sites associated therewith. Each of the other computers, communication devices, or systems described herein can also have a web site or web sites associated with same.

Although the Internet and/or the World Wide Web is a preferred communication system and/or medium utilized, the present invention can also be utilized with any appropriate communication network or system, or with any combination of appropriate communication networks or systems.

Any of the central processing computer/distributed ledger/Blockchain technology system(s), the user communication devices, the vehicle computers, the vehicle battery/recharging systems, the navigation information system computers, the electric road/vehicle recharging system computers, the electric road/vehicle recharging systems, the video camera monitoring systems, and/or the RFID reader systems, can communicate with one another, and/or can be linked to one another, on, over, or via, any suitable communication network, telecommunication network, telephone network, a line-connected network, and/or a wireless communication network, and/or the Internet and/or the World Wide Web. Each of the computers, communication devices, or systems can be linked with any other computer or computers, communication device(s), or system(s), directly or indirectly with one another so as to facilitate a direct or indirect bi-directional communication between said respective computers, communication devices, or systems. Communications between each of the computers, communication devices, or systems can also involve an e-mail server or e-mail servers in those instances when e-mails are described as being used to transmit, or to send, any of the information, signals, messages, reports, notification messages, or any other communications, described herein, by or between any of the computers, communication devices, systems or when any of the information, signals, messages, reports, notification messages, or any other communications, described herein, are transmitted by and/or between any of the various individuals or entities and/or by or between any of the computers, communication devices, or systems or any other computers or communication devices, computer systems, communication network equipment, server computers, etc., or any other devices used or needed, in order to facilitate communications or the transmission of any of the herein-described data, information, signals, messages, reports, notification messages, or any other communications.

Each of the central processing computer/distributed ledger/Blockchain technology system(s), the user communication devices, the vehicle computers, the vehicle battery/recharging systems, the navigation information system computers, the electric road/vehicle recharging system computers, the electric road/vehicle recharging systems, the video camera monitoring systems, and/or the RFID reader systems, can communicate in a bi-directional manner with, and/or can send and/or receive signals, messages, reports, notification messages, alerts, or any other communications or electronic communication transmissions, to, from, and/or between, any other, or any number of, or other, central processing computer/distributed ledger/Blockchain technology system(s), the user communication devices, the vehicle computers, the vehicle battery/recharging systems, the navigation information system computers, the electric road/vehicle recharging system computers, the electric road/vehicle recharging systems, the video camera monitoring systems, and/or the RFID reader systems.

Each of the central processing computer/distributed ledger/Blockchain technology system(s), the user communication devices, the vehicle computers, the vehicle battery/recharging systems, the navigation information system computers, the electric road/vehicle recharging system computers, the electric road/vehicle recharging systems, the video camera monitoring systems, and/or the RFID reader systems, can be linked to or with any other central processing computer/distributed ledger/Blockchain technology system(s), user communication device(s), vehicle computer(s), vehicle battery/recharging system(s), navigation information system computer(s), electric road/vehicle recharging system computer(s), electric road/vehicle recharging system(s), video camera monitoring system(s), and/or RFID reader system(s), via a wired link or line or a wireless link.

Each of the user communication device(s), the vehicle computer(s), the vehicle battery/recharging system(s), the navigation information system computer(s), the electric road/vehicle recharging system computer(s), the electric road/vehicle recharging system(s), the video camera monitoring system(s), and/or the RFID reader system(s), can be connected with, or linked with, the central processing computer/distributed ledger/Blockchain technology system(s). Each of the user communication device(s), the vehicle computer(s), the vehicle battery/recharging system(s), the navigation information system computer(s), the electric road/vehicle recharging system computer(s), the electric road/vehicle recharging system(s), the video camera monitoring system(s), and/or the RFID reader system(s), can be connected with, or linked with, the central processing computer/distributed ledger/Blockchain technology system(s) via a wired line or wired link, via a wireless line, and/or via any combination of same.

Any and/or all of the signals, messages, reports, notification messages, or any other communications, described herein as being transmitted from one device, computer, communication device, or system to another, can be, or can be included in, or can be attached to, an e-mail message, an instant messaging message, an electronic transmission, or an electronic data transmission or electronic data interchange, or can be transmitted via any other data or information transmission, and/or can be transmitted via or using any appropriate or necessary computer(s) or device(s).

Each of the central processing computer/distributed ledger/Blockchain technology system(s), the user communication devices, the vehicle computers, the vehicle battery/recharging systems, the navigation information system computers, the electric road/vehicle recharging system computers, the electric road/vehicle recharging systems, the video camera monitoring systems, and/or the RFID reader systems, can transmit data and/or information using TCP/IP, as well as any other Internet and/or World Wide Web, and/or communication, protocols.

The present invention can utilize electronic commerce technologies and security methods, techniques and technologies, including any encryption or security technologies and/or techniques, in any and/or all of the instances of, or involving, data and/or information processing, and/or data and/or information transmission, described herein.

The central processing computer component of the central processing computer/distributed ledger/Blockchain technology system can be any computer or computer system, a server computer, a network computer, or any other communication device, which can provide the functionality of, and which can be utilized as a central processing computer, such as an Internet server computer and/or a web site server computer. The central processing computer can include a central processing unit or CPU, a random access memory device, a read only memory device (ROM), a user input device, a display device, a transmitter, a receiver, a database, an output device, a video and/or audio recording device, and/or a global positioning device.

The user communication device can be any communication device, computer, personal computer, laptop computer, notebook computer, Smart phone or smartphone, smart telephone, cellular telephone, personal digital assistant, wireless telephone, wireless communication device, tablet, tablet computer, watch, smart watch, or wearable device or computer, or any combination of same, or any equivalent of same, or any other computer or communication device, which can provide the functionality of, and which can be utilized as a user communication device. The user communication device can include a central processing unit or CPU, a random access memory device (RAM), a read only memory device (ROM), a user input device, a display device, a transmitter, a receiver, a database, an output device, a video and/or audio recording device, and/or a global positioning device.

The vehicle computer, or any number of vehicle computers, can be used in or with, can located on, at, or in, and/or can be associated with, any electric vehicle or hybrid vehicle which is utilized in connection with the present invention. The vehicle computer can be any communication device, computer, micro-computer, microprocessor, personal computer, laptop computer, notebook computer, Smart phone or smartphone, smart telephone, cellular telephone, personal digital assistant, wireless telephone, wireless communication device, tablet, tablet computer, watch, smart watch, or wearable device or computer, or any combination of same, or any equivalent of same, or any other computer or communication device, which can provide the functionality of, and which can be utilized as a vehicle computer. The vehicle computer can include a central processing unit or CPU, a random access memory device(s) (RAM), a read only memory device(s) (ROM), a user input device, a display device, a transmitter, a receiver, a database, an output device, a video and/or audio recording device, and/or a global positioning device.

The vehicle computer can also include a vehicle operating systems control and monitoring interface (I/F), which can be used to control, monitor, and/or operate, any of the respective electric vehicle's or hybrid vehicle's various electric motor(s), internal combustion engine control systems, propulsion system(s), transmission(s), differential(s), brake system(s), heating system(s), cooling system(s), air-conditioning system(s), lighting system(s), entertainment system(s), navigation system(s), steering system(s), flight control system(s), autopilot system(s), collision avoidance system(s), electric axle system(s), electrical system(s), ignition system(s), fuel system(s), fuel cell system(s), fuel cell fuel system(s), battery power management system(s), battery recharging system(s), contact recharging system(s) such as those used to deploy a conductor to make contact with an electric rail and/or to interface with a charging conductor or an electric road or a segment of an electric road, a plug-in recharger system(s), an inductive coil recharging systems(s) for use in inductive charging applications in connection with electric road charging via inductive charging, fuel cell refueling system(s), and/or any other systems, equipment, components, or devices, which can be found in electric vehicles and/or hybrid vehicles and/or which can be operated, controlled, or monitored, by a computer or communication device. Any number of vehicle operating system control and monitoring interfaces (I/F) can be utilized in a vehicle and/or in connection with the vehicle computer.

The vehicle computer can also include a vehicle battery/recharging system interface (I/F). The vehicle battery system I/F can be used to control and/or to monitor the charge level or charge state of the vehicle's battery or batteries, and/or to control and/or to monitor, and/or to operate, the battery recharging system or equipment, to control and/or to monitor the operation or any battery recharging system or equipment, and/or to control and/or to monitor the operation of any fuel cell or fuels cells in the vehicle and/or any fuel cell fuel supply, storage, pumping, or dispensing, system or equipment. In this regard, the vehicle computer can be utilized to perform battery management operations and/or functionalities regarding controlling and/or monitoring the operation, and/or the charge level or charge state, of the vehicle's battery or batteries, as well as controlling and/or monitoring the operation of the vehicle's fuel cell or fuel cells, and/or controlling and/or monitoring the vehicle's battery recharging system(s) or equipment, and/or controlling and/or monitoring the supply of fuel to and/or for the vehicle's fuel cell or fuel cells.

The vehicle battery/recharging system can be located in, on, or at, the vehicle and/or the battery/recharging system can be located remote from, and/or separate and apart from, the vehicle, and/or can be linked to, or connected to, the vehicle, the vehicle computer, and/or the central processing computer/distributed ledger/Blockchain technology system, via a wired connection and/or via a wireless connection, and/or via any combination of a wired and/or a wireless connection.

The vehicle battery/recharging system includes a vehicle battery/recharging system computer which can perform any and/or all control and/or monitoring operations and/or functions regarding the vehicle battery/recharging system and its component systems, equipment, components, and/or devices. The vehicle battery/recharging system can also include the vehicle battery or batteries of the respective electric vehicle or hybrid vehicle. The vehicle battery or batteries can be separate and apart from the vehicle battery/recharging system, and can be connected directly to or with the same and/or can be connected to or with the same directly or indirectly via a battery interface (I/F).

The vehicle battery/recharging system computer can be connected to, or linked with, the vehicle battery or batteries so as to control the same, to monitor the operation of the same, to monitor the charge level of the same, and/or to monitor a recharging of the same. The vehicle battery/recharging system can also include a plug-in recharging system which facilitates the recharging of the vehicle battery or batteries via a plug-in or direct wired connection, such as by plugging or connecting a wire, line, and/or a plug or other connector, into a recharging line or supply such as, for example, a 120 Volt, a 240 Volt, or any other voltage, or any other alternating current (AC) power supply or recharging system, and/or any suitable direct current (DC) power supply or recharging system, and/or in any other manner for recharging a battery or batteries of an electric vehicle or a hybrid vehicle which is known by those skilled in the art. The plug-in recharging system can be connected to the vehicle battery or batteries and is connected to, and/or is, and/or can be, controlled and/or monitored by, the vehicle battery/recharging system computer.

The vehicle battery/recharging system can include an electric road ("eroad") inductive recharging system and inductive coil system which is or can be used for charging or recharging the vehicle battery or batteries via inductive charging or recharging equipment and/or techniques of any suitable kind or type. Inductive charging or recharging of the vehicle batteries can be performed while the electric vehicle or hybrid vehicle is moving along an electric road ("eroad") or a segment of an eroad, while the vehicle is parked on a charging pad or at an inductive charging location, or stall, in a parking lot, garage, or driveway, and/or at or in any other place or location which provides inductive charging.

The eroad inductive recharging system/inductive coil system can also includes any and/or all needed or required equipment, systems, components, or devices, and/or an inductive coil systems and/or any number of inductive coils or coil systems, in order to provide inductive recharging of and for the vehicle battery or batteries. The vehicle battery/recharging system can also include the inductive charging coils which is/are connected to or with, and/or which is/are also a component(s) of, the ("eroad") inductive recharging system/inductive coil system. Any suitable electrical coil or coils can be utilized in or as the inductive charging coils. The eroad inductive recharging system/inductive coil system can be connected to the vehicle battery or batteries and/or can be connected to, and/or can be controlled and/or monitored by, the vehicle battery/recharging system computer.

The vehicle battery/recharging system can also include an electric road ("eroad") electric rail ("erail") contact rail recharging system and a deployable conductor or arm system which can be used for charging or recharging the vehicle battery or batteries via a direct contact of a conductor of the electric vehicle or hybrid vehicle with a conductive rail or other conductor or conductive device of the electric road or electric road segment. The conductor of the electric vehicle or hybrid vehicle can be any fixed, extendable, deployable, and/or retractable, conductor, arm, line, wire, or conducting item which can be brought into direct contact with a conductive rail or other conductor or conductive device of the electric road or electric road segment while the electric vehicle or hybrid vehicle travels on or along the respective eroad or segment thereof.

The eroad erail/contact rail recharging system/deployable conductor/arm system can include any and/or all needed or required equipment, systems, components, or devices, and/or a fixed, extendable, deployable, and/or retractable, conductor, arm, line, wire, or conducting item which can be brought into direct contact with a conductive rail or other conductor or conductive device of the electric road or electric road segment, in order to provide direct contact recharging of and for the vehicle battery or batteries. The vehicle battery/recharging system can also include a contact charging deployable conductor or arm. Any suitable deployable conductor or arm can be used as the contact charging deployable conductor/arm.

The vehicle battery/recharging system can also include a vehicle fuel cell or a plurality of vehicle fuel cells, which can provide electrical power to or for the operation of the electric vehicle or hybrid vehicle, and/or to of for any and/or all systems, devices, components, or devices, of the same. The vehicle fuel cell/fuel cells can be any suitable fuel cell or fuel cells, can be any suitable type or kind of fuel cell, and/or can be a hydrogen fuel cell or hydrogen fuel cells. Any suitable type or kind of fuel cell or fuels cells can be utilized in any of the herein-described electric vehicles or hybrid vehicles. The vehicle fuel cell/fuel cells can be, or can include, a hydrogen fuel cell(s), a zinc fuel cell(s), an alkaline fuel cell(s), a phosphoric acid fuel cell(s), a proton exchange membrane fuel cell(s), a methanol fuel cell(s), a direct methanol fuel cell(s), a natural gas fuel cell(s), a molten carbonate fuel cell(s), a solid oxide fuel cell(s), and/or any other type or kind of fuel cell(s) which are available and/or which are known to those skilled in the pertinent art, and/or any combination thereof and/or of the same The vehicle battery/recharging system can also include one or more fuel cell fuel tank(s), each of which can contain the respective fuel for and used by each fuel cell of the vehicle fuel cell/fuel cells. The fuel cell fuel tank(s) is/are connected to or with, and/or is, and/or can be, controlled and/or monitored by, the vehicle battery/recharging system computer. The fuel cell fuel tank(s) is/are connected to or with the vehicle fuel cell/fuel cells in order to effectuate and/or to facilitate the supply of the respective fuel to each respective fuel cell of the vehicle fuel cell/fuel cells.

The navigation information system computer can include a central processing unit or CPU, a random access memory device (RAM), a read only memory device (ROM), a user input device, a display device, a transmitter, a receiver, a database, and output device, a video and/or audio recording device, and/or a global positioning device.

The navigation information system computer can also include a navigation system or any number of navigation systems which can process and/or to provide navigation information, and/or any combination of map information, travel information, news information, weather information, public safety information, road maintenance information, and/or any other information.

The navigation information system computer can also include a traffic/weather/news/information system or any number of the same, which can also provide traffic information, weather information, news information, public safety information, road maintenance information, and/or any other information, from one source or from multiple sources, to the navigation information system computer.

The electric road/vehicle recharging system computer can be any server computer, Internet server computer, computer or computer system, communication device, computer, micro-computer, microprocessor, personal computer, laptop computer, notebook computer, Smart phone or smartphone, smart telephone, cellular telephone, personal digital assistant, wireless telephone, wireless communication device, tablet, tablet computer, watch, smart watch, or wearable device or computer, or any combination of same, or any equivalent of same, or any other computer or communication device, which can provide the functionality of, and which can be utilized as an electric road/vehicle recharging system computer. The electric road/vehicle recharging system computer can include a central processing unit or CPU, a random access memory device (RAM), a read only memory device (ROM), a user input device, a display device, a transmitter, a receiver, a database, an output device, a video and/or audio recording device(s), and/or a global positioning device. The global positioning device can determine a position or location of the electric road/vehicle recharging system computer, or any of its components, and/or any mobile vehicles or drones which is/are utilized in connection with the same.

The electric road/vehicle recharging system computer can also include an electric road/vehicle recharging systems interface ("I/F") or any number of same, for enabling and/or for allowing the electric road/vehicle recharging system computer to control and/or to monitor, via the, or a respective, electric road/vehicle recharging system(s) I/F, an operation of any plug-in recharging power system, any electric road ("eroad") inductive charging system and/or inductive coil system, any eroad, road, or roadside, inductive charging coil(s), any eroad electric rail contact charging system, and/or any eroad charging rail or charging conductor, which is utilized in connection with, or in conjunction with, the electric road/vehicle recharging system computer and/or the present invention. The electric road/vehicle recharging system(s) I/F can also be utilized to enable and/or for allow the electric road/vehicle recharging system computer to control and/or to monitor, via the, or a respective, electric road/vehicle recharging system(s) I/F, an operation of any mobile recharging vehicle(s) or any recharging drone(s) which is or can be utilized in connection with, or in conjunction with, the electric road/vehicle recharging system computer and/or the present invention.

Any number of electric road/vehicle recharging system(s) I/Fs can be utilized by the electric road/vehicle recharging system computer, and/or each electric road/vehicle recharging system(s) I/F can be connected to, or linked with, the electric road/vehicle recharging system computer via a wired connection, via a wireless connection, and/or via any combination thereof.

The electric road/vehicle recharging system computer can also include a fuel cell refueling system interface (I/F) or any number of same, for enabling and/or for allowing the electric road/vehicle recharging system computer to control and/or to monitor, via the, or a respective, fuel cell refueling system(s) I/F, any fuel cell refueling system which is utilized in connection with, or in conjunction with, the electric road/vehicle recharging system computer and/or the present invention.

Any number of fuel cell refueling system(s) I/Fs can be utilized by the electric road/vehicle recharging system computer, and/or each fuel cell refueling system(s) I/F can be connected to, or linked with, the electric road/vehicle recharging system computer via a wired connection, via a wireless connection, and/or via any combination thereof.

The electric road/vehicle recharging system can include an electric road/vehicle charging system computer or any number of the same, which can be associated with each electric road or each electric road segment. The electric road/vehicle recharging system can perform any and/or all control and/or monitoring operations and/or functions regarding the electric road/vehicle recharging system and its component systems, equipment, components, and/or devices, described herein.

The electric road/vehicle recharging system can include a plug-in recharging power system or any number of the same, which can be associated with each electric road or each electric road segment. The plug-in recharging power system can be utilized to facilitate and/or to perform any type or kind of plug-in recharging, via a plug-in or direct wired, line, or other, direct contact connection, of a battery or batteries of an electric vehicle or a hybrid vehicle. The plug-in recharging power system can be any type or kind of suitable plug-in recharging power system or power supply.

The electric road/vehicle recharging system can also include an electric road ("eroad") inductive charging system and inductive coil system or any number of the same, which is/are, or can be, associated with each electric road or each electric road segment. The eroad inductive charging system/inductive coil system can also include any systems, equipment, components, or devices, and/or any inductive charging coil(s) and/or any associated equipment or components, which allow for and/or facilitate and/or perform inductive charging or inductive recharging of a battery or batteries of an electric vehicle or a hybrid vehicle via the use of electric coils which are located or placed on, adjacent to, underneath, or buried wholly or partially in or within, any pavement of an electric road. The eroad inductive charging system/inductive coil system can also include any systems, equipment, components, or devices, and/or any inductive charging coil(s) and/or any associated equipment or components, which allow for and/or facilitate and/or perform inductive charging or inductive recharging of a battery or batteries of an electric vehicle or a hybrid vehicle via the use of electric coils which are located or placed on, adjacent to, underneath, or buried wholly or partially in or within, any parking space, parking lot, battery charging pad or location, stall, parking garage, garage, driveway, inductive charging station, or any other place, location, or venue, where a vehicle battery can be inductively charged or recharged while the vehicle is stationary and/or parked. The eroad inductive charging system/inductive coil system can be connected via a wired link or connection, via a wireless link or connection, or via any combination of the same, to the electric road/vehicle charging system computer and/or can be controlled and/or monitored by the electric road/vehicle charging system computer.

The electric road/vehicle recharging system can also include an electric road ("eroad") road and/or roadside inductive charging coil and/or any number of the same which can also be the charging or recharging coil or coils of the eroad inductive charging system/inductive coil system. Any number of eroad/road/roadside inductive charging coil(s) can be associated with any eroad inductive charging system/inductive coil system. The eroad/road/roadside inductive charging coil(s) can be connected, via a wired link or connection, via a wireless link or connection, or via any combination of the same, to the eroad inductive charging system/inductive coil system and/or can be controlled and/or monitored by the eroad inductive charging system/inductive coil system and/or by the electric road/vehicle charging system computer.

The electric road/vehicle recharging system can also include an electric road ("eroad") road electric rail contact charging system or any number of the same, which can be associated with each electric road or each electric road segment. The eroad electric rail contact charging system includes any systems, equipment, components, or devices, and/or any electric rail(s), electric conductor(s), conductive rail(s), or other conductor(s) or conductive device(s), of or associated with the electric road or electric road segment, which respective electric rail(s), electric conductor(s), conductive rail(s), or other conductor(s) or conductive device(s), of or associated with the electric road or electric road segment, can charge or recharge a battery or batteries of an electric vehicle or hybrid vehicle via direct and/or any other appropriate contact with the respective, and/or any suitable, fixed, extendable, deployable, and/or retractable, conductor, arm, line, wire, or conducting item of the respective vehicle. In this regard, charging or recharging of a battery or batteries of an electric vehicle or hybrid vehicle can occur when the fixed, extendable, deployable, and/or retractable, conductor, arm, line, wire, or conducting item of the respective vehicle is brought into contact with, and while it remains in contact with, the respective electric rail, electric conductor, conductive rail, or other conductor or conductive device, of or associated with the electric road or electric road segment. The eroad electric rail contact charging system can be connected, via a wired link or connection, via a wireless link or connection, or via any combination of the same, to the electric road/vehicle charging system computer and/or can be controlled and/or monitored by the electric road/vehicle charging system computer.

The electric road/vehicle recharging system 70 can also include an electric road ("eroad") charging rail or conductor, or any number of the same, which can be associated with each electric road or each electric road segment. The eroad charging rail/conductor can be the charging or recharging electric rail, electric conductor, conductive rail, or other conductor or conductive device, of the eroad electric rail contact charging system.

The electric road/vehicle recharging system can also include a mobile recharging vehicle or recharging drone and/or any number of the same. The mobile recharging vehicle/drone can be any motor vehicle, car, automobile, truck, sport utility vehicle, recreational vehicle, land vehicle, boat, marine vehicle or vessel, submarine, aircraft, jet, airplane, spacecraft, satellite, robot, self-driving or self-operating vehicle or drone, remote-controlled vehicle or drone, flying drone, and/or any manned or unmanned, vehicle or drone. The mobile recharging vehicle/drone can be equipped with an inductive charging coil(s) and any associated inductive recharging system or equipment, a contact charging conductor or system, and/or plug-in recharging equipment.

The electric road/vehicle recharging system can also include a vehicle fuel cell fuel dispensing system or any number of the same, which can be utilized to perform fuel cell fuel dispensing for electric vehicles or hybrid vehicles equipped with fuel cells. The electric road/vehicle recharging system can also include a fuel cell fuel tank or any number of the same, which can be utilized to store fuel cell fuel of any type or kind.

Each electric road/vehicle recharging system computer, or any number of the same, and/or any number of electric road/vehicle charging system(s), which are associated therewith, can be associated with, or assigned to, an electric vehicle or hybrid vehicle recharging facility, fuel cell refueling facility, or any other facility, servicing facility, service station, parking lot, parking garage, or any other servicing location of any type or kind, and/or each electric road/vehicle recharging system computer, or any number of the same, and/or any number of electric road/vehicle charging system(s), which are associated therewith, can be associated with, or assigned to, an electric road ("eroad") or an eroad segment.

The video camera monitoring system can include a video camera monitoring system computer which can control and monitor the operation and/or the functioning of the video camera monitoring system and its systems, equipment, components, and/or devices. Any number of video camera monitoring systems, and video camera monitoring system computers, can be utilized with each video camera monitoring system and/or video camera monitoring system computer being assigned to a specific geographic location, municipality, political subdivision, locality, property, commercial property, and/or any road, highway, parkway, expressway, street, electric road ("eroad"), eroad segment, and/or any other venue.

The video camera monitoring system can also include any number of cameras, video cameras, or video recording cameras, each of which can be deployed and/or located on, along, adjacent to, or in the vicinity of a road, roadway, street, electric road ("eroad"), road segment, eroad segment, eroad segment containing battery recharging equipment and/or fuel cell refueling equipment, highway, parkway, expressway, thoroughfare, intersection, parking lot, shopping center, sports venue, strip mall, shopping mall, commercial building, electric vehicle or hybrid vehicle battery charging station, building, residential building, store, airport, train station, bus station, bridge, tunnel, toll plaza, parking lot, parking garage, commercial parking lot, driveway, and/or structure of any type or kind, and/or located on a mobile recharging vehicle and/or drone, and/or can be located or situated at any other location of interest, and/or can be mounted or placed on or at any suitable structure, which can be of interest to owners or operators of electric vehicles or hybrid vehicles and/or any other users of the present invention. In a preferred embodiment, any number of cameras can be placed at, stationed at, assigned to, and/or utilized at, any place, location, or venue. Each camera can record and/or transmits pictures, photographs, or live video.

The video camera monitoring system can also include any number of location computers, each of which can be connected to, or linked with, can control an operation of, can operate, can record and/or store pictures, photographs, and/or live video obtained by for from, and/or can transmit pictures, photographs, and/or live video by or from, any one or more cameras which is is/are assigned thereto. Each location computer can be connected to or linked with each of one or more cameras via a wireless connection or link, via a wired connection or link, or via any combination of the same.

The video camera monitoring system computer can be connected to or linked with each of one or more location computers via a wireless connection or link, via a wired connection or link, or via any combination of the same, and/or can control and/or monitor an operation of, and/or can operate, the one or more location computers. The video camera monitoring system computer can also be connected to or linked with each of the cameras utilized in connection with the present invention via a wireless connection or link, via a wired connection or link, or via any combination of the same, and/or can control and/or monitor an operation of, and/or can operate, and/or can record and/or store pictures, photographs, and/or live video obtained by for from, and/or can transmit pictures, photographs, and/or live video obtained by or from, any of the cameras.

Each of the video camera monitoring system computer, the locations cameras, and/or each of the cameras, can record, store, and/or transmit any pictures, photographs, or live video, obtained by or with each respective camera, and/or each of the video camera monitoring system computer, the locations cameras, and/or each of the cameras, can transmit any pictures, photographs, live video, and/or recorded video, obtain by or with each respective camera.

Each of the video camera monitoring system computer and/or the locations cameras can control an operation of, activate an operation of, deactivate an operation of, monitor an operation of, and/or operate, any camera or cameras which is/are associated with a respective location computer. The video camera monitoring system computer can control an operation of, activate an operation of, deactivate an operation of, monitor an operation of, and/or operate, any camera or cameras which are associated with the video camera monitoring system computer either directly and/or indirectly via the respective location computer which is assigned to or associated with the respective camera or cameras. The pictures, photographs, live video, and/or recorded video, obtained by or with any of the herein-described cameras can be provided to any users of the present invention.

The present invention can be utilized in a number of ways in order to facilitate the recharging or a battery or batteries of, and/or for, electric vehicles and/or hybrid vehicles, and/or in order to facilitate the refueling of fuels cells of, and/or for, electric vehicles and/or hybrid vehicles. The present invention can also be utilized in order to identify and/or locate a battery recharging facility and/or a fuel cell refueling facility, and/or to identify and/or locate a battery recharging facility and/or a fuel cell refueling facility based on a current or expected state or charge of a battery or batteries, and/or a current or expected fuel cell fuel level, and/or to identify and/or locate a battery recharging facility and/or a fuel cell refueling facility based on the current or expected state or charge of a battery or batteries, and/or the current or expected fuel cell fuel level and/or based on navigation instructions or information on a current or expected travel route.

The present invention can also be utilized to identify an electric vehicle or hybrid vehicle which utilizes a battery recharging operation, activity, or service, and/or which utilizes a fuel cell refueling operation, activity, or service, determine a charge for the respective operation, activity, or service, and automatically bill a respective battery recharging account or fuel cell refueling account. The present invention can also provide account security for battery recharging accounts and/or fuel cell refueling accounts by generating and transmitting account use alert messages in order to notify the respective account holder, who or which can an owner or operator, or any other individual or entity, regarding a use or attempted use of his or her, or its, respective battery recharging account and/or fuel cell refueling account.

The present invention can also be utilized in order to provide for trip planning or travel planning in order to provide for, and/or in order to ensure, that an electric vehicle or a hybrid vehicle has access to battery recharging services and/or fuel cell refueling services, throughout the during of the trip or travel. The present invention can also be utilized in order to provide for the recharging of a battery or batteries of an electric vehicle or a hybrid vehicle by, with, or using, mobile recharging vehicles or drones, and/or in order to provide for the refueling of a fuel cell or fuel cells of an electric vehicle or a hybrid vehicle by, with, or using, mobile refueling vehicles or drones.

The present invention can be utilized in order to facilitate the recharging or a battery or batteries of, and/or for, electric vehicles and/or hybrid vehicles, and/or in order to facilitate the refueling of fuels cells of, and/or for, electric vehicles and/or hybrid vehicles. The present invention can also be utilized in order to identify and/or locate a battery recharging facility and/or a fuel cell refueling facility based on the current or expected state or charge of a battery or batteries, and/or a current or expected fuel cell fuel level, and/or based on the current or expected state or charge of a battery or batteries, and/or the current or expected fuel cell fuel level, and/or based on navigation instructions or information on or regarding a current or expected travel route.

The present invention can be utilized to allow a vehicle operator to locate an electric vehicle or hybrid vehicle battery charging facility or venue, and/or to provide navigation information or instructions to the electric vehicle or hybrid vehicle battery charging facility or venue, and/or to provide battery recharging services and/or fuel cell refueling products and/or services.

The present invention can also be utilized in trip planning or travel planning so as to plan a travel route, of any distance, from a point of origin to a destination. The present invention can process information for planning, and can identify, a travel route or a navigation route which provides for electric vehicle and/or hybrid vehicle battery recharging and/or fuel cell fuel refueling along the travel route or navigation route. In this regard, the present invention can continuously and/or automatically monitor, and/or can determine or ascertain, the charge state or charge level of the battery or batteries of the electric vehicle or hybrid vehicle and/or the fuel cell fuel amount or fuel cell of the fuel cell or fuel cells in the electric vehicle or hybrid vehicle, can detect a need for recharging the battery or batteries of the electric vehicle or hybrid vehicle, and/or can detect a need to refuel a fuel cell or fuel cells of the electric vehicle or hybrid vehicle.

Once a need for recharging the battery or batteries of the electric vehicle or hybrid vehicle, and/or a need to refuel a fuel cell or fuel cells of the electric vehicle or hybrid vehicle, is detected, the present invention can identify a battery recharging facility or venue and/or fuel cell refueling facility or venue, within the range of travel remaining for the vehicle, identify a travel route the battery recharging facility or venue and/or fuel cell refueling facility or venue, and provide, via the vehicle computer, navigation information, navigation instructions, or driving directions to the battery recharging facility or venue and/or fuel cell refueling facility or venue.

The present invention can repeat the above process to direct the vehicle operator to a next battery recharging facility or venue and/or fuel cell refueling facility or venue on the way to the destination, and the above process can be repeated until the vehicle reached the destination.

The present invention can recharge a battery or batteries of an electric vehicle or a hybrid vehicle with or using a mobile recharging vehicle/drone of, or associated with, an electric road/vehicle recharging system(s), which mobile recharging vehicle can be a an automobile or a truck, or any other land vehicle, or a drone, which can be deployed to meet the vehicle and to provide stationary charging at any location. The mobile recharging vehicle/drone can provide moving or in-motion plug-in recharging via a tether while both the vehicle and the mobile recharging vehicle/drone can travel next to each other, or while a drone mobile recharging vehicle/drone can land atop the vehicle, and/or the present invention can provide moving or in-motion inductive charging with or using a mobile recharging vehicle/drone which can be equipped with an eroad inductive charging system/inductive coil system and the eroad/roadside inductive charging coil(s), and/or can provide moving or in-motion electric road electrified rail contact battery recharging with a mobile recharging vehicle/drone which is equipped with an eroad electric rail contact charging system and/or the eroad charging rail/conductor of the same. The mobile recharging vehicle/drone can also provide fuel cell refueling of the vehicle's fuel cell or fuel cells.

The present invention can also be utilized to recharge the vehicle battery or vehicle batteries with and/or using the fuel cell or fuel cells of the vehicle. The fuel cell or fuel cells of the vehicle can recharge the vehicle battery or batteries at any time, during vehicle operation, and/or when the vehicle is not being operated.

The fuel cell or fuel cells of the vehicle can be used to provide electrical power directly to the electric motor or electric motors of the vehicle, and/or can be used to provide electrical power to the electric motor or electric motors of the vehicle via a vehicle fuel cell interface ("I/F") and/or via a vehicle fuel cells interface ("I/F"). The vehicle battery or vehicle batteries can be used to provide electrical power directly to the electric motor or electric motors of the vehicle, and/or can be used to provide electrical power to the electric motor or electric motors of the vehicle via a vehicle battery interface ("I/F") and/or via a vehicle batteries interface ("I/F").

The present invention can also be utilized to recharge the vehicle battery or batteries with and/or using the fuel cell or fuel cells of the vehicle prior to vehicle operation or vehicle electric motor operation. The fuel cell or fuel cells of the vehicle can recharge the vehicle battery or batteries, and/or can provide electrical power to the vehicle electric motor(s), at any time, and/or prior to vehicle operation or vehicle motor operation, during vehicle operation or vehicle electric motor operation, and/or after vehicle operation or vehicle electric motor operation.

The fuel cell or fuel cells of the vehicle can be activated to, and can, recharge the vehicle battery or batteries and/or provide electrical power to the vehicle electric motor(s), at any time, and can be activated, and/or controlled, and/or deactivated, via the vehicle computer and/or the input device of the same, and/or can be remotely activated, and/or controlled, and/or deactivated, via the user communication device.

The vehicle fuel cell or fuel cells can be of any type of kind which is suitable and/or appropriate for use in electric vehicles or hybrid vehicles. Any suitable liquid, solid, or gaseous, fuel can be utilized as fuel for the respective vehicle fuel cell or fuel cells used in a vehicle. The fuel cell fuel tank(s)/container can be any suitable tank, container, or storage device or entity, for storing and/or for containing, and/or for delivering to the respective vehicle fuel cell or fuel cells the fuel or fuels which can be used as fuel in the respective vehicle fuel cell or fuel cells. The vehicle fuel cell or fuel cells can, among other uses, be utilized to proved a back-up power source for electric vehicle or hybrid vehicle operation, can be used along with, and/or in conjunction with, the be the vehicle battery or batteries so as to conserve battery charge levels, and/or can serve as an emergency power source in the event that access to an electrical battery recharging facility is not readily available.

The present invention, and/or the apparatus and/or the vehicle battery/recharging system of the same, and, in particular, the or any plug-in recharging system of the same, or any standalone system of the apparatus, can also be equipped with solar panels which can be located on the hood, roof, trunk, or side(s), of the electric vehicle or the hybrid vehicle, and/or can include a rotational recharging system which can include one or more alternators or generators, or any combination of the same, which can be driven by the rotation of the axle(s), wheel(s), or any other rotating component(s) or a specially situated air driven propeller(s), of the electric vehicle or hybrid vehicle. Applicant incorporates by reference herein the subject matter and teachings of U.S. Provisional Patent Application Ser. No. 63/149,530, filed Feb. 15, 2021, and entitled "Battery Power Management Apparatus And Method", the subject matter and teachings of which are incorporated by reference herein in their entirety. Applicant further incorporates by reference herein the subject matter and teachings of FIGS. 10A and 10B, and the written description corresponding to the same, and the teachings regarding the vehicle battery recharging system and technique disclosed therein, of U.S. Provisional Patent Application Ser. No. 63/149,530, filed Feb. 15, 2021, and entitled "Battery Power Management Apparatus And Method", the subject matter and teachings of which are incorporated by reference herein in their entirety.

Applicant also hereby incorporates by reference herein the subject matter and teachings of U.S. Provisional Patent Application Ser. No. 63/162,124, filed Mar. 17, 2021, and entitled "BATTERY POWER MANAGEMENT APPARATUS AND METHOD FOR ELECTRIC VEHICLES AND/OR HYBRID VEHICLES", the subject matter and teachings of which are hereby incorporated by reference herein in their entirety.

Although the solar panels and the rotational recharging system are described as being components of the plug-in recharging system, the solar panels and the rotational recharging system can be separate and apart from the plug-in recharging system, and/or can be stand alone, and separate and distinct, components of the vehicle battery/recharging system or the apparatus of the present invention.

The present invention can also include the vehicle electric drive motor or the vehicle electric drive motors of the electric vehicle or the hybrid vehicle, and a vehicle battery/recharging system. The vehicle battery/recharging system can be connected to, or can be linked with, the vehicle computer. The vehicle computer can also control and/or monitor the operation of the vehicle battery/recharging system. The vehicle battery/recharging system can be located in, on, or at, the vehicle. The battery/recharging system can also be located remote from, and/or separate and apart from, the vehicle, and/or can be linked to, or connected to, the vehicle, the vehicle computer, and/or the central processing computer/distributed ledger/Blockchain technology system, via a wired connection and/or a wireless connection, and/or via any combination of a wired and/or a wireless connection. The vehicle battery/recharging system can be connected to, or linked with, the vehicle electric drive motor(s). The vehicle battery/recharging system can also provide electrical power to the vehicle electric drive motor(s), directly and/or indirectly via any suitable interface ("I/F") so as to activate, and/or to control and/or to monitor, and/or so as to provide electrical power to drive and/or control the operation of, the electric drive motor(s) of the electric vehicle or hybrid vehicle. The vehicle computer can also be connected to, or linked with, the electric drive motor(s) and can activate, control and operation or, and/or monitor an operation of, the electric drive motor(s).

The vehicle battery/recharging system can also include a plug-in recharging system which can also include any suitable plug or receptacle which can be used for effectuating plug-in vehicle battery charging or recharging in conjunction with an external battery charging or recharging device which can be, or which can include, any suitable plug-in type recharging device, a mobile device, a drone which can effectuate vehicle battery charging or recharging, and/or any other suitable vehicle battery charging or recharging device. The plug-in recharging system can also include a solar panel or system of solar panels which can be located on the exterior of the electric vehicle or hybrid vehicle at any suitable location on the hood, roof, trunk, or side(s), of the electric vehicle or hybrid vehicle, and/or at or on any other suitable location of the electric vehicle or hybrid vehicle, and which can generate electrical power from sunlight or any other light source or lighting source. Electrical power generated by the solar panel(s) can be input into the plug-in recharging system via a plug and receptacle system or via a hard-wired system or configuration.

The plug-in recharging system can also include a rotational recharging system which can include one or more alternators or generators, or any combination of the same, which can be driven by the rotation of the axle(s), wheel(s), or any other rotating component(s), or any specially situated air driven propeller(s), of the electric vehicle or hybrid vehicle, which can be used in order to recharge the vehicle battery/batteries.

The plug-in recharging system can also include mounting hardware and/or mating hardware for effectuating the mounting and/or the mating of any suitable charging or recharging device, such as, but not limited to, any suitable stationary or mobile charging or recharging equipment, or a mobile charging or recharging drone, with or on the electric vehicle or the hybrid vehicle so as to facilitating the charging or recharging of the vehicle battery/batteries of the same. In this manner, a charging or recharging drone can travel to, or can fly to, the respective electric vehicle or the hybrid vehicle, and can land on and attach itself to, mount, or mate with, the same using any appropriate mounting/mating hardware.

The charging or recharging drone can include, at the very least, and in addition to its required equipment, a charging or recharging power source, and mating/mounting hardware of its own for facilitation its landing onto, mounting, or mating with, the mounting/mating hardware of the electric vehicle or hybrid vehicle and/or of the plug-in recharging system. Any other type of suitable charging or recharging device can also connect to or mate with the mounting/mating hardware.

The charging or recharging drone, or any other suitable charging or recharging device can charge or recharge the vehicle battery/batteries, via a plug-in charging or recharging method or technique, such as by plugging in the drone or other device into the plug-in recharging system. The drone or other suitable charging or recharging device can also charge or recharge the vehicle battery/batteries via any other contact charging or recharging method or technique. The drone or other suitable charging or recharging device can also charge or recharge the vehicle battery/batteries via any inductive charging or recharging method or technique.

The vehicle fuel cell/fuel cells, in addition to being connected, or linked with or, the vehicle battery/recharging system computer and to or with the fuel cell fuel tank(s)/container, can also connected to, or linked with or to, the vehicle battery/batteries, and, can provide electrical power directly to, or indirectly via an interface ("I/F") to, the vehicle battery/batteries, so as to charge or to recharge the vehicle battery/batteries, and/or so as to provide electrical power, directly and/or indirectly, to the vehicle electric drive motor(s), and/or any other electrical devices, systems, or components, of the electric vehicle or the hybrid vehicle, through and/or via, or by way of, and/or in conjunction with, the vehicle battery/batteries.

Each of the vehicle battery/batteries and the vehicle fuel cell/fuel cells can be used to provide electrical power, directly and/or via an interface ("I/F"), to the vehicle electric drive motor(s). In such a configuration, electrical power generated by the vehicle fuel cell/fuel cells can be used in order to conserve the charge level(s) in the vehicle battery/batteries.

The vehicle battery/recharging system computer of the vehicle battery/recharging system computer can be connected to each of the vehicle battery/batteries, the vehicle fuel cell/fuel cells, and the vehicle electric drive motor(s). The vehicle battery/batteries can also be connected directly to the vehicle electric drive motor(s), and the vehicle fuel cell/fuel cells can also be connected directly to the vehicle electric drive motor(s). The vehicle battery/batteries can also be connected to the vehicle electric drive motor(s) via a vehicle battery/batteries I/F, and the vehicle fuel cell/fuel cells can also be connected to the vehicle electric drive motor(s) via the vehicle fuel cell/fuel cells I/F.

The vehicle battery/batteries can provide electrical power to the vehicle electric drive motor(s) directly and/or via the vehicle battery/batteries I/F, the vehicle fuel cell/fuel cells can provide electrical power to the vehicle electric drive motor(s) directly and/or via the vehicle fuel cell/fuel cells I/F, and/or both of the vehicle battery/batteries and the vehicle fuel cell/fuel cells can provide electrical power, at the same time, in an alternating fashion, and/or in any combination of the same, to the vehicle electric drive motor(s) directly and/or via their respective vehicle battery/batteries interface (I/F) devices. In this manner, the vehicle battery/batteries and the vehicle fuel cell/fuel cells can be utilized in order to conserve the charge levels of the vehicle battery/batteries while providing electrical power to the vehicle electric drive motor(s). The vehicle battery/batteries and the vehicle fuel cell/fuel cells can also be utilized in order to conserve the charge levels of the vehicle battery/batteries while providing electrical power to the vehicle electric drive motor(s) and while recharging the vehicle battery/batteries with and/or using the vehicle fuel cell/fuel cells.

The vehicle battery/recharging system computer can also be programmed and/or configured so as to activate, control, deactivate, and/or monitor, the respective operations of each of the vehicle battery/batteries and the vehicle fuel cell/fuel cells in order to effectuate and control the operations of the same in performing any and/or all of the functions and/or functionalities described herein.

The present invention can also be utilized in order to activate and/or to control an operation of the vehicle fuel cell/fuel cells in order to utilize the vehicle fuel cell/fuel cells to recharge, or to perform a recharging operation for, the vehicle battery/batteries while the electric vehicle or hybrid vehicle is in use or operational and/or when the electric vehicle or hybrid vehicle is not in use or non-operational, and/or in order to utilize the vehicle fuel cell/fuel cells in order to provide or to supply electrical power to the vehicle electric drive motor(s) as the sole source of electrical power to the electric drive motor(s), such that only the vehicle fuel cell/fuel cells are supplying electrical power to, or "driving", the vehicle electric drive motor(s), and/or in order to utilize both of the vehicle fuel cell/fuel cells and the vehicle battery/batteries in order to provide or to supply electrical power to the vehicle electric drive motor(s), so that both the vehicle fuel cell/fuel cells and the vehicle battery/batteries provide or supply electrical power to the vehicle electric drive motor(s) simultaneously, at the same time, in an alternating fashion, or in any other appropriate manner, and/or in order to utilize the vehicle fuel cell/fuel cells in order to recharge, or to perform a recharging operation for, the vehicle battery/batteries while also providing or supplying electrical power to the vehicle electric drive motor(s) of the electric vehicle or hybrid vehicle, simultaneously, at the same time, in an alternating fashion, or in any other appropriate manner.

The vehicle fuel cell/fuel cells can also be used to conserve the battery charge level(s) of the vehicle battery/batteries, can be used to provide an emergency power source, or an emergency power store, for the electric vehicle or the hybrid vehicle, can be used to supply electrical power to the vehicle electric drive motor(s), can be used to extend the driving range of the electric vehicle or the hybrid vehicle, and/or can be used as an emergency back-up vehicle battery or batteries.

The fuel cell fuel tank(s)/container can also be provided with extra storage tank or extra storage container capacity in order to extend the fuel cell fuel capacity for the vehicle fuel cell/fuel cells and provide for extended driving ranges for the electric vehicle or the hybrid vehicle. The vehicle fuel cell/fuel cells can also serve as an important electrical power back-up source for recharging the vehicle battery/batteries and/or for providing electrical power to operate, or "drive", the vehicle electric drive motor(s), and/or the vehicle fuel cell/fuel cells can also provide an emergency power source for the electric vehicle or hybrid vehicle in instances when an electrical vehicle battery recharging station or source is unavailable or is or may be non-operational.

Applicant incorporates by reference herein any and/or all of the teachings and techniques for and/or relating to the supplying of electrical power to the electric drive motors of, in, or for, electric vehicles and/or hybrid vehicles, and any and/or all teaching and techniques for and/or relating to the charging or recharging of vehicle batteries for electric vehicles and/or hybrid vehicles, which are known by those skilled in the art as of the filing date of this patent application.

The present invention can also be utilized in order to effectuate a recharging of the vehicle battery/batteries and/or a refueling of the vehicle fuel cell/fuel cells by utilizing a mobile recharging vehicle/drone or any other land, sea, or air, vehicle.

The present invention can also be utilized in order to provide electric vehicles and/or hybrid vehicles of any type or kind and/or which can be any manned, unmanned, and/or remote-controlled, land vehicles, cars, trucks, buses, trains, subway trains, motorcycles, sport utility vehicles, recreational vehicles, planes, jets, helicopters, aircraft and/or other flying vehicles, boats, ships, and/or water vehicles and/or vessels, submarines, flying drones, and/or spacecraft. In this regard, the present invention can also be utilized in, and/or can be, any one or more of the electric vehicles and/or hybrid vehicles, which can be any manned, unmanned, and/or remote-controlled, land vehicles, cars, trucks, buses, trains, subway trains, motorcycles, sport utility vehicles, recreational vehicles, planes, jets, helicopters, aircraft and/or other flying vehicles, boats, ships, and/or water vehicles and/or vessels, submarines, flying drones, and/or spacecraft, described herein.

The present invention can also be utilized in order to provide for an apparatus and/or a vehicle, which can be any electric vehicle and/or a hybrid vehicle described herein, which can also provide for the processing of, and/or for the performing of any functions for and/or relating to, any blockchain information processing routines or operations, any blockchain transaction processing routines or operations, any blockchain block mining routines or operations, any blockchain block minting routines or operations, any cryptocurrency mining, and/or any other and/or any related blockchain or blockchain-related processing routines, operations, or functions.

The present invention, and/or the respective electric vehicle or hybrid vehicle, in which the present invention can be used, can be equipped with a computer or processing system, and/or can perform computer processing functions, routines, or operations, which can process blockchain and/or blockchain-related transactions, and/or can process information for mining or minting new blockchain blocks for inclusion into, or for addition to or for adding to, the blockchain of the distributed ledger/blockchain technology system, and/or can process blockchain and/or blockchain-related transactions, and/or can process information for mining or minting new blockchain blocks for inclusion into, or for addition to or for adding to, the blockchain of any other distributed ledger and blockchain technology system.

In this regard, the present invention can, and/or the respective electric vehicle or hybrid vehicle, in which the present invention can be utilized, can also be utilized to, and can also perform, any and/or all types or kinds of blockchain processing routines or operations, blockchain transaction processing routines or operations, blockchain block creation routines or operations, and/or cryptocurrency mining, for and/or in connection with any distributed ledger and blockchain technology system, for and/or in connection with any permissioned distributed ledger and blockchain technology system, for and/or in connection with any permissionless distributed ledger and blockchain technology system, and/or for or in connection with the distributed ledger/blockchain technology system.

The apparatus of the present invention, and/or the respective electric vehicle or hybrid vehicle in which the apparatus is used, can also be utilized to mine cryptocurrencies of or associated with any of the foregoing types or kinds of, and/or or associated with any of the herein-described distributed ledgers and blockchain technology systems and/or the distributed ledger/blockchain technology system.

The vehicle computer can also be equipped with the necessary software and/or hardware needed for performing any and/or all of the blockchain processing routines or operations, the blockchain transaction processing routines or operations, the blockchain block creation routines or operations, and/or the cryptocurrency mining routines or operations, for and/or in connection with any distributed ledger and blockchain technology system, any permissioned distributed ledger and blockchain technology system, any permissionless distributed ledger and blockchain technology system, and/or the distributed ledger/blockchain technology system.

The present invention can also include a blockchain processing/mining computer which can be utilized, for each of any number of blockchain platforms, in order to process blockchain transactions for a respective blockchain or blockchain platform, to create or to mint new blocks for a respective blockchain or blockchain platform, to add new blocks to a respective blockchain, to process individual transactions for, and/or involving and/or pertaining to, a respective blockchain or blockchain platform, and/or to perform any other processing routines, functions, and/or operations, for, pertaining to, or relating to, a respective blockchain or blockchain platform. The blockchain processing/mining computer can be equipped with any required, needed, or desired, hardware, software, and/or firmware, including, but not limited to transaction processing software and/or mining software, for performing any blockchain and/or blockchain-related processing routines, functions, and/or operations, for any blockchain or blockchain platform in, on, or for, which the blockchain processing/mining computer is to be utilized.

The present invention can also include a cooling system for cooling the blockchain processing/mining computer at any time before, during, or after its operation. The cooling system can include a liquid cooling system, which liquid cooling system can include any of the various components of a vehicle combustion engine's cooling system, including, but not limited to, a water pump, a coolant reservoir or supply tank, a radiator, a fan or any number of fans, a pulley system or pulley system(s) which can drive the rotation of the fan or fans, and a plumbing system of pipes, hoses, conduits, and/or passageways, for circulating the water or coolant during cooling operations for the blockchain processing/mining computer and/or for other vehicle components. Cooled water, coolant, or coolant liquid or fluid, can be directed or passed, or can be caused to flow, through, on, in, near, or in the vicinity of, the blockchain processing/mining computer in order to cool the same and/or the operating environment of the same in a same manner in which cooled water or coolant can be directed or passed through various components of a combustion engine to cool the same.

The cooling system can also include an air conditioning cooling system which can be, or can include, the vehicle's air conditioning system and/or any of the various components of the same, including, but not limited to, a compressor, a tank or reservoir for storing or housing Freon or any other suitable coolant liquid, gas, substance, or material, a fan or fans and/or a pulley system or pulley systems for driving the same, and a blower motor or any number of blower motors, and any number of air conditioning vents for expelling cold air. Any number air conditioning vents can be located adjacent or in the vicinity of the blockchain processing/mining computer in order to direct cooled air at the same.

The cooling system can also include an air cooling system which can utilize air which is collected from the external environment of the vehicle to be used to collected and directed at the blockchain processing/mining computer in order to cool the same. The air cooling system can include any number of external air intake vents, which can be located at various locations on the vehicle's exterior, and any suitable plumbing system of pipes, hoses, conduits, and/or passageways, for directing the outside air at and onto the blockchain processing/mining computer in order to cool the same. The air cooling system can also include one or more fans which can server to suction external air into the vehicle and/or to direct external air at or onto the blockchain processing/mining computer in order to cool the same. It is submitted that the wind chill factor of moving air, whether introduced into a moving vehicle, whether created by a fan, and/or whether enhanced by a fan or fans, can be utilized to cool the blockchain processing/mining computer and/or perform a cooling operation on and/or for the same.

The apparatus of the present invention can also include a blockchain processing/mining computer and/or any number of blockchain processing/mining computers. The blockchain processing/mining computer(s) are located in, on, or at, the vehicle. The blockchain processing/mining computer can be connected to or with, and/or linked to or with, the vehicle battery/recharging system which can provide the electrical power to operate the blockchain processing/mining computer. The blockchain processing/mining computer can also be connected to or with, and/or linked to or with, the vehicle computer. The vehicle computer can also control and/or monitor the operation of the blockchain processing/mining computer.

The blockchain processing/mining computer, and/or each of the blockchain processing/mining computers, can be equipped with any required, needed, or desired, hardware, software, and/or firmware, including, but not limited to, transaction processing software and/or mining software, for performing any and/or all of the blockchain and/or blockchain-related processing routines, functions, and/or operations, for any blockchain or blockchain platform in, on, or for, which the respective blockchain processing/mining computer is utilized.

The apparatus of the present invention can also include a cooling system, located in, on, or at, the vehicle, for performing cooling operations and/or functions for and/or regarding the blockchain processing/mining computer, and/or for or regarding each of the blockchain processing/mining computers. As noted herein, the cooling system can include a liquid cooling system, an air conditioning cooling system, and/or an air cooling system. The cooling system, and/or any of the systems or components of the same, can be connected to or with, and/or linked to or with, the vehicle battery/recharging system which provides the electrical power to operate the cooling system and/or any of the systems or components of the same. In a preferred embodiment, the cooling system 36, and/or any of the systems or components of the same, can also be connected to or with, and/or linked to or with, the vehicle computer 30. In a preferred embodiment, the vehicle computer 30 can control and/or monitor the operation of the cooling system 36 and/or any of the systems or components of the same.

The blockchain processing/mining computer includes, at the very least, all of the components of the vehicle computer as well as any hardware, software, and/or firmware, including, but not limited to, transaction processing software and/or mining software, for performing any and/or all of the blockchain and/or blockchain-related processing routines, functions, and/or operations, for any blockchain or blockchain platform in, on, or for, which the respective blockchain processing/mining computer is utilized.

The blockchain processing/mining computer can be any blockchain processing computer, blockchain mining computer, and/or any appropriately and/or suitably equipped communication device, computer, micro-computer, microprocessor, personal computer, laptop computer, notebook computer, Smart phone or smartphone, smart telephone, cellular telephone, personal digital assistant, wireless telephone, wireless communication device, tablet, tablet computer, watch, smart watch, or wearable device or computer, or any combination of same, or any equivalent of same, or any other computer or communication device, which can provide the functionality of, and which can be utilized as a blockchain processing/mining computer. Any number of blockchain processing/mining computers can be deployed in, or utilized in, at, or on, any of the various vehicles described herein.

The blockchain processing/mining computer includes a central processing unit or CPU, which can be a microprocessor, a microcomputer, a minicomputer, a macro-computer, and/or a mainframe computer, depending upon the application.

The blockchain processing/mining computer can also include a random access memory device(s) (RAM) and a read only memory device(s) (ROM), a user input device, a display device, a transmitter(s), a receiver, a database(s), an output device, and a video and/or audio recording device(s). The blockchain processing/mining computer can also include a global positioning device, a vehicle operating systems control and monitoring interface (I/F), and a vehicle battery/recharging system interface (I/F).

The vehicle computer can also be programmed to, and/or can be configured to or designed to, operate as any blockchain processing/mining computer or as the blockchain processing/mining computer in order to process any blockchain transactions, to mine or mint new blockchain blocks, to add new blocks to a blockchain, and/or to perform any blockchain and/or blockchain-related processing routines, functions, or operations.

The cooling system can be utilized for performing cooling operations on and/or for, of for cooling, the blockchain processing/mining computer(s) located in, at, or on, the vehicle. The cooling system can include a liquid cooling system, an air conditioning cooling system, and/or an air cooling system.

The liquid cooling system can include any of the various components of a vehicle combustion engine's cooling system, including, but not limited to, a liquid cooling device, which can be any suitable device, system, or element, for delivering or directing cooled liquid to, on, in, or to the vicinity of, the blockchain processing/mining computer(s). The liquid cooling system can also include liquid cooling system components, including, but not limited, a water pump, a coolant reservoir or supply tank, a radiator, a fan or any number of fans, a pulley system or pulley system(s) which can drive the rotation of the fan or fans, and a plumbing system of pipes, hoses, conduits, and/or passageways, for circulating the water or coolant during cooling operations for the blockchain processing/mining computer(s) and/or for other vehicle components.

Cooled water, coolant, or coolant liquid or fluid, can be directed or passed, or can be caused to flow by, or by means of or by action of, the liquid cooling device through, on, in, near, or in the vicinity of, the blockchain processing/mining computer(s) in order to cool the same and/or the operating environment of the same in a same manner in which cooled water or coolant can be directed or passed through various components of a combustion engine to cool the same.

The air conditioning cooling system can include any of the various components of a vehicle air conditioning system, including, but not limited to, an air conditioner blower device or system, which can be any suitable device, system, or element, for delivering or directing cooled air to, on, in, or to the vicinity of, the blockchain processing/mining computer(s). The air conditioning system can also include liquid cooling system components, including, but not limited to, a compressor, a tank or reservoir for storing or housing Freon or any other suitable coolant liquid, gas, substance, or material, a fan or fans and/or a pulley system or pulley systems for driving the same, and a blower motor or any number of blower motors, and any number of air conditioning vents for expelling cold air during cooling operations for the blockchain processing/mining computer(s) and/or for other vehicle components and/or for providing any other vehicle air conditioning functions.

Cooled air can be directed or can be caused to be directed by, or by means of or by action of, the air conditioner blower device or system at and/or towards, through, on, in, near, or in the vicinity of, the blockchain processing/mining computer(s) in order to cool the same and/or the operating environment of the same in a same manner in which an air conditioner can be used to direct or blow cold air on any device in order to cool the same.

The air cooling system can include any of the various components of an air cooling system, including, but not limited to, an air cooler blower device or system which can be any suitable device, system, or element, for delivering or directing air, obtained from the vehicle's external environment to, on, in, or to the vicinity of, the blockchain processing/mining computer(s). The air cooling system can also include air cooling system components including, but not limited to, any number of external air intake vents, which can be located at various locations on the vehicle's exterior, and any suitable plumbing system of pipes, hoses, conduits, and/or passageways, for directing the outside air at and onto the blockchain processing/mining computer(s) in order to cool the same. The air cooling system can also include one or more fans which can serve to suction external air into the vehicle and/or to direct external air at or onto the blockchain processing/mining computer(s) in order to cool the same.

Cooled air can be directed or can be caused to be directed by, or by means of or by action of, the air cooler blower device or system at and/or towards, through, on, in, near, or in the vicinity of, the blockchain processing/mining computer(s) in order to cool the same and/or the operating environment of the same.

In a preferred embodiment, each of the liquid cooling device, the air conditioner blower device or system, and/or the air cooler blower device or system, can be located, positioned, and/or situated at, near, on, or in the vicinity of the blockchain processing/mining computer(s) in order to cool the same, and/or to effectuate the cooling of the same.

The apparatus of the present invention can be utilized in connection with a vehicle-based blockchain processing/ mining computer, such as the blockchain processing/mining computer described herein and/or such as with an appropriately equipped vehicle computer, in order to process blockchain transactions, to mine or mint new blockchain blocks, to add new blocks to a blockchain, and/or to perform any blockchain and/or blockchain-related processing routines, functions, or operations. In this regard, the apparatus and methods of the present invention can facilitate providing electrical power for, and can serve as an operational platform for, a vehicle-based and vehicle-powered blockchain processing computer and/or system which can process blockchain transactions, which can mine or mint new blockchain blocks, which can add new blocks to a blockchain, and/or which can perform any blockchain and/or blockchain-related processing routines, functions, or operations.

In the above-described manner, the apparatus of the present invention can be utilized in order to provide and/or to supply electrical power for operating any number of blockchain processing/mining computers or otherwise, in order to perform various blockchain, and/or cryptocurrency mining, processing and/or computational routines, functions, and/or operations, and/or can facilitate the doing of, or the performance of, the same at and/or with the vehicle.

If needed, any direct current (DC) current and voltage, which is supplied from the vehicle battery/batteries, can be converted to the requisite alternating current (AC) current and voltage, for operating the blockchain processing/mining computer and/or each of the blockchain processing/mining computers, by using an appropriate DC to AC converter(s) and/or equipment as well as by using any voltage step-up or voltage step-down transformer equipment.

The present invention can, at the very least, be utilized in order to provide a technically innovative and efficient solution in providing battery power management for electric vehicles and/or hybrid vehicles of any type or kind.

DESCRIPTION OF THE PREFERRED EMBODIMENTS

Figure 1:
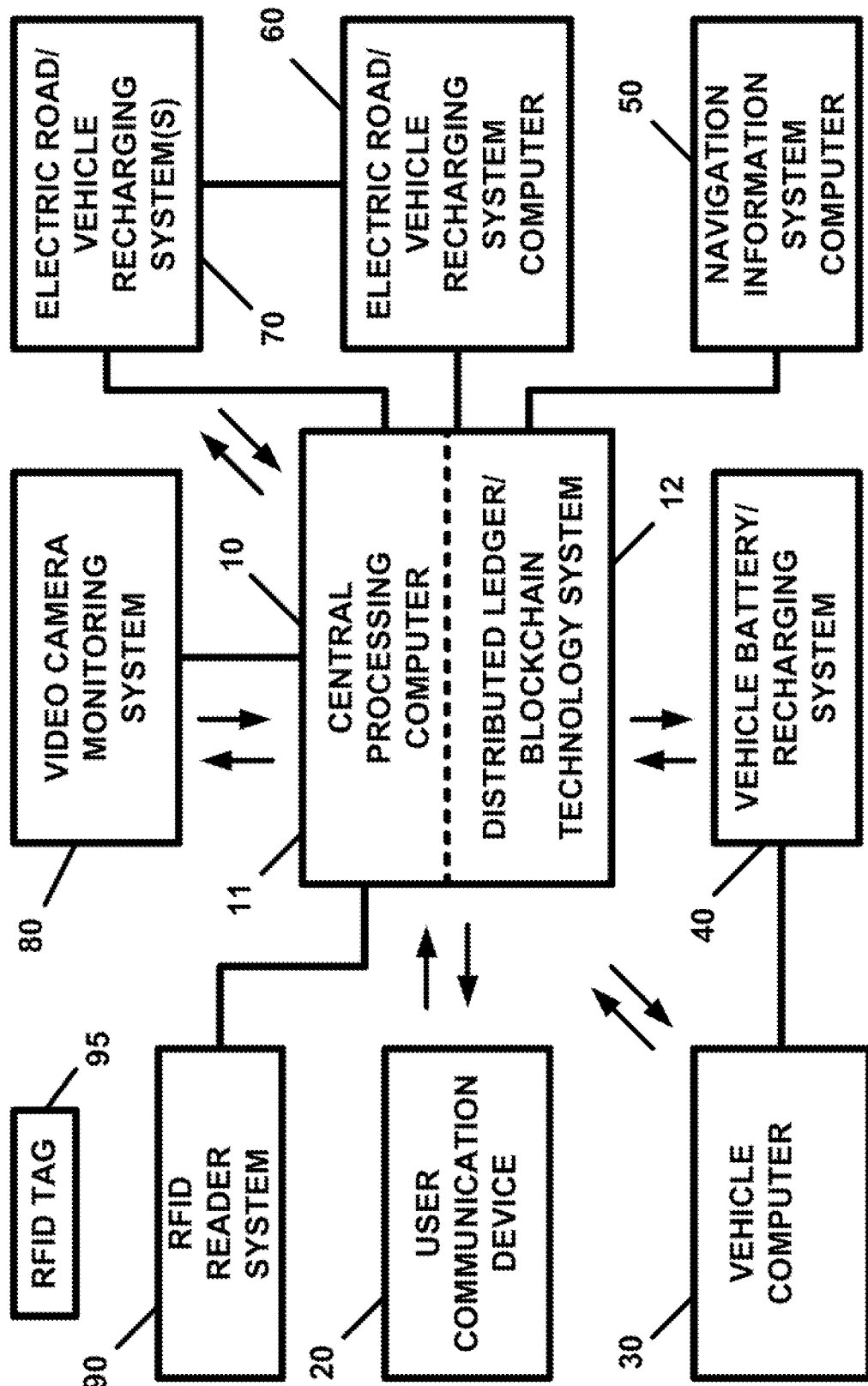
FIG. 1 illustrates a preferred embodiment of the apparatus of the present invention, in block diagram form.

The apparatus and methods of the present invention pertains to a battery power management apparatus and methods for electric vehicles and/or for hybrid vehicles and, in particular, to a battery power management apparatus and methods for electric vehicles and/or for hybrid vehicles which can facilitate the management of, the monitoring of, the maintenance of, and/or the recharging of, a battery or batteries, or a power source, of an electric vehicle and/or of a hybrid vehicle.

The apparatus and methods of the present invention can be utilized to facilitate the monitoring of, and/or the recharging of, a battery or batteries of an electric vehicle and/or a hybrid vehicle by using any one of, any one or more of, or any combination of, a wide variety of vehicle battery recharging methods and/or technologies, and/or by using position or location information of or regarding an electric vehicle and/or a hybrid vehicle, and/or by using navigation information and/or trip planning information regarding a use of an electric vehicle or a hybrid vehicle, and/or by using information regarding a current state or electrical charge in a battery or batteries.

The apparatus and methods of the present invention provides an apparatus and methods which can be utilized in connection with, or in connection with, any type or kind of land, sea, air, or space, vehicle, and/or with, or in connection with, any manned, unmanned, or autonomous, vehicle, including, but not limited to, automobiles, cars, sport utility vehicles (SUVs), recreational vehicles (RVs), mobile homes, motor homes, buses, trucks, tractor trailers, trains, subway trains, drones of any and/or sizes, kinds, or types, boats, ships, marine vessels, aircraft, airplanes, jets. helicopters, spacecraft, satellites, and/or any or all types or kinds of vehicles, so as to, and/or in order to, provide for the recharging of a battery or batteries of the same, and/or so as to provide for the use of the same, and/or to provide for the uninterrupted use of the same by serving to ensure access to battery recharging facilities and/or services based on a vehicle's position or location, travel plan, and/or charge state of a vehicle's battery or batteries.

Applicant hereby incorporates by reference herein the subject matter and teachings of U.S. Provisional Patent Application Ser. No. 63/162,124, filed Mar. 17, 2021, and entitled "BATTERY POWER MANAGEMENT APPARATUS AND METHOD FOR ELECTRIC VEHICLES AND/OR HYBRID VEHICLES", the subject matter and teachings of which are hereby incorporated by reference herein in their entirety.

Applicant hereby incorporates by reference herein the subject matter and teachings of U.S. Provisional Patent Application Ser. No. 63/299,924, filed Jan. 15, 2022, and entitled "BATTERY POWER MANAGEMENT APPARATUS AND METHOD FOR ELECTRIC VEHICLES AND/OR HYBRID VEHICLES", the subject matter and teachings of which are hereby incorporated by reference herein in their entirety.

Applicant hereby incorporates by reference herein the subject matter and teachings of U.S. patent application Ser. No. 17/827,843, filed May 30, 2022, and entitled "BATTERY POWER MANAGEMENT APPARATUS AND METHOD FOR ELECTRIC VEHICLES AND/OR HYBRID VEHICLES", the subject matter and teachings of which are hereby incorporated by reference herein in their entirety.

Applicant hereby incorporates by reference herein the subject matter and teachings of U.S. patent application Ser. No. 17/592,540, filed Feb. 4, 2022, and entitled "BATTERY POWER MANAGEMENT APPARATUS AND METHOD FOR ELECTRIC VEHICLES AND/OR HYBRID VEHICLES", the subject matter and teachings of which are hereby incorporated by reference herein in their entirety.

FIG. 1 illustrates a preferred embodiment of the apparatus of the present invention, in block diagram form. The apparatus of the present invention is denoted generally by the reference numeral 100. In the preferred embodiment, the apparatus 100 of the present invention includes a central processing computer and distributed ledger and Blockchain technology system 10 (hereinafter referred to as "central processing computer/distributed ledger/Blockchain technology system 10"). In a preferred embodiment, the central processing computer/distributed ledger/Blockchain technology system 10 includes a central processing computer or central processing computer system 11 (hereinafter referred to as "central processing computer 11" or "central processing computer 11 component") and a distributed ledger and Blockchain technology system 12 (hereinafter referred to as "distributed ledger/Blockchain technology system 12" or "distributed ledger/Blockchain technology system 12 component"). In the preferred embodiment, the central processing computer 11 can be any computer or computer system or can be any server computer or any computer or computer system which can be used in a communication network. Any number of central processing computers 11 can be utilized in conjunction with, or in connection, with the apparatus 100 of the present invention.

In the preferred embodiment, the central processing computer 11 can provide control over the apparatus 100 and can perform any of the various processing services and/or functions described herein as being performed by the apparatus 100 of the present invention. In a preferred embodiment, the central processing computer 11 may be a single computer or system of computers and/or may include a plurality of computers or computer systems which are utilized in conjunction with one another. The central processing computer 11, in the preferred embodiment, can provide services for any of the other communications devices and/or computers and/or computer systems, and/or for any of the various systems, described herein as being associated with any of the users, individuals, persons, or entities, system operators, goods or products providers, and/or service providers, who or which utilize the apparatus 100 of the present invention.

With reference once again to FIG. 1, the apparatus 100 also includes a user communication device or computer 20 (hereinafter referred to as "user communication device 20" or "user computer 20") which is associated with, or which can be used by, any one or more of any of the hereindescribed users, individuals, persons, or entities, system operators, goods or products providers, and/or service providers, who or which utilize the apparatus 100 of the present invention.

Any number of user communication devices 20 can be utilized by, or can be associated with, each of the users, individuals, persons, or entities, system operators, goods or products providers, and/or service providers (hereinafter also referred to generally as a "user" or "users"), who or which utilize the apparatus 100 of the present invention. The user communication device 20 can be any communication device, computer, personal computer, laptop computer, notebook computer, Smart phone or smartphone, smart telephone, cellular telephone, personal digital assistant, wireless telephone, wireless communication device, tablet, tablet computer, watch, smart watch, or wearable device or computer, or any combination of same, or any equivalent of same, which can be utilized by any user, individual, person, or entity, system operator, goods or products provider, and/or service provider, who or which utilizes the apparatus 100 and method of the present invention. The user communication device 20 can also be a server computer, a mainframe computer, a mini-computer, a microcomputer, or any other computer or device for suiting the needs of the particular user. The user communication device 20 can also be any device or computer, or a kiosk, which can be located at public places or locations or which can also be publicly available. Any number of user communication devices 20 can be utilized in conjunction with, or in connection with, the apparatus 100 of the present invention.

The user communication device(s) 20 can communicate with, and/or can operate in conjunction with, the central processing computer/distributed ledger/Blockchain technology system 10 and/or any of the other communication devices, computers, and/or computer systems, and/or systems, described herein as being associated with, or used by, any of the users, individuals, persons, or entities, system operators, goods or products providers, and/or service providers, who or which utilize the apparatus 100 of the present invention.

With reference once again to FIG. 1, the apparatus 100 also includes a vehicle computer 30 which is located in, on, at, or associated with, an electric vehicle or a hybrid vehicle which can be utilized in connection with, or in conjunction with, the apparatus 100 of the present invention. In a preferred embodiment, the vehicle computer 30 can include any number of computers, computer systems, and/or computer modules, and/or the vehicle computer 30 can control and/or monitor and/or all aspects of vehicle operation, movement, functionality, and/or travels. For example, in autonomous and/or self driving vehicles, the vehicle computer 30 can control, monitor, and/or oversee, any and/or all operations, movements, functionalities, and/or travels, of the vehicle. In a preferred embodiment, the vehicle can also be remotely controlled and/or monitored via the vehicle computer 30. In the case of electric vehicles, hybrid vehicles, manned vehicles, unmanned vehicles, self-driving vehicles, and/or autonomous vehicles, the respective vehicle computer 30 can control, can monitor, and/or can include or be integrated with, any and/or all systems, devices, components, driving systems, propulsion systems, braking systems, steering systems, cooling systems, communications systems, battery recharging systems, navigation systems, radar systems, sonar systems, anti-collision systems, collision avoidance systems, pedestrian avoidance systems, emergency braking systems, cruise control systems, air conditioning systems, heating systems, electric motors, electric driving motors, battery systems, power systems, fuels cells, fuel cell systems, fuel storage systems, energy storage systems, internal combustion engine control and/or monitoring systems, fuel tank systems, fuel cell fuel storage or tank systems, transmission systems, eaxles, eaxle systems, axle systems, differential systems, battery power management systems, auto-pilot systems, self-driving systems and/or equipment, and/or any other systems, equipment, components, and/or devices, in, of, or associated with, the respective vehicle, whether or not the same is located in, on, or at, the vehicle, which are needed, required, or desired, for use and/or operation and/or functioning, of the respective vehicle.

Any number of vehicle computers 30 can be utilized by, or can be associated with, each electric vehicle or each hybrid vehicle. The vehicle computer 30 can be any communication device, computer, personal computer, laptop computer, notebook computer, Smart phone or smartphone, smart telephone, cellular telephone, personal digital assistant, wireless telephone, wireless communication device, tablet, tablet computer, watch, smart watch, or wearable device or computer, or any combination of same, or any equivalent of same, which can be utilized in connection with any electric vehicle or hybrid vehicle. The vehicle computer 30 can also be a server computer, a mainframe computer, a mini-computer, a microcomputer, or any other computer or device for suiting the needs of the particular electric vehicle or hybrid vehicle. The vehicle computer 30 can also be any device or computer, or a kiosk, which can be located at, in, or on, the particular electric vehicle or hybrid vehicle. Any number of vehicle computers 30 can be utilized in conjunction with, or in connection with, the apparatus 100 of the present invention.

The vehicle computer(s) 30 can communicate with, and/or can operate in conjunction with, the central processing computer/distributed ledger/Blockchain technology system 10 and/or any of the other communication devices, computers, and/or computer systems, and/or any of the various systems, described herein as being associated with, or used by, any of the users, individuals, persons, or entities, system operators, goods or products providers, and/or service providers, who or which utilize the apparatus 100 of the present invention. The vehicle computer 30, in a preferred embodiment, is wirelessly connected to the central processing computer/distributed ledger/Blockchain technology system 10. In another preferred embodiment, the vehicle computer 30 can also be connected to the central processing computer/distributed ledger/Blockchain technology system 10 in a wired manner and/or in any other appropriate manner.

With reference once again to FIG. 1, the apparatus 100 can also include a vehicle battery/recharging system 40. In a preferred embodiment, the vehicle battery/recharging system 40 can be located in, on, or at, the vehicle. In a preferred embodiment, the vehicle battery/recharging system 40 is connected to, or linked with, the vehicle computer 30 as shown in FIG. 1. In another preferred embodiment, the battery/recharging system 40 can be located remote from, and/or separate and apart from, the vehicle, and/or can be linked to, or connected to, the vehicle, the vehicle computer 30, and/or the central processing computer/distributed ledger/Blockchain technology system 10, via a wired connection and/or a wireless connection, and/or via any combination of a wired and/or a wireless connection.

In a preferred embodiment, the vehicle battery/recharging system 40 includes the battery or batteries of the vehicle and recharging equipment, devices, or components, for recharging the battery or batteries of the vehicle. In a preferred embodiment, the recharging equipment, devices, or components, can include, but not be limited to recharging equipment, devices, or components, which can be used in connection with a plug-in battery recharging system or device, an electric road ("eroad") electric rail and vehicle deployable conducting arm battery recharging system or device, an eroad inductive charging battery recharging system or device, an electronic pad or parking lot or stall inductive charging battery recharging system or device, and/or any battery recharging equipment, devices, or components, including, but not limited to, AC to DC recharging equipment, rectifiers, capacitors or energy storage devices, inductive coils and capacitors, transformers, rectifiers, charge measurement devices, charge cut-off or safety equipment, and/or any other equipment, devices, or components, known to or by those having ordinary skill in the art or field of electric vehicle battery recharging or other battery recharging, and/or in the art or field or hybrid vehicle battery recharging or other battery recharging.

In another preferred embodiment, the vehicle battery/recharging system 40 can also include one or more fuel cells, such as, but not limited to, hydrogen fuel cells or any other suitable type or kind of fuel cells and a supply storage tank for supplying the fuel to and/or for each fuel cell of the fuel cells. In a preferred embodiment, the vehicle battery/recharging system 40 is connected to the vehicle computer 30 via a wired link or connection, via a wireless link or connection or link, and/or via any combination of the same. In a preferred embodiment, the vehicle battery/recharging system 40 is connected to or linked to the central processing computer/distributed ledger/Blockchain technology system 10 via a wireless link or connection, and/or a wired link or connection, and/or via any combination of a wireless and/or a wired link or connection. In a preferred embodiment, the vehicle battery/recharging system 40 can also be connected to or linked to the herein-described electric road/vehicle recharging system computer 60, and/or to the herein-described electric road/vehicle recharging system(s) 70, via a wireless connection, and/or a wired link or connection, and/or via any combination of a wireless and/or a wired link or connection. In a preferred embodiment, any number of vehicle battery/recharging systems 40 can be used for, in, on, or at, a respective vehicle. In this manner, battery power back-up system redundancy can be facilitated by using two or more vehicle battery/recharging systems 40 in, on, at, or for, each respective vehicle to provide back up batteries and/or fuel cells along with respective recharging equipment and/or a fuel supply for the same.

With reference once again to FIG. 1, the apparatus 100 also includes a navigation information system computer 50 which, in a preferred embodiment, is linked to or connected with the central processing computer/distributed ledger/Blockchain technology system 10 via a wired link or connection, via a wireless link or connection, and/or via any combination of a wired and/or a wireless link or connection. In a preferred embodiment, the navigation information system computer 50 can provide navigation instructions from any location to a destination, weather information, traffic information, news information, information regarding recharging stations or locations, information regarding eroad recharging locations and the respective recharging systems utilized therein, thereat, or in association therewith, video and/or audio information obtained from various places or locations, as can, for example, be obtained via the video camera monitoring system 80 described herein and/or which can be obtained from or by other sources. The navigation information system can, in a preferred embodiment, include servers or other suitable computers, receivers, transmitters, databases and/or external information sources for acquiring, obtaining, and/or storing, navigation information, map information, and/or weather, traffic, and/or news information, any and/or all of which information can be obtained via its respective source or respective information provider and/or which can be, or which can include, real-time information, past or historic information, present information, future information, and/or predicted information. In a preferred embodiment, the navigation information system can also be linked to, or accessed by, any of the herein-described user communication devices 20 and/or vehicle computers 30.

With reference once again to FIG. 1, the apparatus 100 also includes an electric road/vehicle recharging system computer 60 which, in a preferred embodiment, is linked to or connected with the central processing computer/distributed ledger/Blockchain technology system 10 via a wired link or connection, via a wireless link or connection, and/or via any combination of a wireless and/or a wired link or connection. In a preferred embodiment, an electric road/vehicle recharging system computer 60 can be associated with, or assigned to, each electric road recharging system, each plug-in recharging system, each recharging location or venue, and/or each fuel cell refueling location or venue, and/or any combination of the same. In a preferred embodiment, each electric road/vehicle recharging system computer 60 can be utilized in order to control, monitor, and/or oversee, the operation and/or functioning of each electric road recharging system, each plug-in recharging system, each recharging location or venue, and/or each fuel cell refueling location or venue, and/or any combination of the same, to which it is associated or assigned. In a preferred embodiment, the electric road/vehicle recharging system computer 60 can also be linked to the central processing computer/distributed ledger/Blockchain technology system 10 via a wired link or connection, via a wireless link or connection, and/or via any combination of a wireless and/or a wired link or connection. In a preferred embodiment, the electric road/vehicle recharging system computer 60 can also be linked to any of the herein-described user communication devices 20, to any of the herein-described vehicle computers 30, to any of the herein-described vehicle battery/recharging systems 40, and/or to any of the navigation information system computers 50, via a wireless link or connection, via a wired link or connection, and/or via any combination of a wireless and/or a wired link or connection. In a preferred embodiment, the electric road/vehicle recharging system computer 60 can also be linked to any of the herein-described electric road/vehicle recharging system(s) 70 to which it is associated or assigned, via a wired link or connection, via a wireless link or connection, and/or via any combination of a wired and/or a wireless link or connection.

With reference once again to FIG. 1, the apparatus 100 also includes an electric road/vehicle charging system(s) 70 which, in a preferred embodiment, can be any suitable electric vehicle recharging system or any suitable hybrid vehicle recharging system. In a preferred embodiment, the vehicle battery/recharging system 40 can be located in, on, or at, the vehicle. In a preferred embodiment, the electric road/vehicle charging system(s) 70 is connected to, or linked with, the electric road/vehicle recharging system computer 60 as shown in FIG. 1. In a preferred embodiment, the electric road/vehicle charging system(s) 70 is, or can also be, linked to the central processing computer/distributed ledger/Blockchain technology system 10 via a wired link or connection, via a wireless link or connection, and/or via any combination of a wireless and/or a wired link or connection.

In a preferred embodiment, each electric road/vehicle charging system(s) 70 can be, or can include, a plug-in battery recharging station or a plurality of plug-in battery recharging stations, and/or a battery recharging pad, parking space, or parking lot, which can recharge batteries of electric vehicles and/or hybrid vehicles by induction charging and/or by plug-in charging, inductive charging stations.

In a preferred embodiment, each electric road/vehicle recharging system computer 60, or any number of the same, and/or any number of electric road/vehicle charging system(s) 70, which are associated therewith, can be associated with, or assigned to, an electric vehicle or hybrid vehicle recharging facility, fuel cell refueling facility, or any other facility, servicing facility, service station, parking lot, parking garage, or any other servicing location of any type or kind, and/or each electric road/vehicle recharging system computer 60, or any number of the same, and/or any number of electric road/vehicle charging system(s) 70, which are associated therewith, can be associated with, or assigned to, an electric road ("eroad") or an eroad segment.

In a preferred embodiment, each electric road/vehicle charging system(s) 70 can be, or can include, an electric road ("eroad") or an eroad section, which is equipped with a suitable electric rail or other suitable conductor which is used for recharging a battery or batteries of a vehicle via a metal conductor which can deployed from beneath the vehicle and which can come into contact with the electric rail or conductor while the vehicle travels over the same, and which can thereby recharge the battery or batteries of the vehicle, as the vehicle travels on or along the eroad or eroad segment, and/or the eroad or erode segment can be equipped with a suitable overhead conducting line, wire, or structure, or a suitable roadside-based or guardrail-based conducting line, wire, or structure, for connecting to or with a metal conductor which can extend from the vehicle and which can come into contact with the same, and which can thereby recharge the battery or batteries of the vehicle as the vehicle travels on or along the eroad or eroad segment, and/or each eroad or eroad segment can be equipped with an electric inductive (or induction) coil or electric inductive (or induction) coil structure, which can be suitably placed within the eroad or eroad segment, or which can be embedded within the eroad or eroad segment, or which can be embedded beneath a portion or the eroad or eroad segment so as to be covered by at least some of the road material, or which can be positioned on the surface of the eroad or eroad segment, or on the top of the surface of the eroad or eroad segment, and which electric inductive coil generates a magnetic field when energized by an alternating current (AC) power source which, in turn, induces an AC voltage and current flow in an induction coil in or of the vehicle and/or of the vehicle battery/recharging system 40. The induced alternating current (AC) voltage and current is then rectified to a direct current (DC) voltage and current which can be used to recharge the battery or batteries of the vehicle.

In a preferred embodiment, each electric road/vehicle charging system(s) 70 can be, or can include, fuel cell fuel storage tanks and dispensing equipment for refilling fuel cell fuel storage tanks in vehicles. In a preferred embodiment, each electric road/vehicle charging system(s) 70 can be, or can include, any other suitable elective vehicle or hybrid vehicle battery recharging equipment, system, or device, or any fuel cell fuel storage and dispensing equipment, system, or device.

In another preferred embodiment, it is also envisioned that the electric road/vehicle charging system(s) 70 can also be, or can include, mobile recharging stations or mobile recharging platforms which can be suitably equipped for, and which can be utilized for mobile plug-in recharging, and/or for mobile inductive recharging, and/or for any other mobile recharging. In this regard, in a preferred embodiment, any drone or any automobile, truck, or other mobile equipment or platform, which can be equipped with any suitable battery recharging power source and/or recharging source, as well as with any needed, required, or desired, plug-in, inductive, or other, battery recharging equipment, can also be utilized as an electric road/vehicle charging system(s) 70 and/or as a component of the same. In this regard, for example, regarding drones or recharging vehicles of any type or kind can be used to recharge electric vehicle batteries while the vehicle is in motion, stopped, or stranded. In this regard, emergency roadside service battery recharging can also be effectuated by the electric road/vehicle charging system(s) 70 of the apparatus 100 of the present invention. As and for some example uses of a mobile an electric road/vehicle charging system(s) 70, a drone can be deployed to land on and recharge a vehicle being driven in rural areas via inductive recharging or plug-in recharging, a recharging truck can be used to drive along with and inductively recharge the batteries of a vehicle or vehicles driving adjacent the same, and/or a service vehicle can drive to and recharge the battery of a vehicle in need of a recharge.

With reference once again to FIG. 1, the apparatus 100 also includes a video camera monitoring system 80 or any number of video camera monitoring systems 80. In a preferred embodiment, the video camera monitoring system 80 includes any number of cameras, video cameras, or video recording cameras (hereinafter referred to as "camera" or "cameras"), which can be deployed and/or located on, along, adjacent to, or in the vicinity of, roads, roadways, streets, electric roads ("eroads"), road segments, eroad segments, eroad segments containing battery recharging equipment and/or fuel cell refueling equipment, highways, parkways, expressways, thoroughfares, intersections, parking lots, shopping centers, sports venues, strip malls, commercial buildings, electric vehicle or hybrid vehicle battery charging stations, buildings, residential buildings, stores, airports, train stations, bus stations, bridges, tunnels, toll plazas, parking lots, parking garages, commercial parking lots, driveways, and/or structures of any type or kind, or can be located on mobile recharging vehicles and/or drones, and/or can be located or situated at any other location of interest, and/or can be mounted or placed on or at any suitable structure, any and/or all of which can be of interest to owners or operators of electric vehicles or hybrid vehicles and/or any other users of the apparatus 100 of the present invention.

In a preferred embodiment, the video camera monitoring system 80 can also be linked to the central processing computer/distributed ledger/Blockchain technology system 10 via a wired link or connection, via a wireless link or connection, and/or via any combination of a wireless and/or a wired link or connection. In a preferred embodiment, the video camera monitoring system 80 can also be linked to any of the herein-described user communication devices 20, to any of the herein-described vehicle computers 30, to any of the herein-described vehicle battery/recharging systems 40, to any of the navigation information system computers 50, to any of the herein-described electric road/vehicle recharging system computers 60, and/or to any of the herein-described electric road/vehicle recharging system(s) 70, via a wireless link or connection, via a wired link or connection, and/or via any combination of a wireless and/or a wired link or connection. In a preferred embodiment, any number of video camera monitoring systems 80 can be utilized in connection with, or in conjunction with, the apparatus 100 of the present invention.

With reference once again to FIG. 1, in a preferred embodiment, the apparatus 100 can also include an RFID reader system 90 or any number of RFID reader systems 90, each of which can read any number of RFID tags 95 which can be utilized in connection with, or in conjunction with, the apparatus 100. In a preferred embodiment, the RFID reader system(s) 90 can be utilized in or for any number of a variety ways as described herein and/or otherwise. In a preferred embodiment, the RFID reader system(s) 90 can be connected to, and/or linked with, the central processing computer/distributed ledger/Blockchain technology system 10, using any suitable and/or appropriate wired connection, wireless connection, or any combination of same, on, via, or using, any suitable and/or appropriate communication network or any combination of communication networks. In a preferred embodiment, each RFID reader of the RFID reader system(s) 90 can be connected to, and/or linked with, the central processing computer/distributed ledger/Blockchain technology system 10, using any suitable and/or appropriate wired connection, wireless connection, or any combination of same, on, via, or using, any suitable and/or appropriate communication network or any combination of communication networks.

In a preferred embodiment, the RFID tags 95 can be passive RFID tags, active RFID tags, or can be RFID tags which have both passive and active features and/or functionality.

The RFID reader system(s) 90 can communicate with, and/or can operate in conjunction with, the central processing computer/distributed ledger/Blockchain technology system 10 and/or any of the other communication devices, computers, and/or computer systems, described herein as being associated with, or used by, any of the users, individuals, persons, or entities, who or which utilize the apparatus 100 and method of the present invention.

In a preferred embodiment, it is envisioned that each user, each electric vehicle owner, each hybrid vehicle owner, each vehicle, each user communication device 20, each vehicle computer 30, each vehicle batter/recharging system 40 and/or each component of the same, each battery of each vehicle, each navigation information system computer 50, each electric road/vehicle recharging system computer 60, each electric road ("eroad"), each electric road ("eroad") segment, each plug-in recharging system, equipment, or device, each inductive recharging system, equipment, or device, each electric road/vehicle recharging system 70 and/or each component of the same, each video camera of the video camera monitoring systems 80, each drone, or each mobile recharging vehicle, described herein as being utilized in connection with, or in conjunction with, the apparatus 100 of the present invention, can have an RFID tag 95 or multiple RFID tags 95 assigned thereto or associated therewith.

In a preferred embodiment, it is also envisioned that each user, each electric vehicle owner, each hybrid vehicle owner, each vehicle, each user communication device 20, each vehicle computer 30, each vehicle batter/recharging system 40 and/or each component of the same, each battery of each vehicle, each navigation information system computer 50, each electric road/vehicle recharging system computer 60, each electric road ("eroad"), each electric road ("eroad") segment, each plug-in recharging system, equipment, or device, each inductive recharging system, equipment, or device, each electric road/vehicle recharging system 70 and/or each component of the same, each video camera of the video camera monitoring systems 80, each drone, or each mobile recharging vehicle, described herein as being utilized in connection with, or in conjunction with, the apparatus 100 of the present invention, can have an RFID reader system 90 or multiple RFID reader systems 90 assigned thereto or associated therewith.

In a preferred embodiment, the RFID tags 95 can be utilized as a distinct identifier of and for each user, each electric vehicle owner, each hybrid vehicle owner, each vehicle, each user communication device 20, each vehicle computer 30, each vehicle batter/recharging system 40 and/or each component of the same, each battery of each vehicle, each navigation information system computer 50, each electric road/vehicle recharging system computer 60, each electric road ("eroad"), each electric road ("eroad") segment, each plug-in recharging system, equipment, or device, each inductive recharging system, equipment, or device, each electric road/vehicle recharging system 70 and/or each component of the same, each video camera of the video camera monitoring systems 80, each drone, or each mobile recharging vehicle, who or which utilizes the apparatus 100 of the present invention, or which is utilized in connection with, or in conjunction with, the apparatus 100 of the present invention.

In a preferred embodiment, the RFID reader system 90 can be linked or connected with the central processing computer/distributed ledger/Blockchain technology system 10, and/or with any of the user communication devices 20, the vehicle computers 30, the vehicle battery/recharging systems 40, the navigation information system computers 50, the electric road/vehicle recharging system computers 60, the electric road/vehicle recharging systems 70, the video camera monitoring systems 80, and/or any other RFID reader systems 90, described herein.

In the preferred embodiment, the central processing computer/distributed ledger/Blockchain technology system(s) 10, the user communication devices 20, the vehicle computers 30, the vehicle battery/recharging systems 40, the navigation information system computers 50, the electric road/vehicle recharging system computers 60, the electric road/vehicle recharging systems 70, the video camera monitoring systems 80, and/or the RFID reader systems 90, can be, or can include, any computer or communication device, including, but not limited to, a personal computer, a home computer, a server computer, a computer capable of being utilized in a network, a hand-held computer, a palmtop computer, a laptop computer, a personal communication device, a cellular telephone, a wireless telephone, wireless communication device, a mobile telephone, a digital television, an interactive television, a digital television, a personal digital assistant, a telephone, a digital telephone, a television, an interactive television, a beeper, a pager, and/or a watch or a Smart watch, and/or any wearable device, computer, or communication device.

Each of the central processing computer/distributed ledger/Blockchain technology system(s) 10, the user communication devices 20, the vehicle computers 30, the vehicle battery/recharging systems 40, the navigation information system computers 50, the electric road/vehicle recharging system computers 60, the electric road/vehicle recharging systems 70, the video camera monitoring systems 80, and/or the RFID reader systems 90, can transmit information to, as well as receive information from, any of the computers, communication devices, or systems 10, 20, 30, 40, 50, 60, 70, 80, and/or 90, described herein.

In this regard, each of the computers, communication devices, or systems 10, 20, 30, 40, 50, 60, 70, 80, and/or 90, described herein, can communicate with, process information transmitted from or received from, and/or share data and/or information with, each other and/or with any other computers, communication devices, or systems 10, 20, 30, 40, 50, 60, 70, 80, and/or 90, described herein and/or utilized in conjunction with the apparatus 100 of the present invention. In this manner, data and/or information transfer can occur with or between any of the computers, communication devices, or systems 10, 20, 30, 40, 50, 60, 70, 80, and/or 90 with or between any other computers, communication devices, or systems 10, 20, 30, 40, 50, 60, 70, 80, and/or 90. Further, any of the computers, communication devices, or systems 10, 20, 30, 40, 50, 60, 70, 80, and/or 90, described herein can communicate with any other computers, communication devices, or systems 10, 20, 30, 40, 50, 60, 70, 80, and/or 90, in a bi-directional manner. In this manner, any of the computer(s) or communication device(s) 10, 20, 30, 40, 50, 60, 70, 80, and/or 90, can communicate with any other computer(s) or communication device(s) 10, 20, 30, 40, 50, 60, 70, 80, and/or 90, in a bi-directional manner.

In the preferred embodiment, the present invention can be utilized on, and/or over, the Internet and/or the World Wide Web. The apparatus 100 of the present invention, in the preferred embodiment, can also utilize wireless Internet and/or World Wide Web services, equipment and/or devices. The central processing computer/distributed ledger/Blockchain technology system(s) 10, in the preferred embodiment, has a web site or web sites associated therewith. Each of the other computers, communication devices, or systems 20, 30, 40, 50, 60, 70, 80 and/or 90, described herein can also have a web site or web sites associated with same.

Although the Internet and/or the World Wide Web is a preferred communication system and/or medium utilized, the present invention, in any and/or all of the embodiments described herein, can also be utilized with any appropriate communication network or system including, but not limited to, a telecommunication network or system, a telephone communication network or system, a cellular communication network or system, a wireless communication network or system, a line or wired communication network or system, a wireless Internet network or system, a wireless World Wide Web network or system, a digital communication network or system, a personal communication network or system, a personal communication services (PCS) network or system, a satellite communication network or system, a broad band communication network or system, a low earth orbiting (LEO) satellite network or system, a public switched telephone network or system, a telephone communication network or system, a radio communication network or system, a cable television network or system, and/or any other communication network or system, and/or any combination of the above communication networks or systems.

Any of the central processing computer/distributed ledger/Blockchain technology system(s) 10, the user communication devices 20, the vehicle computers 30, the vehicle battery/recharging systems 40, the navigation information system computers 50, the electric road/vehicle recharging system computers 60, the electric road/vehicle recharging systems 70, the video camera monitoring systems 80, and/or the RFID reader systems 90, can communicate with one another, and/or can be linked to one another, on, over, or via, any suitable communication network, telecommunication network, telephone network, a line-connected network, and/or a wireless communication network, and/or the Internet and/or the World Wide Web. Each of the computers, communication devices, or systems 10, 20, 30, 40, 50, 60, 70, 80, and/or 90 can be linked with any other computer or computers, communication device(s), or system(s), directly or indirectly with one another so as to facilitate a direct or indirect bi-directional communication between said respective computers, communication devices, or systems. Communications between each of the computers, communication devices, or systems 10, 20, 30, 40, 50, 60, 70, 80, and/or 90 can also involve an e-mail server or e-mail servers in those instances when e-mails are described as being used to transmit, or to send, any of the information, signals, messages, reports, notification messages, or any other communications, described herein, by or between any of the computers, communication devices, systems 10, 20, 30, 40, 50, 60, 70, 80, and/or 90, or when any of the information, signals, messages, reports, notification messages, or any other communications, described herein, are transmitted by and/or between any of the various individuals or entities and/or by or between any of the computers, communication devices, or systems 10, 20, 30, 40, 50, 60, 70, 80, and/or 90, or any other computers or communication devices, computer systems, communication network equipment, server computers, etc., or any other devices used or needed, in order to facilitate communications or the transmission of any of the herein-described data, information, signals, messages, reports, notification messages, or any other communications.

In a preferred embodiment, each of the central processing computer/distributed ledger/Blockchain technology system(s) 10, the user communication devices 20, the vehicle computers 30, the vehicle battery/recharging systems 40, the navigation information system computers 50, the electric road/vehicle recharging system computers 60, the electric road/vehicle recharging systems 70, the video camera monitoring systems 80, and/or the RFID reader systems 90, can communicate in a bi-directional manner with, and/or can send and/or receive signals, messages, reports, notification messages, alerts, or any other communications or electronic communication transmissions, to, from, and/or between, any other, or any number of, or other, central processing computer/distributed ledger/Blockchain technology system(s) 10, the user communication devices 20, the vehicle computers 30, the vehicle battery/recharging systems 40, the navigation information system computers 50, the electric road/vehicle recharging system computers 60, the electric road/vehicle recharging systems 70, the video camera monitoring systems 80, and/or the RFID reader systems 90.

In a preferred embodiment, each of the central processing computer/distributed ledger/Blockchain technology system(s) 10, the user communication devices 20, the vehicle computers 30, the vehicle battery/recharging systems 40, the navigation information system computers 50, the electric road/vehicle recharging system computers 60, the electric road/vehicle recharging systems 70, the video camera monitoring systems 80, and/or the RFID reader systems 90, can be linked to or with any other central processing computer/distributed ledger/Blockchain technology system(s) 10, user communication device(s) 20, vehicle computer(s) 30, vehicle battery/recharging system(s) 40, navigation information system computer(s) 50, electric road/vehicle recharging system computer(s) 60, electric road/vehicle recharging system(s) 70, video camera monitoring system(s) 80, and/or RFID reader system(s) 90, via a wired link or line or a wireless link.

In a preferred embodiment, each of the user communication device(s) 20, the vehicle computer(s) 30, the vehicle battery/recharging system(s) 40, the navigation information system computer(s) 50, the electric road/vehicle recharging system computer(s) 60, the electric road/vehicle recharging system(s) 70, the video camera monitoring system(s) 80, and/or the RFID reader system(s) 90, can be connected with, or linked with, the central processing computer/distributed ledger/Blockchain technology system(s) 10, as shown in FIG. 1 or otherwise. In a preferred embodiment, each of the user communication device(s) 20, the vehicle computer(s) 30, the vehicle battery/recharging system(s) 40, the navigation information system computer(s) 50, the electric road/vehicle recharging system computer(s) 60, the electric road/vehicle recharging system(s) 70, the video camera monitoring system(s) 80, and/or the RFID reader system(s) 90, can be connected with, or linked with, the central processing computer/distributed ledger/Blockchain technology system(s) 10 via a wired line or wired link, via a wireless line, and/or via any combination of same.

In a preferred embodiment, any and/or all of the signals, messages, reports, notification messages, or any other communications, described herein as being transmitted from one device, computer, communication device, or system to another, can be, or can be included in, or can be attached to, an e-mail message, an instant messaging message, an electronic transmission, or an electronic data transmission or electronic data interchange, or can be transmitted via any other data or information transmission, and/or can be transmitted via or using any appropriate or necessary computer(s) or device(s).

In the preferred embodiment, each of the central processing computer/distributed ledger/Blockchain technology system(s) 10, the user communication devices 20, the vehicle computers 30, the vehicle battery/recharging systems 40, the navigation information system computers 50, the electric road/vehicle recharging system computers 60, the electric road/vehicle recharging systems 70, the video camera monitoring systems 80, and/or the RFID reader systems 90, can transmit data and/or information using TCP/IP, as well as any other Internet and/or World Wide Web, and/or communication, protocols.

The apparatus 100 of the present invention can utilize electronic commerce technologies and security methods, techniques and technologies, including any encryption or security technologies and/or techniques, in any and/or all of the instances of, or involving, data and/or information processing, and/or data and/or information transmission, described herein.

Figure 2:
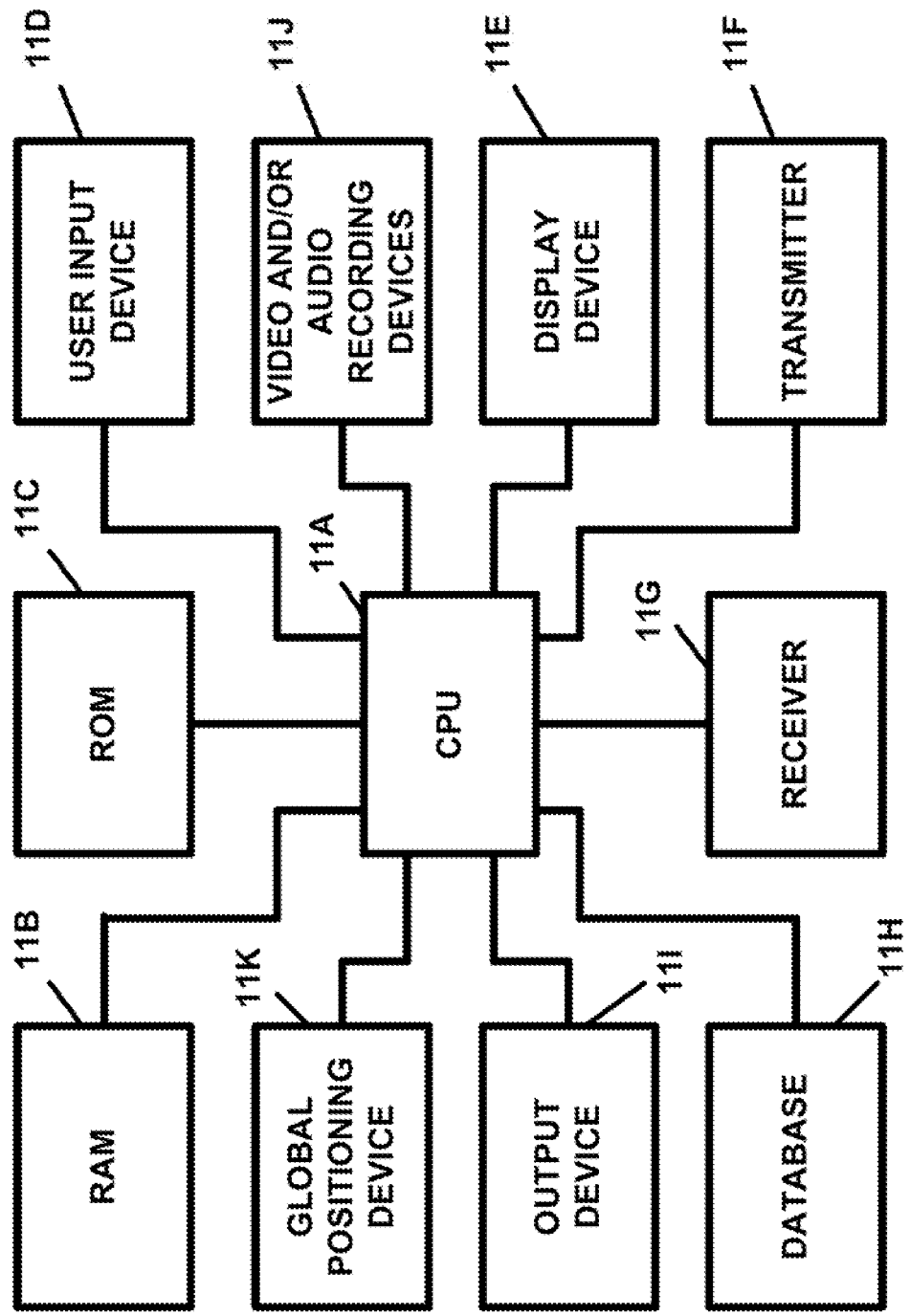
FIG. 2 illustrates the central processing computer component of the central processing computer and distributed ledger and Blockchain technology system of FIG. 1, in block diagram form.

FIG. 2 illustrates the central processing computer 11 component, of the central processing computer/distributed ledger/Blockchain technology system 10 of the apparatus 100, in block diagram form. The central processing computer 11, in the preferred embodiment, can be any computer or computer system, a server computer, a network computer, or any other communication device, which can provide the functionality of, and which can be utilized as a central processing computer 11, such as an Internet server computer and/or a web site server computer. In the preferred embodiment, the central processing computer 11 includes a central processing unit or CPU 11A, which, in the preferred embodiment, is a microprocessor. The CPU 11A can also be a microcomputer, a minicomputer, a macro-computer, and/or a mainframe computer, depending upon the application.

The central processing computer 11 also includes a random access memory device(s) 11B (RAM) and a read only memory device(s) 11C (ROM), each of which is connected to, or linked with, the CPU 11A, and a user input device 11D, for entering data and/or information and/or commands into the central processing computer 11, which can include any one or more of a keyboard, a scanner, a user pointing device, such as, for example, a mouse, a touch pad, and/or an audio input device and/or a video input device, a microphone or audio recording device, a camera or a video recording device, and/or any device, electronic and/or otherwise, which can be utilized for inputting and/or entering data and/or information and/or commands into the central processing computer 11. The user input device(s) 11D is/are also connected to, or linked with, the CPU 11A. The central processing computer 11 also includes a display device 11E for displaying data and/or information to a user or operator. The display device 11E is also connected to, or linked with, the CPU 11A.

The central processing computer 11 also includes a transmitter(s) 11F, for transmitting signals and/or data and/or information to any one or more of the user communication device(s) 20, the vehicle computers 30, the vehicle battery/recharging systems 40, the navigation information system computers 50, the electric road/vehicle recharging system computers 60, the electric road/vehicle recharging systems 70, the video camera monitoring systems 80, and/or the RFID reader systems 90, and/or to any other central processing computer(s) 11, and/or to any other individual computer(s) or individual communication device(s) which may be utilized in conjunction with the apparatus 100 of the present invention. The transmitter 11F is also connected to, or linked with, the CPU 11A.

The central processing computer 11 also includes a receiver 11G, for receiving signals and/or data and/or information from any one or more of the user communication device(s) 20, the vehicle computers 30, the vehicle battery/recharging systems 40, the navigation information system computers 50, the electric road/vehicle recharging system computers 60, the electric road/vehicle recharging systems 70, the video camera monitoring systems 80, and/or the RFID reader systems 90, and/or from any other central processing computer(s) 11, and/or from any other individual computer(s) or individual communication device(s) which may be utilized in conjunction with the apparatus 100 of the present invention. The receiver 11G is also connected to, or linked with, the CPU 11A.

The central processing computer 11 also includes a database(s) 11H which contains any and/or all of the data and/or information required, needed, or desired, for allowing and/or enabling the central processing computer 11 and/or the apparatus 100 to perform any and/or all of the functions and functionalities described herein as being performed, and/or as capable of being performed, by the central processing computer 11 and/or the apparatus 100 of the present invention. In this regard, and notwithstanding any specific examples of data and/or information described herein as being stored in the database 11H, it is to be understood that the database 11H contains or includes any and/or all data and/or information required, needed, or desired, for allowing and/or for enabling the central processing computer 11 and/or the apparatus 100 to perform any and/or all of the functions and functionalities described herein as being performed by the central processing computer 11 and/or the apparatus 100 of the present invention.

In a preferred embodiment, the database 11H can, for example, contain and/or include data and/or information pertaining to, and/or regarding, any and/or all of the users of, and/or any individuals or entities who or which use or provide services via, the apparatus 100 of the present invention. In this regard, for each user, individual, or entity, including, but not limited to, vehicle owners, vehicle operators, owners of fleets of vehicles, vehicle dealers, vehicle repair shops, battery manufacturers, fuel cell manufacturers, fuel cell fuel suppliers, battery recharger equipment or system owners, operators, or providers, navigation information system owners, operators, or providers, electric road/vehicle recharging system computer owners, operators, or providers, electric road/vehicle recharging system owners, operators, or providers, video camera monitoring system owners, operators, or providers, vide camera owners, operators, or providers, RFID reader systems, central processing computer/distributed ledger/Blockchain technology system 10 owners, operators, or providers, or any other user of the apparatus 100, the database 11H can store, contain, and/or include, data and/or information regarding the name, address, telephone number, facsimile number, email address, text messaging number or contact information, uniform resource locator (url), website, domain name, of the respective user, individual, or entity who or which utilizes the apparatus 100 or who or which provides goods, products, or services, to users of the apparatus 100.

The database 11H can also store, contain, and/or include, for each user, individual, or entity, including, but not limited to, vehicle owners, vehicle operators, owners of fleets of vehicles, vehicle dealers, vehicle repair shops, battery manufacturers, fuel cell manufacturers, fuel cell fuel suppliers, battery recharger equipment or system owners, operators, or providers, navigation information system owners, operators, or providers, electric road/vehicle recharging system computer owners, operators, or providers, electric road/vehicle recharging system owners, operators, or providers, video camera monitoring system owners, operators, or providers, vide camera owners, operators, or providers, RFID reader systems, central processing computer/distributed ledger/Blockchain technology system 10 owners, operators, or providers, or any other user of the apparatus 100, data and/or information regarding account information and/or an identification number assigned to each such user, data and/or information regarding any account, use account, battery recharge account, fuel cell refueling account, and/or any financial account, of, associated with, or assigned to the respective user, individual, or entity.

The database 11H can also store, contain, and/or include, for each user, individual, or entity, data and/or information regarding each vehicle owned or operated by the respective including user, individual, or entity, and can store, contain, or include, for each such vehicle, identification information, an identification number(s), and/or a serial number(s) for or regarding the same, data and/or information regarding the type or kind of battery or batteries, fuel cells, fuel cell fuels, used in, or associated with, the vehicle, and/or any identification information, identification number(s), and/or serial number(s), regarding the same, the recharging equipment or system used in the vehicle, the recharging system(s) or equipment which can be used to recharge the battery or batteries of the vehicle, data and/or information regarding the RFID tag(s) 95 which are assigned to, or associated with, the vehicle, and identification information, an identification number(s), and/or a serial number(s) for or regarding the same, and/or any data and/or information regarding any battery, batteries, fuel cell(s), battery recharging equipment or system(s), and/or any other component, equipment, system, or device, of the vehicle, and/or any identification information, an identification number(s), and/or a serial number(s) for or regarding the same. The database 11H can also store, contain, or include, any data and/or information regarding any and/or all of the RFID tag(s) 95 utilized in connection with the apparatus 100 of the present invention along with information regarding the respective user, individual, entity, vehicle, vehicle battery or recharging system component, fuel cell, or other vehicle system, equipment, or component, to which the RFID tag(s) 95 is/are assigned. The database 11H can also store, contain, or include, any data and/or information regarding any and/or all of the RFID reader system 90 utilized in connection with the apparatus 100 of the present invention along with information regarding the respective user, individual, entity, vehicle, vehicle battery or recharging system component, fuel cell, or other vehicle system, equipment, or component, to which the RFID tag(s) 95 is/are assigned.

The database 11H can also store, contain, or include, any data and/or information regarding any and/or all of the RFID tag(s) 95 utilized in connection with the apparatus 100 of the present invention along with information regarding the respective electric road ("eroad") or electric road segment, equipment or system, including, but not limited to, a plug-in recharger(s), inductive coil(s), capacitor(s), fuel cell fuel storage tank(s), fuel cell fuel dispenser(s), charging pad(s), electric rail(s), and/or any other eroad system, equipment, or component, used in connection with each road segment, to which the RFID tag(s) 95 is/are assigned.

The database 11H can also store, contain, or include, any data and/or information regarding any and/or all of the RFID reader system 90 utilized in connection with the apparatus 100 of the present invention along with information regarding the respective electric road ("eroad") or electric road segment, equipment or system, including, but not limited to, a plug-in recharger(s), inductive coil(s), capacitor(s), fuel cell fuel storage tank(s), fuel cell fuel dispenser(s), charging pad(s), electric rail(s), and/or any other eroad system, equipment, or component, used in connection with each road segment, to which the RFID reader system 90 is assigned.

The database 11H can also store, contain, or include, any data and/or information regarding each electric road ("eroad") or electric road segment, utilized in connection with the apparatus 100, including, but not limited, a name or identifying information, and/or descriptive information, for or regarding the same, any identification number(s) or serial number(s) regarding the same, information regarding the location of the same, information regarding the recharging or fuel cell refueling system(s) or equipment provided by the same, information regarding the respective plug-in recharger(s), inductive coil(s), capacitor(s), fuel cell fuel storage tank(s), fuel cell fuel dispenser(s), charging pad(s), electric rail(s), and/or any other eroad system, equipment, or component, used in connection with the same, and/or an identification number(s) or serial number(s) for, or assigned to, each eroad, eroad segment, and each plug-in recharger, inductive coil, capacitor, fuel cell fuel storage tank, fuel cell fuel dispenser, charging pad, electric rail, or any other equipment or system of the respective eroad or eroad segment.

The database 11H can also store, contain, or include, any data and/or information regarding each electric road ("eroad") or electric road segment, utilized in connection with the apparatus 100, including, but not limited, information regarding any drone(s), mobile recharging vehicle(s), or mobile fuel cell refueling vehicle(s), of or associated with an electric road/vehicle recharging system 70 associated with the eroad or eroad segment, and for each drone, mobile recharging vehicle, or mobile fuel cell refueling vehicle, the database 11H can store, contain, or include, data and/or information regarding a name or identifying information, and/or descriptive information, for or regarding the same, any identification number(s) or serial number(s) regarding the same, information regarding the location of the same or the traveling area of the same, information regarding the recharging or fuel cell refueling system(s) or equipment provided by the same, information regarding the respective plug-in recharger(s), inductive coil(s), capacitor(s), fuel cell fuel storage tank(s), fuel cell fuel dispenser(s), equipped on or at the same, and/or any other information regarding the drone, mobile recharging vehicle, or mobile fuel cell refueling vehicle. The database 11H can also store, contain, or include, data and/or information regarding any RFID tag(s) 95 and/or RFID reader system(s) 90 assigned to, attached to, or associated with, each drone, mobile recharging vehicle, or mobile fuel cell refueling vehicle, utilized in connection with the apparatus 100.

The database 11H can also store, contain, or include, any data and/or information regarding each video camera monitoring system 80 used in connection with the apparatus 100, including, but not limited to, the owner or the operator of the same, the location of the same, the area(s), geographic and/or other areas(s) covered by the same, and/or information regarding each camera or video recording device used in connection with the respective video camera monitoring system 80. The database 11H can also store, contain, and/or include, for each camera or video recording device utilized in each respective video camera monitoring system 80, information regarding the type and/or the model of the camera or video recording device, the geographical position or location of the same, the place of same, the address of the same, a road or building where the same is located, a sponsor for the same, and/or any other data and/or information regarding the same, any information regarding an RFID tag(s) 95 and/or and RFID reader system 90, assigned to, or associated with, the same, and/or any other data and/or information regarding the respective camera or video recording device.

In a preferred embodiment, the database 11H can also store, contain, or include, any other data and/or information needed, required, or desired, for allowing the apparatus 100 and/or any of the computers, communication devices, and/or systems, 10, 11, 20, 30, 40, 50, 60, 70, 80, and/or 90, to perform any and/or all of the functions and/or functionalities described herein as being performed by, with, or using, the apparatus 100 of the present invention.

In a preferred embodiment, the database 11H can also store, contain, and/or include, any and/or all data and/or information, messages, reports, alerts, alert messages, notification messages, appointment information, repair information, recharging information, refueling information, pictures, video recordings, and/or any other data and/or information described herein as be processed by, generated by, created by, stored by, received by, and/or transmitted from, the apparatus 100 and/or any of the computers, communication devices, and/or systems, 10, 11, 20, 30, 40, 50, 60, 70, 80, and/or 90, described herein.

In a preferred embodiment, the database 11H can also store, contain, or include, any data and/or information described herein as being contained and/or included in any of the herein-described or other databases of, or associated with, any of the communication device(s) 20, the vehicle computers 30, the vehicle battery/recharging systems 40, the navigation information system computers 50, the electric road/vehicle recharging system computers 60, the electric road/vehicle recharging systems 70, the video camera monitoring systems 80, and/or the RFID reader systems 90.

The central processing computer 11 also includes an output device 11I for outputting any of the data, information, or reports, described herein or otherwise. In the preferred embodiment, the output device 11I can be a printer, a display, a transmitter, a modem, a speaker, and/or any other device which can be used to output data.

The central processing computer 11 can also include a video and/or audio recording device(s) 11J which can include a camera and/or a video recording device, for recording pictures or video and/or video clips, and/or a microphone or an audio recording device, for recording audio or audio clips, which can be recorded by, and/or transmitted live, by or from the central processing computer 11, or which can be recorded by, and stored at or in, the central processing computer 11 for transmission by or from the central processing computer 11 at a later time. The video and/or audio recording device(s) 11J can also be utilized to facilitate one-way broadcasts from the central processing computer 11, and/or can be utilized to facilitate video conferencing, video chatting, and/or audio conferencing, and/or video and audio conferencing, between users of the central processing computer 11 and any of the herein-described users, individuals, persons, or entities, who or which utilize the apparatus 100 of the present invention.

The central processing computer 11 can also include a global positioning device 11K. In a preferred embodiment, the global positioning device 11K determines or can determine a position or location of the central processing computer 11.

In a preferred embodiment, the central processing computer 11 can also be equipped, and/or can be programmed, for voice activation operation and/or voice control operation of and/or regarding any and/or all of the herein-described operations and functions which are capable of being performed by the central processing computer 11.

Figure 3:
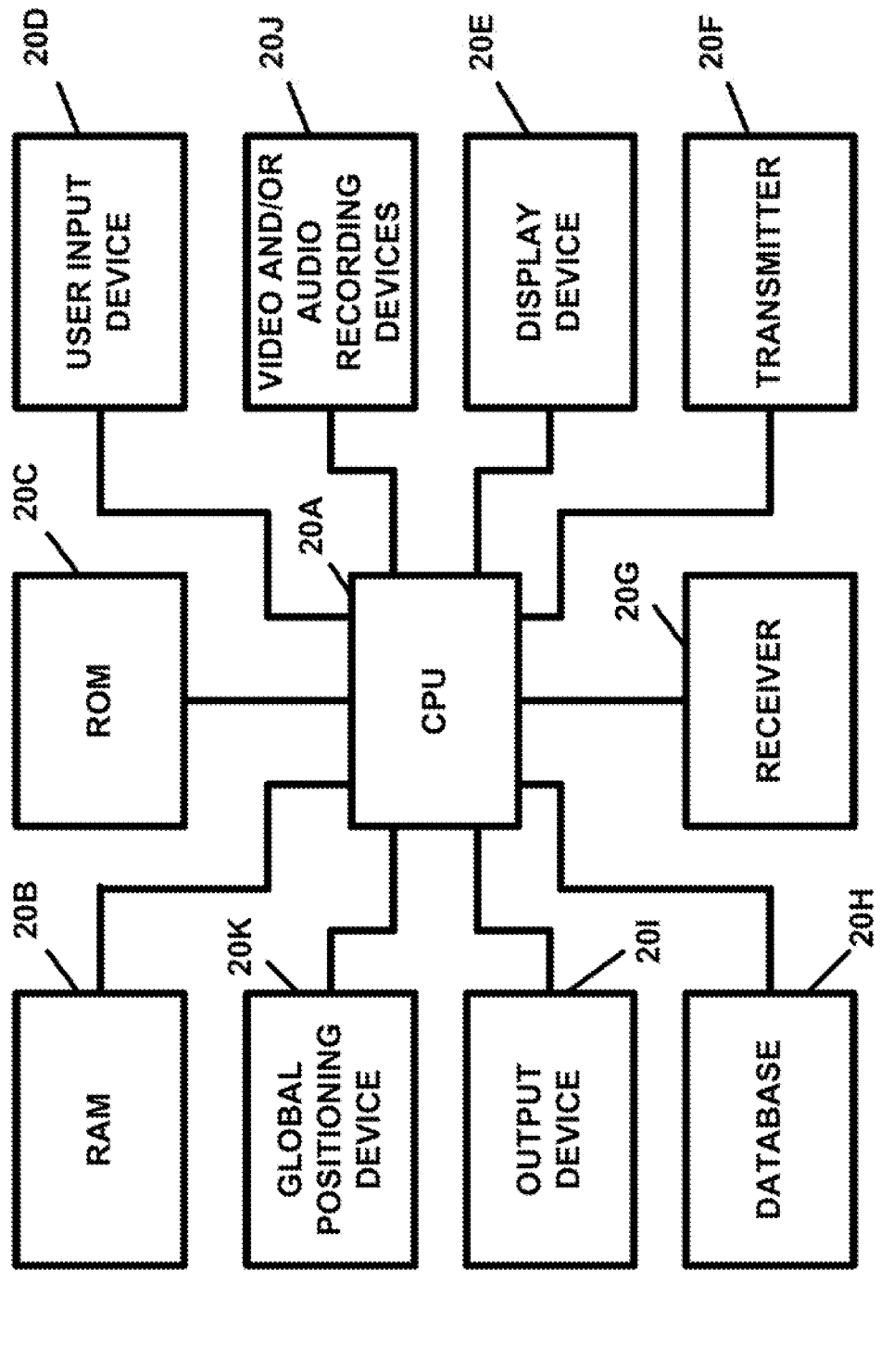
FIG. 3 illustrates the user communication device of FIG. 1, in block diagram form.

FIG. 3 illustrates the user communication device 20 of the apparatus 100, in block diagram form. In a preferred embodiment, the user communication device 20, or any number of user communication devices 20, can be used by any user, individual, or entity, who or which uses the apparatus 100 of the present invention. The user communication device 20, in the preferred embodiment, can be any communication device, computer, personal computer, laptop computer, notebook computer, Smart phone or smartphone, smart telephone, cellular telephone, personal digital assistant, wireless telephone, wireless communication device, tablet, tablet computer, watch, smart watch, or wearable device or computer, or any combination of same, or any equivalent of same, or any other computer or communication device, which can provide the functionality of, and which can be utilized as a user communication device 20. In the preferred embodiment, the user communication device 20 includes a central processing unit or CPU 20A, which, in the preferred embodiment, is a microprocessor. The CPU 20A can also be a microcomputer, a minicomputer, a macro-computer, and/or a mainframe computer, depending upon the application.

The user communication device 20 also includes a random access memory device(s) 20B (RAM) and a read only memory device(s) 20C (ROM), each of which is connected to, or linked with, the CPU 20A, and a user input device 20D, for entering data and/or information and/or commands into the user communication device 20, which can include any one or more of a keyboard, a scanner, a user pointing device, such as, for example, a mouse, a touch pad, and/or an audio input device and/or a video input device, a microphone or audio recording device, a camera or a video recording device, and/or any device, electronic and/or otherwise, which can be utilized for inputting and/or entering data and/or information and/or commands into the user communication device 20. The user input device(s) 20D is/are also connected to, or linked with, the CPU 20A. The user communication device 20 also includes a display device 20E for displaying data and/or information to a user or individual. The display device 20E is also connected to, or linked with, the CPU 20A.

The user communication device 20 also includes a transmitter(s) 20F, for transmitting signals and/or data and/or information to any one or more of the central processing computer(s) 11, the vehicle computers 30, the vehicle battery/recharging systems 40, the navigation information system computers 50, the electric road/vehicle recharging system computers 60, the electric road/vehicle recharging systems 70, the video camera monitoring systems 80, and/or the RFID reader systems 90, and/or to any other user communication device(s) 20, and/or to any other individual computer(s) or individual communication device(s) which may be utilized in conjunction with the apparatus 100 of the present invention. The transmitter 20F is also connected to, or linked with, the CPU 20A.

The user communication device 20 also includes a receiver 20G, for receiving signals and/or data and/or information from any one or more of the central processing computer(s) 11, the vehicle computers 30, the vehicle battery/recharging systems 40, the navigation information system computers 50, the electric road/vehicle recharging system computers 60, the electric road/vehicle recharging systems 70, the video camera monitoring systems 80, and/or the RFID reader systems 90, and/or from any other user communication device(s) 20, and/or to any other individual computer(s) or individual communication device(s) which may be utilized in conjunction with the apparatus 100 of the present invention. The receiver 20G is also connected to, or linked with, the CPU 20A.

The user communication device 20 also includes a database(s) 20H which stores, contains, or includes, any and/or all of the data and/or information required, needed, or desired, for allowing and/or enabling the user communication device 20 and/or the apparatus 100 to perform any and/or all of the functions and functionalities described herein as being performed, and/or as capable of being performed, by the user communication device 20 and/or the apparatus 100. In this regard, and notwithstanding any specific examples of data and/or information described herein as being stored in the database 20H, it is to be understood that the database 20H stores, contains, and/or includes, any and/or all data and/or information required, needed, or desired, for allowing and/or enabling the user communication device 20 and/or the apparatus 100 to perform any and/or all of the functions and functionalities described herein as being performed by the user communication device 20 and/or the apparatus 100 of the present invention.

In a preferred embodiment, the database 20H can store, contain, and/or include, any data and/or information regarding the user or individual, including, but not limited to, the name, sex, age, birth date, address, telephone number, cellular telephone number, text messaging number, video-conferencing or video chat identification (ID) name or number, email address, website address or uniform resource locator (url), insurance information, and/or any other contact information, agent or representative contact information, of the user or individual. In a preferred embodiment, the database 20H can also store, contain, and/or include, information regarding any electric vehicle and/or hybrid vehicle owned or operated by the individual. The database 20H can also store, contain, and/or include, any data and/or information regarding any account information and/or an identification number assigned to the user, data and/or information regarding any account, use account, battery recharge account, fuel cell refueling account, and/or any financial account, of, associated with, or assigned to the user.

In a preferred embodiment, the database 20H can also store, contain, or include, any other data and/or information needed, required, or desired, for allowing the user communication device 20, the apparatus 100, and/or any of the computers, communication devices, and/or systems, 10, 11, 30, 40, 50, 60, 70, 80, and/or 90, to perform any and/or all of the functions and/or functionalities described herein as being performed by, with, or using, the user communication device 20 and/or the apparatus 100 of the present invention.

The user communication device 20 also includes an output device 20I for outputting any of the data, information, or reports, described herein or otherwise. In the preferred embodiment, the output device 20I can be a printer, a display, a transmitter, a modem, a speaker, and/or any other device which can be used to output data.

The user communication device 20 can also include a video and/or audio recording device(s) 20J which can include a camera and/or a video recording device, for recording pictures or video and/or video clips, and/or a microphone or an audio recording device, for recording audio or audio clips, which can be recorded by, and/or transmitted live, by or from the user communication device 20, or which can be recorded by, and stored at or in, the user communication device 20 for transmission by or from the user communication device 20 at a later time. The video and/or audio recording device(s) 20J can also be utilized to facilitate one-way broadcasts from the user communication device 20, and/or can be utilized to facilitate video conferencing, video chatting, and/or audio conferencing, and/or video and audio conferencing, between a user of the user communication device 20 and any of the herein-described users, individuals, persons, or entities, who or which utilize the apparatus 100 of the present invention.

The user communication device 20 can also include a global positioning device 20K. In a preferred embodiment, the global positioning device 20K determines or can determine a position or location of the user communication device 20.

In a preferred embodiment, the user communication device 20 can also be equipped, and/or can be programmed, for voice activation operation and/or voice control operation of and/or regarding any and/or all of the herein-described operations and functions which are capable of being performed by the user communication device 20.

Figure 4:
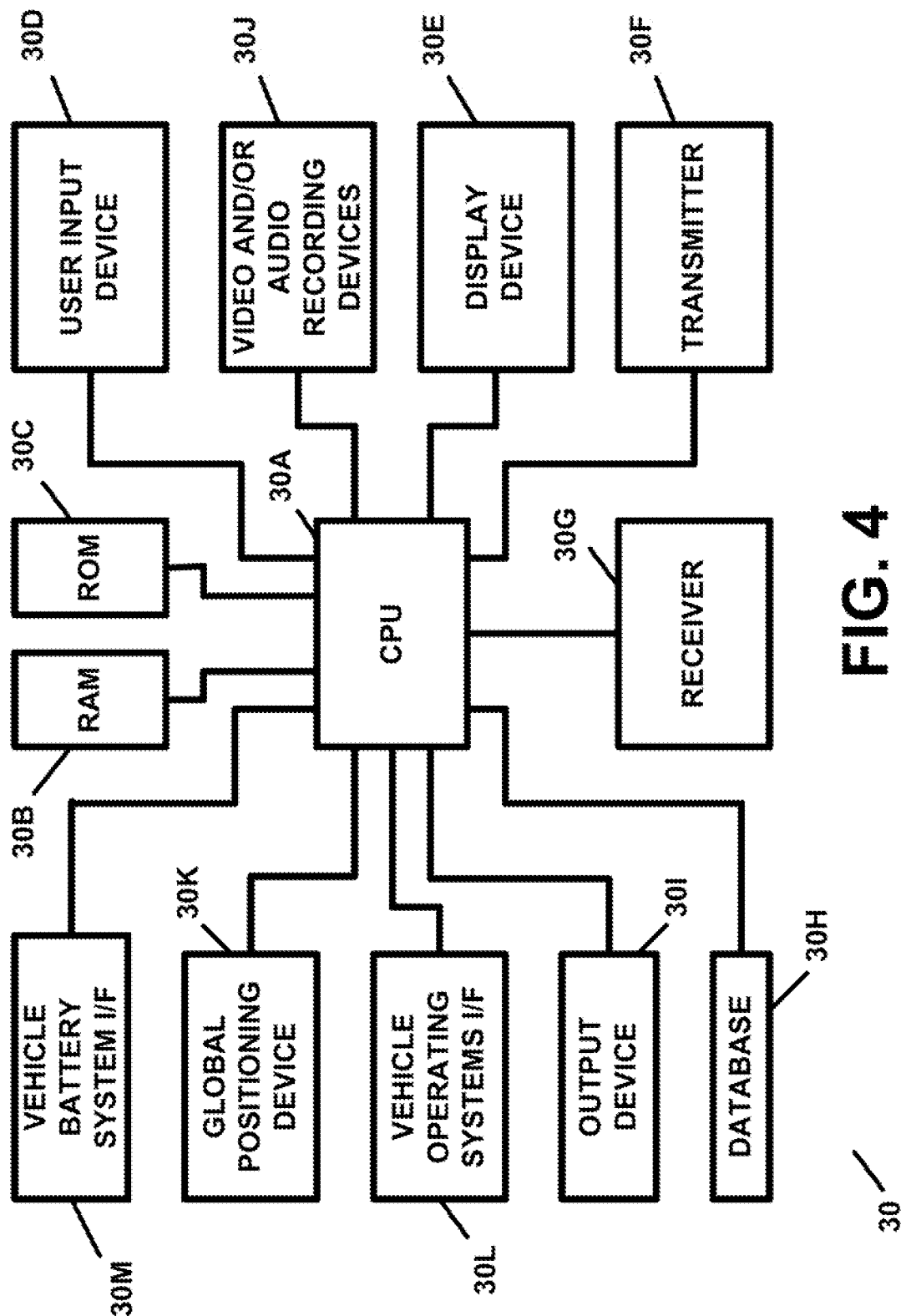
FIG. 4 illustrates the vehicle computer of FIG. 1, in block diagram form.

FIG. 4 illustrates the vehicle computer 30 of FIG. 1, in block diagram form. In a preferred embodiment, the vehicle computer 30, or any number of vehicle computers 30, can be used in or with, can located on, at, or in, and/or can be associated with, any electric vehicle or hybrid vehicle which is utilized in connection with the apparatus 100 of the present invention. The vehicle computer 30, in the preferred embodiment, can be any communication device, computer, micro-computer, microprocessor, personal computer, laptop computer, notebook computer, Smart phone or smartphone, smart telephone, cellular telephone, personal digital assistant, wireless telephone, wireless communication device, tablet, tablet computer, watch, smart watch, or wearable device or computer, or any combination of same, or any equivalent of same, or any other computer or communication device, which can provide the functionality of, and which can be utilized as a vehicle computer 30. In the preferred embodiment, the vehicle computer 30 includes a central processing unit or CPU 30A, which, in the preferred embodiment, is a microprocessor. The CPU 30A can also be a microcomputer, a minicomputer, a macro-computer, and/or a mainframe computer, depending upon the application.

The vehicle computer 30 also includes a random access memory device(s) 30B (RAM) and a read only memory device(s) 30C (ROM), each of which is connected to, or linked with, the CPU 30A, and a user input device 30D, for entering data and/or information and/or commands into the vehicle computer 30, which can include any one or more of a keyboard, a scanner, a user pointing device, such as, for example, a mouse, a touch pad, and/or an audio input device and/or a video input device, a microphone or audio recording device, a camera or a video recording device, and/or any device, electronic and/or otherwise, which can be utilized for inputting and/or entering data and/or information and/or commands into the vehicle computer 30. The user input device(s) 30D is/are also connected to, or linked with, the CPU 30A. The vehicle computer 30 also includes a display device 30E for displaying data and/or information to a user or individual. The display device 30E is also connected to, or linked with, the CPU 30A.

The vehicle computer 30 also includes a transmitter(s) 30F, for transmitting signals and/or data and/or information to any one or more of the central processing computer(s) 11, the user communication devices 20, the vehicle battery/recharging systems 40, the navigation information system computers 50, the electric road/vehicle recharging system computers 60, the electric road/vehicle recharging systems 70, the video camera monitoring systems 80, and/or the RFID reader systems 90, and/or to any other vehicle computer(s) 30, and/or to any other individual computer(s) or individual communication device(s) which may be utilized in conjunction with the apparatus 100 of the present invention. The transmitter 30F is also connected to, or linked with, the CPU 30A.

The vehicle computer 30 also includes a receiver 30G, for receiving signals and/or data and/or information from any one or more of the central processing computer(s) 11, the user communication devices 20, the vehicle battery/recharging systems 40, the navigation information system computers 50, the electric road/vehicle recharging system computers 60, the electric road/vehicle recharging systems 70, the video camera monitoring systems 80, and/or the RFID reader systems 90, and/or from any other vehicle computer(s) 30, and/or to any other individual computer(s) or individual communication device(s) which may be utilized in conjunction with the apparatus 100 of the present invention. The receiver 30G is also connected to, or linked with, the CPU 30A.

The vehicle computer 30 also includes a database(s) 30H which stores, contains, or includes, any and/or all of the data and/or information required, needed, or desired, for allowing and/or enabling the vehicle computer 30 and/or the apparatus 100 to perform any and/or all of the functions and functionalities described herein as being performed, and/or as capable of being performed, by the vehicle computer 30 and/or the apparatus 100. In this regard, and notwithstanding any specific examples of data and/or information described herein as being stored in the database 30H, it is to be understood that the database 30H stores, contains, and/or includes, any and/or all data and/or information required, needed, or desired, for allowing and/or enabling the vehicle computer 30 and/or the apparatus 100 to perform any and/or all of the functions and functionalities described herein as being performed by the vehicle computer 30 and/or the apparatus 100 of the present invention.

In a preferred embodiment, the database 30H can store, contain, and/or include any and/or all data and/or information regarding the vehicle, any data and/or information regarding any owner(s) or operator(s) of the vehicle, any data and/or information regarding any and/or all of the systems, devices, equipment, or components, of the vehicle, any software and/or hardware in or associated with the vehicle, any software programs, software applications, or software "apps", or any algorithms or processing routines, needed by, or used by, the vehicle computer 30 to control and/or to monitor any operation of the vehicle and/or any operation of any system, equipment, component, or device, of the vehicle. In a preferred embodiment, since the vehicle computer 30 can be utilized in self-driving cars or vehicles, self-operating cars or vehicles, and/or autonomous cars or vehicles. the database 30H also stores, contains, or includes, for such vehicles, any software programs, software applications, or software "apps", or any algorithms or processing routines, needed by, or used by, the vehicle computer 30 to operate, to control, and/or to monitor, the vehicle and/or to operate, control, and/or monitor, any and/or all systems, equipment, components, or devices, of the vehicle.

In a preferred embodiment, the database 30H also stores, contains, or includes, any software programs, software applications, or software "apps", or any algorithms or processing routines, needed by, or used by, the vehicle computer 30 to monitor, to control, and/or to operate, the battery or batteries of the vehicle, monitor charge levels, control and/or monitor recharging systems, equipment, components, or devices, and/or perform any other operations, functions, and/or functionalities, described herein as capable of be performed by the vehicle computer 30 and/or the apparatus 100.

In a preferred embodiment, the database 30H can store, contain, and/or include, any data and/or information regarding any user, owner, or operator, of the vehicle, including, but not limited to, the name, sex, age, birth date, address, telephone number, cellular telephone number, text messaging number, videoconferencing or video chat identification (ID) name or number, email address, website address or uniform resource locator (url), insurance information, and/or any other contact information, agent or representative contact information, of the user, owner, or operator. The database 30H can also store, contain, and/or include, any data and/or information regarding any account information and/or an identification number assigned to the vehicle or to the user, owner, or operator, of the same, any data and/or information regarding any account, use account, battery recharge account, fuel cell refueling account, and/or any financial account, of, associated with, or assigned to the vehicle and/or to the user, owner, or operator, of the vehicle.

In a preferred embodiment, the database 30H can also store, contain, or include, any other data and/or information needed, required, or desired, for allowing the vehicle computer 30, the apparatus 100, and/or any of the computers, communication devices, and/or systems, 10, 11, 20, 40, 50, 60, 70, 80, and/or 90, to perform any and/or all of the functions and/or functionalities described herein as being performed by, with, or using, the vehicle computer 30 and/or the apparatus 100 of the present invention.

The vehicle computer 30 also includes an output device 30I for outputting any of the data, information, or reports, described herein or otherwise. In the preferred embodiment, the output device 30I can be a printer, a display, a transmitter, a modem, a speaker, and/or any other device which can be used to output data.

The vehicle computer 30 can also include a video and/or audio recording device(s) 30J which can include a camera and/or a video recording device, for recording pictures or video and/or video clips, and/or a microphone or an audio recording device, for recording audio or audio clips, which can be recorded by, and/or transmitted live, by or from the vehicle computer 30, or which can be recorded by, and stored at or in, the vehicle computer 30 for transmission by or from the vehicle computer 30 at a later time. The video and/or audio recording device(s) 30J can also be utilized to facilitate one-way broadcasts from the vehicle computer 30, and/or can be utilized to facilitate video conferencing, video chatting, and/or audio conferencing, and/or video and audio conferencing, between a user of the vehicle computer 30 and any of the herein-described users, individuals, persons, or entities, who or which utilize the apparatus 100 of the present invention.

The vehicle computer 30 can also include a global positioning device 30K. In a preferred embodiment, the global positioning device 30K determines or can determine a position or location of the vehicle computer 30 and/or the vehicle.

With reference once again to FIG. 4, the vehicle computer 30 can also include a vehicle operating systems control and monitoring interface (I/F) 30L which can be used to control, monitor, and/or operate, any of the respective electric vehicle's or hybrid vehicle's various electric motor(s), internal combustion engine control systems, propulsion system(s), transmission(s), differential(s), brake system(s), heating system(s), cooling system(s), air-conditioning system(s), lighting system(s), entertainment system(s), navigation system(s), steering system(s), flight control system(s), autopilot system(s), collision avoidance system(s), electric axle system(s), electrical system(s), ignition system(s), fuel system(s), fuel cell system(s), fuel cell fuel system(s), battery power management system(s), battery recharging system(s), contact recharging system(s) such as those used to deploy a conductor to make contact with an electric rail and/or to interface with a charging conductor or an electric road or a segment of an electric road, a plug-in recharger system(s), an inductive coil recharging systems(s) for use in inductive charging applications in connection with electric road charging via inductive charging, fuel cell refueling system(s), and/or any other systems, equipment, components, or devices, which can be found in electric vehicles and/or hybrid vehicles and/or which can be operated, controlled, or monitored, by a computer or communication device.

In a preferred embodiment, the any number of vehicle operating system control and monitoring interfaces (I/F) 30L can be utilized in a vehicle and/or in connection with the vehicle computer 30. In a preferred embodiment, each vehicle operating systems control and monitoring interface (I/F) 30L can be connected to, or linked with, the CPU 30A via any suitable wired connection or link, via any suitable wireless connection or link, or via any combination of the same.

With reference once again to FIG. 4, the vehicle computer 30 also includes a vehicle battery/recharging system interface 30M (hereinafter referred to as "vehicle battery system I/F 30M"). In a preferred embodiment, the vehicle battery system I/F 30M can be used to control and/or to monitor the charge level or charge state of the vehicle's battery or batteries, and/or to control and/or to monitor, and/or to operate, the battery recharging system or equipment, to control and/or to monitor the operation or any battery recharging system or equipment, and/or to control and/or to monitor the operation of any fuel cell or fuels cells in the vehicle and/or any fuel cell fuel supply, storage, pumping, or dispensing, system or equipment. In this regard, the vehicle computer 30 can be utilized to perform battery management operations and/or functionalities regarding controlling and/or monitoring the operation, and/or the charge level or charge state, of the vehicle's battery or batteries, as well as controlling and/or monitoring the operation of the vehicle's fuel cell or fuel cells, and/or controlling and/or monitoring the vehicle's battery recharging system(s) or equipment, and/or controlling and/or monitoring the supply of fuel to and/or for the vehicle's fuel cell or fuel cells.

In a preferred embodiment, the vehicle battery system I/F 30M can be connected to, or linked with, the CPU 30A via any suitable wired connection or link, via any suitable wireless connection or link, or via any combination of the same.

In a preferred embodiment, the vehicle computer 30 can also be equipped, and/or can be programmed, for voice activation operation and/or voice control operation of and/or regarding any and/or all of the herein-described operations and functions which are capable of being performed by the vehicle computer 30.

Figure 5:
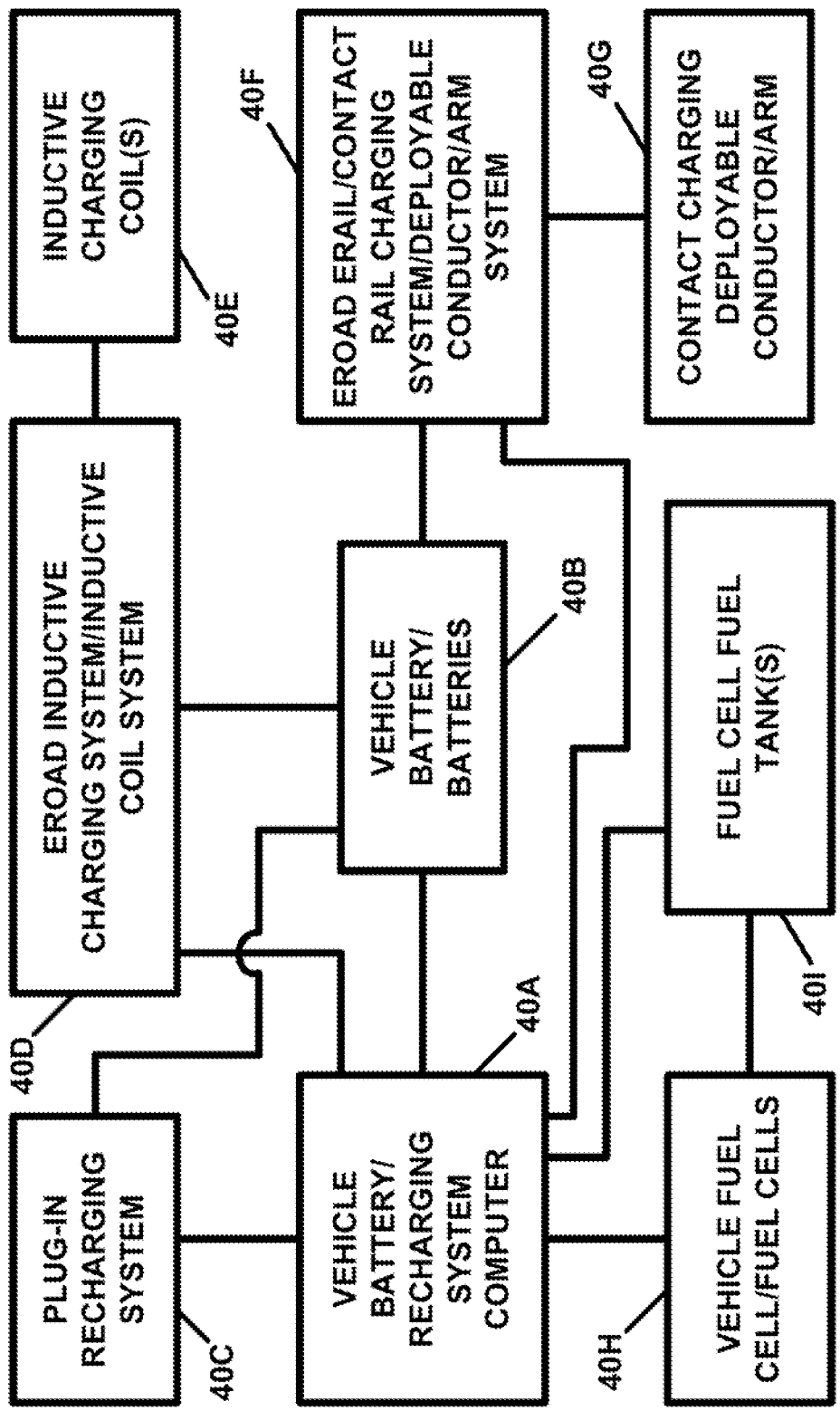
FIG. 5 illustrates the vehicle battery/recharging system of FIG. 1, in block diagram form.

FIG. 5 illustrates the vehicle battery/recharging system 40 of FIG. 1, in block diagram form. In a preferred embodiment, the vehicle battery/recharging system 40 can be located in, on, or at, the vehicle. In another preferred embodiment, the battery/recharging system 40 can be located remote from, and/or separate and apart from, the vehicle and/or can be linked to, or connected to, the vehicle, the vehicle computer 30, and/or the central processing computer/distributed ledger/Blockchain technology system 10, via a wired connection and/or via a wireless connection, and/or via any combination of a wired and/or a wireless connection.

With reference to FIG. 5, the vehicle battery/recharging system 40 includes a vehicle battery/recharging system computer 40A which performs any and/or all control and/or monitoring operations and/or functions regarding the vehicle battery/recharging system 40 and its component systems, equipment, components, and/or devices. With reference once again to FIG. 5, the vehicle battery/recharging system 40, in a preferred embodiment, also includes the vehicle battery or batteries 40B of the respective electric vehicle or hybrid vehicle. In another preferred embodiment, the vehicle battery or batteries 40B can be separate and apart from the vehicle battery/recharging system 40, and can be connected directly to or with the same and/or can be connected to or with the same directly or indirectly via a battery interface (I/F) (not shown).

In a preferred embodiment, the vehicle battery/recharging system computer 40A is connected to, or linked with, the vehicle battery or batteries 40B so as to control the same, to monitor the operation of the same, to monitor the charge level of the same, and/or to monitor a recharging of the same. In a preferred embodiment, the vehicle battery/recharging system 40 also includes a plug-in recharging system 40C which facilitates the recharging of the vehicle battery or batteries 40B via a plug-in or direct wired connection, such as by plugging or connecting a wire, line, and/or a plug or other connector, into a recharging line or supply such as, for example, a 120 Volt, a 240 Volt, or any other voltage, or any other alternating current (AC) power supply or recharging system, and/or any suitable direct current (DC) power supply or recharging system, and/or in any other manner for recharging a battery or batteries of an electric vehicle or a hybrid vehicle which is known by those skilled in the art. As shown in FIG. 5, the plug-in recharging system 40C is, in a preferred embodiment, is connected to the vehicle battery or batteries 40B and is connected to, and/or is, and/or can be, controlled and/or monitored by, the vehicle battery/recharging system computer 40A.

With reference once again to FIG. 5, the vehicle battery/recharging system 40 also includes an electric road ("eroad") inductive recharging system and inductive coil system 40D (hereinafter referred to as "eroad inductive recharging system/inductive coil system 40D") which is or can be used for charging or recharging the vehicle battery or batteries 40B via inductive charging or recharging equipment and/or techniques of any suitable kind or type. In a preferred embodiment, inductive charging or recharging of the vehicle batteries 40B can be performed while the electric vehicle or hybrid vehicle is moving along an electric road ("eroad") or a segment of an eroad, while the vehicle is parked on a charging pad or at an inductive charging location, or stall, in a parking lot, garage, or driveway, and/or at or in any other place or location which provides inductive charging.

In a preferred embodiment, the eroad inductive recharging system/inductive coil system 40D includes any and/or all needed or required equipment, systems, components, or devices, and/or an inductive coil systems and/or any number of inductive coils or coil systems, in order to provide inductive recharging of and for the vehicle battery or batteries 40B. With reference to FIG. 5, the vehicle battery/recharging system 40 also includes the inductive charging coils 40E which is/are connected to or with, and/or which is/are also a component(s) of, the ("eroad") inductive recharging system/inductive coil system 40D. In a preferred embodiment, any suitable electrical coil or coils can be utilized in or as the inductive charging coils 40E. In a preferred embodiment, as shown in FIG. 5, the eroad inductive recharging system/inductive coil system 40D is connected to the vehicle battery or batteries 40B and is connected to, and/or is, and/or can be, controlled and/or monitored by, the vehicle battery/recharging system computer 40A.

With reference once again to FIG. 5, the vehicle battery/recharging system 40 also includes an electric road ("eroad") electric rail ("erail") contact rail recharging system and a deployable conductor or arm system 40F (hereinafter referred to as "eroad erail/contact rail recharging system/deployable conductor/arm system 40F") which is or can be used for charging or recharging the vehicle battery or batteries 40B via a direct contact of a conductor of the electric vehicle or hybrid vehicle with a conductive rail or other conductor or conductive device of the electric road or electric road segment. In a preferred embodiment, the conductor of the electric vehicle or hybrid vehicle can be any fixed, extendable, deployable, and/or retractable, conductor, arm, line, wire, or conducting item which can be brought into direct contact with a conductive rail or other conductor or conductive device of the electric road or electric road segment while the electric vehicle or hybrid vehicle travels on or along the respective eroad or segment thereof.

In a preferred embodiment, the eroad erail/contact rail recharging system/deployable conductor/arm system 40F includes any and/or all needed or required equipment, systems, components, or devices, and/or a fixed, extendable, deployable, and/or retractable, conductor, arm, line, wire, or conducting item which can be brought into direct contact with a conductive rail or other conductor or conductive device of the electric road or electric road segment, in order to provide direct contact recharging of and for the vehicle battery or batteries 40B. With reference to FIG. 5, the vehicle battery/recharging system 40 also includes the contact charging deployable conductor or arm 40G (hereinafter referred to a "contact charging deployable conductor/arm 40G") which is connected to or with, and/or which is also a component of, the eroad erail/contact rail recharging system/deployable conductor/arm system 40F. In a preferred embodiment, any suitable deployable conductor or arm can be used as the contact charging deployable conductor/arm 40G. In a preferred embodiment, as shown in FIG. 5, the eroad erail/contact rail recharging system/deployable conductor/arm system 40F is connected to the vehicle battery or batteries 40B and is connected to, and/or is, and/or can be, controlled and/or monitored by, the vehicle battery/recharging system computer 40A.

With reference once again to FIG. 5, the vehicle battery/recharging system 40 also includes a vehicle fuel cell or a plurality of vehicle fuel cells 40H (hereinafter referred to as "vehicle fuel cell/fuel cells 40H"). In a preferred embodiment, the vehicle fuel cell/fuel cells 40H can provide electrical power to or for the operation of the electric vehicle or hybrid vehicle, and/or to of for any and/or all systems, devices, components, driving systems, propulsion systems, braking systems, steering systems, cooling systems, communications systems, battery recharging systems, navigation systems, radar systems, sonar systems, anti-collision systems, collision avoidance systems, pedestrian avoidance systems, emergency braking systems, cruise control systems, air conditioning systems, heating systems, electric motors, electric driving motors, battery systems, power systems, fuels cells, fuel cell systems, fuel storage systems, energy storage systems, internal combustion engine control and/or monitoring systems, fuel tank systems, fuel cell fuel storage or tank systems, transmission systems, eaxles, eaxle systems, axle systems, differential systems, battery power management systems, auto-pilot systems, self-driving systems and/or equipment, and/or any other systems, equipment, components, and/or devices, in, of, or associated with, the respective vehicle.

In a preferred embodiment, the vehicle fuel cell/fuel cells 40H can be any suitable fuel cell or fuel cells, can be any suitable type or kind of fuel cell, and/or can be a hydrogen fuel cell or hydrogen fuel cells. In a preferred embodiment, the vehicle fuel cell/fuel cells 40H can be, or can include, a hydrogen fuel cell(s), a zinc fuel cell(s), an alkaline fuel cell(s), a phosphoric acid fuel cell(s), a proton exchange membrane fuel cell(s), a methanol fuel cell(s), a direct methanol fuel cell(s), a natural gas fuel cell(s), a molten carbonate fuel cell(s), a solid oxide fuel cell(s), and/or any other type or kind of fuel cell(s) which are available and/or which are known to those skilled in the pertinent art, and/or any combination thereof and/or of the same. As shown in FIG. 5, the vehicle fuel cell/fuel cells 40H is connected to, and/or is, and/or can be, controlled and/or monitored by, the vehicle battery/recharging system computer 40A.

With reference once again to FIG. 5, the vehicle battery/recharging system 40 also includes one or more fuel cell fuel tank(s) 40I, each of which can contain the respective fuel for and used by each fuel cell of the vehicle fuel cell/fuel cells 40H. In a preferred embodiment, the fuel cell fuel tank(s) 40I is/are connected to or with, and/or is, and/or can be, controlled and/or monitored by, the vehicle battery/recharging system computer 40A. In a preferred embodiment, the fuel cell fuel tank(s) 40I is/are connected to or with the vehicle fuel cell/fuel cells 40H in order to effectuate and/or to facilitate the supply of the respective fuel to each respective fuel cell of the vehicle fuel cell/fuel cells 40H.

Figure 6:
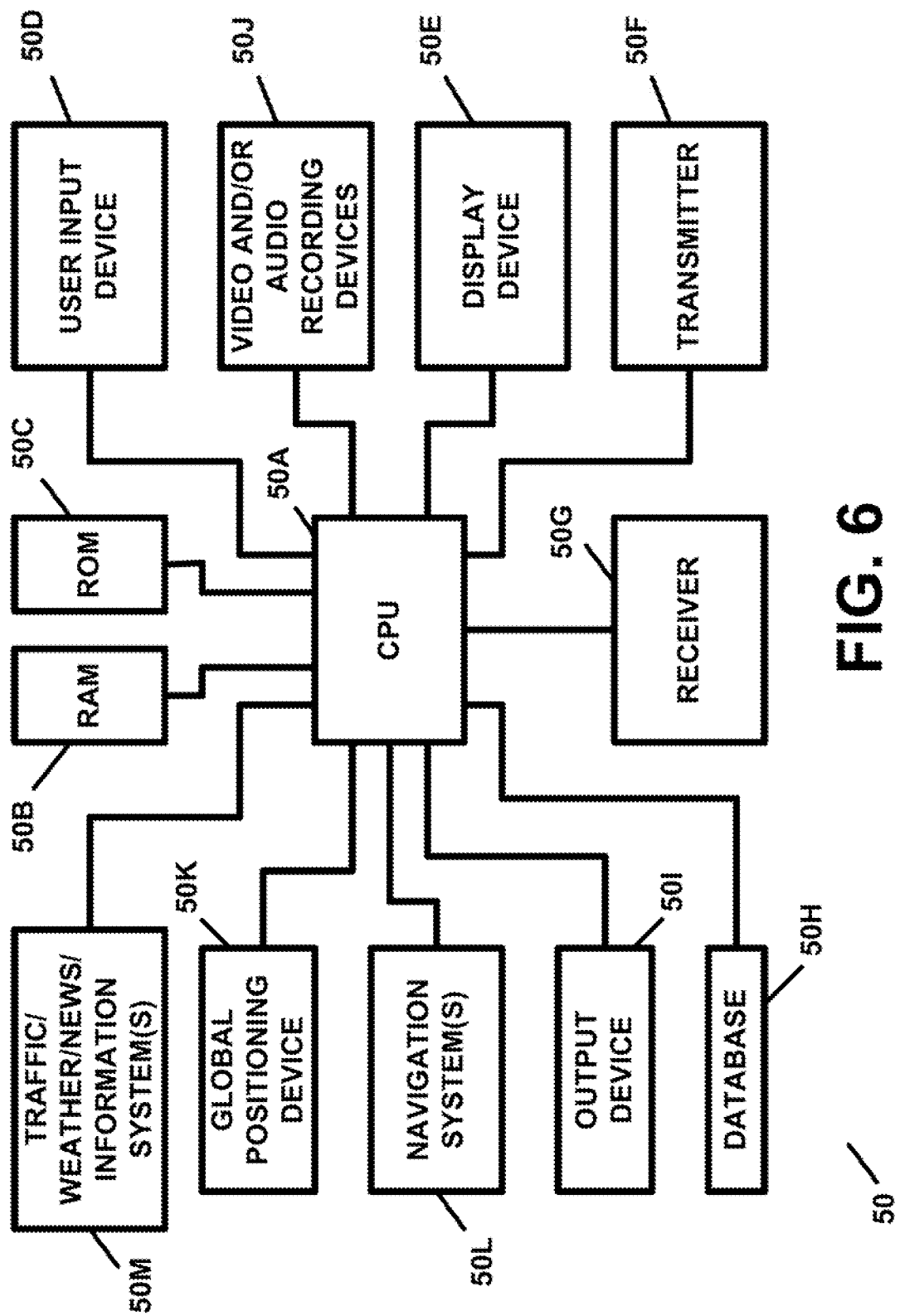
FIG. 6 illustrates the navigation information system of FIG. 1, in block diagram form.

FIG. 6 illustrates the navigation information system computer 50 of FIG. 1, in block diagram form. In a preferred embodiment, the navigation information system computer 50, or any number of navigation information system computers 50, can be used in connection with, or in conjunction with, the apparatus 100 of the present invention. The navigation information system computer 50, in the preferred embodiment, can be any server computer, Internet server computer, communication device, computer, micro-computer, microprocessor, personal computer, laptop computer, notebook computer, Smart phone or smartphone, smart telephone, cellular telephone, personal digital assistant, wireless telephone, wireless communication device, tablet, tablet computer, watch, smart watch, or wearable device or computer, or any combination of same, or any equivalent of same, or any other computer or communication device, which can provide the functionality of, and which can be utilized as a navigation information system computer 50. In the preferred embodiment, the navigation information system computer 50 includes a central processing unit or CPU 50A, which, in the preferred embodiment, is a microprocessor. The CPU 50A can also be a microcomputer, a mini-computer, a macro-computer, and/or a mainframe computer, depending upon the application.

The navigation information system computer 50 also includes a random access memory device(s) 50B (RAM) and a read only memory device(s) 50C (ROM), each of which is connected to, or linked with, the CPU 50A, and a user input device 50D, for entering data and/or information and/or commands into the navigation information system computer 50, which can include any one or more of a keyboard, a scanner, a user pointing device, such as, for example, a mouse, a touch pad, and/or an audio input device and/or a video input device, a microphone or audio recording device, a camera or a video recording device, and/or any device, electronic and/or otherwise, which can be utilized for inputting and/or entering data and/or information and/or commands into the navigation information system computer 50. The user input device(s) 50D is/are also connected to, or linked with, the CPU 50A. The navigation information system computer 50 also includes a display device 50E for displaying data and/or information to a user or individual. The display device 50E is also connected to, or linked with, the CPU 50A.

The navigation information system computer 50 also includes a transmitter(s) 50F, for transmitting signals and/or data and/or information to any one or more of the central processing computer(s) 11, the user communication devices 20, the vehicle computers 30, the vehicle battery/recharging systems 40, the electric road/vehicle recharging system computers 60, the electric road/vehicle recharging systems 70, the video camera monitoring systems 80, and/or the RFID reader systems 90, and/or to any other navigation information system computer(s) 50, and/or to any other individual computer(s) or individual communication device(s) which may be utilized in conjunction with the apparatus 100 of the present invention. The transmitter 50F is also connected to, or linked with, the CPU 50A.

The navigation information system computer 50 also includes a receiver 50G, for receiving signals and/or data and/or information from any one or more of the central processing computer(s) 11, the user communication devices 20, the vehicle computers 30, the vehicle battery/recharging systems 40, the navigation information system computers 50, the electric road/vehicle recharging system computers 60, the electric road/vehicle recharging systems 70, the video camera monitoring systems 80, and/or the RFID reader systems 90, and/or from any other navigation information system computer(s) 50, and/or to any other individual computer(s) or individual communication device(s) which may be utilized in conjunction with the apparatus 100 of the present invention. The receiver 50G is also connected to, or linked with, the CPU 50A.

The navigation information system computer 50 also includes a database(s) 50H which stores, contains, or includes, any and/or all of the data and/or information required, needed, or desired, for allowing and/or enabling the navigation information system computer 50 and/or the apparatus 100 to perform any and/or all of the functions and functionalities described herein as being performed, and/or as capable of being performed, by the navigation information system computer 50 and/or the apparatus 100. In this regard, and notwithstanding any specific examples of data and/or information described herein as being stored in the database 50H, it is to be understood that the database 50H stores, contains, and/or includes, any and/or all data and/or information required, needed, or desired, for allowing and/or enabling the navigation information system computer 50 and/or the apparatus 100 to perform any and/or all of the functions and functionalities described herein as being performed by the navigation information system computer 50 and/or the apparatus 100 of the present invention.

In a preferred embodiment, the database 50H can store, contain, and/or include any and/or all data and/or information needed, required, or desired, for enabling the navigation information system computer 50 to provide navigation information, navigation instructions to a destination, travel route information, and/or any other information which can be provided by a navigation device, a navigation application or "app", and/or any other device, system, or software application of "app", which can provide navigation instructions or directions, or travel route information, and/or any data and/or information relating thereto, to an operator or occupant of any vehicle and/or otherwise.

In a preferred embodiment, the database 50H can also store, contain, and/or include any and/or all data and/or information needed, required, or desired, for enabling the navigation information system computer 50 to provide traffic information, weather information, road maintenance information, public safety information, and/or news information, and/or any other information, and/or provide the same along with navigation information, navigation instructions to a destination, travel route information, and/or any other information which can be provided by a navigation device, a navigation application or "app", and/or any other device, system, or software application of "app", which can provide navigation instructions or directions to an operator or occupant of any vehicle or otherwise.

The database 50H can also store, contain, or include, data and/or information regarding any and/or all of the video camera monitoring systems 80 which are utilized in connection with, or in conjunction with, the apparatus 100, including, but not limited to identification information, and position or location information, for and/or regarding each camera and/or video recording device which is utilized in each video camera monitoring systems 80, as well as information and/or software programs, algorithms, and/or processing routines, for identifying cameras and/or video recording devices which are located on, and/or situated adjacent to, or otherwise situated for viewing or for obtaining a view of, any portion of a road, roadway, or location, on and/or along an identified navigation route or travel route.

The database 50H can also store, contain, or include, any software, any software programs, software applications, or software "apps", or any algorithms or processing routines, needed by, or used by, the navigation information system computer 50 in order to perform and/or provide any and/or all of the herein-described functions and/or functionalities described herein as being provided by the navigation information system computer 50 and/or the apparatus 100 of the present invention.

In a preferred embodiment, the database 50H can also store, contain, or include, any other data and/or information needed, required, or desired, for allowing the navigation information system computer 50, the apparatus 100, and/or any of the computers, communication devices, and/or systems, 10, 11, 20, 40, 50, 60, 70, 80, and/or 90, to perform any and/or all of the functions and/or functionalities described herein as being performed by, with, or using, the navigation information system computer 50 and/or the apparatus 100 of the present invention.

The navigation information system computer 50 also includes an output device 501 for outputting any of the data, information, or reports, described herein or otherwise. In the preferred embodiment, the output device 501 can be a printer, a display, a transmitter, a modem, a speaker, and/or any other device which can be used to output data.

The navigation information system computer 50 can also include a video and/or audio recording device(s) 50J which can include a camera and/or a video recording device, for recording pictures or video and/or video clips, and/or a microphone or an audio recording device, for recording audio or audio clips, which can be recorded by, and/or transmitted live, by or from the navigation information system computer 50, or which can be recorded by, and stored at or in, the navigation information system computer 50 for transmission by or from the navigation information system computer 50 at a later time. The video and/or audio recording device(s) 50J can also be utilized to facilitate one-way broadcasts from the navigation information system computer 50, and/or can be utilized to facilitate video conferencing, video chatting, and/or audio conferencing, and/or video and audio conferencing, between a user of the navigation information system computer 50 and any of the herein-described users, individuals, persons, or entities, who or which utilize the apparatus 100 of the present invention.

The navigation information system computer 50 can also include a global positioning device 50K. In a preferred embodiment, the global positioning device 50K determines or can determine a position or location of the navigation information system computer 50.

With reference once again to FIG. 6, the navigation information system computer 50 can also include a navigation system 50L or any number of navigation systems 50L (hereinafter referred to as "navigation system(s) 50L") which can process navigation information, and/or any combination of map information, travel information, news information, weather information, public safety information, road maintenance information, and/or any other information, in order to provide navigation information, navigation instructions, driving instructions, travel route instructions, or any other information which can be utilized by the electric vehicle or hybrid vehicle or the vehicle computer 30 of the same, and/or by a driver or operator of the same, and/or which can be utilized by the navigation information system computer 50 for any purpose and/or to perform any operation, action, or function. Any number of navigation systems 50L can be utilized by the navigation information system computer 50 and each navigation system 50L can be connected to, or linked with, the navigation information system computer 50 via a wired connection, via a wireless connection, and/or via any combination thereof.

With reference once again to FIG. 6, the navigation information system computer 50 can also include a traffic/weather/news/information system 50M or any number of traffic/weather/news/information systems 50M (hereafter referred to as "traffic/weather/news/information system(s) 50M". In a preferred embodiment, the traffic/weather/news/information system(s) 50M can also provide traffic information, weather information, news information, public safety information, road maintenance information, and/or any other information, from one source or from multiple sources, to the navigation information system computer 50 for use by the same in providing any of the herein-described navigation information and/or any other of the herein-described or other information, to any of the users, individuals, or entities, described herein or otherwise, who or which use the apparatus 100 of the present invention.

Figure 7:
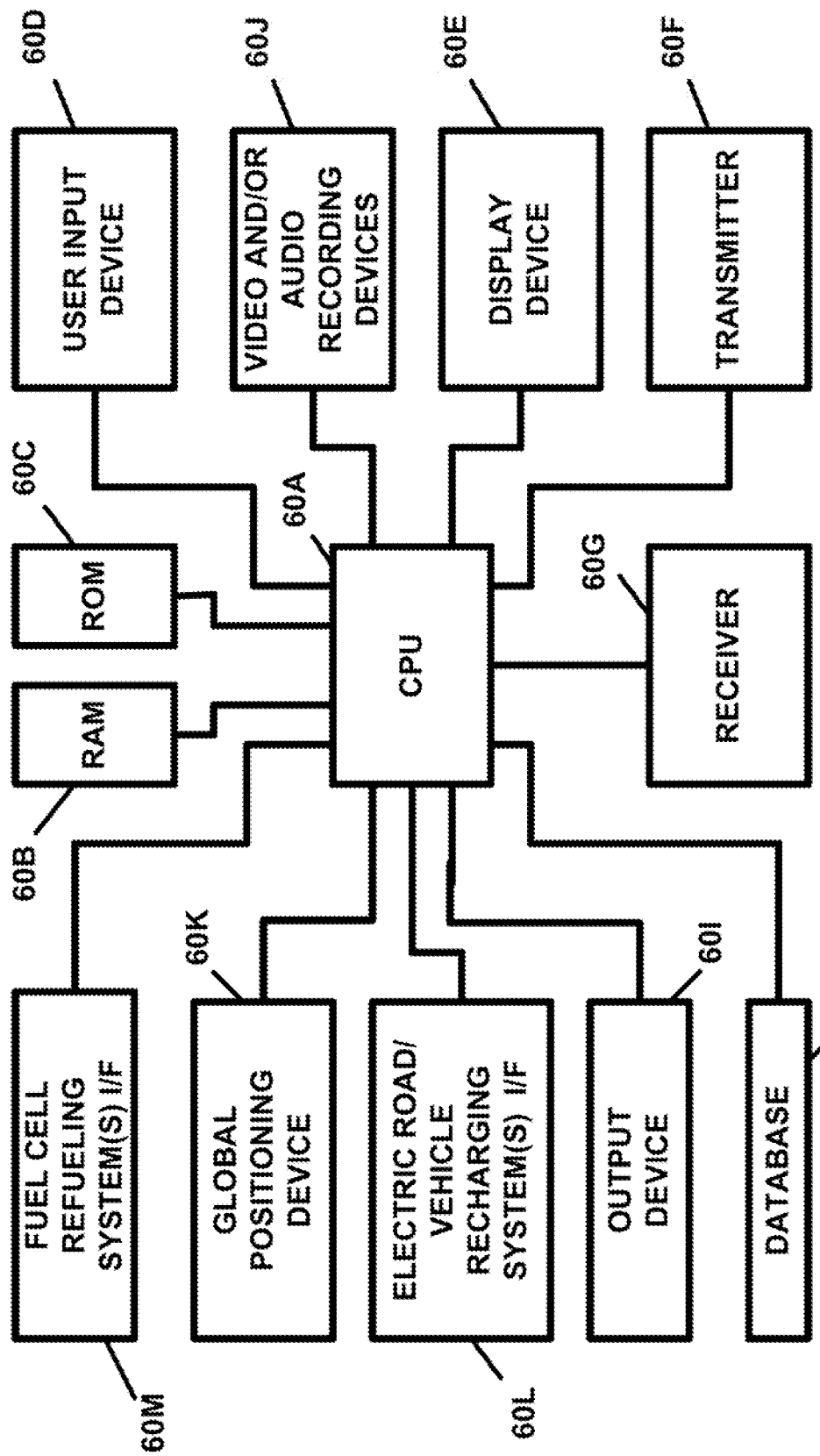
FIG. 7 illustrates the electric road/vehicle recharging system computer of FIG. 1, in block diagram form.

FIG. 7 illustrates the electric road/vehicle recharging system computer 60 of FIG. 1, in block diagram form. In a preferred embodiment, the electric road/vehicle recharging system computer 60, or any number of electric road/vehicle recharging system computers 60, can be used in connection with, or in conjunction with, the apparatus 100 of the present invention. The electric road/vehicle recharging system computer 60, in the preferred embodiment, can be any server computer, Internet server computer, computer or computer system, communication device, computer, micro-computer, microprocessor, personal computer, laptop computer, notebook computer, Smart phone or smartphone, smart telephone, cellular telephone, personal digital assistant, wireless telephone, wireless communication device, tablet, tablet computer, watch, smart watch, or wearable device or computer, or any combination of same, or any equivalent of same, or any other computer or communication device, which can provide the functionality of, and which can be utilized as an electric road/vehicle recharging system computer 60. In the preferred embodiment, the electric road/vehicle recharging system computer 60 includes a central processing unit or CPU 60A, which, in the preferred embodiment, is a microprocessor. The CPU 60A can also be a microcomputer, a minicomputer, a macro-computer, and/or a mainframe computer, depending upon the application.

The electric road/vehicle recharging system computer 60 also includes a random access memory device(s) 60B (RAM) and a read only memory device(s) 60C (ROM), each of which is connected to, or linked with, the CPU 60A, and a user input device 60D, for entering data and/or information and/or commands into the electric road/vehicle recharging system computer 60, which can include any one or more of a keyboard, a scanner, a user pointing device, such as, for example, a mouse, a touch pad, and/or an audio input device and/or a video input device, a microphone or audio recording device, a camera or a video recording device, and/or any device, electronic and/or otherwise, which can be utilized for inputting and/or entering data and/or information and/or commands into the electric road/vehicle recharging system computer 60. The user input device(s) 60D is/are also connected to, or linked with, the CPU 60A. The electric road/vehicle recharging system computer 60 also includes a display device 60E for displaying data and/or information to a user or individual. The display device 60E is also connected to, or linked with, the CPU 60A.

The electric road/vehicle recharging system computer 60 also includes a transmitter(s) 60F, for transmitting signals and/or data and/or information to any one or more of the central processing computer(s) 11, the user communication devices 20, the vehicle computers 30, the vehicle battery/recharging systems 40, the navigation information system computers 50, the electric road/vehicle recharging systems 70, the video camera monitoring systems 80, and/or the RFID reader systems 90, and/or to any other electric road/vehicle recharging system computer(s) 60, and/or to any other individual computer(s) or individual communication device(s) which may be utilized in conjunction with the apparatus 100 of the present invention. The transmitter 60F is also connected to, or linked with, the CPU 60A.

The electric road/vehicle recharging system computer 60 also includes a receiver 60G, for receiving signals and/or data and/or information from any one or more of the central processing computer(s) 11, the user communication devices 20, the vehicle computers 30, the vehicle battery/recharging systems 40, the navigation information system computers 50, the electric road/vehicle recharging systems 70, the video camera monitoring systems 80, and/or the RFID reader systems 90, and/or from any other electric road/vehicle recharging system computer(s) 60, and/or to any other individual computer(s) or individual communication device(s) which may be utilized in conjunction with the apparatus 100 of the present invention. The receiver 60G is also connected to, or linked with, the CPU 60A.

The electric road/vehicle recharging system computer 60 also includes a database(s) 60H which stores, contains, or includes, any and/or all of the data and/or information required, needed, or desired, for allowing and/or enabling the electric road/vehicle recharging system computer 60 and/or the apparatus 100 to perform any and/or all of the functions and functionalities described herein as being performed, and/or as capable of being performed, by the electric road/vehicle recharging system computer 60 and/or the apparatus 100. In this regard, and notwithstanding any specific examples of data and/or information described herein as being stored in the database 60H, it is to be understood that the database 60H stores, contains, and/or includes, any and/or all data and/or information required, needed, or desired, for allowing and/or enabling the electric road/vehicle recharging system computer 60 and/or the apparatus 100 to perform any and/or all of the functions and functionalities described herein as being performed by the electric road/vehicle recharging system computer 60 and/or the apparatus 100 of the present invention.

In a preferred embodiment, the database 60H can store, contain, and/or include any and/or all data and/or information, software programs, software applications or "apps", processing routines, or algorithms, needed, required, or desired, for enabling, and/or for facilitating the operation of, the electric road/vehicle recharging system computer 60 to control and/or to monitor the operation of any electric road or electric road segment, and/or any plug-in recharging power system(s), any electric road ("eroad") inductive charging system(s), any eroad inductive coil system(s), any eroad, road, or roadside, inductive charging coil(s), any eroad electric rail contact charging system(s), any eroad charging rails and/or charging conductors, any fuel cell fuel dispensing system(s), any fuel cell fuel tank(s), and/or any mobile recharging vehicle(s) or drone(s), associated with, or assigned to, the electric road/vehicle recharging system computer 60.

The database 60H can also store, contain, or include, any data and/or information regarding and/or all electric vehicles and/or hybrid vehicles used in connection with the apparatus 100 of the present invention, and, for each such vehicle, the database 60H can store, contain, and/or include, data and/or information regarding the make and model of each vehicle, and/or battery requirements for the vehicle, and/or fuel cell fuel requirements or type(s) for the vehicle, and/or recharging instructions or specifications for the vehicle, and/or fuel cell refueling requirements for the vehicle, and/or plug-in recharging requirements and information for and/or regarding the vehicle, and/or inductive recharging requirements, information, and/or recharging method(s) (for example, stationary recharging and/or in-motion recharging), and/or electric road contact recharging requirements and information for and/or regarding the vehicle, and/or recharging methods, and/or mobile recharging requirements and/or methods (for example, but not limited to, moving recharging vehicles, stationary recharging vehicles, and/or drones, which can be employed to recharge the respective vehicle) for the respective vehicle.

The database 60H can also store, contain, or include, data and/or information regarding recharging accounts for or associated with any vehicle(s), and, for each vehicle, the database 60H can store, contain, or include, any data and/or information regarding the owner or operator of any vehicle and/or any recharging account(s) and/or other account(s) of or associated with the owner or operator of the vehicle or the vehicle itself.

In a preferred embodiment, the database 60H can also store, contain, and/or include, any and/or all data and/or information needed, required, or desired, for enabling the electric road/vehicle recharging system computer 60 to perform or proves any and/or all of the actions, operations, or functions, described herein as be performed, or as capable of being performed, by the electric road/vehicle recharging system computer 60.

The database 60H can also store, contain, or include, any software, any software programs, software applications, or software "apps", or any algorithms or processing routines, needed by, or used by, the electric road/vehicle recharging system computer 60 in order to perform and/or provide any and/or all of the herein-described functions and/or functionalities described herein as being provided by the electric road/vehicle recharging system computer 60 and/or the apparatus 100 of the present invention.

In a preferred embodiment, the database 60H can also store, contain, or include, any other data and/or information needed, required, or desired, for allowing the electric road/vehicle recharging system computer 60, the apparatus 100, and/or any of the computers, communication devices, and/or systems, 10, 11, 20, 40, 50, 60, 70, 80, and/or 90, to perform any and/or all of the functions and/or functionalities described herein as being performed by, with, or using, the electric road/vehicle recharging system computer 60 and/or the apparatus 100 of the present invention.

The electric road/vehicle recharging system computer 60 also includes an output device 60I for outputting any of the data, information, or reports, described herein or otherwise. In the preferred embodiment, the output device 60I can be a printer, a display, a transmitter, a modem, a speaker, and/or any other device which can be used to output data.

The electric road/vehicle recharging system computer 60 can also include a video and/or audio recording device(s) 60J which can include a camera and/or a video recording device, for recording pictures or video and/or video clips, and/or a microphone or an audio recording device, for recording audio or audio clips, which can be recorded by, and/or transmitted live, by or from the electric road/vehicle recharging system computer 60, or which can be recorded by, and stored at or in, the electric road/vehicle recharging system computer 60 for transmission by or from the electric road/vehicle recharging system computer 60 at a later time. The video and/or audio recording device(s) 60J can also be utilized to facilitate one-way broadcasts from the electric road/vehicle recharging system computer 60, and/or can be utilized to facilitate video conferencing, video chatting, and/or audio conferencing, and/or video and audio conferencing, between a user of the electric road/vehicle recharging system computer 60 and any of the herein-described users, individuals, persons, or entities, who or which utilize the apparatus 100 of the present invention.

The electric road/vehicle recharging system computer 60, or any of its components, and/or any mobile vehicles or drones which is/are utilized in connection with the same, can also include a global positioning device 60K. In a preferred embodiment, the global positioning device 60K determines or can determine a position or location of the electric road/vehicle recharging system computer 60, or any of its components, and/or any mobile vehicles or drones which is/are utilized in connection with the same.

With reference once again to FIG. 7, the electric road/vehicle recharging system computer 60 can also include an electric road/vehicle recharging systems interface ("I/F") 60L (hereinafter referred to as "electric road/vehicle recharging system(s) I/F 60L", or any number of same, for enabling and/or for allowing the electric road/vehicle recharging system computer 60 to control and/or to monitor, via the, or a respective, electric road/vehicle recharging system(s) I/F 60L, an operation of any plug-in recharging power system, any electric road ("eroad") inductive charging system and/or inductive coil system, any eroad, road, or roadside, inductive charging coil(s), any eroad electric rail contact charging system, and/or any eroad charging rail or charging conductor, which is utilized in connection with, or in conjunction with, the electric road/vehicle recharging system computer 60 and/or the apparatus 100. The electric road/vehicle recharging system(s) I/F 60L can also be utilized to enable and/or for allow the electric road/vehicle recharging system computer 60 to control and/or to monitor, via the, or a respective, electric road/vehicle recharging system(s) I/F 60L, an operation of any mobile recharging vehicle(s) or any recharging drone(s) which is utilized in connection with, or in conjunction with, the electric road/vehicle recharging system computer 60 and/or the apparatus 100.

Any number of electric road/vehicle recharging system(s) I/Fs 60L can be utilized by the electric road/vehicle recharging system computer 60 and/or each electric road/vehicle recharging system(s) I/F 60L can be connected to, or linked with, the electric road/vehicle recharging system computer 60 via a wired connection, via a wireless connection, and/or via any combination thereof.

With reference once again to FIG. 7, the electric road/vehicle recharging system computer 60 can also include a fuel cell refueling system interface (I/F) 60M (hereinafter referred to as "fuel cell refueling system(s) I/F 60M") or any number of same, for enabling and/or for allowing the electric road/vehicle recharging system computer 60 to control and/or to monitor, via the, or a respective, fuel cell refueling system(s) I/F 60M, any fuel cell refueling system which is utilized in connection with, or in conjunction with, the electric road/vehicle recharging system computer 60 and/or the apparatus 100.

Any number of fuel cell refueling system(s) I/Fs 60M can be utilized by the electric road/vehicle recharging system computer 60 and/or each fuel cell refueling system(s) I/F 60M can be connected to, or linked with, the electric road/vehicle recharging system computer 60 via a wired connection, via a wireless connection, and/or via any combination thereof.

Figure 8:
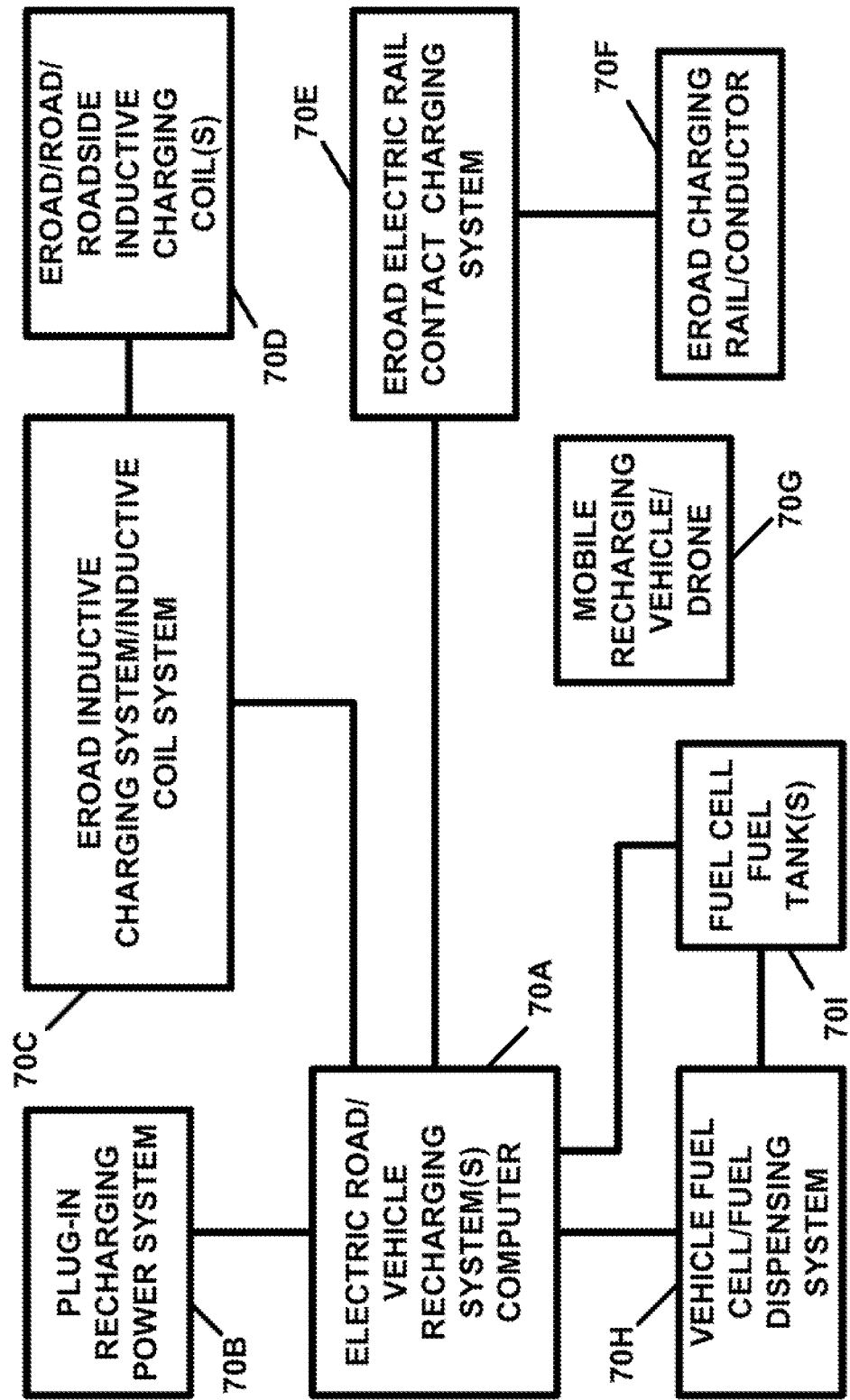
FIG. 8 illustrates the electric road/vehicle recharging system(s) of FIG. 1, in block diagram form.

FIG. 8 illustrates the electric road/vehicle recharging system(s) 70 of FIG. 1, in block diagram form. With reference to FIG. 8, in a preferred embodiment, the electric road/vehicle recharging system(s) 70 includes an electric road/vehicle charging system(s) computer 70A or any number of electric road/vehicle charging system(s) computers 70A (hereinafter referred to as "electric road/vehicle recharging system(s) 70"), which is/are, or can be, associated with each electric road or each electric road segment. In a preferred embodiment, the electric road/vehicle recharging system(s) 70 performs any and/or all control and/or monitoring operations and/or functions regarding the electric road/vehicle recharging system(s) 70 and its component systems, equipment, components, and/or devices, described herein.

With reference once again to FIG. 8, the electric road/vehicle recharging system(s) 70, in a preferred embodiment, also includes a plug-in recharging power system 70B, or any number of the same, which is/are, or can be, associated with each electric road or each electric road segment. In a preferred embodiment, the plug-in recharging power system 70B can be utilized to facilitate and/or to perform any type or kind of plug-in recharging, via a plug-in or direct wired, line, or other, direct contact connection, of a battery or batteries of an electric vehicle or a hybrid vehicle. In a preferred embodiment, the plug-in recharging power system can be any type or kind of suitable plug-in recharging power system or power supply. In a preferred embodiment, the plug-in recharging power system 70B can, for example, be a 120 Volt AC recharger, a 240 Volt AC recharger, an AC recharger of any other voltage, and/or any other alternating current (AC) power supply or recharging system, and/or the plug-in recharging power system 70B can be any suitable direct current (DC) power supply or recharging system, and/or can be any other type or kind of electric vehicle battery or hybrid vehicle battery recharger which is/are known to those skilled in the pertinent art. As shown in FIG. 8, the plug-in recharging power system 70B, in a preferred embodiment, is, or can be, connected, via a wired link or connection, via a wireless link or connection, or via any combination of the same, to the electric road/vehicle charging system(s) computer 70A, and/or is, and/or can be, controlled and/or monitored by the electric road/vehicle charging system(s) computer 70A.

With reference once again to FIG. 8, the electric road/vehicle recharging system(s) 70 also includes an electric road ("eroad") inductive charging system and inductive coil system 70C (hereinafter referred to as "eroad inductive charging system/inductive coil system 70C"), or any number of the same, which is/are, or can be, associated with each electric road or each electric road segment. In a preferred embodiment, the eroad inductive charging system/inductive coil system 70C includes any systems, equipment, components, or devices, and/or any inductive charging coil(s) and/or any associated equipment or components, which allow for and/or facilitate and/or perform inductive charging or inductive recharging of a battery or batteries of an electric vehicle or a hybrid vehicle via the use of electric coils which are located or placed on, adjacent to, underneath, or buried wholly or partially in or within, any pavement of an electric road. In a preferred embodiment, the eroad inductive charging system/inductive coil system 70C also includes any systems, equipment, components, or devices, and/or any inductive charging coil(s) and/or any associated equipment or components, which allow for and/or facilitate and/or perform inductive charging or inductive recharging of a battery or batteries of an electric vehicle or a hybrid vehicle via the use of electric coils which are located or placed on, adjacent to, underneath, or buried wholly or partially in or within, any parking space, parking lot, battery charging pad or location, stall, parking garage, garage, driveway, inductive charging station, or any other place, location, or venue, where a vehicle battery can be inductively charged or recharged while the vehicle is stationary and/or parked. As shown in FIG. 8, the eroad inductive charging system/inductive coil system 70C, in a preferred embodiment, is, or can be, connected, via a wired link or connection, via a wireless link or connection, or via any combination of the same, to the electric road/vehicle charging system(s) computer 70A, and/or is, and/or can be, controlled and/or monitored by the electric road/vehicle charging system(s) computer 70A.

With reference once again to FIG. 8, the electric road/vehicle recharging system(s) 70 also includes an electric road ("eroad") road and/or roadside inductive charging coil 70D (hereinafter referred to as "eroad/road/roadside inductive charging coil(s) 70D") and/or any number of the same which, in a preferred embodiment, is/are the charging or recharging coil or coils of the eroad inductive charging system/inductive coil system 70C. In this regard, in a preferred embodiment, the eroad/road/roadside inductive charging coil(s) 70D is/are a component(s) of the, or its respective, eroad inductive charging system/inductive coil system 70C. In a preferred embodiment, any number of eroad/road/roadside inductive charging coil(s) 70D can be associated with any eroad inductive charging system/inductive coil system 70C. As shown in FIG. 8, the eroad/road/roadside inductive charging coil(s) 70D, in a preferred embodiment, is, or can be, connected, via a wired link or connection, via a wireless link or connection, or via any combination of the same, to the eroad inductive charging system/inductive coil system 70C, and/or is, and/or can be, controlled and/or monitored by the eroad inductive charging system/inductive coil system 70C and/or by the electric road/vehicle charging system(s) computer 70A.

With reference once again to FIG. 8, the electric road/vehicle recharging system(s) 70 also includes an electric road ("eroad") road electric rail contact charging system 70E (hereinafter referred to as "eroad electric rail contact charging system 70E") and/or any number of the same, which is/are, or can be, associated with each electric road or each electric road segment. In a preferred embodiment, the eroad electric rail contact charging system 70E includes any systems, equipment, components, or devices, and/or any electric rail(s), electric conductor(s), conductive rail(s), or other conductor(s) or conductive device(s), of or associated with the electric road or electric road segment, which respective electric rail(s), electric conductor(s), conductive rail(s), or other conductor(s) or conductive device(s), of or associated with the electric road or electric road segment, can charge or recharge a battery or batteries of an electric vehicle or hybrid vehicle via direct and/or any other appropriate contact with the respective, and/or any suitable, fixed, extendable, deployable, and/or retractable, conductor, arm, line, wire, or conducting item of the respective vehicle. In this regard, charging or recharging of a battery or batteries of an electric vehicle or hybrid vehicle can occur when the fixed, extendable, deployable, and/or retractable, conductor, arm, line, wire, or conducting item of the respective vehicle is brought into contact with, and while it remains in contact with, the respective electric rail, electric conductor, conductive rail, or other conductor or conductive device, of or associated with the electric road or electric road segment. As shown in FIG. 8, the eroad electric rail contact charging system 70E, in a preferred embodiment, is, or can be, connected, via a wired link or connection, via a wireless link or connection, or via any combination of the same, to the electric road/vehicle charging system(s) computer 70A, and/or is, and/or can be, controlled and/or monitored by the electric road/vehicle charging system(s) computer 70A.

With reference once again to FIG. 8, the electric road/vehicle recharging system(s) 70 also includes an electric road ("eroad") charging rail or conductor 70F (hereinafter referred to as "eroad charging rail/conductor 70F"), or any number of the same, which is/are, or can be, associated with each electric road or each electric road segment. In a preferred embodiment, the eroad charging rail/conductor 70F is the charging or recharging electric rail, electric conductor, conductive rail, or other conductor or conductive device, of the eroad electric rail contact charging system 70E. In this regard, in a preferred embodiment, the eroad charging rail/conductor 70F is/are a component(s) of the, or its respective, eroad electric rail contact charging system 70E. In a preferred embodiment, any number of eroad charging rail/conductor 70F can be associated with any eroad electric rail contact charging system 70E. As shown in FIG. 8, the eroad charging rail/conductor(s) 70F, in a preferred embodiment, is/are, or can be, connected, via a wired link or connection, via a wireless link or connection, or via any combination of the same, to the eroad electric rail contact charging system 70E, and/or is, and/or can be, controlled and/or monitored by the eroad electric rail contact charging system 70E and/or by the electric road/vehicle charging system(s) computer 70A.

With reference once again to FIG. 8, the electric road/vehicle recharging system(s) 70 also includes a mobile recharging vehicle or recharging drone 70G (hereinafter referred to as "mobile recharging vehicle/drone 70G") and/or any number of the same. In a preferred embodiment, the mobile recharging vehicle/drone 70G can be any motor vehicle, car, automobile, truck, sport utility vehicle, recreational vehicle, land vehicle, boat, marine vehicle or vessel, submarine, aircraft, jet, airplane, spacecraft, satellite, robot, self-driving or self-operating vehicle or drone, remote-controlled vehicle or drone, flying drone, and/or any manned or unmanned, vehicle or drone. In a preferred embodiment, the mobile recharging vehicle/drone 70G is, or can be, is equipped with an inductive charging coil(s) and any associated inductive recharging system or equipment (not shown), for performing inductive charging or recharging of any battery or batteries of an electric or hybrid vehicle, and/or is, or can be, equipped with a contact charging conductor or system and any associated contact recharging system or equipment (not shown) for performing contact charging or recharging of a battery or batteries of an electric or hybrid vehicle, and/or is, or can be, equipped with plug-in recharging equipment (not shown) for performing plug-in or other contact charging or recharging of a battery or batteries of an electric or hybrid vehicle. In a preferred embodiment, any can equipment, systems, components, devices, inductive coils, rails, and/or conductors, and/or any other charging or recharging components described herein as being utilized in or with the plug-in recharging power system 70B, the eroad inductive charging system/inductive coil system 70C, and/or the eroad electric rail contact charging system 70E, can also be utilized, in appropriate sizes, shapes, types, or kinds, in each respective mobile recharging vehicle/drone 70G. It is envisioned, in a preferred embodiment, that the mobile recharging vehicle/drone 70G can be utilized in roadside service, other service, periodic recharging, remote recharging, emergency recharging, and/or any other recharging activity wherein the respective mobile recharging vehicle/drone 70G travels to a respective electric vehicle or hybrid vehicle.

With reference once again to FIG. 8, the electric road/vehicle recharging system(s) 70 also includes a vehicle fuel cell fuel dispensing system 70H (hereinafter referred to as "vehicle fuel cell/fuel dispensing system 70H") or any number of the same, which can be utilized to perform fuel cell fuel dispensing for electric vehicles or hybrid vehicles equipped with fuel cells. In a preferred embodiment, the vehicle fuel cell/fuel dispensing system 70H can be equipped with any needed or required equipment for dispensing fuel cell fuel. As shown in FIG. 8, the vehicle fuel cell/fuel dispensing system 70H, in a preferred embodiment, is, or can be, connected, via a wired link or connection, via a wireless link or connection, or via any combination of the same, to the electric road/vehicle charging system(s) computer 70A, and/or is, and/or can be, controlled and/or monitored by the electric road/vehicle charging system(s) computer 70A. As shown in FIG. 8, the vehicle fuel cell/fuel dispensing system 70H, in a preferred embodiment, is, or can be, connected, via a wired link or connection, via a wireless link or connection, or via any combination of the same, to the electric road/vehicle charging system(s) computer 70A, and/or is, and/or can be, controlled and/or monitored by the electric road/vehicle charging system(s) computer 70A.

With reference once again to FIG. 8, the electric road/vehicle recharging system(s) 70 also includes a fuel cell fuel tank(s) 70I or any number of the same, which can be utilized to store fuel cell fuel of any type or kind. In a preferred embodiment, the fuel cell fuel tank(s) 70I is, or can be, connected, via a wired link or connection, via a wireless link or connection, or via any combination of the same, to the electric road/vehicle charging system(s) computer 70A, and/or is, and/or can be, controlled and/or monitored by the electric road/vehicle charging system(s) computer 70A. In a preferred embodiment, the fuel cell fuel tank(s) 70I is, or can be, connected, via a wired link or connection, via a wireless link or connection, or via any combination of the same, to the vehicle fuel cell/fuel dispensing system 70H, and/or is, and/or can be, controlled and/or monitored by the vehicle fuel cell/fuel dispensing system 70H.

In a preferred embodiment, any mobile recharging vehicle/drone 70I can also be equipped with a fuel cell fuel tank(s) 70I and/or any number of the same, and can also be equipped with a vehicle fuel cell/fuel dispensing system 70H and/or any number of the same, in order to perform any type or kind of mobile fuel cell refueling.

Figure 9:
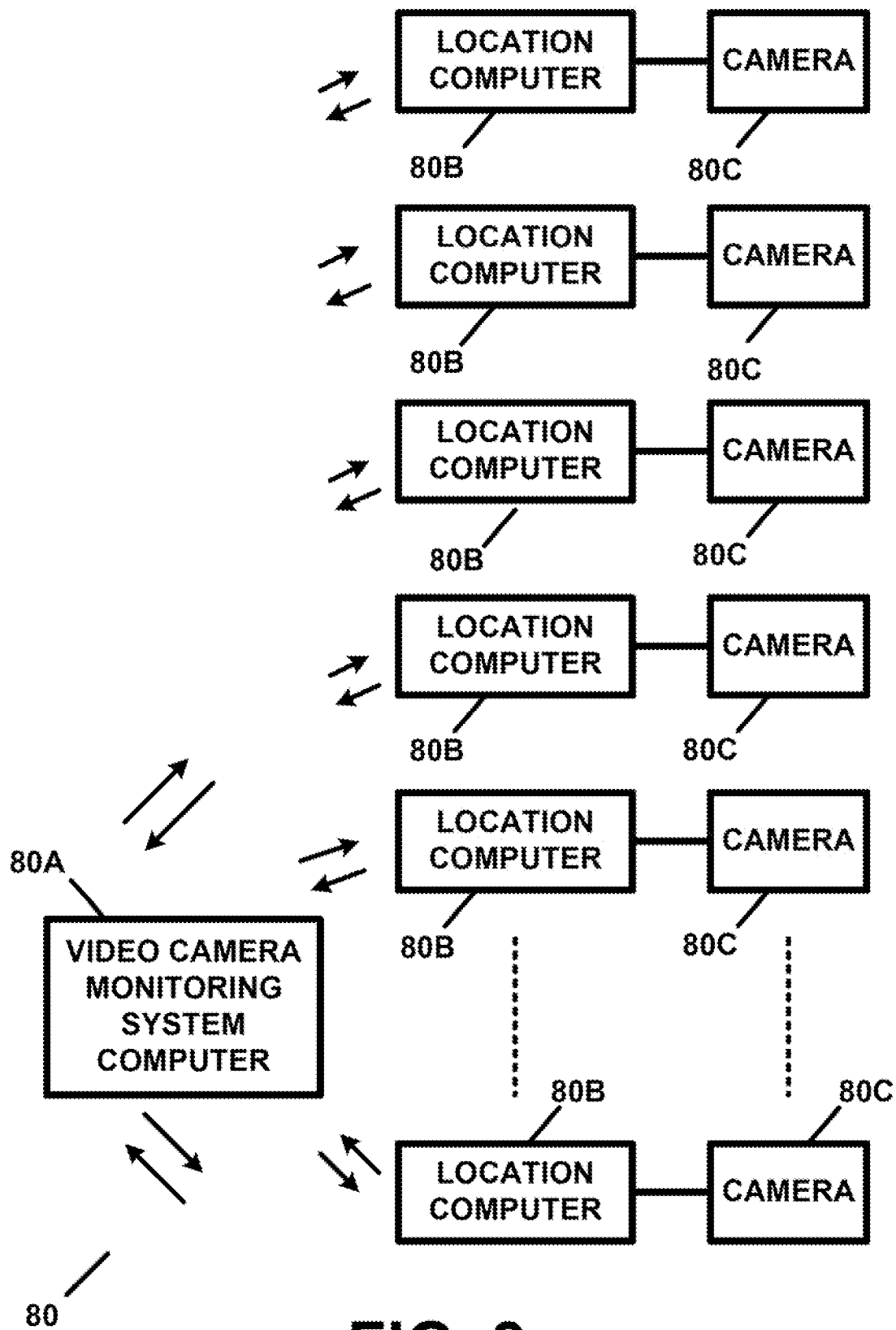
FIG. 9 illustrates the video camera monitoring system of FIG. 1, in block diagram form.

FIG. 9 illustrates the video camera monitoring system 80 of FIG. 1, in block diagram form. With reference to FIG. 9, the video camera monitoring system 80, a preferred embodiment, includes a video camera monitoring system computer 80A which can control and monitor the operation and/or the functioning of the video camera monitoring system 80 and its systems, equipment, components, and/or devices. In a preferred embodiment, any number of video camera monitoring systems 80, and video camera monitoring system computers 80A, can be utilized with each video camera monitoring system 80 and/or video camera monitoring system computer 80A being assigned to a specific geographic location, municipality, political subdivision, locality, property, commercial property, and/or any road, highway, parkway, expressway, street, electric road ("eroad"), eroad segment, and/or any other venue.

With reference once again to FIG. 9, the video camera monitoring system 80 also includes any number of cameras, video cameras, or video recording cameras 80C (hereinafter referred to as "camera 80C" or "cameras 80C"), each of which can be deployed and/or located on, along, adjacent to, or in the vicinity of a road, roadway, street, electric road ("eroad"), road segment, eroad segment, eroad segment containing battery recharging equipment and/or fuel cell refueling equipment, highway, parkway, expressway, thoroughfare, intersection, parking lot, shopping center, sports venue, strip mall, shopping mall, commercial building, electric vehicle or hybrid vehicle battery charging station, building, residential building, store, airport, train station, bus station, bridge, tunnel, toll plaza, parking lot, parking garage, commercial parking lot, driveway, and/or structure of any type or kind, and/or located on a mobile recharging vehicle and/or drone, and/or can be located or situated at any other location of interest, and/or can be mounted or placed on or at any suitable structure, which can be of interest to owners or operators of electric vehicles or hybrid vehicles and/or any other users of the apparatus 100 of the present invention. In a preferred embodiment, any number of cameras 80C can be placed at, stationed at, assigned to, and/or utilized at, any place, location, or venue. In a preferred embodiment, each camera 80C can record and/or transmits pictures, photographs, or live video.

With reference once again to FIG. 9, the video camera monitoring system 80 also includes any number of location computers 80B (hereinafter referred to as "location computer 80B" or "location computers 80B") each of which can be connected to, or linked with, can control an operation of, can operate, can record and/or store pictures, photographs, and/or live video obtained by for from, and/or can transmit pictures, photographs, and/or live video by or from, any one or more cameras 80C which is is/are assigned thereto. In a preferred embodiment, each location computer 80B can be connected to or linked with each of one or more cameras 80C via a wireless connection or link, via a wired connection or link, or via any combination of the same.

In a preferred embodiment, the video camera monitoring system computer 80A can be connected to or linked with each of one or more location computers 80B via a wireless connection or link, via a wired connection or link, or via any combination of the same, and/or can control and/or monitor an operation of, and/or can operate, the one or more location computers 80B. In a preferred embodiment, the video camera monitoring system computer 80A can also be connected to or linked with each of the cameras 80C utilized in connection with the apparatus 100 via a wireless connection or link, via a wired connection or link, or via any combination of the same, and/or can control and/or monitor an operation of, and/or can operate, and/or can record and/or store pictures, photographs, and/or live video obtained by for from, and/or can transmit pictures, photographs, and/or live video obtained by or from, any of the cameras 80C.

In a preferred embodiment, each of the video camera monitoring system computer 80A, the locations cameras 80B, and/or each of the cameras 80C, can record, store, and/or transmit any pictures, photographs, or live video, obtained by or with each respective camera, and/or each of the video camera monitoring system computer 80A, the locations cameras 80B, and/or each of the cameras 80C, can transmit any pictures, photographs, live video, and/or recorded video, obtain by or with each respective camera 80C.

In a preferred embodiment, each of the video camera monitoring system computer 80A and/or the locations cameras 80B can control an operation of, activate an operation of, deactivate an operation of, monitor an operation of, and/or operate, any camera 80C or cameras 80C which are associated with a respective location computer 80B. In a preferred embodiment, the video camera monitoring system computer 80A can control an operation of, activate an operation of, deactivate an operation of, monitor an operation of, and/or operate, any camera 80C or cameras 80C which are associated with the video camera monitoring system computer 80A either directly and/or indirectly via the respective location computer 80B which is assigned to or associated with the respective camera 80C or cameras 80C.

In a preferred embodiment, the pictures, photographs, live video, and/or recorded video, obtained by or with any of the herein-described cameras 80C can be provided to any users of the apparatus 100. As and for some examples, in a preferred embodiment, any pictures, photographs, live video, and/or recorded video, obtained by or with any of the herein-described cameras 80C can be provided to any users of the apparatus 100 for any purpose, including, but not limited to, in connection with trip or travel related information, in connection with previewing travel route or portion thereof, in connection with previewing a road or venue, in connection with requesting in navigation instructions or information, in connection with requesting battery recharging information or fuel cell refueling information, in connection with previewing a battery recharging facility or eroad, in connection with previewing a fuel cell fuel refueling location, in connection with planning, arranging, and/or scheduling a battery recharging operation and/or a fuel cell fuel refueling operation, and/or in connection with any other reason or purpose and/or for whatever reason a user of the apparatus 100 may need, require, or desire, to obtain such information, pictures, photographs, live video, or recorded video.

The apparatus 100 and methods of the present invention can be utilized in a number of ways in order to facilitate the recharging or a battery or batteries of, and/or for, electric vehicles and/or hybrid vehicles, and/or in order to facilitate the refueling of fuels cells of, and/or for, electric vehicles and/or hybrid vehicles. The apparatus 100 and methods of the present invention can also be utilized in order to identify and/or locate a battery recharging facility and/or a fuel cell refueling facility, and/or to identify and/or locate a battery recharging facility and/or a fuel cell refueling facility based on a current or expected state or charge of a battery or batteries, and/or a current or expected fuel cell fuel level, and/or to identify and/or locate a battery recharging facility and/or a fuel cell refueling facility based on the current or expected state or charge of a battery or batteries, and/or the current or expected fuel cell fuel level and/or based on navigation instructions or information on a current or expected travel route.

The apparatus 100 and methods of the present invention can also be utilized to identify an electric vehicle or hybrid vehicle which utilizes a battery recharging operation, activity, or service, and/or which utilizes a fuel cell refueling operation, activity, or service, determine a charge for the respective operation, activity, or service, and automatically bill a respective battery recharging account or fuel cell refueling account. The apparatus 100 and methods of the present invention can also provide account security for battery recharging accounts and/or fuel cell refueling accounts by generating and transmitting account use alert messages in order to notify the respective account holder, who or which can an owner or operator, or any other individual or entity, regarding a use or attempted use of his or her, or its, respective battery recharging account and/or fuel cell refueling account.

The apparatus 100 and methods of the present invention can also be utilized in order to provide for trip planning or travel planning in order to provide for, and/or in order to ensure, that an electric vehicle or a hybrid vehicle has access to battery recharging services and/or fuel cell refueling services, throughout the during of the trip or travel. The apparatus 100 and methods of the present invention can also be utilized in order to provide for the recharging of a battery or batteries of an electric vehicle or a hybrid vehicle by, with, or using, mobile recharging vehicles or drones, and/or in order to provide for the refueling of a fuel cell or fuel cells of an electric vehicle or a hybrid vehicle by, with, or using, mobile refueling vehicles or drones.

In a preferred embodiment, the apparatus 100 and methods of the present invention can be utilized in order to facilitate the recharging or a battery or batteries of, and/or for, electric vehicles and/or hybrid vehicles, and/or in order to facilitate the refueling of fuels cells of, and/or for, electric vehicles and/or hybrid vehicles. In a preferred embodiment, the apparatus 100 and methods of the present invention can also be utilized in order to identify and/or locate a battery recharging facility and/or a fuel cell refueling facility based on the current or expected state or charge of a battery or batteries, and/or a current or expected fuel cell fuel level, and/or based on the current or expected state or charge of a battery or batteries, and/or the current or expected fuel cell fuel level, and/or based on navigation instructions or information on or regarding a current or expected travel route.

In a preferred embodiment, the apparatus 100 and methods of the present invention can be utilized to allow a vehicle operator to locate an electric vehicle or hybrid vehicle battery charging facility or venue, and/or to provide navigation information or instructions to the electric vehicle or hybrid vehicle battery charging facility or venue, and/or to provide battery recharging services and/or fuel cell refueling products and/or services.

Figure 10:
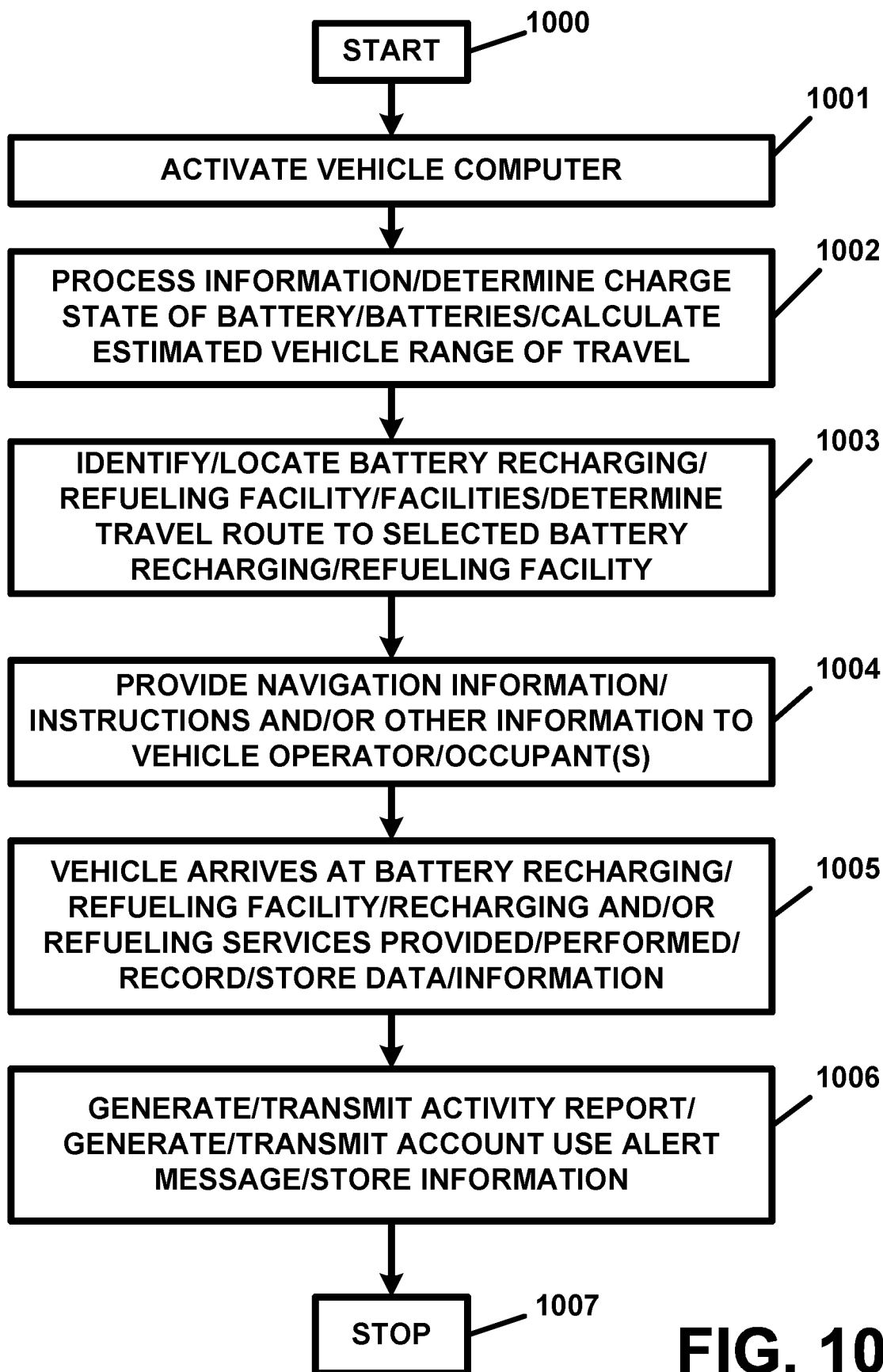
FIG. 10 illustrates the RFID reader system of FIG. 1, in block diagram form.

FIG. 10 illustrates a preferred method for utilizing the apparatus 100 and methods of the present invention, in flow diagram form. With reference to FIG. 10, the operation of the apparatus 100 commences at step 1000. At step 1001, the owner or operator of the electric vehicle or the hybrid vehicle (hereinafter referred to as "vehicle" in the description of the embodiment of FIG. 10), can activate the vehicle computer 30 of the vehicle.

At step 1002, the vehicle computer 30 can process information for determining the charge state of the vehicle battery 40B or for determining the charge state of each battery of the vehicle batteries 40B. At step 1002, the vehicle computer 30 can also process information for determining the fuel cell fuel level or amount of the vehicle fuel cell 40H or for determining the fuel cell fuel level or amount for each fuel cell of the vehicle's fuel cells 40H. At step 1002, the vehicle computer 30 can also calculate or determine the estimated range of travel of the vehicle for the determined charge level of the battery 40B or for the determined charge levels of the batteries 40B, and/or can determine the estimated range of travel of the vehicle for the determined fuel level or amount of the fuel cell 40H or for the determined fuel level or amount for each of the fuel cells 40H. At step 1002, data and/or information regarding the determined or ascertained charge state of the battery 40B or for battery of the vehicle batteries 40B, data and/or information regarding the fuel cell fuel level or amount for the vehicle fuel cell 40H or for each fuel cell of the vehicle's fuel cells 40H, and/or the calculated or determined estimated range of travel of the vehicle, can be displayed via the display device 30H, or can be output via a speaker component of the output device 30H.

At step 1003, the vehicle computer 30 can, utilizing information regarding any and/or all battery recharging facilities or venues, and/or any and/or fuel cell refueling facilities or venues, within the vehicle's estimate range of travel, which can be stored in the database 30H, and/or which can be obtained from or downloaded, automatically and/or otherwise, from the database 11H of the central processing computer 11 component of the central processing computer/distributed ledger/Blockchain technology system 10, process any needed or desired data and/or information and identify and locate one or more battery recharging facilities or venues and/or one or more fuel cell refueling facilities or venues. In a preferred embodiment, the one or more battery recharging facilities or venues and/or one or more fuel cell refueling facilities or venues can be selected by the vehicle computer 30 by utilizing information regarding the type or kinds of battery or batteries 40B, and/or the type or kind of fuel cell or fuel cells, utilized in the vehicle, the respective recharging or refueling requirements for the vehicle, or by using any other suitable criteria.

At step 1003, locations of or regarding each of the identified one or more battery recharging facilities or venues and/or one or more fuel cell refueling facilities or venues can be provided via the display device 30E and/or output via a speaker of the output device 30I. In a preferred embodiment, the location of the vehicle (as determined by the global positioning device 30K), and the location of each of the identified one or more battery recharging facilities or venues and/or the one or more fuel cell refueling facilities or venues, can also be provided via the display device 30E on a digitized map. At step 1003, the owner or operator of the vehicle can also select the respective battery recharging facility or venue or the respective fuel cell refueling facility or venue, to which he or she desires to travel, by entering information regarding the same into the user input device 30D manually or verbally. Thereafter, at step 1003, the vehicle computer 30 can, using navigation information and/or software programs stored in the database 30H of the vehicle computer 30, and/or by accessing, and/or by using navigation information and/or navigation software programs of applications ("apps") stored in the database 11H of, the central processing computer 11 component of the central processing computer/distributed ledger/Blockchain technology system 10, and/or by accessing, and/or by using navigation information and/or navigation software programs or applications ("apps") stored in the database 11H of, the navigation information system computer 50, calculate or determine a travel route from the current location of the vehicle to the location or address of the selected battery recharging facility or venue and/or fuel cell refueling facility or venue. Thereafter, the operation of the apparatus 100 will proceed to step 1004.

At step 1004, the vehicle computer 30 can provide navigation information and/or navigation instructions to the vehicle operator so as to direct the vehicle operator to the selected battery recharging facility or venue and/or fuel cell refueling facility or venue. At and/or during step 1004, the vehicle computer 30 can provide, via the display device 30E and/or over the output device 30I, navigation information, navigation instructions, travel route information, travel instructions, news information, traffic information, weather information, road maintenance information, public safety information, or any another information, or any combination of the same. At step 1004, video and/or audio information, obtained by or with any of the cameras 80C of the video monitoring system 80, can also be provided via the display device 30E and/or a speaker of the output device 30I. At step 1004, in a preferred embodiment, any video or visual information can be displayed on, or provided via, the display device 30E while any audio information can be provided via a speaker of the output device 30I. In a preferred embodiment, live video and/or recorded video, obtained or taken along the travel route to the selected battery recharging facility or venue and/or fuel cell refueling facility or venue, and/or a picture, photograph, or video recording, of, or in the vicinity of, the selected battery recharging facility or venue and/or fuel cell refueling facility or venue, can also be displayed on or via the display device 30E.

In a preferred embodiment, the picture, photograph, or video recording, of, or in the vicinity of, the selected battery recharging facility or venue and/or fuel cell refueling facility or venue, can be utilized in order to familiarize the vehicle operator with the selected battery recharging facility or venue and/or fuel cell refueling facility or venue, and/or so as to provide him or her with information regarding any traffic at, congestion at, or state of affairs (such as, for example, but not limited to, whether or not the respective facility or venue is available, available with a short wait, crowded, or overcrowded) of, the selected battery recharging facility or venue and/or fuel cell refueling facility or venue.

Once the vehicle arrives at, or enters into, or onto, the selected battery recharging facility or venue and/or fuel cell refueling facility or venue, the operation of the apparatus 100 will proceed to step 1005. In the preferred embodiment, as well as in any and/or all the preferred embodiments and/or any other embodiments described herein, each of the vehicle, the vehicle's battery 40B or each of the vehicle's batteries 40, the vehicle's fuel cell 40H, or each of the vehicle's fuel cells 40H, the vehicle's plug-in charging system 40C, the vehicle's eroad inductive charging system/inductive coil system 40D, the vehicle's inductive charging coil 40E or coils 40E ("coil(s)), the vehicle's eroad erail/contact rail charging system/deployable conductor arm system 40F, the vehicle's contact charging deployable conductor/arm 40G, or the vehicle's fuel cell fuel tank(s) 40I, and/or all of the same and/or any combination of the same, can be equipped with a respective RFID tag 95 which can be assigned thereto for identification purposes, and/or can also be equipped with an RFID reader system 90, or an RFID reader of the same, for reading any RFID tag(s) 95 which is/are assigned to the battery recharging facility or venue and/or fuel cell refueling facility or venue.

In a preferred embodiment, any RFID reader system 90, or any RFID reader of the same, can also be, and/or can serve as, an input device 30D of the vehicle computer 30, as well can be, or can serve as, an input device 60D of the electric road/vehicle recharging system computer 60 which is assigned to the battery recharging facility or venue and/or fuel cell refueling facility or venue.

In a preferred embodiment, the vehicle can also have associated therewith, or assigned thereto, a recharging account and/or refueling account which can be utilized for and/or when making payment for any battery recharging services and/or for fuel cell refueling products and services for or involving the vehicle.

In a preferred embodiment, the battery recharging facility or venue and/or fuel cell refueling facility or venue, or any battery recharging facility or venue and/or fuel cell refueling facility or venue described herein, can be any type or kind of facility which can provide battery recharging services and/or fuel cell refueling services and/or which can be, or which can include, a plug-in battery recharging station or a plurality of plug-in battery recharging stations, and/or a battery recharging pad, parking space, or parking lot, which can recharge batteries of electric vehicles and/or hybrid vehicles by induction charging and/or by plug-in charging, inductive charging stations, an electric road/vehicle charging system(s) which can be, or can include, an electric road ("eroad") or an eroad section, which is equipped with a suitable electric rail or other suitable conductor which is used for recharging a battery or batteries of a vehicle via a metal conductor which can deployed from beneath the vehicle and which can come into contact with the electric rail or conductor while the vehicle travels over the same, and which can thereby recharge the battery or batteries of the vehicle, as the vehicle travels on or along the eroad or eroad segment, and/or the eroad or erode segment can be equipped with a suitable overhead conducting line, wire, or structure, or a suitable roadside-based or guardrail-based conducting line, wire, or structure, for connecting to or with a metal conductor which can extend from the vehicle and which can come into contact with the same, and which can thereby recharge the battery or batteries of the vehicle as the vehicle travels on or along the eroad or eroad segment, and/or each eroad or eroad segment can be equipped with an electric inductive (or induction) coil or electric inductive (or induction) coil structure, which can be suitably placed within the eroad or eroad segment, or which can be embedded within the eroad or eroad segment, or which can be embedded beneath a portion or the eroad or eroad segment so as to be covered by at least some of the road material, or which can be positioned on the surface of the eroad or eroad segment, or on the top of the surface of the eroad or eroad segment, and which electric inductive coil generates a magnetic field when energized by an alternating current (AC) power source which, in turn, induces an AC voltage and current flow in an induction coil in or of the vehicle and/or of the vehicle battery/recharging system. The induced alternating current (AC) voltage and current can then be rectified, or converted, to a direct current (DC) voltage and current which can be used to recharge the battery or batteries of the vehicle.

In the preferred embodiment, as well as in any and/or all the preferred embodiments and/or any other embodiments described herein, each of the battery recharging facility or venue and/or fuel cell refueling facility or venue, and/or any other battery recharging facility or venue and/or fuel cell refueling facility or venue described herein as being utilized with the apparatus 100 of the present invention, and/or any plug-in battery recharging station(s), battery recharging pad(s), parking space(s), or parking lot(s), inductive charging station(s), electric road(s), segment(s) of an electric road, plug-in recharging system(s) 70B, eroad inductive charging system/inductive coil system(s) 70C, eroad/road/roadside inductive charging coil(s) 70D, eroad electric rail contact charging system(s) 70E, eroad charging rail/conductor 70F, mobile recharging vehicle/drone 70G, fuel cell fuel dispensing system 70H, or fuel cell fuel tank(s) 70I, and/or all of the same and/or any combination of the same, can be equipped with a respective RFID tag 95 which can be assigned thereto for identification purposes, and/or can also be equipped with an RFID reader system 90, or an RFID reader of the same, for reading any RFID tag(s) 95 which is/are assigned to the respective vehicle, the respective vehicle's battery/batteries 40B, fuel cell/fuel cells 40H, and/or any other component of the respective vehicle's vehicle battery/recharging system 40.

As note herein, in a preferred embodiment, the vehicle can be equipped with an RFID tag 95 which can be used to identify the vehicle, the type or kind of battery 40B or batteries 40B used in the vehicle, any recharging requirements for the battery 40B or batteries 40B, the vehicle's recharging account and/or refueling account, which can be used for making paying for, or for charging payment, for any battery recharging services or any fuel cell refueling products and/or services, the type or kind of fuel cell 40H or fuel cells 40H used in the vehicle, the type or kind of fuel cell fuel required for the fuel cell 40H or for each fuel cell 40H, and/or any other information needed, desired, or required, in any battery recharging or fuel cell refueling servicing performed for or involving the vehicle.

With reference once again to FIG. 10, at step 1005, as the vehicle arrives at, or enters into, or onto, the battery recharging facility or venue and/or fuel cell refueling facility or venue, an RFID reader system 90, or an RFID reader of the same, which is associated with, or assigned to, the battery recharging facility or venue and/or fuel cell refueling facility or venue can read the RFID tag 95 assigned to the vehicle so as to identify the vehicle. In a preferred embodiment, an RFID reader system 90, which is associated with, or assigned to, the vehicle can read the RFID tag assigned to the entrance of the battery recharging facility or venue and/or fuel cell refueling facility or venue. At step 1005, the electric road/vehicle recharging system computer 60, assigned to the battery recharging facility or venue and/or fuel cell refueling facility or venue, can record, store, and/or process, information regarding the RFID tag 95 of the vehicle and/or information regarding the vehicle. At step 1005, the vehicle computer 30 can record, store, and/or process, information regarding the RFID tag 95 of the battery recharging facility or venue and/or fuel cell refueling facility or venue and/or information regarding the battery recharging facility or venue and/or fuel cell refueling facility or venue.

Thereafter, at step 1005, any battery recharging operation or activities can be performed so as to recharge the vehicle battery 40B or the vehicle batteries 40B, and/or any fuel cell refueling operation or activities can be performed so as to refuel the vehicle fuel cell 40 or fuel cells 40H. At step 1005, the type or kind of battery recharging can be selected from among the battery recharging services offered by and/or provided by the battery recharging facility or venue and/or fuel cell refueling facility or venue. In a similar manner, any fuel cell refueling can also be selected from among the refueling options offered by and/or provided by the battery recharging facility or venue and/or fuel cell refueling facility or venue.

In a preferred embodiment, at step 1005, if a plug-in recharging service is selected, the vehicle can be parked on, or adjacent to, the plug-in battery recharging station or equipment, and the equipment or component of the vehicle's plug-in recharging system 40C can be plugged into the plug-in recharging system 70B of the electric road/vehicle recharging system(s) 70 of the battery recharging facility or venue and/or fuel cell refueling facility or venue, and the vehicle battery 40B or batteries can be recharged.

In a preferred embodiment, at step 1005, the vehicle's RFID reader system 90, or RFID reader of the same, can read the RFID tag 95 assigned to the plug-in recharging system 70B, when the vehicle parks adjacent to, or on, the plug-in recharging system 70B and/or when the vehicle exits from or leaves the plug-in recharging system 70B, and, in and for each instance, in and for each instance, the vehicle computer 30 can record, store, and/or process, information regarding the recharging of the vehicle's battery 40B or batteries 40B by or with the plug-in recharging system 70B of the electric road/vehicle recharging system(s) 70, and/or the time, and the amount of time, the vehicle battery 40B or batteries 40B were recharged thereat. In a preferred embodiment, at step 1005, the RFID reader system 90, or RFID reader of the same, of the plug-in recharging system 70B can read the RFID tag 95 assigned to the vehicle, when the vehicle parks adjacent to, or on, the plug-in recharging system 70B and/or when the vehicle exits from or leaves the plug-in recharging system 70B, and, in and for each instance, the electric road/vehicle recharging system computer 60 can record, store, and/or process information regarding the recharging of the vehicle's battery 40B or batteries 40B by or with the plug-in recharging system 70B of the road/vehicle recharging system(s) 70, and/or the time, and the amount of time, the vehicle battery 40B or batteries 40B were recharged thereat.

In a preferred embodiment, at step 1005, if an inductive recharging service is selected, then the vehicle can be parked on, or adjacent to, a battery recharging pad, a parking space, an inductive charging stall, or a parking lot, which can recharge batteries by induction, an inductive charging station (hereinafter referred to as "stationary inductive recharging station"), or the vehicle can be driven along an electric ("eroad") or an eroad section (hereinafter "eroad recharging"). In another preferred embodiment, if an inductive recharging service is selected, the vehicle can be parked on, or adjacent to, a battery recharging pad, a parking space, an inductive charging stall, or a parking lot, which can recharge batteries by induction, an inductive charging station, and/or the vehicle can be driven along an electric ("eroad") or an eroad section (hereinafter "in motion inductive recharging").

In a preferred embodiment, at step 1005, if stationary inductive recharging station recharging is to be performed, then the eroad inductive charging system/inductive coil system 70C and the eroad/roadside inductive charging coil(s) 70D of the same, of the electric road/vehicle recharging system(s) 70, of the battery recharging facility or venue and/or fuel cell refueling facility or venue, can be activated and/or electrified, and/or otherwise provided with electrical power, and the eroad inductive charging system/inductive coil system 70C and the eroad/roadside inductive charging coil(s) 70D can inductively recharge the vehicle battery 40B or batteries 40B via the vehicle's eroad inductive charging system/inductive coil system 40D and the vehicle's inductive charging coil(s) 40E. In this manner, the vehicle battery 40B or batteries can be inductively recharged via the stationary inductive recharging station.

In a preferred embodiment, at step 1005, if in motion inductive recharging is to be performed, then the vehicle can be driven along the eroad or eroad segment while the respective eroad inductive charging system/inductive coil system 70C and the eroad/roadside inductive charging coil(s) 70D of the same, of the electric road/vehicle recharging system(s) 70, of the battery recharging facility or venue and/or fuel cell refueling facility or venue, are activated and/or electrified, and/or otherwise provided with electrical power, and the eroad inductive charging system/inductive coil system 70C and the eroad/roadside inductive charging coil(s) 70D can inductively recharge the vehicle battery 40B or batteries 40B via the vehicle's eroad inductive charging system/inductive coil system 40D and the vehicle's inductive charging coil(s) 40E. In this manner, the vehicle battery 40B or batteries can be inductively recharged via such an in motion inductive recharging operation.

In a preferred embodiment, at step 1005, the vehicle's RFID reader system 90, or RFID reader of the same, can read the RFID tag 95 assigned to the eroad inductive charging system/inductive coil system 70C, and/or the eroad/roadside inductive charging coil(s) 70D, and/or the stationary charging station, when the vehicle parks adjacent to, or on, the eroad inductive charging system/inductive coil system 70C, and/or the eroad/roadside inductive charging coil(s) 70D, and/or the stationary inductive recharging station, and/or when the vehicle exits from or leaves the eroad inductive charging system/inductive coil system 70C, and/or the eroad/roadside inductive charging coil(s) 70D, and/or the stationary inductive recharging station, and, in and for each instance, the vehicle computer 30 can record, store, and/or process, information regarding the recharging of the vehicle's battery 40B or batteries 40B by or with the eroad inductive charging system/inductive coil system 70C and the eroad/roadside inductive charging coil(s) 70D of the same, of the electric road/vehicle recharging system(s) 70, and/or the time, and the amount of time, the vehicle battery 40B or batteries 40B were recharged thereat. In a preferred embodiment, at step 1005, the RFID reader system 90, or RFID reader of the same, of the eroad inductive charging system/inductive coil system 70C, and/or the eroad/roadside inductive charging coil(s) 70D, and/or the stationary inductive recharging station can read the RFID tag 95 assigned to the vehicle, when the vehicle parks adjacent to, or on, the eroad inductive charging system/inductive coil system 70C, and/or the eroad/roadside inductive charging coil(s) 70D, and/or the stationary inductive recharging station, and/or when the vehicle exits from or leaves the eroad inductive charging system/inductive coil system 70C, and/or the eroad/roadside inductive charging coil(s) 70D, and/or the stationary inductive recharging station, and, in and for each instance, the electric road/vehicle recharging system computer 60 can record, store, and/or process, information regarding the recharging of the vehicle's battery 40B or batteries 40B by or with the eroad inductive charging system/inductive coil system 70C and the eroad/roadside inductive charging coil(s) 70D of the same, of the electric road/vehicle recharging system(s) 70, and/or the time, and the amount of time, the vehicle battery 40B or batteries 40B were recharged thereat.

In a preferred embodiment, at step 1005, if an in-motion electric road electrified rail contact battery recharging activity is to be performed to recharge the vehicle battery 40B or batteries 40B, then the vehicle's eroad erail/contact rail charging system/deployable conductor/arm system 40F and, in particular, the contact charging deployable conductor/arm 40G of the same, can be brought into contact with the eroad electric rail contact charging system 70E and, in particular, the eroad charging rail/conductor 70F of the same, of the electric road/vehicle recharging system(s) 70, of the battery recharging facility or venue and/or fuel cell refueling facility or venue, the vehicle can be driven along the eroad or the eroad segment, and the vehicle's battery 40B or batteries 40B can be recharged as the deployable conductor/arm 40G is and remains in contact with the eroad charging rail/conductor 70F as the vehicle drives along the eroad or eroad segment, In a preferred embodiment, at step 1005, the vehicle's RFID reader system 90, or RFID reader of the same, can read the RFID tag 95 assigned to the eroad electric rail contact charging system 70E and/or the eroad charging rail/conductor 70F of the same, of the electric road/vehicle recharging system(s) 70, of the battery recharging facility or venue and/or fuel cell refueling facility or venue, when the vehicle enters the eroad and/or when the vehicle's contact charging deployable conductor/arm 40G makes contact with the eroad charging rail/conductor 70F, and/or when the vehicle exits the eroad, and/or when the vehicle's contact charging deployable conductor/arm 40G ceases being in contact with the eroad charging rail/conductor 70F and, in and for each instance, the vehicle computer 30 can record, store, and/or process, information regarding the recharging of the vehicle's battery 40B or batteries 40B by or with the eroad electric rail contact charging system 70E, and/or the eroad charging rail/conductor 70F of the same, of the electric road/vehicle recharging system(s) 70, and/or the time, and the amount of time, the vehicle battery 40B or batteries 40B were recharged thereat. In a preferred embodiment, at step 1005, the RFID reader system 90, or RFID reader of the same, of the eroad electric rail contact charging system 70E and/or the eroad charging rail/conductor 70F of the same, of the electric road/vehicle recharging system(s) 70, of the battery recharging facility or venue and/or fuel cell refueling facility or venue, can read the RFID tag 95 assigned to the vehicle when the vehicle enters the eroad and/or when the vehicle's contact charging deployable conductor/arm 40G makes contact with the eroad charging rail/conductor 70F, and/or when the vehicle exits the eroad, and/or when the vehicle's contact charging deployable conductor/arm 40G ceases being in contact with the eroad charging rail/conductor 70F and, in and for each instance, the electric road/vehicle recharging system computer 60 can record, store, and/or process, information regarding the recharging of the vehicle's battery 40B or batteries 40B by or with the eroad electric rail contact charging system 70E, and/or the eroad charging rail/conductor 70F of the same, of the electric road/vehicle recharging system(s) 70, and/or the time, and the amount of time, the vehicle battery 40B or batteries 40B were recharged thereat.

In a preferred embodiment, at step 1005, if a fuel cell fuel refueling is needed for the vehicle's fuel cell 40H or for any of the vehicle's fuel cells, then the vehicle can enter a fuel cell refueling area or location, or stall, and the vehicle's fuel cell 40H or any one or more of the vehicle's fuel cells 40H can be refueled with or by utilizing the vehicle fuel cell/fuel dispensing system 70H with fuel cell fuel stored in a corresponding fuel cell fuel tank(s) 70I, In a preferred embodiment, at step 1005, the vehicle's RFID reader system 90, or RFID reader of the same, can read the RFID tag 95 assigned to the vehicle fuel cell/fuel dispensing system 70H and/or the fuel cell fuel tank(s) 70I, when the vehicle parks adjacent to the same, and/or when the vehicle exits from or leaves the same, and, in and for each instance, the vehicle computer 30 can record, store, and/or process, information regarding the refueling of the vehicle's battery fuel cell 40H or fuel cells 40H and the amount of fuel dispensed for the vehicle. In a preferred embodiment, at step 1005, the RFID reader system 90, or RFID reader of the same, of the vehicle fuel dispensing system 70H or of the fuel cell fuel tank(s) 70I, can read the RFID tag 95 assigned to the vehicle, when the vehicle parks adjacent to the same, and/or when the vehicle exits from or leaves the same, and, in and for each instance, the electric road/vehicle recharging system computer 60 can record, store, and/or process, information regarding the regarding the refueling of the vehicle's battery fuel cell 40H or fuel cells 40H and the amount of fuel dispensed for the vehicle.

Thereafter, the operation of the apparatus 100 proceeds to step 1006. At step 1006, the electric road/vehicle recharging system computer 60 can process information regarding any of the vehicle battery recharging activities or services provided or performed, or which took place, at or during step 1005, and/or the electric road/vehicle recharging system computer 60 can process information regarding any of the vehicle fuel cell refueling activities or services provided or performed, or which took place, at or during step 1005, and can generate a recharging and/or refueling activity report which can include information identifying the battery recharging facility or venue and/or fuel cell refueling facility or venue, the recharging and/or refueling serviced provided or performed, identification information regarding the vehicle, and/or the charges for products and/or services provided or performed. At step 1006, the electric road/vehicle recharging system computer 60 can process any financial transaction involving the vehicle's recharging account and/or refueling account, and can store any information regarding the same in the databases 60H.

At step 1006, the electric road/vehicle recharging system computer 60 can generate a recharging account and/or refueling account use alert message and can transmit the same to the user communication device 20 of or associated with the registered owner or operator of the vehicle. At step 1006, in a preferred embodiment, the electric road/vehicle recharging system computer 60 can also transmit the same to the vehicle computer 30 of the vehicle which was serviced by the electric road/vehicle recharging system(s) 70 at and during step 1005. In a preferred, the registered owner or operator of the vehicle can view and/or review the recharging account and/or refueling account use alert message via the display device 20E of the user communication device 20 and/or the vehicle operator and/or an occupant can view and/or review the recharging account and/or refueling account use alert message via the display device 30E of the vehicle computer 30.

In a preferred embodiment, at step 1006, the electric road/vehicle recharging system computer 60 can store any and/or all data and/or information regarding any and/or all of the battery recharging activities or services provided or performed, or which took place, and/or any and/or all fuel cell refueling activities or services provided or performed, or which took place, during step 1005, any data and/or information contained in the recharging and/or refueling activity report, the recharging and/or refueling activity report, any data and/or information regarding any financial transaction processed as well as processed on, with, or involving, the vehicle's recharging account and/or refueling account, and/or data and/or information contained in the recharging account and/or refueling account use alert message, and the recharging account and/or refueling account use alert message, in the database 60H.

In a preferred embodiment, at step 1006, the electric road/vehicle recharging system computer 60 can also transmit any and/or all data and/or information regarding any and/or all of the battery recharging activities or services provided or performed, or which took place, and/or any and/or all fuel cell refueling activities or services provided or performed, or which took place, during step 1005, any data and/or information contained in the recharging and/or refueling activity report, the recharging and/or refueling activity report, any data and/or information regarding any financial transaction processed as well as processed on, with, or involving, the vehicle's recharging account and/or refueling account, and/or data and/or information contained in the recharging account and/or refueling account use alert message, and the recharging account and/or refueling account use alert message, to the central processing computer/distributed ledger/Blockchain technology system 10, for storage in the distributed ledger/Blockchain technology system 12 of the same and/or for storage in the database 11H of the central processing computer 11 of the same. Thereafter, the operation of the apparatus 100 will cease at step 1007.

In another preferred embodiment, the apparatus 100 and methods of the present invention can be utilized in trip planning or travel planning so as to plan a travel route, of any distance, from a point of origin to a destination. In a preferred embodiment, the apparatus 100 can process information for planning, and can identify, a travel route or a navigation route which provides for electric vehicle and/or hybrid vehicle battery recharging and/or fuel cell fuel refueling along the travel route or navigation route. In this regard, the apparatus 100 of the present invention can continuously and/or automatically monitor, and/or can determine or ascertain, the charge state or charge level of the battery or batteries of the electric vehicle or hybrid vehicle and/or the fuel cell fuel amount or fuel cell of the fuel cell or fuel cells in the electric vehicle or hybrid vehicle, can detect a need for recharging the battery or batteries of the electric vehicle or hybrid vehicle, and/or can detect a need to refuel a fuel cell or fuel cells of the electric vehicle or hybrid vehicle.

Once a need for recharging the battery or batteries of the electric vehicle or hybrid vehicle, and/or a need to refuel a fuel cell or fuel cells of the electric vehicle or hybrid vehicle, is detected, the apparatus 100 can identify a battery recharging facility or venue and/or fuel cell refueling facility or venue, within the range of travel remaining for the vehicle, identify a travel route the battery recharging facility or venue and/or fuel cell refueling facility or venue, and provide, via the vehicle computer 30, navigation information, navigation instructions, or driving directions to the battery recharging facility or venue and/or fuel cell refueling facility or venue.

In a preferred embodiment, the apparatus 100 of the present invention can repeat the above process to direct the vehicle operator to a next battery recharging facility or venue and/or fuel cell refueling facility or venue on the way to the destination, and the above process can be repeated until the vehicle reached the destination.

In another preferred embodiment, the apparatus 100 of the present invention can recharge a battery or batteries of an electric vehicle or a hybrid vehicle with or using a mobile recharging vehicle/drone 70G of, or associated with, an electric road/vehicle recharging system(s) 70, which mobile recharging vehicle, in a preferred embodiment, can be a an automobile or a truck, or any other land vehicle, or a drone, which can be deployed to meet the vehicle and to provide stationary charging at any location. In a preferred embodiment, the mobile recharging vehicle/drone 70G can provide moving or in-motion plug-in recharging via a tether while both the vehicle and the mobile recharging vehicle/drone 70G can travel next to each other, or while a drone mobile recharging vehicle/drone 70G can land atop the vehicle, and/or the apparatus 100 can provide moving or in-motion inductive charging with or using a mobile recharging vehicle/drone 70G which can be equipped with an eroad inductive charging system/inductive coil system 70C and the eroad/roadside inductive charging coil(s) 70D, and/or can provide moving or in-motion electric road electrified rail contact battery recharging with a mobile recharging vehicle/drone 70G which is equipped with an eroad electric rail contact charging system 70E and/or the eroad charging rail/conductor 70F of the same. In a preferred embodiment, the mobile recharging vehicle/drone 70G can also provide fuel cell refueling of the vehicle's fuel cell or fuel cells.

In a preferred embodiment, the apparatus 100, the vehicle computer 30, the central processing computer 11, and/or the navigation information computer 50, can all be programmed to perform any and/or all of the above-described and/or herein-described processing routines, operations, and/or functions and/or functionalities. In a preferred embodiment, the apparatus 100, the vehicle computer 30, the central processing computer 11, and/or the navigation information computer 50, can all be programmed to perform any and/or all of the above-described and/or herein-described processing routines, operations, and/or functions and/or functionalities, described herein in the preferred embodiments of FIG. 10 and FIGS. 11A and 11B.

Figure 11A:
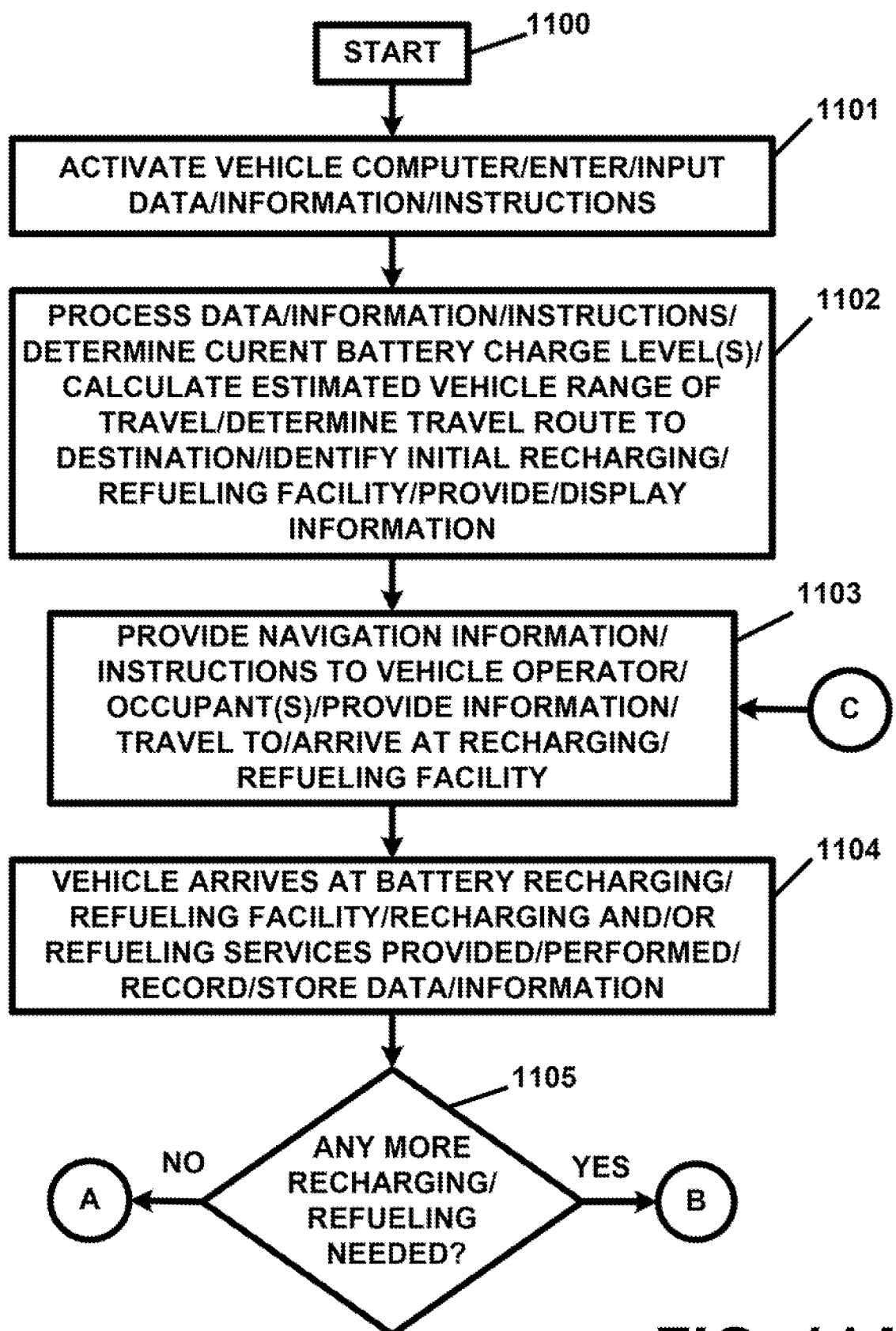
FIGS. 11A and 11B illustrate another preferred embodiment method for utilizing the apparatus of the present invention, in flow diagram form.
Figure 11B:
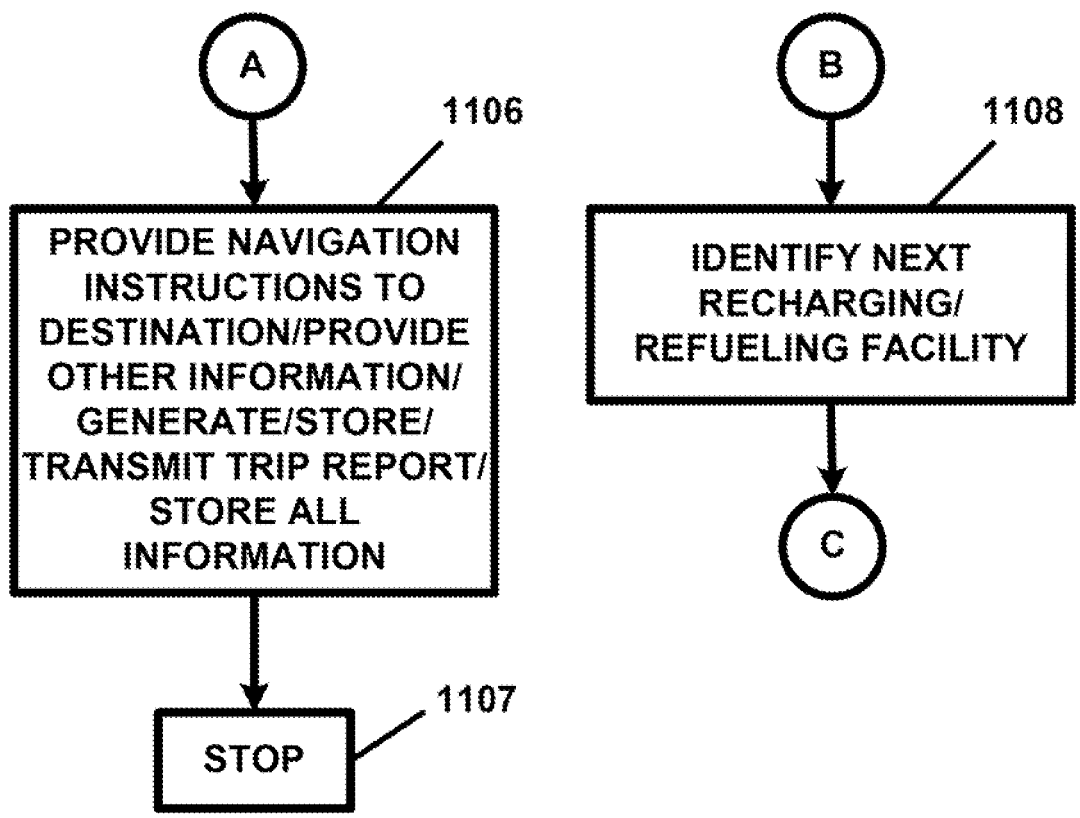

FIGS. 11A and 11B illustrate another preferred embodiment method of utilizing the apparatus 100 of the present invention, in flow diagram form. With reference to FIGS. 11A and 11B, the operation of the apparatus 100 commences at step 1100. At step 1101, the owner or operator of the electric vehicle or the hybrid vehicle (hereinafter referred to as "vehicle" in the description of the embodiment of FIGS. 11A and 11B) can activate the vehicle computer 30 of the vehicle. At and during step 1101, in a preferred embodiment, any and/or all data and/or information, and/or commands or instructions, which are described herein as being entered by the vehicle owner or operator at and during step 1101 can be entered via the user input device 30D.

At step 1101, the owner or operator can enter destination information for or regarding the destination or address to which he or she wants to travel in the vehicle. At step 1101, the owner or operator can also select to have the vehicle computer 30 manage the battery 40B or batteries 40B, and/or the fuel cell 40H or view cells 40H, of the vehicle for the entire trip to a destination. In this regard, the owner or operator can select to have the vehicle computer 30 manage the vehicle battery management system, which vehicle battery power management system monitors and/controls the charge level or charge state for the battery 40B or batteries 40B of the vehicle and/or the fuel level and/or operating state of the fuel cell 40H or fuel cells 40H of the vehicle. At step 1101, in another preferred embodiment, the owner or operator can select to have the have the vehicle computer 30 manage and/or control the battery 40B or batteries 40B, and/or the fuel cell 40H or view cells 40H, and/or the vehicle battery power management system for the entire trip to a destination, or for only a portion of the trip to the destination. In a preferred embodiment, for vehicles having self-driving capabilities and/or autonomous driving capabilities, the vehicle owner or operator can select to have the vehicle computer 30 control and operate the vehicle in self-driving mode or in autonomous driving mode in and/or while traveling to the destination. At step 1101, the vehicle owner or operator can also request that the vehicle computer 30 provide navigation information or navigation instructions, driving instructions, and/or travel route instructions and/or information, and/or any one or more of traffic information, weather information, news information, public safety information, and/or any video and/or audio information regarding the travel route, and/or any other information, to the vehicle owner or operator, and/or any vehicle occupants, during the entire trip, or any portion of the trip, to the destination.

At step 1101, the vehicle owner or operator can also request that the vehicle computer 30 seek and/or obtain recharging services of and for the vehicle battery 40B or the vehicle batteries 40B when the charge of the same, or of each of the same reaches, or drops to, a certain pre-specified level (hereinafter the "pre-specified recharging charge level"). In a preferred embodiment, the pre-specified recharging charge level can be selected to be any level, such as, for example, but not limited to 50% charge, 25% charge, 10% charge, or any other charge level. In a similar manner, at step 1101, the vehicle owner or operator can also request that the vehicle computer 30 seek and/or obtain refueling for the vehicle fuel cell 40H or the vehicle fuel cells 40H when the fuel level for the same, or for each of the same, reaches, or drops to, a certain pre-specified level (hereinafter the "pre-specified refueling level"). In a preferred embodiment, the pre-specified refueling level can be selected to be any level, such as, for example, but not limited to 50% full, 25% full, 10% full, or any other fuel cell fuel level.

In another preferred embodiment, at step 1101, the vehicle owner or operator can also perform any and/or all of the information entry, vehicle computer 30 programming, and/or any of the other activities or operations, described above as occurring during step 1101 remotely with and/or by using a user communication device 20. In such an embodiment, the vehicle owner or operator can, with and/or using his, her, or any appropriate, user communication device 20, access the vehicle computer 30 via the Internet and/or the World Wide Web, or via any other communication network or system, and transmit any and/or all pertinent data and/or information, and/or commands or instructions, to the vehicle computer 30. At step 1101, the vehicle computer 20 can receive, store, and process, any and/or all data and/or information, and/or commands or instructions, which are transmitted from the user communication device 20 at step 1101.

At step 1101, the vehicle computer 30 can store, record, and/or process, any and/or all data and/or information, and/or commands or instructions, which were entered via the user input device 20E and/or which were transmitted from the user communication device 20 at step 1101.

At step 1102, the vehicle computer 30 can process any and/or all information entered at step 1102. In a preferred embodiment, the vehicle computer 30 can also ascertain or determine the current charge level of the vehicle battery 40B or each of the vehicle batteries 40B and/or the vehicle computer can ascertain the current fuel cell fuel level for the vehicle's fuel cell 40H or each of the vehicle's fuel cells 40H. In this regard, at step 1102, vehicle computer 30 can process any data and/or information for determining the charge state of the vehicle battery 40B or for determining the charge state of each battery of the vehicle batteries 40B. At step 1102, the vehicle computer 30 can also process data and/or information for determining the fuel cell fuel level or amount of the vehicle fuel cell 40H or for determining the fuel cell fuel level or amount for each fuel cell of the vehicle's fuel cells 40H.

At step 1002, the vehicle computer 30 can also calculate or determine the estimated range of travel of the vehicle for the determined charge level of the battery 40B or for the determined charge levels of the batteries 40B, and/or can determine the estimated range of travel of the vehicle for the determined fuel level or amount of the fuel cell 40H or for the determined fuel level or amount for each of the fuel cells 40H. At step 1102, data and/or information regarding the determined or ascertained charge state of the battery 40B or for battery of the vehicle batteries 40B, data and/or information regarding the fuel cell fuel level or amount for the vehicle fuel cell 40H or for each fuel cell of the vehicle's fuel cells 40H, and/or the calculated or determined estimated range of travel of the vehicle, can be displayed via the display device 30H, or can be output via a speaker component of the output device 30H.

At step 1102, the vehicle computer 30 can, using any and/or all of the data and/or information recorded and/or stored at step 1101, and/or using any and/or all data and/or information processed or ascertained at step 1102, and/or any other data and/or information, including any needed or required navigation information stored in the databases 30H of the vehicle computer 30, or obtained by the vehicle computer 30 from the central processing computer 11, and/or the navigation information computer 50, at and during step 1102, determine or calculate a travel route to the destination. At step 1102, and using information regarding the current charge level of the vehicle battery 40B or each of the vehicle batteries 40, and/or using information regarding the current fuel cell fuel level of the fuel in fuel cell 40H or in each of fuel cells 40H, and/or using the estimated range of travel for the vehicle, and/or using the pre-specified recharging charge level for the battery 40B or batteries 40B, and/or the pre-specified refueling level for the fuel cell 40H or fuel cells 40H, the vehicle computer 30 can identify an initial or first battery recharging facility or venue and/or a fuel cell fuel refueling facility or venue on or near the determined travel route to the destination.

Any and/or all data and/or information regarding the travel route selected and/or the initial or first battery recharging facility or venue and/or a fuel cell fuel refueling facility or venue can also be provided via the vehicle computer 30, such as by being displayed via the display device 30E or by being output via the speaker of the output device 30I.

At step 1102, the vehicle owner or operator can also be provided, via the vehicle computer 30, such as by being displayed via the display device 30E or by being output via the speaker of the output device 30I, with any information regarding the vehicle, information regarding battery 40B charge level, the charge level(s) for each of the vehicle's batteries 40B, the fuel cell fuel level for fuel cell 40H, the fuel cell fuel level(s) for each of the vehicle's, the vehicle's estimate driving range before battery recharging and/or before fuel cell refueling, navigation instructions and/or information, travel route information, and/or any traffic information, weather information, news information, public safety information, and/or any video and/or audio information, regarding the travel route, and/or any pictures, photographs, or video information, obtained via any of the cameras 80C of the video camera monitoring system 80 which relate to travel route or which relate to any portion of the travel route, and/or which relate to the travel route to the first, initial, or a next, battery recharging facility or venue and/or a fuel cell fuel refueling facility or venue, to which the vehicle is traveling.

At step 1103, the vehicle computer 30 can provide the vehicle owner or operator with navigation information and/or navigation instructions, via the vehicle computer 30, such as by being displayed via the display device 30E or by being output via the speaker of the output device 30I, to the initial or first battery recharging facility or venue and/or a fuel cell fuel refueling facility or venue on or near the determined travel route to the destination. At and during step 1103, the vehicle can be driven, and, in the case of the vehicle being a self-driving vehicle or autonomous vehicle, the vehicle computer 30 can control the driving and/or operation of the vehicle, to the initial or first battery recharging facility or venue and/or a fuel cell fuel refueling facility or venue. At any and/or all times during the vehicle's travels, at and during step 1103, the vehicle owner or operator can also be provided, via the vehicle computer 30, such as by being displayed via the display device 30E or by being output via the speaker of the output device 30I, with any information regarding the vehicle, information regarding battery 40B charge level, the charge level(s) for each of the vehicle's batteries 40B, the fuel cell fuel level for fuel cell 40H, the fuel cell fuel level(s) for each of the vehicle's, the vehicle's estimate driving range before battery recharging and/or before fuel cell refueling, navigation instructions and/or information, travel route information, and/or any traffic information, weather information, news information, public safety information, and/or any video and/or audio information, regarding the travel route, and/or any pictures, photographs, or video information, obtained via any of the cameras 80C of the video camera monitoring system 80 which relate to travel route or which relate to any portion of the travel route, and/or which relate to the travel route to the first, initial, or a next, battery recharging facility or venue and/or a fuel cell fuel refueling facility or venue, to which the vehicle is traveling. At step 1103, the vehicle can be driven to, and can arrive at, the battery recharging facility or venue and/or a fuel cell fuel refueling facility or venue.

At step 1104, the vehicle battery 40B and/or each of the vehicle batteries 40B, or any of the vehicle batteries 40B can be recharged using any of the battery recharging equipment and/or methods described herein as being utilized at and during step 1005 of the embodiment of FIG. 10. In this regard, the vehicle battery 40B, or each of, or any of, the vehicle's batteries 40B, can be recharged by and/or using any of the herein-described plug-in power system 70B, and/or any of the eroad inductive charging system/inductive coil system 70C and/or eroad/road/roadside inductive charging coil(s) 70D of the same, and/or any of the eroad electric rail contact charging system 70E and/or eroad charging rail/conductor 70F of the same, equipment of the battery recharging facility or venue and/or a fuel cell fuel refueling facility or venue. At step 1104, the fuel cell 40H or fuel cells can also be refueled by and/or using vehicle fuel cell/fuel dispensing system 70H with fuel cell fuel which is stored in the fuel cell fuel tank(s) 70I. Applicant hereby incorporates by reference herein the subject matter and teachings of the description of the preferred embodiment of FIG. 10 and of step 1005 thereof. In a preferred embodiment, any activity or operation, and/or any data and/or information obtained, which is described herein as be provided or performed by or with, and/or as being obtained by, the apparatus 100, and/or by or with the vehicle computer 30, and/or by or with electric road/vehicle recharging system computer 60, and/or by or with the electric road/vehicle recharging system(s) 70 of the battery recharging facility or venue and/or fuel cell refueling facility or venue, and/or by or with the plug-in power system 70B, and/or by or with the eroad inductive charging system/inductive coil system 70C and/or eroad/road/roadside inductive charging coil(s) 70D of the same, and/or by or with the eroad electric rail contact charging system 70E and/or eroad charging rail/conductor 70F of the same, and/or by or with the vehicle fuel cell/fuel dispensing system 70H, at and during step 1005 of the embodiment of FIG. 10 can also be respectively provided or performed, or obtained, by the apparatus 100 at and during step 1104 of the preferred embodiment of FIGS. 11A and 11B. In this regard, and activity, operation, or data and/or information obtained, which is described as being performed at or during step 1005 of the embodiment of FIG. 10 can also be performed, in same, a similar, and/or analogous, manner, by and/or with the apparatus 100 and the various computers, communication, devices, systems, components, or devices, 10, 11, 12, 20, 30, 40, 50, 60, 70, 80, 90, and/or 95, and/or by any of the respective components of the computers, communication, devices, systems, components, or devices, 10, 11, 12, 20, 30, 40, 50, 60, 70, 80, 90, and/or 95.

At step 1104, the electric road/vehicle recharging system computer 60 of the battery recharging facility or venue and/or fuel cell refueling facility or venue can process information regarding any of the vehicle battery recharging activities or services provided or performed, or which took place, at or during step 1104, and/or the electric road/vehicle recharging system computer 60 can process information regarding any of the vehicle fuel cell refueling activities or services provided or performed, or which took place, at or during step 1104, and can generate a recharging and/or refueling activity report which can include information identifying the battery recharging facility or venue and/or fuel cell refueling facility or venue, the recharging and/or refueling serviced provided or performed, identification information regarding the vehicle, and/or the charges for products and/or services provided or performed. At step 1104, the electric road/vehicle recharging system computer 60 can also process any financial transaction involving the vehicle's recharging account and/or refueling account, and can store any information regarding the same in the databases 60H.

At step 1104, the electric road/vehicle recharging system computer 60 can also generate a recharging account and/or refueling account use alert message and can transmit the same to the user communication device 20 of or associated with the registered owner or operator of the vehicle. At step 1104, in a preferred embodiment, the electric road/vehicle recharging system computer 60 can also transmit the same to the vehicle computer 30 of the vehicle which was serviced by the electric road/vehicle recharging system(s) 70 at and during step 1104. In a preferred, the registered owner or operator of the vehicle can view and/or review the recharging account and/or refueling account use alert message via the display device 20E of the user communication device 20 and/or the vehicle operator and/or an occupant can view and/or review the recharging account and/or refueling account use alert message via the display device 30E of the vehicle computer 30.

In a preferred embodiment, at step 1104, the electric road/vehicle recharging system computer 60 can store any and/or all data and/or information regarding any and/or all of the battery recharging activities or services provided or performed, or which took place, and/or any and/or all fuel cell refueling activities or services provided or performed, or which took place, during step 1004, any data and/or information contained in the recharging and/or refueling activity report, the recharging and/or refueling activity report, any data and/or information regarding any financial transaction processed as well as processed on, with, or involving, the vehicle's recharging account and/or refueling account, and/or data and/or information contained in the recharging account and/or refueling account use alert message, and the recharging account and/or refueling account use alert message, in the database 60H.

In a preferred embodiment, at step 1104, the electric road/vehicle recharging system computer 60 can also transmit any and/or all data and/or information regarding any and/or all of the battery recharging activities or services provided or performed, or which took place, and/or any and/or all fuel cell refueling activities or services provided or performed, or which took place, during step 1104, any data and/or information contained in the recharging and/or refueling activity report, the recharging and/or refueling activity report, any data and/or information regarding any financial transaction processed as well as processed on, with, or involving, the vehicle's recharging account and/or refueling account, and/or data and/or information contained in the recharging account and/or refueling account use alert message, and the recharging account and/or refueling account use alert message, to the central processing computer/distributed ledger/Blockchain technology system 10, for storage in the distributed ledger/Blockchain technology system 12 of the same and/or for storage in the database 11H of the central processing computer 11 of the same. Thereafter, the operation of the apparatus 100 will proceed to step 1105

At step 1105, the vehicle computer 30 can process information regarding whether or not any additional battery recharging service is or may be needed before the vehicle is expected to arrive at the destination, and/or whether or not any additional fuel cell refueling service is or may be needed before the vehicle is expected to arrive at the destination. If, at step 1105, it is determined that no additional battery recharging service and/or that no additional fuel cell refueling service will be needed before the vehicle arrives at the destination, then the operation of the apparatus 100 will proceed to step 1106.

At step 1106, as at and during step 1103, the vehicle computer 30 can provide the vehicle owner or operator with navigation information and/or navigation instructions, along with any other of the herein-described information, via the vehicle computer 30, such as by being displayed via the display device 30E or by being output via the speaker of the output device 30I, to the destination. At and during step 1106, the vehicle can be driven, and, in the case of the vehicle being a self-driving vehicle or autonomous vehicle, the vehicle computer 30 can control the driving and/or operation of the vehicle, to the destination. At any and/or all times during the vehicle's travels, at and during step 1106, the vehicle owner or operator can also be provided, via the vehicle computer 30, such as by being displayed via the display device 30E or by being output via the speaker of the output device 30I, with any information regarding the vehicle, information regarding battery 40B charge level, the charge level(s) for each of the vehicle's batteries 40B, the fuel cell fuel level for fuel cell 40H, the fuel cell fuel level(s) for each of the vehicle's, the vehicle's estimate driving range before battery recharging and/or before fuel cell refueling, navigation instructions and/or information, travel route information, and/or any traffic information, weather information, news information, public safety information, and/or any video and/or audio information, regarding the travel route, and/or any pictures, photographs, or video information, obtained via any of the cameras 80C of the video camera monitoring system 80 which relate to travel route or which relate to any portion of the travel route, and/or which relate to the travel route to the destination.

At step 1106, the vehicle can be driven to, and can arrive at, the destination. Once the vehicle arrives at the destination, the vehicle computer 30 can process any data and/or information regarding the vehicle's travels, from the point or place of origin of the trip to the trip's destination can generate a trip report. In a preferred embodiment, the trip report, can contain any data and/or information regarding the trip, such as, but limited to, start date and time, end date and time, travel route(s) used, navigation routes used, trip mileage, trip time, recharging services used, refueling products and/or service used, and/or any other information pertinent to the vehicle's operation during the trip to the destination and/or the trip itself.

At step 1106, the vehicle computer 30 can store the trip report in the database 30H, and/or can transmit the trip report to the user communication device 20 of or associated with the vehicle owner or operator. In a preferred embodiment, the trip report, and/or any information contained therein, can be transmitted, from the vehicle computer 30 to, to the central processing computer/distributed ledger/Blockchain technology system 10, for storage of the trip report, or any data and/or information contained therein, in the distributed ledger/Blockchain technology system 12 of the central processing computer/distributed ledger/Blockchain technology system 10 and/or for storage in the database 11H of the central processing computer 11 of the same. Thereafter, the operation of the apparatus 100 will cease at step 1107.

If, however, at step 1105, it is determined that an additional battery recharging service and/or that an additional fuel cell refueling service will be needed before the vehicle arrives at the destination, then the operation of the apparatus 100 will proceed to step 1108, and the vehicle computer 30 can identify a next battery recharging facility or venue and/or fuel cell refueling facility or venue. Thereafter, the operation of the apparatus 100 will proceed to step 1103 and the vehicle computer 30 can provide the vehicle owner or operator with navigation instructions, via the vehicle computer 30, such as by being displayed via the display device 30E or by being output via the speaker of the output device 30I, to the next battery recharging facility or venue and/or fuel cell refueling facility or venue, and the vehicle can be driven, and, in the case of the vehicle being a self-driving vehicle or autonomous vehicle, the vehicle computer 30 can control the driving and/or operation of the vehicle, to the destination next battery recharging facility or venue and/or fuel cell refueling facility or venue.

Thereafter, the apparatus 100 will continue operating from and during step 1103 and the apparatus will repeat the herein-described operations(s) at and during steps 1104 and 1105 until the vehicle computer 30 determines that no additional fuel cell refueling service and/or that no additional fuel cell refueling service will be needed before the vehicle arrives at the destination.

In another preferred embodiment of FIGS. 11A and 11B, at any time and/or for any reason during steps 1101, 1102, 1103, and/or 1104, the vehicle computer 30, and/or or the vehicle owner or operator using the vehicle computer 30 and/or his or her user communication device 20, can order or request battery recharging servicing and/or fuel cell fuel refueling servicing by a mobile recharging vehicle/drone 70G, which a mobile recharging vehicle/drone 70G can be associated with any electric road/vehicle recharging system(s) 70 and/or which be an independently operated electric road/vehicle recharging system(s) 70.

In such a preferred embodiment, the vehicle and/or the mobile recharging vehicle/drone 70G can be equipped with an interface(s) or mounting equipment for allowing the drone mobile recharging vehicle/drone 70G to land on, and/or to or mate up with, or to dock up with, or onto, the vehicle in order to perform any suitable plug-in battery recharging operation, any inductive battery recharging operation, and/or any contact rail or conductor battery recharging operation, and/or any fuel cell refueling operation. In a preferred embodiment, the drone mobile recharging vehicle/drone 70G can be used to recharge a battery 40B or batteries 40B and/or can refuel a fuel cell 40H or fuel cells 40H while the vehicle is stationary and/or while in motion while driving.

In another preferred embodiment, a land vehicle can be used as a mobile recharging vehicle/drone 70G. In a preferred embodiment, the vehicle and/or the mobile recharging vehicle/drone 70G can be equipped with an interface(s) or mounting equipment for allowing the land vehicle mobile recharging vehicle/drone 70G to mate up with, or to dock up with, or onto, the vehicle, and/or to otherwise allow the land vehicle mobile recharging vehicle/drone 70G to interface with, interact with, park alongside, or travel alongside while in motion along with, vehicle in order to perform any suitable plug-in battery recharging operation, any inductive battery recharging operation, and/or any contact rail or conductor battery recharging operation, and/or any fuel cell refueling operation. In a preferred embodiment, the land vehicle mobile recharging vehicle/drone 70G can be used to recharge a battery 40B or batteries 40B and/or can refuel a fuel cell 40H or fuel cells 40H while the vehicle is stationary and/or while in motion while driving.

In any and/or all of the embodiments described herein, the vehicle owner or operator can, at any time during the operation of the apparatus 100 of the preferred embodiments of FIGS. 11A and 11B and/or FIG. 10, change the destination to which the vehicle is to travel. In such an instance, the vehicle computer 30 can process any and/or all of the herein-described data and/or information so as to provide to travel to the new destination. In any and/or all of the embodiments described herein, the vehicle owner or operator can, at any time during the operation of the apparatus 100 of the preferred embodiments of FIGS. 11A and 11B and/or FIG. 10, change the pre-specified recharging charge level of and for the vehicle battery 40B or the vehicle batteries 40B and/or can change the pre-specified refueling level for the vehicle fuel cell 40H or the vehicle fuel cells 40H.

In any and/or all of the embodiments described herein, any electric vehicle or hybrid vehicle described herein can be equipped both a vehicle battery 40B, or any number of vehicle batteries 40B, and can also be equipped with a vehicle fuel cell 40H or any number of vehicle fuel cells 40H. The vehicle fuel cell(s) 40H can provide power for any purpose and/or can serve as a back-up power source, and/or as an alternate power source, to and/or the vehicle battery 40B or batteries 40B. In another preferred embodiment, the vehicle need not be equipped with any fuel cell 40H or fuel cells 40H.

In another preferred embodiment, the apparatus and methods of the present invention can also be utilized to recharge the vehicle battery 40B or vehicle batteries 40B with and/or using the fuel cell 40H or fuel cells 40H of the vehicle. In a preferred embodiment, the fuel cell 40H or fuel cells 40H of the vehicle can recharge the vehicle battery 40B or batteries 40B at any time, during vehicle operation, and/or when the vehicle is not being operated.

In a preferred embodiment, the fuel cell 40H or the fuel cells 40H of the vehicle can be used to provide electrical power directly to the electric motor or electric motors of the vehicle, and/or can be used to provide electrical power to the electric motor or electric motors of the vehicle via a vehicle fuel cell interface ("I/F") and/or via a vehicle fuel cells interface ("I/F"). In a preferred embodiment, the vehicle battery 40B or the vehicle batteries 40B can be used to provide electrical power directly to the electric motor or electric motors of the vehicle, and/or can be used to provide electrical power to the electric motor or electric motors of the vehicle via a vehicle battery interface ("I/F") and/or via a vehicle batteries interface ("I/F").

In a preferred embodiment, the apparatus and methods of the present invention can be utilized to recharge the vehicle battery 40B or batteries 40B with and/or using the fuel cell 40H or fuel cells 40H of the vehicle prior to vehicle operation or vehicle electric motor operation. In a preferred embodiment, the fuel cell 40H or fuel cells 40H of the vehicle can recharge the vehicle battery 40B or batteries 40B, and/or can provide electrical power to the vehicle electric motor(s), at any time, and/or prior to vehicle operation or vehicle motor operation, during vehicle operation or vehicle electric motor operation, and/or after vehicle operation or vehicle electric motor operation.

In a preferred embodiment, the fuel cell 40H or the fuel cells 40H of the vehicle can be activated to, and can, recharge the vehicle battery 40B or vehicle batteries 40B and/or provide electrical power to the vehicle electric motor(s), at any time, and can be activated, and/or controlled, and/or deactivated, via the vehicle computer 30 and/or the input device 30D of the same, and/or can be remotely activated, and/or controlled, and/or deactivated, via the user communication device 20.

In a preferred embodiment, the vehicle fuel cell 40H or the vehicle fuel cells 40H can be of any type of kind which is suitable and/or appropriate for use in electric vehicles or hybrid vehicles. In a preferred embodiment, any suitable liquid, solid, or gaseous, fuel can be utilized as fuel for the respective vehicle fuel cell 40H or the vehicle fuel cells 40H used in a vehicle. In a preferred embodiment, the fuel cell fuel tank(s)/container 40I can be any suitable tank, container, or storage device or entity, for storing and/or for containing, and/or for delivering to the respective vehicle fuel cell 40H or the vehicle fuel cells 40H, the fuel or fuels which can be used as fuel in the respective vehicle fuel cell 40H or the respective vehicle fuel cells 40H. In a preferred embodiment, the vehicle fuel cell 40H or the vehicle fuel cells 40H can, among other uses, be utilized in order to provide a back-up power source for electric vehicle or hybrid vehicle operation, can be utilized along with, and/or in conjunction with, the vehicle battery 40B or vehicle batteries 40B, so as to conserve battery charge levels, and/or can serve as an emergency power source in the event that access to an electrical battery recharging facility is not readily available.

In a preferred embodiment, the vehicle battery/recharging system 40 and, and in particular, the plug-in recharging system 40C, can also be equipped with solar panels which can be located on the hood, roof, trunk, or side(s), of the electric vehicle or the hybrid vehicle, and/or can include a rotational recharging system which can include one or more alternators or generators, or any combination of the same, which can be driven by the rotation of the axle(s), wheel(s), or any other rotating component(s) and/or a specially situated air driven propeller(s), of the electric vehicle or hybrid vehicle.

Applicant incorporates by reference herein the subject matter and teachings of U.S. Provisional Patent Application Ser. No. 63/149,530, filed Feb. 15, 2021, and entitled "Battery Power Management Apparatus And Method", the subject matter and teachings of which are incorporated by reference herein in their entirety. Applicant further incorporates by reference herein the subject matter and teachings of FIGS. 10A and 10B, and the written description corresponding to the same, and the teachings regarding the vehicle battery recharging system and technique disclosed therein, of U.S. Provisional Patent Application Ser. No. 63/149,530, filed Feb. 15, 2021, and entitled "Battery Power Management Apparatus And Method", the subject matter and teachings of which are incorporated by reference herein in their entirety.

In a preferred embodiment, the solar panels and the rotational recharging system are described as being components of the plug-in recharging system. In another preferred embodiment, however, the solar panels and the rotational recharging system can be separate and apart from the plug-in recharging system, and/or can be stand alone, and separate and distinct, components of the vehicle battery/recharging system.

Figure 12:
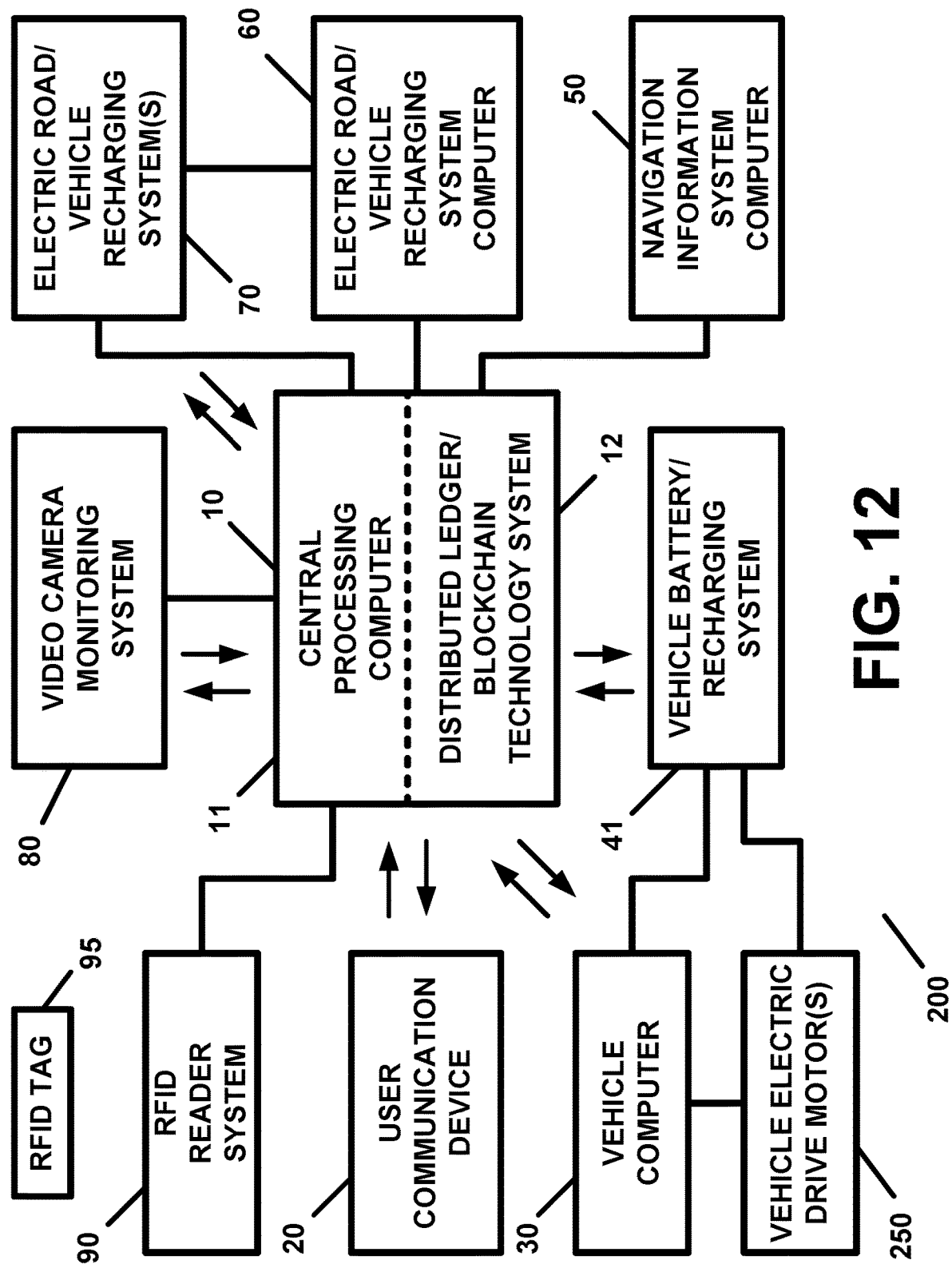
FIG. 12 illustrates another preferred embodiment of the apparatus of the present invention, in block diagram form.

FIG. 12 illustrates another preferred embodiment of the apparatus of the present invention, which is denoted generally by the reference numeral 200, in block diagram form. With reference to FIG. 12, the apparatus 200 includes the components 10, 11, 12, 20, 30, 50, 60, 70, 80, 90, and 95, of the apparatus 100 of FIG. 1, and further includes the vehicle electric drive motor 250 or the vehicle electric drive motors 250 (hereinafter referred to as vehicle electric drive motor(s) 250") of the electric vehicle or the hybrid vehicle, and a vehicle battery/recharging system 41.

With reference once again the FIG. 12, in a preferred embodiment, the vehicle battery/recharging system 41 is connected to, or linked with, the vehicle computer 30 as shown in FIG. 12. In a preferred embodiment, the vehicle computer 30 can control and/or can monitor the operation of the vehicle battery/recharging system 41. In a preferred embodiment, the vehicle battery/recharging system 41 can be located in, on, or at, the vehicle. In another preferred embodiment, the battery/recharging system 41 can also be located remote from, and/or can be separate and apart from, the vehicle, and/or can be linked to, or connected to or with, the vehicle, the vehicle computer 30, and/or the central processing computer/distributed ledger/Blockchain technology system 10, via a wired connection and/or a wireless connection, and/or via any combination of a wired and/or a wireless connection.

With reference once again the FIG. 12, in a preferred embodiment, the vehicle battery/recharging system 41 is connected to, or linked with, the vehicle electric drive motor(s) 250 as shown in FIG. 12. In the preferred embodiment, the vehicle battery/recharging system 41 can provide electrical power to the vehicle electric drive motor(s) 250, directly and/or indirectly via any suitable interface ("I/F") so as to activate, and/or to control, and/or to monitor, and/or so as to provide electrical power to drive and/or control the operation of, the electric drive motor(s) 250 of the electric vehicle or hybrid vehicle. In a preferred embodiment, the vehicle computer 30 is also connected to, or linked with, the electric drive motor(s) 250 and can activate, control an operation of, and/or monitor an operation of, the electric drive motor(s) 250.

Figure 13:
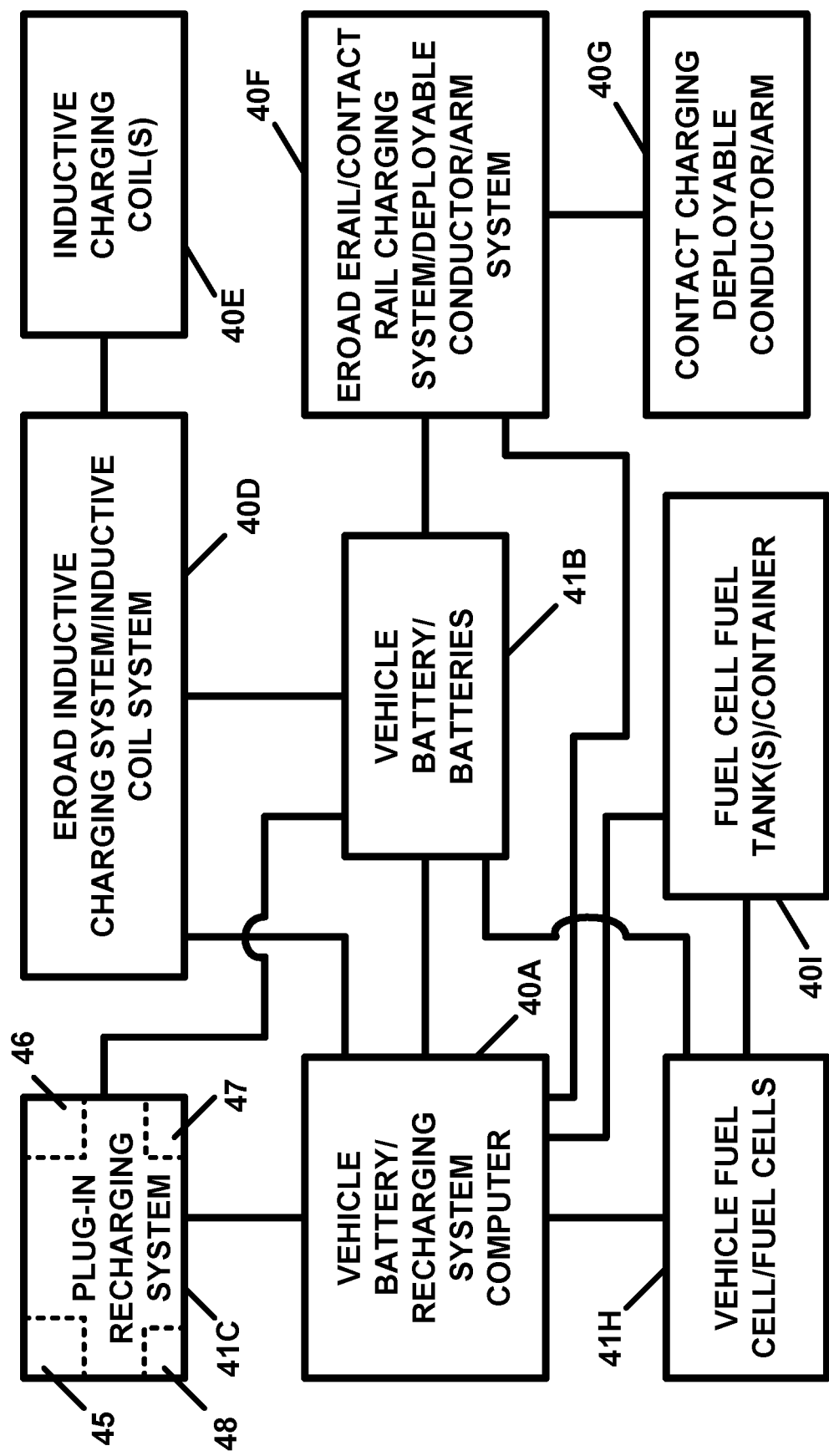
FIG. 13 illustrates the vehicle battery/recharging system of FIG. 12, in block diagram form.

FIG. 13 illustrates the vehicle battery/recharging system 41 of the apparatus 200 of FIG. 12. With reference to FIG. 13, the vehicle battery/recharging system 41 includes the components 40A, 40D, 40E, 40F, 40G, and 40I, of the vehicle battery/recharging system 40 of FIG. 5, and also includes the vehicle battery/batteries 41, the vehicle fuel cell/fuel cells 41H, and a plug-in recharging system 41C. In a preferred embodiment, the plug-in recharging system 41C includes all of the components and devices of the plug-in recharging system 40C, and further includes any suitable plug or receptacle 45 (hereinafter "plug or receptacle 45"), which can be used for effectuating plug-in vehicle battery charging or recharging in conjunction with an external battery charging or recharging device which can be, or which can include, any suitable plug-in type recharging device, a mobile device, a drone which can effectuate vehicle battery charging or recharging, and/or any other suitable vehicle battery charging or recharging device.

In a preferred embodiment, the plug-in recharging system 41C can also include a solar panel or system of solar panels 46 (hereinafter "solar panel(s) 46"), which can be located on the exterior of the electric vehicle or hybrid vehicle at any suitable location at or the hood, roof, trunk, or side(s), of the electric vehicle or hybrid vehicle, and/or at or on any other suitable location of or on the electric vehicle or hybrid vehicle, and which can generate electrical power from sunlight or any other light source or lighting source. In a preferred embodiment, electrical power generated by the solar panel(s) 46 can be input into the plug-in recharging system 41C via a plug and receptacle system and/or via a hard-wired system or configuration.

In a preferred embodiment, the plug-in recharging system 41C can also include mounting hardware and/or mating hardware 47 (hereinafter referred to as "mounting/mating hardware 47"), which can be any suitable or appropriate hardware or collection of hardware, for effectuating the mounting and/or the mating of any suitable charging or recharging device, such as, but not limited to, any suitable stationary or mobile charging or recharging equipment, or a mobile charging or recharging drone, with or on the electric vehicle or the hybrid vehicle, so as to facilitate the charging or recharging of the vehicle battery/batteries 41B of the same. In this manner, in a preferred embodiment, a charging or recharging drone can travel to, or can fly to, the respective electric vehicle or the hybrid vehicle, and can land on and/or attach itself to, mount, or mate with, the same using any appropriate mounting/mating hardware 47.

In a preferred embodiment, the plug-in recharging system 41C also includes a rotational recharging system 48 which can include one or more alternators or generators, or any combination of the same, which can be driven by the rotation of the axle(s), wheel(s), or any other rotating component(s), or any specially situated air driven propeller(s), of the electric vehicle or hybrid vehicle, which can be used in order to generate electrical power which can be used to recharge the vehicle battery/batteries 41B.

In a preferred embodiment, the charging or recharging drone can include, at the very least, and in addition to its required equipment, a charging or recharging power source, and mating/mounting hardware of its own for facilitating its landing onto, mounting on, or mating with, the mounting/mating hardware 47 of the electric vehicle or hybrid vehicle and/or of the plug-in recharging system 41C. In a preferred embodiment, any other type of suitable charging or recharging device can also connect to or mate with the mounting/mating hardware 47.

In a preferred embodiment, the charging or recharging drone, or any other suitable charging or recharging device can charge or recharge the vehicle battery/batteries 40B, via a plug-in charging or recharging method or technique, such as by plugging in an electrical connector or line of the drone or other device into the plug-in recharging system 41C. In another preferred embodiment, the drone or other suitable charging or recharging device can also charge or recharge the vehicle battery/batteries 41B via any other contact charging or recharging method or technique. In another preferred embodiment, the drone or other suitable charging or recharging device can also charge or recharge the vehicle battery/batteries 41B via any inductive charging or recharging method or technique.

With reference once again to FIG. 13, the vehicle fuel cell/fuel cells 41H, in addition to being connected, or linked with or, to the vehicle battery/recharging system computer 40A and to or with the fuel cell fuel tank(s)/container 40I, is/are also connected to, or linked with or to, the vehicle battery/batteries 41B, and, in a preferred embodiment, can provide electrical power directly to, or indirectly via an interface ("I/F") to, the vehicle battery/batteries 41B, so as to charge or to recharge the vehicle battery/batteries 41B, and/or so as to provide electrical power, directly and/or indirectly, to the vehicle electric drive motor(s) 250, and/or to any other electrical devices, systems, or components, of the electric vehicle or the hybrid vehicle, through and/or via, or by way of, and/or in conjunction with, the vehicle battery/batteries 41B.

In a preferred embodiment, each of the vehicle battery/batteries 41B and the vehicle fuel cell/fuel cells 41H can be used to provide electrical power, directly and/or via an interface ("I/F"), to the vehicle electric drive motor(s) 250. In such a preferred embodiment, electrical power generated by the vehicle fuel cell/fuel cells 41H can be used in order to conserve the charge level(s) in and of the vehicle battery/batteries 41B.

Figure 14:
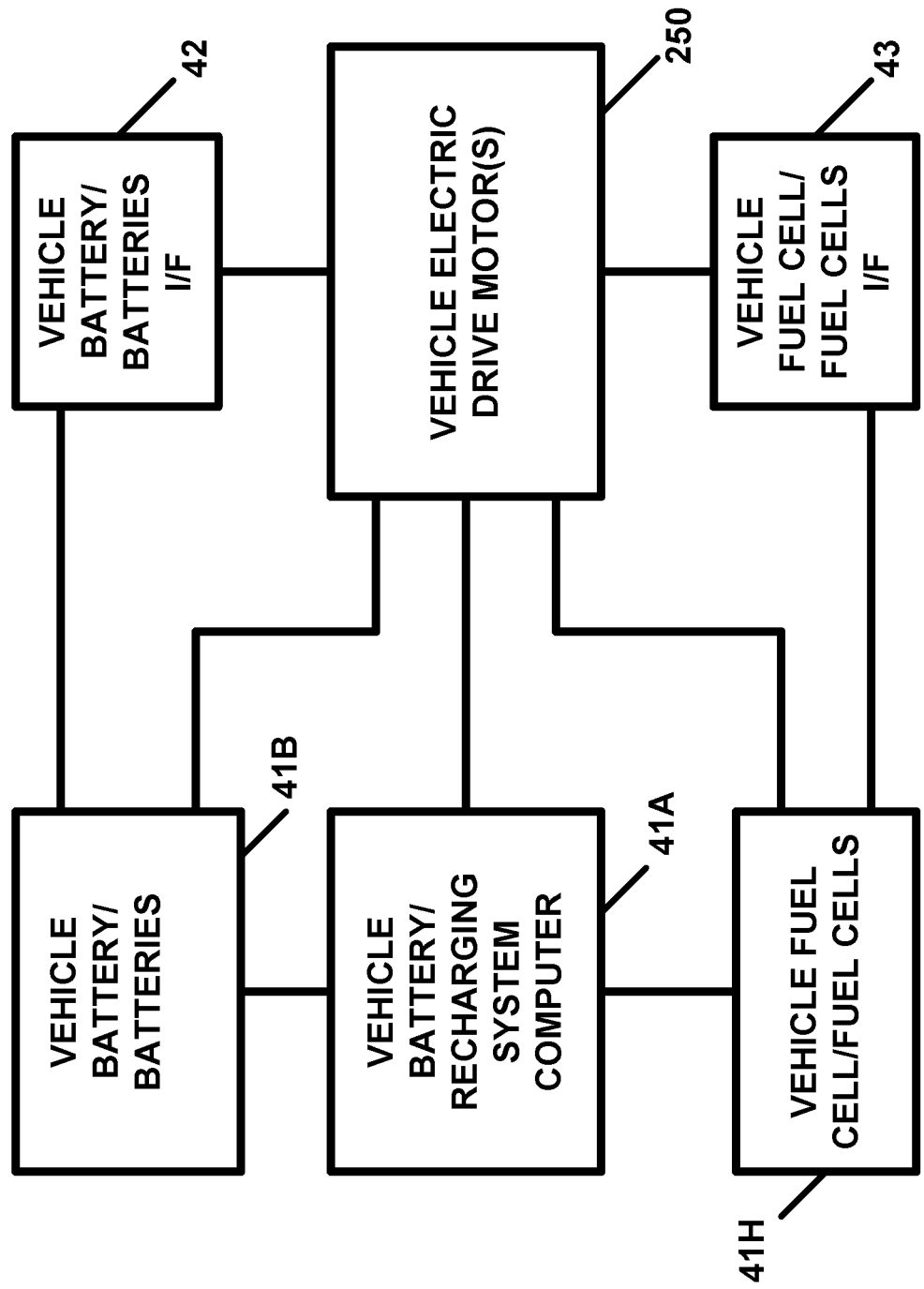
FIG. 14 illustrates a preferred embodiment configuration of a system of components which can be utilized in order to provide electrical power from the vehicle battery/batteries, from the vehicle fuel cell/fuel cells, or from both of the vehicle battery/batteries and the vehicle fuel cell/fuel cells, in block diagram form.

FIG. 14 illustrates a preferred embodiment configuration of a system of components which can be utilized to provide electrical power from the vehicle battery/batteries 41B, from the vehicle fuel cell/fuel cells 41H, or from both of the vehicle battery/batteries 41B and the vehicle fuel cell/fuel cells 41H, in block diagram form. With reference to FIG. 14, in a preferred embodiment, the vehicle battery/recharging system computer 41A of the vehicle battery/recharging system 41 is connected to each of the vehicle battery/batteries 41B, to the vehicle fuel cell/fuel cells 41H, and to the vehicle electric drive motor(s) 250 as shown. As is also shown in FIG. 14, in a preferred embodiment, the vehicle battery/batteries 41B is/are connected directly to the vehicle electric drive motor(s) 250, and the vehicle fuel cell/fuel cells 41H is/are also connected directly to the vehicle electric drive motor(s) 250. As is also shown in FIG. 14, in a preferred embodiment, the vehicle battery/batteries 41B is/are connected to the vehicle electric drive motor(s) 250 via a vehicle battery/batteries I/F 42, and the vehicle fuel cell/fuel cells 41H is/are also connected to the vehicle electric drive motor(s) 250 via the vehicle fuel cell/fuel cells I/F 43.

In the preferred embodiment of FIG. 14, the vehicle battery/batteries 41B can provide electrical power to the vehicle electric drive motor(s) 250 directly and/or via the vehicle battery/batteries I/F 42, the vehicle fuel cell/fuel cells 41H can provide electrical power to the vehicle electric drive motor(s) 250 directly and/or via the vehicle fuel cell/fuel cells I/F 43, and/or both of the vehicle battery/batteries 41B and the vehicle fuel cell/fuel cells 41H can provide electrical power, at the same time, in an alternating fashion, and/or in any combination of the same, to the vehicle electric drive motor(s) 250 directly and/or via their respective vehicle battery/batteries I/F 42 and vehicle fuel cell/fuel cells I/F 43. In this manner, in a preferred embodiment, the vehicle battery/batteries 41B and the vehicle fuel cell/fuel cells 41H can be utilized in order to conserve the charge levels of the vehicle battery/batteries 41B while providing electrical power to the vehicle electric drive motor(s) 250. In a preferred embodiment, the vehicle battery/batteries 41B and the vehicle fuel cell/fuel cells 41H can also be utilized in order to conserve the charge levels of the vehicle battery/batteries 41B while providing electrical power to the vehicle electric drive motor(s) 250 and while recharging the vehicle battery/batteries 41B with and/or using the vehicle fuel cell/fuel cells 41H.

In a preferred embodiment, the vehicle battery/recharging system computer 41A can be programmed and/or can be configured so as to activate, control, deactivate, and/or monitor, the respective operations of each of the vehicle battery/batteries 41B and the vehicle fuel cell/fuel cells 41H in order to effectuate and/or to control the operations of the same in performing any and/or all of the functions and/or functionalities described herein as being performed or provided by the apparatus and methods of the present invention.

In a preferred embodiment, the apparatus 200 can be utilized in order to activate and/or to control an operation of the vehicle fuel cell/fuel cells 41H in order to utilize the vehicle fuel cell/fuel cells 41H to recharge, or to perform a recharging operation for, the vehicle battery/batteries 41B while the electric vehicle or hybrid vehicle is in use or operational and/or when the electric vehicle or hybrid vehicle is not in use or non-operational, and/or in order to utilize the vehicle fuel cell/fuel cells 41H in order to provide or to supply electrical power to the vehicle electric drive motor(s) 250 as the sole source of electrical power to the electric drive motor(s) 250, such that only the vehicle fuel cell/fuel cells 41H are supplying electrical power to, or "driving", the vehicle electric drive motor(s) 250, and/or in order to utilize both of the vehicle fuel cell/fuel cells 41H and the vehicle battery/batteries 41B in order to provide or to supply electrical power to the vehicle electric drive motor(s) 250, so that both the vehicle fuel cell/fuel cells 41H and the vehicle battery/batteries 41B provide or supply electrical power to the vehicle electric drive motor(s) 250 simultaneously, at the same time, in an alternating fashion, or a combination of the above, or in any other appropriate manner, and/or in order to utilize the vehicle fuel cell/fuel cells 41H in order to recharge, or to perform a recharging operation for, the vehicle battery/batteries 41B while also providing or supplying electrical power to the vehicle electric drive motor(s) 250 of the electric vehicle or hybrid vehicle, simultaneously, at the same time, in an alternating fashion, in any combination of the same, or in any other appropriate manner.

Figure 15:
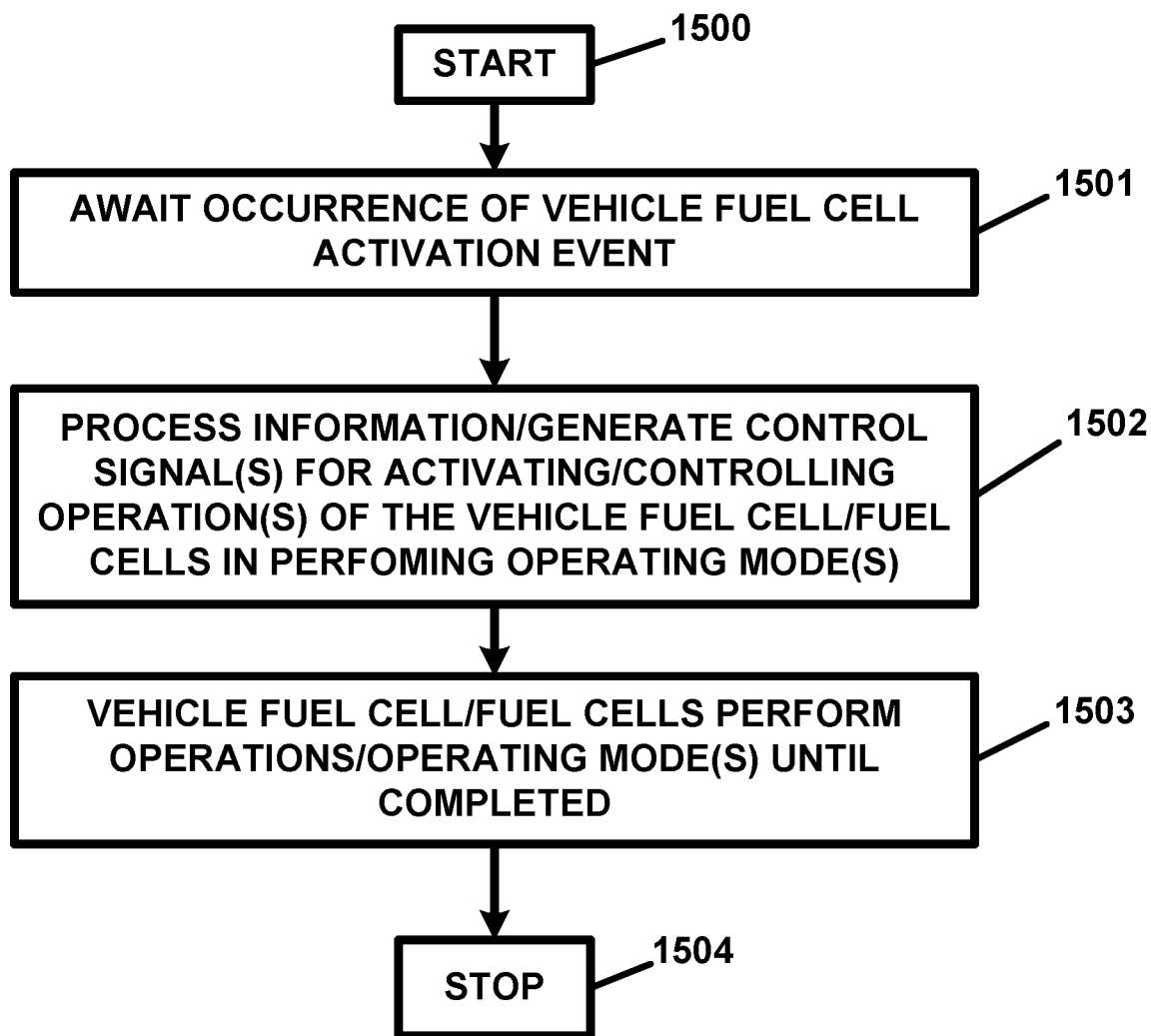
FIG. 15 illustrates another preferred embodiment method for utilizing the apparatus of the present invention, in flow diagram form.

FIG. 15 illustrates a preferred embodiment method for utilizing the apparatus 200 of FIG. 12, in flow diagram form. With reference to FIG. 15, the operation of the apparatus 200 commences at step 1500. At step 1501, the apparatus 200 will await an occurrence of a vehicle fuel cell activation event ("vehicle fuel cell activation event"). In a preferred embodiment, the "vehicle fuel cell activation event" means, or is defined as, or is defined to be, any event or occurrence, which can call for, or which can require, or which can result in, the vehicle fuel cell/fuel cells 41H performing an operation or any number of operations (hereinafter referred to as "operating mode(s))". In a preferred embodiment, the operating mode(s) can be performed one at a time, if a plurality of such are selected, simultaneously, and/or sequentially.

As used herein, the operating mode(s) of the vehicle fuel cell/fuel cells 41H can include, but is/are not limited to, the vehicle fuel cell/fuel cells 41H recharging, or performing a recharging operation for or regarding, the vehicle battery/batteries 41B, or the vehicle fuel cell/fuel cells 41H recharging, or performing a recharging operation for or regarding, the vehicle battery/batteries 41B while the electric vehicle or the hybrid vehicle is in use or is operational and/or when the electric vehicle or the hybrid vehicle is not in use or is non-operational, or the vehicle fuel cell/fuel cells 41H providing or supplying electrical power to the vehicle electric drive motor(s) 250 as the sole source of electrical power to the electric drive motor(s) 250, such that only the vehicle fuel cell/fuel cells 41H is/are supplying electrical power to, or are "driving", the vehicle electric drive motor(s) 250, or the vehicle fuel cell/fuel cells 41H and the vehicle battery/batteries 41B providing or supplying electrical power to the vehicle electric drive motor(s) 250, so that both the vehicle fuel cell/fuel cells 41H and the vehicle battery/batteries 41B are providing or supplying electrical power to the vehicle electric drive motor(s) 250, or the vehicle fuel cell/fuel cells 41H and the vehicle battery/batteries 41B providing or supplying electrical power to the vehicle electric drive motor(s) 250 either simultaneously or sequentially, or any combination of the same, or the vehicle fuel cell/fuel cells 41H recharging, or performing a recharging operation for or regarding, the vehicle battery/batteries 41B while also providing or supplying electrical power to the vehicle electric drive motor(s) 250 of the electric vehicle or the hybrid vehicle, and/or any combination of the same.

In a preferred embodiment, at step 1501, the operating mode(s) of the vehicle fuel cell/fuel cells 41H can be selected by, and the vehicle fuel cell activation event can be activated, or can be triggered, by the owner or operator of the electric vehicle or the hybrid vehicle, or by any authorized user, while the owner, operator, or user, is at, on, or inside, the vehicle via, or by using, and/or by entering or inputting, information regarding an operating mode(s) selection, and/or information regarding a command(s) or instruction(s) to activate or to commence the selected operating mode(s), into the user input device 30D of the vehicle computer 30. In a preferred embodiment, the information regarding the command(s) or instruction(s) to activate or to commence the selected operating mode(s) can include information for activating the operating mode(s) immediately, after a certain amount of time, at a time in the future, or upon the falling of the battery charge level of the vehicle battery/batteries 41B below a pre-selected or pre-specified level.

In another preferred embodiment, the operating mode(s) of the vehicle fuel cell/fuel cells 41H can also be selected by, and the vehicle fuel cell activation event can be activated, or can be triggered, by the owner or operator of the electric vehicle or the hybrid vehicle, or by any authorized user, while the owner, operator, or user, is at a location remote from the vehicle, by entering or inputting, information regarding an operating mode(s) selection, and information regarding a command(s) or instruction(s) to activate or to commence the selected operating mode(s), into the user input device 20D of the user communication device 20, and by transmitting the data and/or information, containing the data and/or information regarding the respective selected operating mode(s) and the command(s) or instruction(s) related to or corresponding to the same, from the user communication device 20 directly to the vehicle computer 30, and/or by transmitting the data and/or information, containing data and/or information regarding the respective selected operating modes(s) and the command(s) or instruction(s) related to or corresponding to the same, from the user communication device 20 to the vehicle computer 30 indirectly and/or via the central processing computer/distributed ledger/Blockchain technology system 10 and/or the central processing computer component 11 of the same.

In a preferred embodiment, the vehicle computer 30 can receive and/or process, and can store, the information input or received regarding the respective selected operating modes(s) and the command(s) or instruction(s) related to or corresponding to the same.

In a preferred embodiment, the vehicle fuel cell activation event can also be automatically triggered by the vehicle computer 30 and/or by the vehicle battery/recharging system computer 41A of the vehicle battery/recharging system 41. In a preferred embodiment, the vehicle computer 30 and/or the vehicle battery/recharging system computer 41A of the vehicle battery/recharging system 41 can be programmed to activate, or to trigger, the vehicle fuel cell activation event, and to select, activate, and/or commence the operating mode(s), at any given or pre-selected time, on any given or pre-selected day, at any given or pre-selected time of day, on any given or pre-selected day(s) of the week or month, and/or upon a detection of a battery charge level(s) below a pre-specified level so as to activate a recharging of the vehicle battery/batteries 41B, or upon an occurrence or a detected occurrence or a detected condition which would require or suggest that a recharging of the vehicle battery/batteries 41B is needed, required, or desired, and/or for any other reason deemed appropriate. In a preferred embodiment, each of the vehicle computer 30 and/or the vehicle battery/recharging system computer 41A of the vehicle battery/recharging system 41 can be programmed to detect any condition or state which can give rise to the need to activate, or to trigger, the vehicle fuel cell activation event, and to select, activate, and/or commence, the operation and/or the performing of the operating mode(s).

In a preferred embodiment, the vehicle computer 30 and/or the vehicle battery/recharging system computer 41A of the vehicle battery/recharging system 41 can be programmed to automatically monitor the battery charge level(s) of the vehicle battery/batteries 41B and to automatically detect a condition or state in which the battery charge level(s) of the vehicle battery/batteries 41B has/have fallen below a pre-set, or pre-specified, battery charge level ("recharge threshold"), which, in a preferred embodiment, can be any selected percentage number range between, and including, 0% to 100%. For example, in a preferred embodiment, the pre-set, or pre-specified, battery charge level, upon which a recharge operation is determined to be needed, required, or desired, can be selected by the vehicle owner, operator, or any other authorized user, or automatically by the vehicle computer 30, to be 50%, 75%, or any other number between, and including, 0% to 100%.

In a preferred embodiment, the pre-set, or pre-specified, battery charge level can be programmed into the vehicle computer 30 and/or into the vehicle battery/recharging system computer 41A of the vehicle battery/recharging system 41, by entering information regarding the same into the user input device 30D of the vehicle computer 30, and by storing the same in the database 30H of the vehicle computer 30 and/or in the database (not shown) of the vehicle battery/recharging system computer 41A of the vehicle battery/recharging system 41. In a preferred embodiment, the pre-set, or pre-specified, battery recharge level can also be remotely programmed into the vehicle computer 30 and/or into the vehicle battery/recharging system computer 41A of the vehicle battery/recharging system 41, by entering the information regarding the same into the user input device 20D of the user communication device 20, and by transmitting the same directly to the vehicle computer 30, and by storing the same in the database 30H of the vehicle computer 30 and/or in the database (not shown) of the vehicle battery/recharging system computer 41A of the vehicle battery/recharging system 41, and/or can be remotely programmed by transmitting the same to the vehicle computer 30 via the central processing computer/distributed ledger/Blockchain technology system 10, and by storing the same in the database 30H of the vehicle computer 30 and/or in the database (not shown) of the vehicle battery/recharging system computer 41A of the vehicle battery/recharging system 41.

In a preferred embodiment, the vehicle computer 30 and/or the vehicle battery/recharging system computer 41A of the vehicle battery/recharging system 41 can also be programmed to monitor, continuously and/or otherwise, and/or in any appropriate manner, the charge level of or for the vehicle battery/batteries 41B, and can be programmed to automatically activate, or trigger, a pre-specified vehicle fuel cell activation event, or a vehicle fuel cell activation event, and select the operating mode(s) which is/are needed and/or appropriate, given the circumstances and/or the situation, in order to recharge the vehicle battery/batteries 41B as needed, required, or desired.

With reference once again to FIG. 15, once the vehicle fuel cell activation event occurs at step 1501, the operation of the apparatus 200 will proceed to step 1502. At step 1502, in a preferred embodiment, the vehicle computer 30 can process information and generates a control signal which activates and/or which controls an activation and/or an operation of the vehicle battery/recharging system 41, and, in particular, the vehicle battery/recharging system computer 41A of the same. In a preferred embodiment, the vehicle battery/recharging system computer 41A can, in turn, process information and generate a control signal which activates the vehicle fuel cell/fuel cells 41H and/or which controls an operation of the vehicle fuel cell/fuel cells 41H in the performance of the operating mode(s) which were selected and/or identified and selected at and/or during step 1501.

At step 1503, in a preferred embodiment, the vehicle fuel cell/fuel cells 41H will perform the needed operations for performing the operating mode(s) which were selected and/or identified and/or which were selected at and/or during step 1501. In a preferred embodiment, at step 1503, the vehicle fuel cell/fuel cells 41H can recharge, or perform a recharging operation for or regarding, the vehicle battery/batteries 41B, or, at step 1503, the vehicle fuel cell/fuel cells 41H can recharge, or perform a recharging operation for or regarding, the vehicle battery/batteries 41B while the electric vehicle or the hybrid vehicle is in use or is operational and/or when the electric vehicle or the hybrid vehicle is not in use or is non-operational, or, at step 1503, the vehicle fuel cell/fuel cells 41H can provide or supply electrical power to the vehicle electric drive motor(s) 250 as the sole source of electrical power to the electric drive motor(s) 250, such that only the vehicle fuel cell/fuel cells 41H supply electrical power to the vehicle electric drive motor(s) 250, or, at step 1503, the vehicle fuel cell/fuel cells 41H and the vehicle battery/batteries 41B can provide or supply electrical power to the vehicle electric drive motor(s) 250, so that both the vehicle fuel cell/fuel cells 41H and the vehicle battery/batteries 41B provide or supply electrical power to the vehicle electric drive motor(s) 250, or, at step 1503, the vehicle fuel cell/fuel cells 41H and the vehicle battery/batteries 41B can provide or supply electrical power to the vehicle electric drive motor(s) 250 either simultaneously or sequentially, or any combination of the same, or, at step 1503, the vehicle fuel cell/fuel cells 41H can recharge, or perform a recharging operation for or regarding, the vehicle battery/batteries 41B while also providing or supplying electrical power to the vehicle electric drive motor(s) 250 of the electric vehicle or the hybrid vehicle, and/or, at step 1503, the vehicle fuel cell/fuel cells 41H can perform any one or more of, any number of, or any combination of, the above operations or functions in any appropriate manner, order, simultaneously, or sequentially.

The operation of the apparatus 200 will continue at step 1503 until the operation of the operating mode(s) has been completed. In a preferred embodiment, the operation of the operating mode(s) can be deemed to be completed by the vehicle computer 30 and/or by the vehicle battery/recharging system computer 41A when the charge level of the vehicle battery, or when the charge level of each of the vehicle batteries, of the vehicle battery/batteries 41B reaches 100% (the "full charge condition") or reaches some other pre-selected or pre-specified percentage charge level percentage or other number, when the electric vehicle or the hybrid vehicle ceases operation or ceases to be operated, or is parked, and/or when any other pre-specified condition is determined to exist which dispenses with the need to de-activate the vehicle fuel cell/fuel cells 41H from the operating and/or performing the operating mode(s).

In a preferred embodiment, the vehicle fuel cell/fuel cells 41H can be provided with any needed or necessary amount or fuel cell fuel, for performing and/or for completing the operation and/or the performance of the operation mode(s), which fuel cell fuel is, or can be, provided to the vehicle fuel cell/fuel cells 41H from and via the fuel cell fuel tank(s)/container 40I.

Upon the detected completion of the operation of the operating mode(s), at and during step 1503, the vehicle computer 30 and/or the vehicle battery/recharging system computer 41A can generate and transmit a deactivation signal to the vehicle fuel cell/fuel cells 41H so as to cease the operation of the same. Thereafter, the operation of the apparatus 200 will cease at step 1504.

In a preferred embodiment, the operation of the vehicle fuel cell/fuel cells 41H can continue even after the vehicle ceases to be operation, the vehicle is turned off or parked, so as to ensure that the operation of the operation mode(s) is completed.

In another preferred embodiment, at step 1503, the vehicle computer 30 and/or the vehicle battery/recharging system computer 41A can also activate the solar panel(s) 46, which can be located on the hood, roof, trunk, or side(s), of the electric vehicle or the hybrid vehicle, and/or can activate a rotational recharging system 48 which can include one or more alternators or generators, or any combination of the same, which can be driven by the rotation of the axle(s), wheel(s), or any other rotating component(s), or any specially situated air driven propeller(s), of the electric vehicle or hybrid vehicle, in order to also recharge the vehicle battery/batteries 41B with electricity generated by the solar panels 46 and/or the rotational recharging system 48.

In another preferred embodiment, at step 1503, the vehicle computer 30 and/or the vehicle battery/recharging system computer 41A can also activate the vehicle fuel cell/fuel cells 41H to recharge the vehicle battery/batteries 41B when the electric vehicle or the hybrid vehicle is not operating and/or is parked. In this manner, the vehicle fuel cell/fuel cells 41H can recharge the vehicle battery/batteries 41B when the electric vehicle or the hybrid vehicle is parked, parked overnight, and/or is otherwise not being used.

As noted herein, in addition to being controlled at the electric vehicle or at the hybrid vehicle, or by the vehicle computer 30, any and/or all of the operating mode(s) described herein can also be activated and/or controlled remotely and/or via the Internet and/or the World Wide Web, or via any other suitable communication network, and/or with and/or using the user communication device 20, and/or with and/or using the user communication device 20 and the central processing computer/distributed ledger/Blockchain technology system 10 as a distributed control system.

In a preferred embodiment, the vehicle fuel cell/fuel cells 41H can be used to conserve the battery charge level(s) of the vehicle battery/batteries 41B, can be used to provide an emergency power source, or an emergency power store, for the electric vehicle or the hybrid vehicle, can be used to supply electrical power to the vehicle electric drive motor(s) 250, can be used to extend the driving range of the electric vehicle or the hybrid vehicle, and/or can be used as an emergency back-up vehicle battery or batteries.

In a preferred embodiment, the fuel cell fuel tank(s)/container 40I can also be provided with an extra storage tank(s) or extra storage container(s) so as to increase fuel cell fuel storage tank or container capacity in order to extend the fuel cell fuel capacity for the vehicle fuel cell/fuel cells 41H, and/or in order to provide for extended driving ranges for the electric vehicle or the hybrid vehicle. In a preferred embodiment, the vehicle fuel cell/fuel cells 41H can also serve as an important electrical power back-up source for recharging the vehicle battery/batteries 41B and/or for providing electrical power to operate, or "drive", the vehicle electric drive motor(s) 250, and/or the vehicle fuel cell/fuel cells 41H can also provide an emergency power source for the electric vehicle or hybrid vehicle in instances when an electrical vehicle battery recharging station or source is or may be unavailable or is or may be non-operational.

Applicant incorporates by reference herein any and/or all of the teachings and techniques for and/or relating to the supplying of electrical power to the electric drive motors of, in, or for, electric vehicles and/or hybrid vehicles, and any and/or all teaching and techniques for and/or relating to the charging or recharging of vehicle batteries for electric vehicles and/or hybrid vehicles, and any and/or all teachings and techniques for using fuel cells in electric vehicles or hybrid vehicles, which are known by those skilled in the art as of the filing date of this patent application.

In another preferred embodiment, the apparatus 100, the apparatus 200, and/or the methods of the present invention can be utilized in order to effectuate a recharging of the vehicle battery/batteries 41B and/or a refueling of the vehicle fuel cell/fuel cells 41H by utilizing a mobile recharging vehicle/drone 70G of the electric road/vehicle recharging system(s) 70. In a preferred embodiment, the mobile recharging vehicle/drone 70G can be an airborne or flying drone (referred to herein as "mobile recharging vehicle/drone 70G") which can fly to, or which can navigate by flying to, an electric vehicle or a hybrid vehicle which is in need of a battery recharge or a fuel cell fuel delivery or replenishment at a location remote a battery recharging facility or a fuel cell refueling facility. In such a preferred embodiment, the mobile recharging vehicle/drone 70G can be equipped with suitable battery recharging equipment for performing plug-in battery recharging, contact battery recharging, and/or inductive battery recharging, for recharging the vehicle battery/batteries 41B of an electric vehicle or hybrid vehicle, and/or can be equipped with fuel cell fuel storage containers and a fuel cell fuel delivery system for refueling, or for delivering or replenishing a fuel cell fuel supply or of for, the vehicle fuel cell/fuel cells 41H of an electric vehicle or hybrid vehicle. In a preferred embodiment, the mobile recharging vehicle/drone 70G can be equipped for storing and delivering any suitable gas, liquid, or solid, fuel cell fuel.

In a preferred embodiment, the mobile recharging vehicle/drone 70G can also be equipped with any needed or required equipment, hardware, and/or software, for enabling the mobile recharging vehicle/drone 70G to fly to, or to navigate to, the location of the electric vehicle or hybrid vehicle which is in need of a battery recharge or a fuel cell fuel delivery or replenishment, RFID tag reading equipment for reading any RFID tag(s) associated with the electric vehicle or hybrid vehicle in need of a battery recharge or in need of a fuel cell fuel delivery or replenishment, and any other equipment, hardware, and/or software, for enabling the mobile recharging vehicle/drone 70G to effectuate and/or document, and/or to process and/or store information regarding, a battery recharge service or a fuel cell fuel delivery or replenishment service for the electric vehicle or hybrid vehicle. In a preferred embodiment, the mobile recharging vehicle/drone 70G can also be equipped with any and/or all of the hardware, software, and/or equipment, needed, required, or desired, for performing any and/or all of the operations, functions, or functionalities, described herein as being performed by the apparatus 100, the apparatus 200, and/or by any of the respective computers, components, and/or devices, of the same, in any and/or all of the preferred embodiments of FIGS. 10, 11A, 11B, and 15, described herein.

Figure 16:
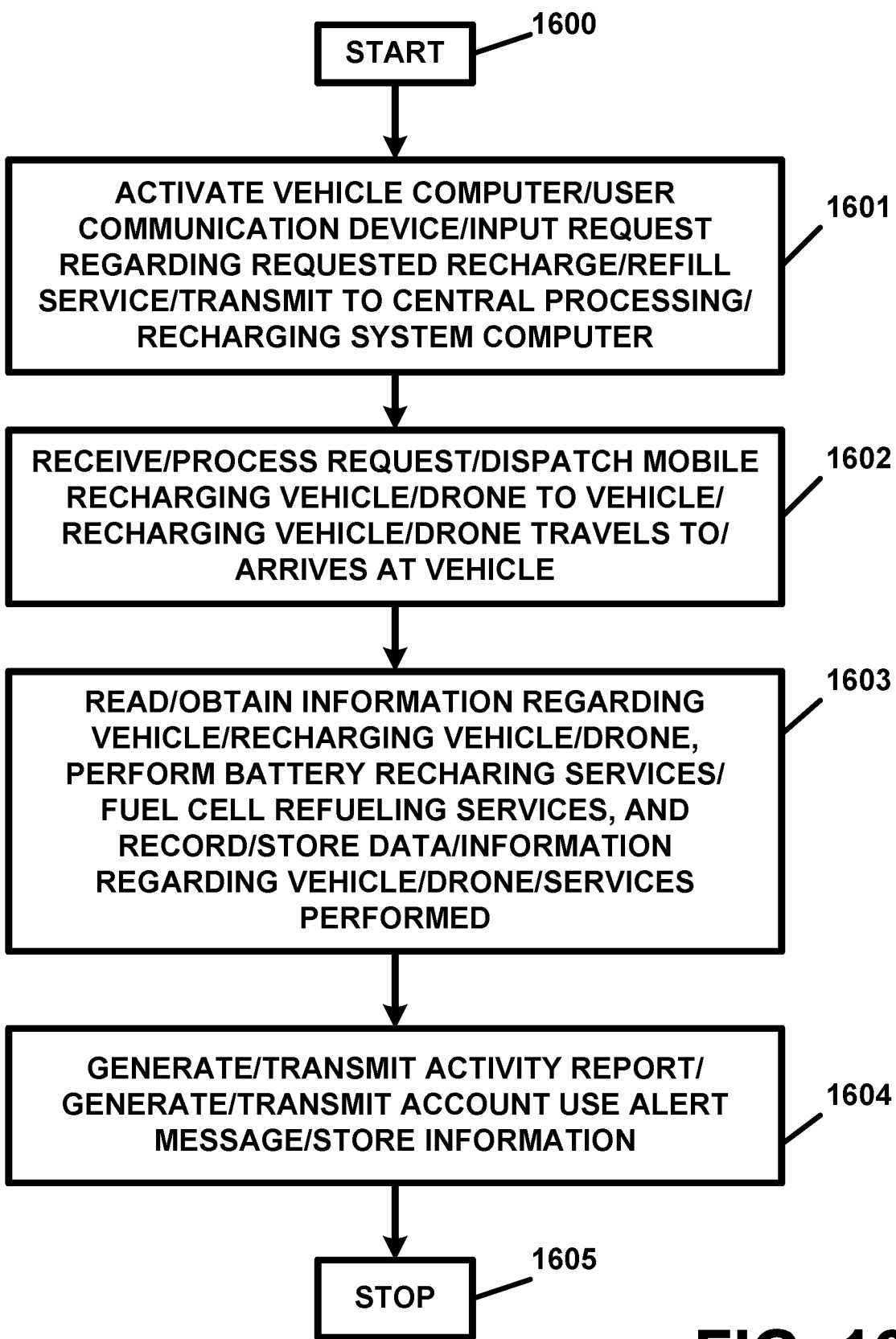
FIG. 16 illustrates still another preferred embodiment method for utilizing the apparatus of the present invention, in flow diagram form.

FIG. 16 illustrates another preferred embodiment method for utilizing the apparatus 100, or the apparatus 200, and/or the methods, of the present invention, in flow diagram form. With reference to FIG. 16, the operation of the apparatus 200 will commence at step 1600. It is important to note that, although described herein as being utilized in connection or in conjunction with the apparatus 200, the preferred embodiment of FIG. 16 can also be utilized in connection or in conjunction with the apparatus 100.

At step 1601, the owner or operator of the electric vehicle or the hybrid vehicle (hereinafter also referred to as the "vehicle" in the description of the embodiment of FIG. 16), or other authorized individual, can activate the vehicle computer 30 of the vehicle and can transmit a request, for a battery recharge service and/or a fuel cell fuel delivery or replenishment service, from the vehicle computer 30 to the central processing computer 11 component of the central processing computer/distributed ledger/Blockchain technology system 10. In another preferred embodiment, the owner or operator of the electric vehicle or the hybrid vehicle, or other authorized individual, can transmit the request, for a battery recharge service and/or a fuel cell fuel delivery or replenishment service, from a user communication device 20 to the central processing computer 11 component of the central processing computer/distributed ledger/Blockchain technology system 10. In another preferred embodiment, the request, for a battery recharge service and/or a fuel cell fuel delivery or replenishment service, can also be transmitted from the vehicle computer 30 or from the user communication device 20 to the electric road/vehicle recharging system computer 60 of or associated with a nearest recharging or refueling facility. In a preferred embodiment, the request can contain, at the very least, information regarding the identity of the electric vehicle or hybrid vehicle and/or the position or location of the same, as determined by the respective global positioning device 30K of the vehicle computer 30, or the global positioning device 20K of the user communication device 20. In a preferred embodiment, the request can also contain information regarding the type of battery recharge service needed, such as for example, whether a plug-in recharge, an inductive recharge, or a contact recharge, is needed, and/or the type of fuel cell fuel which is needed for delivery or replenishment.

At step 1602, the request, for a battery recharge and/or a fuel cell fuel delivery or replenishment, can be received, forwarded, and/or processed, by the respective central processing computer 11 component, of the central processing computer/distributed ledger/Blockchain technology system 10, and/or electric road/vehicle recharging system computer 60 which received the same. At step 1602, the respective central processing computer 11 component, of the central processing computer/distributed ledger/Blockchain technology system 10, and/or electric road/vehicle recharging system computer 60 can dispatch a mobile recharging vehicle/drone 70G to fly to, or to navigate to, the electric vehicle or hybrid vehicle. At step 1602, the mobile recharging vehicle/drone 70G can travel to the electric vehicle or hybrid vehicle.

At step 1602, the mobile recharging vehicle/drone 70G can travel to the electric vehicle or hybrid vehicle and will arrive at the same. In a preferred embodiment, the mobile recharging vehicle/drone 70G can land on or adjacent to the vehicle. In the case where the mobile recharging vehicle/drone 70G lands on the vehicle, the mobile recharging vehicle/drone 70G can land on, or can mount or mate with, the mounting/mating hardware 47 located on the electric vehicle or hybrid vehicle, with and/or using its own mounting or mating hardware.

As noted herein, in a preferred embodiment, as well as in any and/or all the preferred embodiments and/or any other embodiments described herein, each of the vehicle, the vehicle's battery/batteries 41B, the vehicle fuel cell/fuel cells 41H, the vehicle's plug-in charging system 41C, the vehicle's eroad inductive charging system/inductive coil system 40D, the vehicle's inductive charging coil 40E or coils 40E ("coil(s)"), the vehicle's eroad erail/contact rail charging system/deployable conductor arm system 40F, the vehicle's contact charging deployable conductor/arm 40G, or the vehicle's fuel cell fuel tank(s)/containers 40I, and/or all of the same and/or any combination of the same, can be equipped with a respective RFID tag 95 which can be assigned thereto for identification purposes, and/or can also be equipped with an RFID reader system 90, or an RFID reader of the same, for reading any RFID tag(s) 95 which is/are assigned to the mobile recharging vehicle/drone 70G.

In a preferred embodiment, any RFID reader system 90, or any RFID reader of the same, can also be, and/or can serve as, an input device 30D of the vehicle computer 30, as well as can be, or can serve as, an input device (not shown) of the mobile recharging vehicle/drone 70G.

In a preferred embodiment, the vehicle can also have associated therewith, or assigned thereto, a recharging account and/or refueling account which can be utilized for and/or when making payment for any battery recharging services and/or for any fuel cell refueling products and services for or involving the vehicle.

In the preferred embodiment, as well as in any and/or all of the preferred embodiments and/or any other embodiments described herein, the mobile recharging vehicle/drone 70G, and/or any component(s) of the same, can also be equipped with a respective RFID tag 95 which can be assigned thereto for identification purposes, and/or can also be equipped with an RFID reader system 90, or an RFID reader of the same, for reading any RFID tag(s) 95 which is/are assigned to the respective vehicle, the respective vehicle's battery/batteries 41B, vehicle fuel cell/fuel cells 41H, and/or any other component of the respective vehicle's vehicle battery/recharging system 41.

As noted herein, in a preferred embodiment, the vehicle can be equipped with an RFID tag 95 which can be used to identify the vehicle, the type or kind of the vehicle battery/batteries 41B used in the vehicle, any recharging requirements for the vehicle battery/batteries 41B, the vehicle's recharging account and/or refueling account, which can be used for making paying for, or for charging payment, for any battery recharging services or any fuel cell refueling products and/or services, the type or kind of vehicle fuel cell/fuel cells 41H used in the vehicle, the type or kind of fuel cell fuel required for the vehicle fuel cell/fuel cells 41H or for each fuel cell 41H of the same, and/or any other information needed, desired, or required, for or in performing any battery recharging servicing or fuel cell refueling servicing performed for or involving the vehicle.

With reference once again to FIG. 16, at step 1603, an RFID reader system 90, or an RFID reader of the same, which is associated with, or assigned to, the mobile recharging vehicle/drone 70G can read the RFID tag 95 assigned to the vehicle so as to identify the vehicle. In a preferred embodiment, an RFID reader system 90, which is associated with, or assigned to, the vehicle can also read the RFID tag assigned to the mobile recharging vehicle/drone 70G. At step 1603, the mobile recharging vehicle/drone 70G can record, store, and/or process, information regarding the RFID tag 95 of the vehicle and/or information regarding the vehicle. At step 1603, the vehicle computer 30 can record, store, and/or process, information regarding the RFID tag 95 of the mobile recharging vehicle/drone 70G.

Thereafter, at step 1603, any battery recharging operation or activities can be performed so as to recharge the vehicle battery/batteries 41B, and/or any fuel cell refueling operation or activities can be performed so as to refuel the vehicle fuel cell/fuel cells 41H. At step 1603, the type or kind of battery recharging can be selected from among the battery recharging services offered by and/or provided by the mobile recharging vehicle/drone 70G. In a similar manner, any fuel cell fuel refueling servicing can also be selected from among the refueling servicing options offered by and/or provided by the mobile recharging vehicle/drone 70G.

In a preferred embodiment, at step 1603, if a plug-in recharging service is selected, the equipment or component of the vehicle's plug-in recharging system 41C can be plugged into the plug-in recharging system of the mobile recharging vehicle/drone 70G, and the vehicle battery/batteries 41B can be recharged by the mobile recharging vehicle/drone 70G.

In a preferred embodiment, at step 1603, the vehicle's RFID reader system 90, or RFID reader of the same, can read the RFID tag 95 assigned to the plug-in recharging system of the mobile recharging vehicle/drone 70G, and the vehicle computer 30 can record, store, and/or process, information regarding the recharging of the vehicle's battery/batteries 41B by or with the plug-in recharging system of the mobile recharging vehicle/drone 70G, and/or the time, the amount of time, and/or the vehicle battery/batteries 41B which were recharged thereby. In a preferred embodiment, at step 1603, the RFID reader system 90, or RFID reader of the same, of the plug-in recharging system of the mobile recharging vehicle/drone 70G can also read the RFID tag 95 assigned to the vehicle, and can record, store, and/or process, information regarding the recharging of the vehicle's battery/batteries 41B by or with the plug-in recharging system of the mobile recharging vehicle/drone 70G, and/or the time, the amount of time, and/or the vehicle battery/batteries 41B which were recharged thereby.

In a preferred embodiment, at step 1603, if an inductive recharging service is selected, then, with the vehicle situated adjacent to the mobile recharging vehicle/drone 70G, the inductive charging coil(s) of the mobile recharging vehicle/drone 70G can be activated and/or electrified, and/or otherwise provided with electrical power, and the inductive coil system of the mobile recharging vehicle/drone 70G can inductively recharge the vehicle battery/batteries 41B.

In a preferred embodiment, at step 1603, the vehicle's RFID reader system 90, or RFID reader of the same, can read the RFID tag 95 assigned to the inductive coil system of the mobile recharging vehicle/drone 70G, and the vehicle computer 30 can record, store, and/or process, information regarding the recharging of the vehicle's battery/batteries 41B by or with the inductive coil system 70C of the mobile recharging vehicle/drone 70G, and/or the time, the amount of time, and/or the vehicle battery/batteries 40B which were recharged thereby.

In a preferred embodiment, at step 1603, the RFID reader system 90, or RFID reader of the same, of the mobile recharging vehicle/drone 70G can read the RFID tag 95 assigned to the vehicle, and can record, store, and/or process, information regarding the recharging of the vehicle's battery/batteries 41B by the inductive coil system of the mobile recharging vehicle/drone 70G, and/or the time, the amount of time, and/or the vehicle battery/batteries 41B which were recharged thereby.

In a preferred embodiment, at step 1603, if a contact battery recharging activity is to be performed by the mobile recharging vehicle/drone 70G, so as to recharge the vehicle battery/batteries 41B, then either a deployable conductor/arm system of the vehicle can be brought into contact with a conductor element of the mobile recharging vehicle/drone 70G, or a deployable conductor/arm system of the mobile recharging vehicle/drone 70G can be brought into contact with a conductor element of the vehicle, and, thereafter, the vehicle battery/batteries 41B can be recharged by the mobile recharging vehicle/drone 70G.

In a preferred embodiment, at step 1603, the vehicle's RFID reader system 90, or RFID reader of the same, can read the RFID tag 95 assigned to the contact charging system of the mobile recharging vehicle/drone 70G, and the vehicle computer 30 can record, store, and/or process, information regarding the recharging of the vehicle's battery/batteries 41B by the contact charging system of the mobile recharging vehicle/drone 70G, and/or the time, the amount of time, and/or the vehicle battery/batteries 41B which were recharged thereby.

In a preferred embodiment, at step 1603, the RFID reader system 90, or RFID reader of the same, of the mobile recharging vehicle/drone 70G can read the RFID tag 95 assigned to the vehicle, and can record, store, and/or process, information regarding the recharging of the vehicle's battery/batteries 41B by or with the contact charging system of the mobile recharging vehicle/drone 70G, and/or the time, the amount of time, and/or the vehicle battery/batteries 41B which were recharged thereby.

In a preferred embodiment, at step 1603, if a fuel cell fuel refueling is needed for the vehicle fuel cell/fuel cells 41H, then any one or more of the vehicle fuel cell/fuel cells 41H can be refueled with or by utilizing the vehicle fuel cell/fuel dispensing system of the mobile recharging vehicle/drone 70G with fuel cell fuel which is stored in a corresponding fuel cell fuel tank(s)/container of the mobile recharging vehicle/drone 70G.

In a preferred embodiment, at step 1603, the vehicle's RFID reader system 90, or RFID reader of the same, can read the RFID tag 95 assigned to the vehicle fuel cell/fuel dispensing system of the mobile recharging vehicle/drone 70G and/or the fuel cell fuel tank(s). containers of the mobile recharging vehicle/drone 70G, and the vehicle computer 30 can record, store, and/or process, information regarding the refueling of the vehicle fuel cell/fuel cells 41H and the amount of fuel dispensed for the vehicle. In a preferred embodiment, at step 1603, the RFID reader system 90, or RFID reader of the same, of the mobile recharging vehicle/drone 70G, or of the vehicle fuel cell fuel dispensing system of the mobile recharging vehicle/drone 70G, or of the fuel cell fuel tank(s)/container of the mobile recharging vehicle/drone 70G, can read the RFID tag 95 assigned to the vehicle, and can record, store, and/or process, information regarding the refueling of the vehicle fuel cell/fuel cells 41H and the amount of fuel dispensed for the vehicle.

Thereafter, the operation of the apparatus 100 will proceed to step 1604. At step 1604, the mobile recharging vehicle/drone 70G can process information regarding any of the vehicle battery recharging activities or services provided or performed, or which took place, at or during step 1603, and/or the mobile recharging vehicle/drone 70G can process information regarding any of the vehicle fuel cell refueling activities or services provided or performed, or which took place, at or during step 1603, and can generate a recharging and/or refueling activity report which can include information identifying the mobile recharging vehicle/drone 70G, the recharging and/or refueling services provided or performed, identification information regarding the vehicle, and/or the charges for products and/or services provided or performed.

At step 1604, the mobile recharging vehicle/drone 70G can process any financial transaction involving the vehicle's recharging account and/or refueling account, and can store any information regarding the same in the database of the same as well transmit the same to the central processing computer/distributed ledger/Blockchain technology system 10, for storage in the database of the same, and/or to the electric road/vehicle recharging system computer 60, which is associated with the mobile recharging vehicle/drone 70G, for storage in the database of the same.

At step 1604, the mobile recharging vehicle/drone 70G can generate a recharging account and/or refueling account use alert message and can transmit the same to the user communication device 20 of or associated with the registered owner or operator of the vehicle. At step 1604, in a preferred embodiment, the mobile recharging vehicle/drone 70G can also transmit the recharging account and/or refueling account use alert message to the vehicle computer 30 of the vehicle which was serviced by the mobile recharging vehicle/drone 70G at and during step 1603. In a preferred, the registered owner or operator of the vehicle can view and/or review the recharging account and/or refueling account use alert message via the display device 20E of the user communication device 20 and/or the vehicle operator and/or an occupant can view and/or review the recharging account and/or refueling account use alert message via the display device 30E of the vehicle computer 30.

In a preferred embodiment, at step 1604, the mobile recharging vehicle/drone 70G can store any and/or all data and/or information regarding any and/or all of the battery recharging activities or services provided or performed, or which took place, and/or any and/or all fuel cell fuel refueling activities or services provided or performed, or which took place, during step 1603, any data and/or information contained in the recharging and/or refueling activity report, the recharging and/or refueling activity report, any data and/or information regarding any financial transaction processed as well as processed on, with, or involving, the vehicle's recharging account and/or refueling account, and/or data and/or information contained in the recharging account and/or refueling account use alert message, and the recharging account and/or refueling account use alert message, in the database of the mobile recharging vehicle/drone 70G. At step 1604, the mobile recharging vehicle/drone 70G can also transmit any and/or all of the above-noted information and/or messages to the central processing computer/distributed ledger/Blockchain technology system 10, for storage in the database of the same, and/or to the electric road/vehicle recharging system computer 60, which is associated with the mobile recharging vehicle/drone 70G, for storage in the database of the same.

In a preferred embodiment, at step 1604, the mobile recharging vehicle/drone 70G can also transmit any and/or all data and/or information regarding any and/or all of the battery recharging activities or services provided or performed, or which took place, and/or any and/or all of the fuel cell fuel refueling activities or services provided or performed, or which took place, during step 1603, any data and/or information contained in the recharging and/or refueling activity report, the recharging and/or refueling activity report, any data and/or information regarding any financial transaction processed as well as processed on, with, or involving, the vehicle's recharging account and/or refueling account, and/or data and/or information contained in the recharging account and/or refueling account use alert message, and the recharging account and/or refueling account use alert message, to the central processing computer/distributed ledger/Blockchain technology system 10, for storage in the distributed ledger/Blockchain technology system 12 of the same and/or for storage in the database 11H of the central processing computer 11 of the same. Thereafter, the operation of the apparatus 200 will cease at step 1605.

In another preferred embodiment of the embodiment of FIG. 16, any mobile land vehicle or sea vehicle can also be utilized, instead of, or in addition to, the herein-described mobile recharging vehicle/drone 70G, in connection with the apparatus 200, in order to perform any recharging of any of the herein-described vehicle battery/batteries 41B and/or to perform any refueling of any of the herein-described vehicle fuel cell/fuel cells 41H. In this regard, in another preferred embodiment, the preferred embodiment of FIG. 16 can be performed in a same, a similar, and/or an analogous, manner, with and/or using any manned or unmanned vehicle, automobile, truck, service vehicle, emergency repair vehicle, boat, or any other land, sea, or air, vehicle, each of which should be appropriately equipped with the needed or required hardware, software, or equipment, for performing any and/or all of the operations and/or functions described herein as being performed by the mobile recharging vehicle/drone 70G and/or the electric road/vehicle recharging system(s) 70 described herein. In this regard, remote vehicle recharging and/or refueling can be provided by the apparatus 100, by the apparatus 200, and/or by the methods, of the present invention.

In any and/or all of the embodiments described herein, any battery recharging facility or venue and/or fuel cell refueling facility or venue, described herein can be owned and/or operated by any governmental entity, municipal entity, public company or entity, public electrical and/or gas utility company or entity, private company or entity, and/or any other entity. In a preferred embodiment, any battery recharging facility or venue and/or fuel cell refueling facility or venue, can also be a franchise location or entity, or part or a franchise organization, or part or a chain of battery recharging facilities or venues and/or fuel cell refueling facilities or venues, and/or can be independently owned or operated.

The apparatus 100 and methods of the present invention can, at the very least, be utilized in order to provide a technically innovative and efficient solution in providing battery power management for electric vehicles and/or hybrid vehicles of any type or kind. In this regard, the apparatus 100 and methods of the present invention can also be utilized in order to provide a technically innovative and efficient solution in providing a battery power management solution for electric vehicles and/or hybrid vehicles, which can be manned, unmanned, and/or remote-controlled, land vehicles, cars, trucks, buses, trains, subway trains, motorcycles, sport utility vehicles, recreational vehicles, planes, jets, helicopters, aircraft and/or other flying vehicles, boats, ships, and/or water vehicles and/or vessels, submarines, flying drones, and/or spacecraft. In this regard, it is to be understood that the apparatus 100 of the present invention can be utilized in a same, similar, and/or analogous manner, as described in any and/or all of the herein-described embodiments, in order to provide a battery power management solution for electric vehicles and/or hybrid vehicles, which can be manned, unmanned, and/or remote-controlled, land vehicles, cars, trucks, buses, trains, subway trains, motorcycles, sport utility vehicles, recreational vehicles, planes, jets, helicopters, aircraft and/or other flying vehicles, boats, ships, and/or water vehicles and/or vessels, submarines, flying drones, and/or spacecraft.

In another preferred embodiment, the apparatus 100 and/or 200, and/or the methods, of the present invention can also be utilized in order to provide electric vehicles and/or hybrid vehicles of any type or kind and/or which can be any manned, unmanned, and/or remote-controlled, land vehicles, cars, trucks, buses, trains, subway trains, motorcycles, sport utility vehicles, recreational vehicles, planes, jets, helicopters, aircraft and/or other flying vehicles, boats, ships, and/or water vehicles and/or vessels, submarines, flying drones, and/or spacecraft, which can be equipped with the apparatus 100 and/or 200 of the present invention. In this regard, in a preferred embodiment, the present invention can also be utilized in, and/or can be, any one or more of the electric vehicles and/or hybrid vehicles, which can be any manned, unmanned, and/or remote-controlled, land vehicles, cars, trucks, buses, trains, subway trains, motorcycles, sport utility vehicles, recreational vehicles, planes, jets, helicopters, aircraft and/or other flying vehicles, boats, ships, and/or water vehicles and/or vessels, submarines, flying drones, and/or spacecraft, described herein, which can be equipped with the apparatus 100 and/or 200 of the present invention.

In another preferred embodiment, and/or in any and/or all of the embodiments described herein, the apparatus and methods of the present invention can also be utilized in order to provide for an apparatus and/or a vehicle, which can be any electric vehicle and/or a hybrid vehicle described herein, which can also provide for the processing of, and/or for the performing of any functions for and/or relating to, any blockchain information processing routines or operations, any blockchain transaction processing routines or operations, any blockchain block mining routines or operations, any blockchain block minting routines or operations, any cryptocurrency mining, and/or any other and/or any related blockchain or blockchain-related processing routines, operations, or functions.

In this regard, in a preferred embodiment, the apparatus and methods of the present invention, and/or the respective electric vehicle or hybrid vehicle, in which the apparatus of the present invention can be used, can be equipped with a computer or processing system, and/or can perform computer processing functions, routines, or operations, which can process blockchain and/or blockchain-related transactions, and/or can process information for mining or minting new blockchain blocks for inclusion into, or for addition to or for adding to, the blockchain of the distributed ledger/blockchain technology system 12, and/or can process blockchain and/or blockchain-related transactions, and/or can process information for mining or minting new blockchain blocks for inclusion into, or for addition to or for adding to, the blockchain of any other distributed ledger and blockchain technology system.

In this regard, in a preferred embodiment, the apparatus of the present invention can, and/or the respective electric vehicle or hybrid vehicle, in which the apparatus of the present invention is used, can also be utilized to, and can also perform, any and/or all types or kinds of blockchain processing routines or operations, blockchain transaction processing routines or operations, blockchain block creation routines or operations, and/or cryptocurrency mining, for and/or in connection with any distributed ledger and blockchain technology system, for and/or in connection with any permissioned distributed ledger and blockchain technology system, for and/or in connection with any permissionless distributed ledger and blockchain technology system, and/or for or in connection with the distributed ledger/blockchain technology system 12. In a preferred embodiment, the apparatus of the present invention, and/or the respective electric vehicle or hybrid vehicle, in which the apparatus is used, can also be utilized to mine cryptocurrencies of or associated with any of the foregoing types or kinds of, and/or or associated with any of the herein-described distributed ledgers and blockchain technology systems and/or the distributed ledger/blockchain technology system 12.

In a preferred embodiment, the herein-described vehicle computer 30, of each of the apparatus 100 and/or the apparatus 200, can be equipped with the necessary software and/or hardware needed for performing any and/or all of the blockchain processing routines or operations, the blockchain transaction processing routines or operations, the blockchain block creation routines or operations, and/or the cryptocurrency mining routines or operations, for and/or in connection with any distributed ledger and blockchain technology system, any permissioned distributed ledger and blockchain technology system, any permissionless distributed ledger and blockchain technology system, and/or the distributed ledger/blockchain technology system 12.

In another preferred embodiment, the apparatus of the present invention can also include a blockchain processing/mining computer which can be utilized, for each of any number of blockchain platforms, in order to process blockchain transactions for a respective blockchain or blockchain platform, to create or to mint new blocks for a respective blockchain or blockchain platform, to add new blocks to a respective blockchain, to process individual transactions for, and/or involving and/or pertaining to, a respective blockchain or blockchain platform, and/or to perform any other processing routines, functions, and/or operations, for, pertaining to, or relating to, a respective blockchain or blockchain platform. In a preferred embodiment, blockchain processing/mining computer will be equipped with any required, needed, or desired, hardware, software, and/or firmware, including, but not limited to transaction processing software and/or mining software, for performing any blockchain and/or blockchain-related processing routines, functions, and/or operations, for any blockchain or blockchain platform in, on, or for, which the blockchain processing/mining computer is to be utilized.

In a preferred embodiment, the apparatus of the present invention can also include a cooling system for cooling the blockchain processing/mining computer at any time before, during, or after its operation. In a preferred embodiment, the cooling system can include a liquid cooling system, which liquid cooling system, in a preferred embodiment, can include any of the various components of a vehicle combustion engine's cooling system, including, but not limited to, a water pump, a coolant reservoir or supply tank, a radiator, a fan or any number of fans, a pulley system or pulley system(s) which can drive the rotation of the fan or fans, and a plumbing system of pipes, hoses, conduits, and/or passageways, for circulating the water or coolant during cooling operations for the blockchain processing/mining computer and/or for other vehicle components. In a preferred embodiment, cooled water, coolant, or coolant liquid or fluid, can be directed or passed, or can be caused to flow, through, on, in, near, or in the vicinity of, the blockchain processing/mining computer in order to cool the same and/or the operating environment of the same in a same manner in which cooled water or coolant can be directed or passed through various components of a combustion engine to cool the same.

In a preferred embodiment, the cooling system can also include an air conditioning cooling system which can be, or can include, the vehicle's air conditioning system and/or any of the various components of the same, including, but not limited to, a compressor, a tank or reservoir for storing or housing Freon or any other suitable coolant liquid, gas, substance, or material, a fan or fans and/or a pulley system or pulley systems for driving the same, and a blower motor or any number of blower motors, and any number of air conditioning vents for expelling cold air. In a preferred embodiment, any number air conditioning vents can be located adjacent or in the vicinity of the blockchain processing/mining computer in order to direct cooled air at the same.

In a preferred embodiment, the cooling system can also include an air cooling system which can utilize air which is collected from the external environment of the vehicle to be used to collected and directed at the blockchain processing/mining computer in order to cool the same. In a preferred embodiment, the air cooling system can include any number of external air intake vents, which can be located at various locations on the vehicle's exterior, and any suitable plumbing system of pipes, hoses, conduits, and/or passageways, for directing the outside air at and onto the blockchain processing/mining computer in order to cool the same. In a preferred embodiment, the air cooling system can also include one or more fans which can server to suction external air into the vehicle and/or to direct external air at or onto the blockchain processing/mining computer in order to cool the same. In a preferred embodiment, it is submitted that the wind chill factor of moving air, whether introduced into a moving vehicle, whether created by a fan, and/or whether enhanced by a fan or fans, can be utilized to cool the blockchain processing/mining computer and/or perform a cooling operation on and/or for the same.

Figure 17:
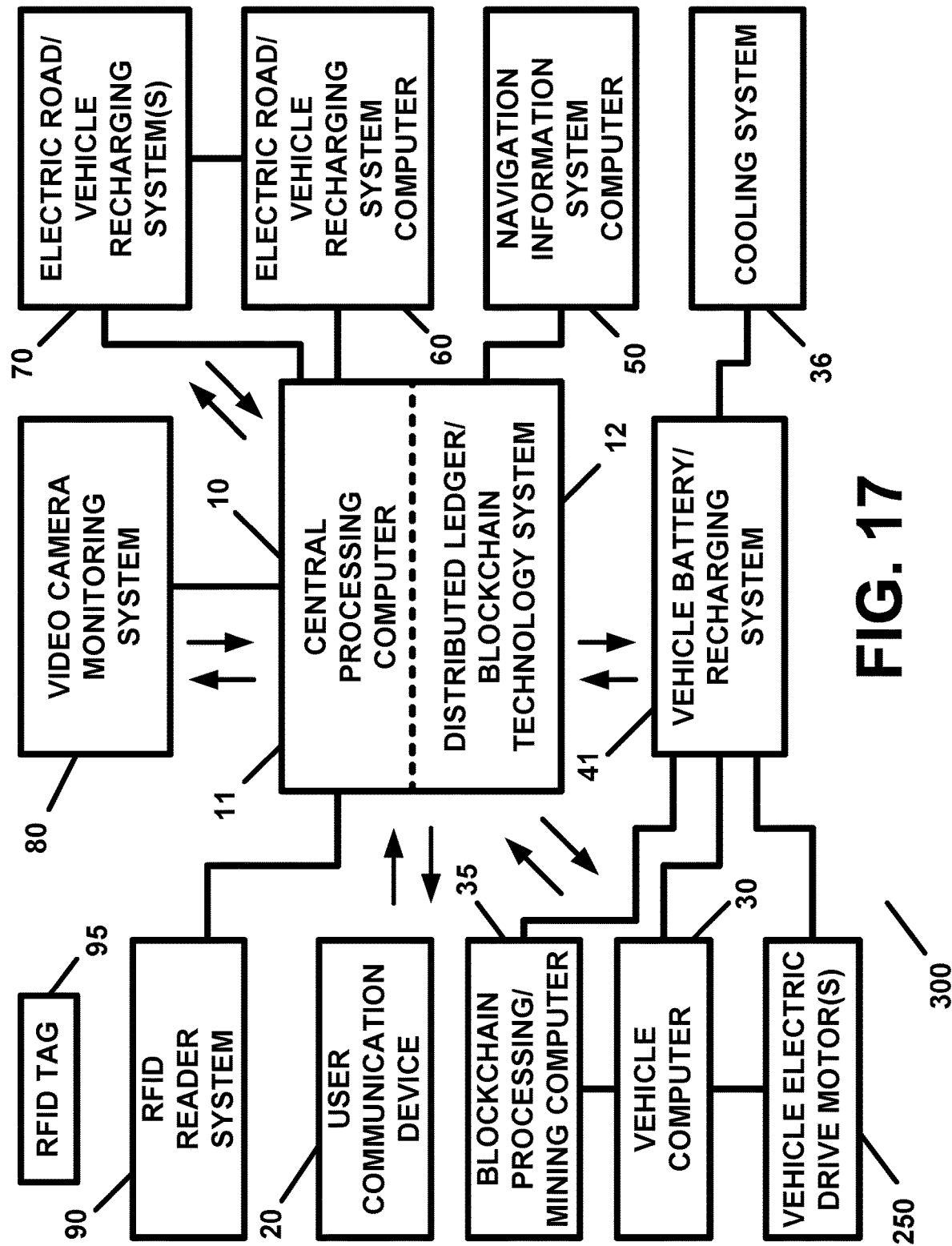
FIG. 17 illustrates another preferred embodiment apparatus of the present invention, in block diagram form.

FIG. 17 illustrates another preferred embodiment apparatus of the present invention, which is denoted generally by the reference numeral 300, in block diagram form. With reference to FIG. 17, the apparatus 300 includes all of the components, computers, systems, and devices, of the apparatus 200 of FIG. 12 and further includes a blockchain processing/mining computer 35 and/or any number of blockchain processing/mining computers 35. In a preferred embodiment, the blockchain processing/mining computer(s) 35 are located in, on, or at, the vehicle. In a preferred embodiment, the blockchain processing/mining computer 35 can be connected to or with, and/or linked to or with, the vehicle battery/recharging system 41 which, in a preferred embodiment, provides the electrical power to operate the blockchain processing/mining computer 35. In a preferred embodiment, the blockchain processing/mining computer 35 can also be connected to or with, and/or linked to or with, the vehicle computer 30. In a preferred embodiment, the vehicle computer 30 can control and/or monitor the operation of the blockchain processing/mining computer 35.

In a preferred embodiment, the blockchain processing/mining computer 35, and/or each of the blockchain processing/mining computers 35, are and/or can be equipped with any required, needed, or desired, hardware, software, and/or firmware, including, but not limited to, transaction processing software and/or mining software, for performing any and/or all of the blockchain and/or blockchain-related processing routines, functions, and/or operations, for any blockchain or blockchain platform in, on, or for, which the respective blockchain processing/mining computer 35 is utilized.

With reference one again to FIG. 17, the apparatus 300 also includes a cooling system 36, located in, on, or at, the vehicle, for performing cooling operations and/or functions for and/or regarding the blockchain processing/mining computer 35, and/or for or regarding each of the blockchain processing/mining computers 35. As noted herein, in a preferred embodiment, the cooling system 36 can include a liquid cooling system, an air conditioning cooling system, and/or an air cooling system. In a preferred embodiment, the cooling system 36, and/or any of the systems or components of the same, can be connected to or with, and/or linked to or with, the vehicle battery/recharging system 41 which, in a preferred embodiment, provides the electrical power to operate the cooling system 36 and/or any of the systems or components of the same. In a preferred embodiment, the cooling system 36, and/or any of the systems or components of the same, can also be connected to or with, and/or linked to or with, the vehicle computer 30. In a preferred embodiment, the vehicle computer 30 can control and/or monitor the operation of the cooling system 36 and/or to any of the systems or components of the same.

Figure 18:
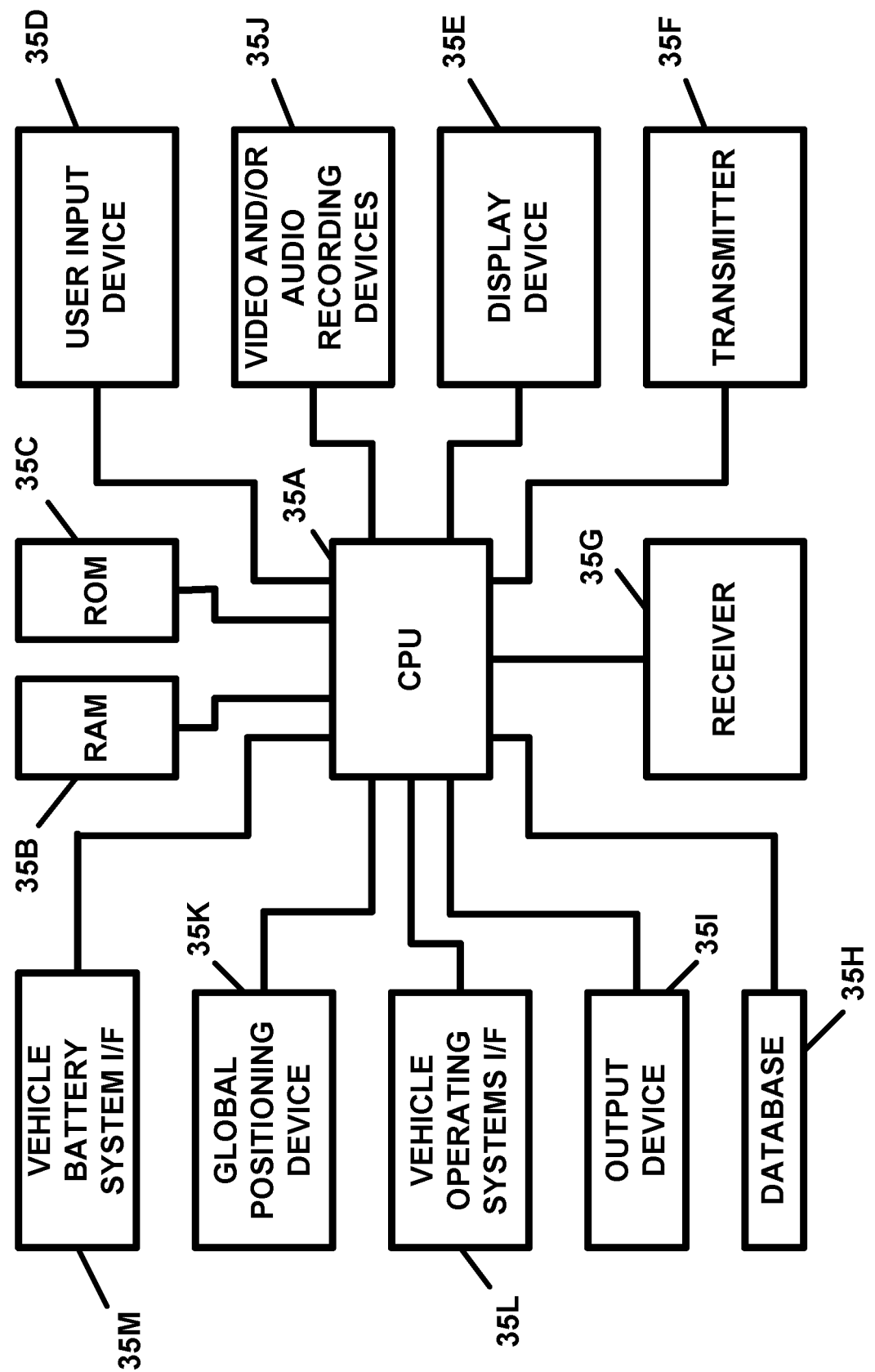
FIG. 18 illustrates the blockchain processing/mining computer of FIG. 17, in block diagram form.

FIG. 18 illustrates the blockchain processing/mining computer 35 of FIG. 17, in block diagram form. With reference to FIG. 18, the blockchain processing/mining computer 35 includes, at the very least, all of the components of the vehicle computer 30 of FIG. 4 as well as any hardware, software, and/or firmware, including, but not limited to, transaction processing software and/or mining software, for performing any and/or all of the blockchain and/or blockchain-related processing routines, functions, and/or operations, for any blockchain or blockchain platform in, on, or for, which the respective blockchain processing/mining computer 35 is utilized.

In a preferred embodiment, the blockchain processing/mining computer 35 can be any blockchain processing computer, blockchain mining computer, and/or any appropriately and/or suitably equipped communication device, computer, micro-computer, microprocessor, personal computer, laptop computer, notebook computer, Smart phone or smartphone, smart telephone, cellular telephone, personal digital assistant, wireless telephone, wireless communication device, tablet, tablet computer, watch, smart watch, or wearable device or computer, or any combination of same, or any equivalent of same, or any other computer or communication device, which can provide the functionality of, and which can be utilized as a blockchain processing/mining computer 35. Any number of blockchain processing/mining computers 35 can be deployed in, or utilized in, at, or on, any of the various vehicles described herein.

In a preferred embodiment, for example, the blockchain processing/mining computer 35 includes a central processing unit or CPU 35A, which, in the preferred embodiment, is a microprocessor. The CPU 35A can also be a microcomputer, a minicomputer, a macro-computer, and/or a mainframe computer, depending upon the application.

The blockchain processing/mining computer 35 also includes a random access memory device(s) 35B (RAM) and a read only memory device(s) 35C (ROM), each of which is connected to, or linked with, the CPU 35A, and a user input device 35D, for entering data and/or information and/or commands into the blockchain processing/mining computer 35, which can include any one or more of a keyboard, a scanner, a user pointing device, such as, for example, a mouse, a touch pad, and/or an audio input device and/or a video input device, a microphone or audio recording device, a camera or a video recording device, and/or any device, electronic and/or otherwise, which can be utilized for inputting and/or entering data and/or information and/or commands into the blockchain processing/mining computer 35. The user input device(s) 35D is/are also connected to, or linked with, the CPU 35A. The blockchain processing/mining computer 35 also includes a display device 35E for displaying data and/or information to a user or individual. The display device 35E is also connected to, or linked with, the CPU 35A.

The blockchain processing/mining computer 35 also includes a transmitter(s) 35F, for transmitting signals and/or data and/or information to any blockchain system, blockchain network, or blockchain platform, or nodes or computers of or associated therewith, as well as to any one or more of the central processing computer(s) 11, the user communication devices 20, the vehicle computers 30, the vehicle battery/recharging systems 40, the navigation information system computers 50, the electric road/vehicle recharging system computers 60, the electric road/vehicle recharging systems 70, the video camera monitoring systems 80, and/or the RFID reader systems 90, and/or to any other blockchain processing/mining computer(s) 35, and/or to any other individual computer(s) or individual communication device(s) which may be utilized in conjunction with the apparatus 300 of the present invention. The transmitter 35F is also connected to, or linked with, the CPU 35A.

The blockchain processing/mining computer 35 also includes a receiver 35G, for receiving signals and/or data and/or information from any respective blockchain system, blockchain network, or blockchain platform, or nodes or computers of or associated therewith, as well as from any one or more of any of the central processing computer(s) 11, the user communication devices 20, the vehicle computers 30, the vehicle battery/recharging systems 40, the navigation information system computers 50, the electric road/vehicle recharging system computers 60, the electric road/vehicle recharging systems 70, the video camera monitoring systems 80, and/or the RFID reader systems 90, and/or from any other blockchain processing/mining computer(s) 35, and/or from any other individual computer(s) or individual communication device(s) which may be utilized in conjunction with the apparatus 100 of the present invention. The receiver 35G is also connected to, or linked with, the CPU 35A.

The blockchain processing/mining computer 35 also includes a database(s) 35H which stores, contains, or includes, any and/or all of the data and/or information required, needed, or desired, for allowing and/or enabling the blockchain processing/mining computer 35 to perform any and/or all of the functions and functionalities described herein as being performed, and/or as capable of being performed, by the blockchain processing/mining computer 35 and/or the apparatus 300. In this regard, and notwithstanding any specific examples of data and/or information described herein as being stored in the database 35H, it is to be understood that the database 35H stores, contains, and/or includes, any and/or all data and/or information, and/or any and all software and/or firmware, required, needed, or desired, for allowing and/or enabling the blockchain processing/mining computer 35 and/or the apparatus 300 to perform any and/or all of the functions and functionalities described herein as being performed by the blockchain processing/mining computer 35 and/or the apparatus 300 of the present invention.

The blockchain processing/mining computer 35 also includes an output device 351 for outputting any of the data, information, or reports, described herein or otherwise. In the preferred embodiment, the output device 351 can be a printer, a display, a transmitter, a modem, a speaker, and/or any other device which can be used to output data.

The blockchain processing/mining computer 35 can also include a video and/or audio recording device(s) 35J which can include a camera and/or a video recording device, for recording pictures or video and/or video clips, and/or a microphone or an audio recording device, for recording audio or audio clips, which can be recorded by, and/or transmitted live, by or from the blockchain processing/mining computer 35, or which can be recorded by, and stored at or in, the blockchain processing/mining computer 35 for transmission by or from the blockchain processing/mining computer 35 at a later time. The video and/or audio recording device(s) 35J can also be utilized to facilitate one-way broadcasts from the blockchain processing/mining computer 35, and/or can be utilized to facilitate video conferencing, video chatting, and/or audio conferencing, and/or video and audio conferencing, between a user of the blockchain processing/mining computer 35 and any of the herein-described users, individuals, persons, or entities, who or which utilize the apparatus 300 of the present invention.

The blockchain processing/mining computer 35 can also include a global positioning device 35K. In a preferred embodiment, the global positioning device 35K determines or can determine a position or location of the blockchain processing/mining computer 35 and/or the vehicle and can also determine a position or location of the blockchain processing/mining computer 35 at and/or during various days, dates, and/or times, of operation.

With reference once again to FIG. 18, the blockchain processing/mining computer 35 can also include a vehicle operating systems control and monitoring interface (I/F) 35L which can be used to control, monitor, and/or operate, any of the respective electric vehicle's or hybrid vehicle's various electric motor(s), internal combustion engine control systems, propulsion system(s), transmission(s), differential(s), brake system(s), heating system(s), cooling system(s), air-conditioning system(s), lighting system(s), entertainment system(s), navigation system(s), steering system(s), flight control system(s), autopilot system(s), collision avoidance system(s), electric axle system(s), electrical system(s), ignition system(s), fuel system(s), fuel cell system(s), fuel cell fuel system(s), battery power management system(s), battery recharging system(s), contact recharging system(s) such as those used to deploy a conductor to make contact with an electric rail and/or to interface with a charging conductor or an electric road or a segment of an electric road, a plug-in recharger system(s), an inductive coil recharging systems(s) for use in inductive charging applications in connection with electric road charging via inductive charging, fuel cell refueling system(s), and/or any other systems, equipment, components, or devices, which can be found in electric vehicles and/or hybrid vehicles and/or which can be operated, controlled, or monitored, by a computer or communication device.

In a preferred embodiment, the any number of vehicle operating system control and monitoring interfaces (I/F) 35L can be utilized in a vehicle and/or in connection with the blockchain processing/mining computer 35. In a preferred embodiment, each vehicle operating systems control and monitoring interface (I/F) 35L can be connected to, or linked with, the CPU 35A via any suitable wired connection or link, via any suitable wireless connection or link, or via any combination of the same.

With reference once again to FIG. 18, the blockchain processing/mining computer 35 also includes a vehicle battery/recharging system interface 35M (hereinafter referred to as "vehicle battery system I/F 35M"). In a preferred embodiment, the vehicle battery system I/F 35M can be used to control and/or to monitor the charge level or charge state of the vehicle's battery or batteries, and/or to control and/or to monitor, and/or to operate, the battery recharging system or equipment, to control and/or to monitor the operation or any battery recharging system or equipment, and/or to control and/or to monitor the operation of any fuel cell or fuels cells in the vehicle and/or any fuel cell fuel supply, storage, pumping, or dispensing, system or equipment. In this regard, the blockchain processing/mining computer 35 can be utilized to perform battery management operations and/or functionalities regarding controlling and/or monitoring the operation, and/or the charge level or charge state, of the vehicle's battery or batteries, as well as controlling and/or monitoring the operation of the vehicle's fuel cell or fuel cells, and/or controlling and/or monitoring the vehicle's battery recharging system(s) or equipment, and/or controlling and/or monitoring the supply of fuel to and/or for the vehicle's fuel cell or fuel cells. In this regard, the blockchain processing/mining computer 35 can also be configured and equipped to control and monitors its own electrical power source(s) and supply.

In a preferred embodiment, the vehicle battery system I/F 35M can be connected to, or linked with, the CPU 35A via any suitable wired connection or link, via any suitable wireless connection or link, or via any combination of the same.

In a preferred embodiment, the blockchain processing/mining computer 35 can also be equipped, and/or can be programmed, for voice activation operation and/or voice control operation of and/or regarding any and/or all of the herein-described operations and functions which are capable of being performed by the blockchain processing/mining computer 35.

In a preferred embodiment, the vehicle computer 30 can also be programmed to, and/or can be configured to or designed to, operate as any blockchain processing/mining computer or as the blockchain processing/mining computer 35 in order to process any blockchain transactions, to mine or mint new blockchain blocks, to add new blocks to a blockchain, and/or to perform any blockchain and/or blockchain-related processing routines, functions, or operations.

Figure 19:
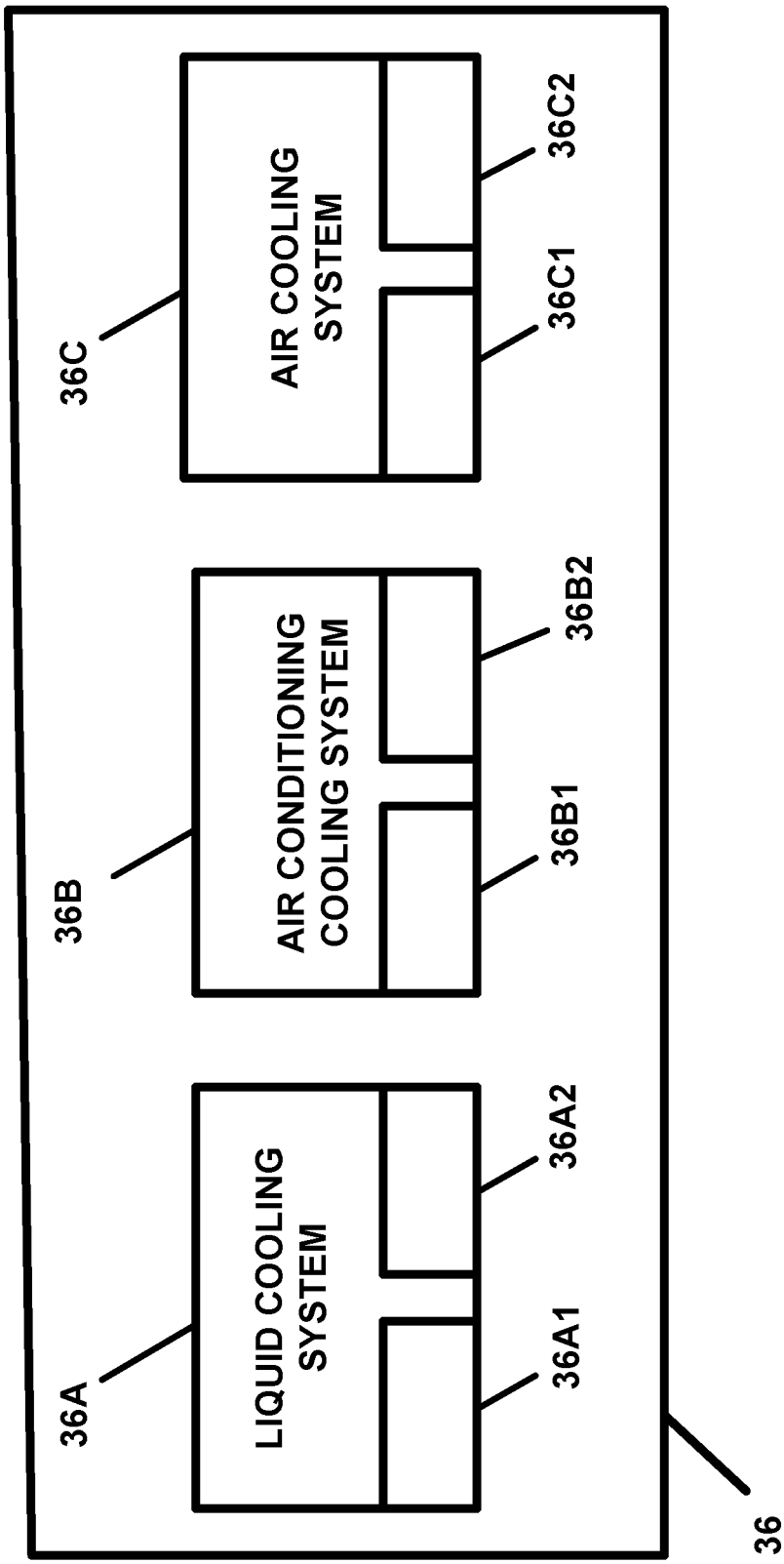
FIG. 19 illustrates the cooling system of FIG. 17 and the various components of the same, in block diagram form.

In a preferred embodiment, the cooling system 36 can be utilized for performing cooling operations on and/or for, of for cooling, the blockchain processing/mining computer(s) 35 located in, at, or on, the vehicle. FIG. 19 illustrates the cooling system 36 of FIG. 17 and the various components of the same, in block diagram form.

With reference to FIG. 19, the cooling system 36 includes a liquid cooling system 36A, an air conditioning cooling system 36B, and/or an air cooling system 36C. With reference once again to FIG. 19, the liquid cooling system 36A, in a preferred embodiment, can include any of the various components of a vehicle combustion engine's cooling system, including, but not limited to, a liquid cooling device 36A1, which can be any suitable device, system, or element, for delivering or directing cooled liquid to, on, in, or to the vicinity of, the blockchain processing/mining computer(s) 35. As noted herein, the liquid cooling system 36A can also include liquid cooling system components 36A2, including, but not limited, a water pump, a coolant reservoir or supply tank, a radiator, a fan or any number of fans, a pulley system or pulley system(s) which can drive the rotation of the fan or fans, and a plumbing system of pipes, hoses, conduits, and/or passageways, for circulating the water or coolant during cooling operations for the blockchain processing/mining computer(s) 35 and/or for other vehicle components.

In a preferred embodiment, cooled water, coolant, or coolant liquid or fluid, can be directed or passed, or can be caused to flow by, or by means of or by action of, the liquid cooling device 36A1 through, on, in, near, or in the vicinity of, the blockchain processing/mining computer(s) 35 in order to cool the same and/or the operating environment of the same in a same manner in which cooled water or coolant can be directed or passed through various components of a combustion engine to cool the same.

With reference once again to FIG. 19, the air conditioning cooling system 36B can, in a preferred embodiment, include any of the various components of a vehicle air conditioning system, including, but not limited to, an air conditioner blower device or system 36B1, which can be any suitable device, system, or element, for delivering or directing cooled air to, on, in, or to the vicinity of, the blockchain processing/mining computer(s) 35. As noted herein, the air conditioning system 36B can also include liquid cooling system components 36A2, including, but not limited to, a compressor, a tank or reservoir for storing or housing Freon or any other suitable coolant liquid, gas, substance, or material, a fan or fans and/or a pulley system or pulley systems for driving the same, and a blower motor or any number of blower motors, and any number of air conditioning vents for expelling cold air during cooling operations for the blockchain processing/mining computer(s) 35 and/or for other vehicle components and/or for providing any other vehicle air conditioning functions.

In a preferred embodiment, cooled air can be directed or can be caused to be directed by, or by means of or by action of, the air conditioner blower device or system 36B1 at and/or towards, through, on, in, near, or in the vicinity of, the blockchain processing/mining computer(s) 35 in order to cool the same and/or the operating environment of the same in a same manner in which an air conditioner can be used to direct or blow cold air on any device in order to cool the same.

With reference once again to FIG. 19, the air cooling system 36C can, in a preferred embodiment, include any of the various components of an air cooling system, including, but not limited to, an air cooler blower device or system 36C1, which can be any suitable device, system, or element, for delivering or directing air, obtained from the vehicle's external environment to, on, in, or to the vicinity of, the blockchain processing/mining computer(s) 35. As noted herein, the air cooling system 36C can also include air cooling system components 36C2, including, but not limited to, any number of external air intake vents, which can be located at various locations on the vehicle's exterior, and any suitable plumbing system of pipes, hoses, conduits, and/or passageways, for directing the outside air at and onto the blockchain processing/mining computer(s) 35 in order to cool the same. In a preferred embodiment, the air cooling system 35C can also include one or more fans which can serve to suction external air into the vehicle and/or to direct external air at or onto the blockchain processing/mining computer(s) 35 in order to cool the same.

In a preferred embodiment, cooled air can be directed or can be caused to be directed by, or by means of or by action of, the air cooler blower device or system 36C1, at and/or towards, through, on, in, near, or in the vicinity of, the blockchain processing/mining computer(s) 35 in order to cool the same and/or the operating environment of the same.

In a preferred embodiment, each of the liquid cooling device 36A1, the air conditioner blower device or system 36B1, and/or the air cooler blower device or system 36C1, can be located, positioned, and/or situated at, near, on, or in the vicinity of the blockchain processing/mining computer(s) 35 in order to cool the same, and/or to effectuate the cooling of the same.

Figure 20:
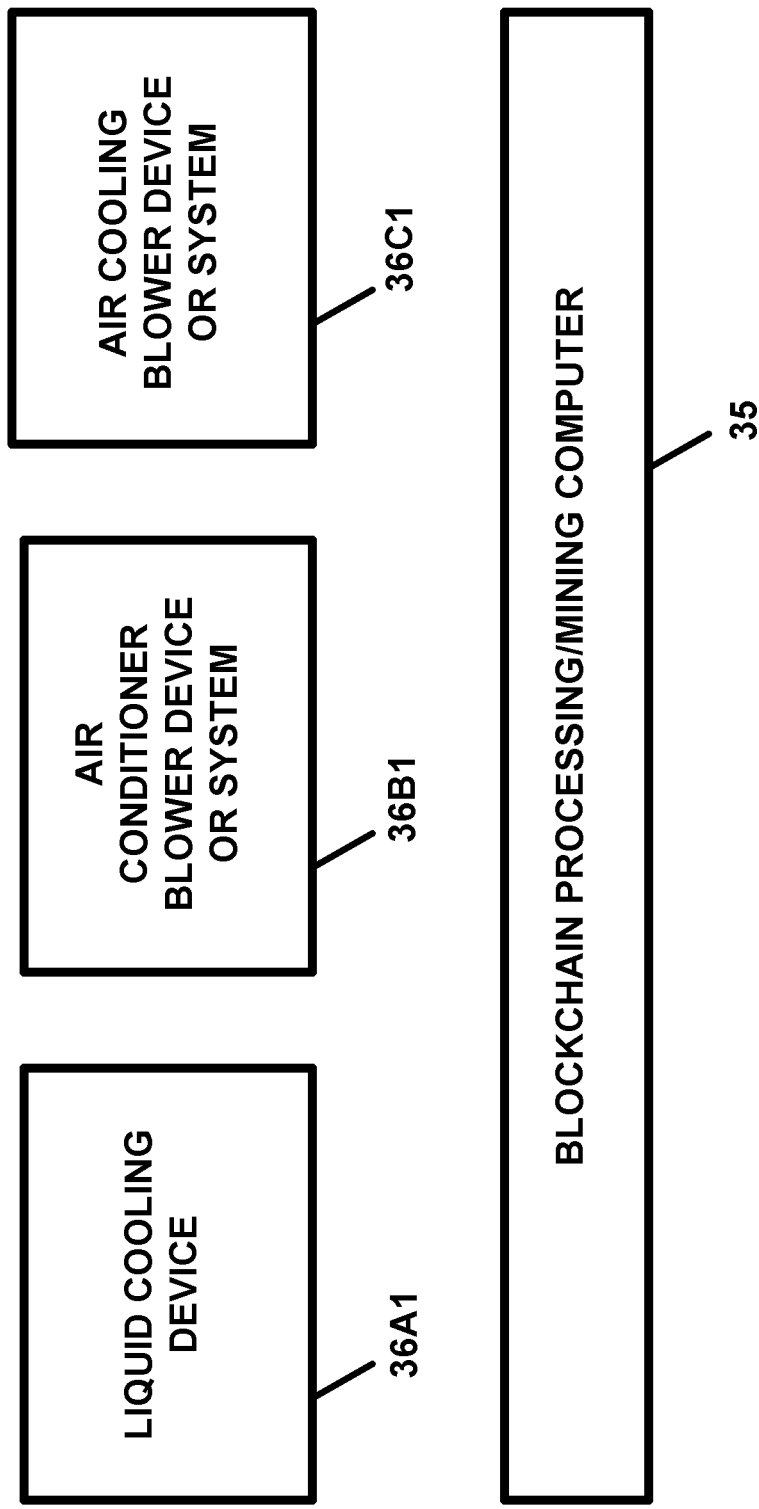
FIG. 20 illustrates an exemplary embodiment of the cooling devices of the cooling system of FIG. 19 being positioned near, or in a vicinity of, a blockchain processing/ mining computer.

FIG. 20 illustrates an exemplary embodiment of the cooling devices 36A1, 36B1, and 36C1, of the cooling system 36 of FIG. 19 being positioned near, or in the vicinity of, a blockchain processing/mining computer 35. with reference to FIG. 20, any one or more of the liquid cooling device 36A1, the air conditioner blower device or system 36B1, and/or the air cooler blower device or system 36C1, be situated at, near, or in the vicinity of, the a blockchain processing/mining computer 35 so as to provide for a cooling of the same.

In a preferred embodiment, the apparatus 300 of the present invention can be utilized in connection with a vehicle-based blockchain processing/mining computer, such as the blockchain processing/mining computer 35 and/or such as with an appropriately equipped vehicle computer 30, in order to process blockchain transactions, to order to mine or mint new blockchain blocks, in order to add new blocks to a blockchain, and/or in order to perform any blockchain and/or blockchain-related processing routines, functions, or operations.

In this regard, the apparatus and methods of the present invention can facilitate providing electrical power for, and can serve as an operational platform for, a vehicle-based and vehicle-powered blockchain processing computer and/or system which can process blockchain transactions, which can mine or mint new blockchain blocks, which can add new blocks to a blockchain, and/or which can perform any blockchain and/or blockchain-related processing routines, functions, or operations, and/or can facilitate the doing of, or the performance of, the same at and/or with the vehicle.

Figure 21:
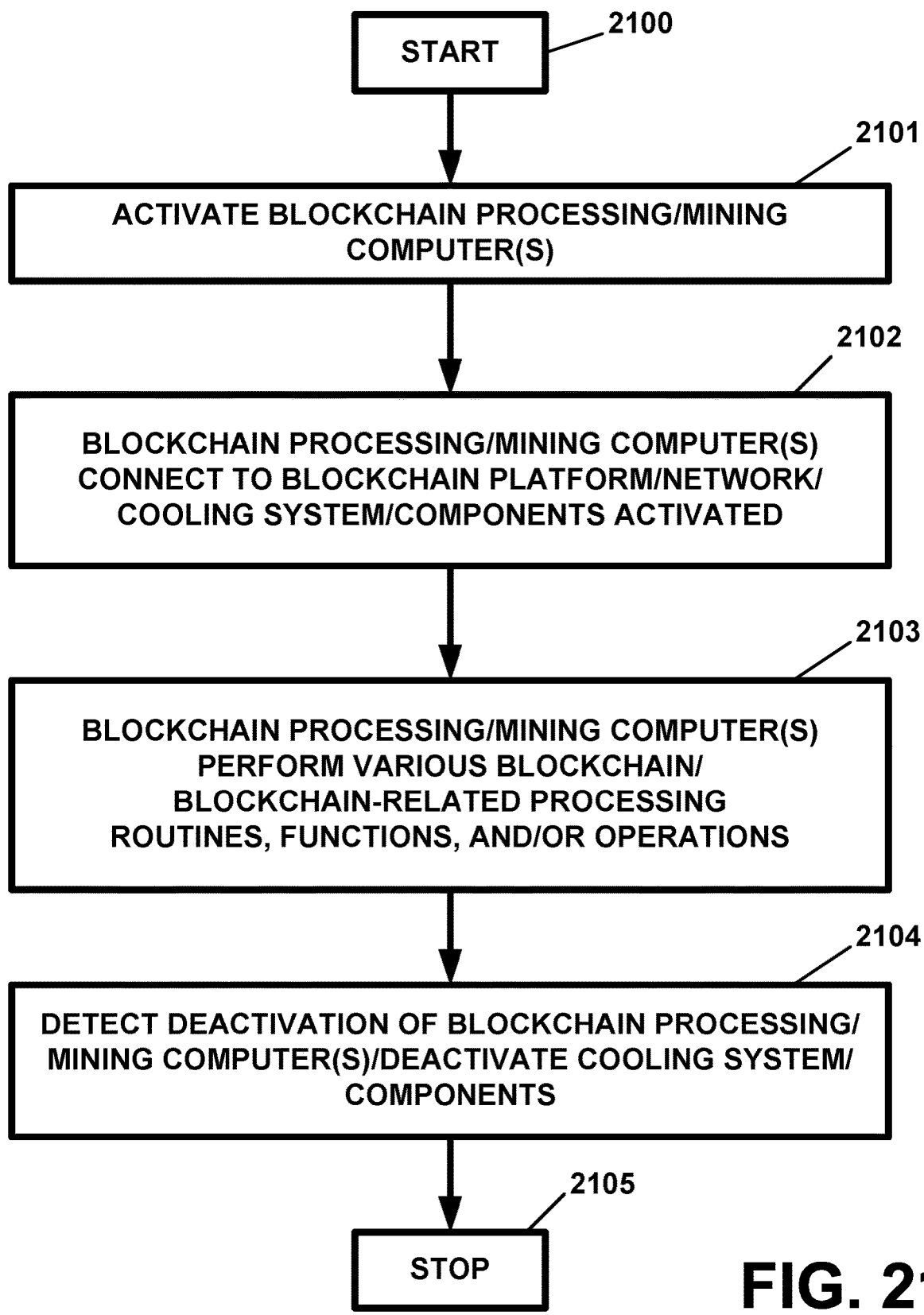
FIG. 21 illustrates another preferred embodiment method for utilizing the apparatus and methods of the present invention, in flow diagram form.

FIG. 21 illustrates another preferred embodiment method for utilizing the apparatus 300 and methods of the present invention, in flow diagram form. In particular, FIG. 21 illustrates another preferred embodiment method for utilizing the apparatus 300 and methods of the present invention in order to provide a vehicle-based and vehicle-powered blockchain processing computer and/or system which can process blockchain transactions, to mine or mint new blockchain blocks, to add new blocks to a blockchain, and/or to perform any blockchain and/or blockchain-related processing routines, functions, or operations. In this regard, vehicle owners, operators, and/or other authorized individuals and/or entities, can utilize any of the herein-described vehicles, electric vehicles, and/or hybrid vehicles, to process blockchain transactions, mine and/or create new blocks for a blockchain platform, and/or mine cryptocurrency, before, during, and/or after vehicle use, and/or during vehicle battery recharging.

In this regard, the apparatus 300 of the present invention can provide for, and can facilitate, blockchain transaction processing, new blockchain block creation or mining, new blockchain block addition to, or insertion into, a blockchain, cryptocurrency mining, and/or any other blockchain and/or blockchain-related processing routines or activities, each of all of which can be performed with and/or using any of the herein-described vehicles, electric vehicles, and/or hybrid vehicles, and/or their respective batteries and/or battery power management systems. In this regard, for example, a vehicle owner can use vehicle power to mine cryptocurrencies and/or engage in any other blockchain and/or blockchain-related processing activities with and using his or her vehicle.

With reference to FIG. 21, the operation of the apparatus 300 commences at step 2100. At step 2101, the operation of the blockchain processing/mining computer 35 can be activated and/or can become operational, and/or the operation of any number of blockchain processing/mining computers 35, if utilized, can be activated or can become operational. In a preferred embodiment, the blockchain processing/mining computer 35 or each of blockchain processing/mining computers 35, if utilized, can be programmed for automatic activation and/or operation upon the activation of the vehicle, or upon the activation of any system or component of the vehicle.

In another preferred embodiment, the blockchain processing/mining computer 35, and/or each of the blockchain processing/mining computers 35, if more than one is utilized, can be activated automatically upon a detected activation and/or operation of the vehicle, or upon the activation of any system or component of the vehicle. In another preferred embodiment, the blockchain processing/mining computer 35, and/or each of the blockchain processing/mining computers 35, if utilized, can be activated automatically upon an detected activation of, or a detected ignition of, the combustion engine of the vehicle, upon a detected activation of the vehicle electric drive motor(s) 250 of the vehicle, upon a detected activation of the vehicle fuel cell/fuel cells 41H of the vehicle, and/or upon a detected recharging of the vehicle battery/batteries 41B, and/or upon any detection of any pre-specified event or activity.

In another preferred embodiment, the blockchain processing/mining computer 35, and/or each of the blockchain processing/mining computers 35 utilized, can be activated manually by an operator or user of the vehicle via the vehicle computer 30 and/or via an user input device 30D of the same, can be activated by or via the user communication device 20 and/or via an user input device 20D of the same, and/or can be activated remotely and/or via the Internet and/or the World Wide Web by a user communication device 20 directly and/or indirectly via the central processing computer 11. In another preferred embodiment, the blockchain processing/mining computer 35 or each of the blockchain processing/mining computers 35 can be programmed for automatic activation at any given, day, date, or time.

In a preferred embodiment, the blockchain processing/mining computer 35, and/or each of the blockchain processing/mining computers 35 utilized, can be powered with electricity which is supplied by the vehicle battery/recharging system 41, by the vehicle battery/batteries 41B, and/or by the vehicle fuel cell/fuel cells 41H. In a preferred embodiment, the blockchain processing/mining computer 35, and/or each of the blockchain processing/mining computers 35 utilized, can also be powered with electricity which is supplied by any plug-in recharging system 41C, by any eroad inductive charging system/inductive coil system 40D, and/or by any eroad erail/contact rail charging system/deployable conductor/arm system 40F, described herein and/or otherwise, and/or by any combination of the same. In a preferred embodiment, the blockchain processing/mining computer 35, and/or each of the blockchain processing/mining computers 35 utilized, can also be powered and can be supplied electricity when and while the vehicle battery/batteries 41B are being recharged.

With reference once again to FIG. 21, once the blockchain processing/mining computer 35 is activated and/or becomes operational, and/or once all of the blockchain processing/mining computers 35 are activated and/or become operational, the operation of the apparatus 300 will proceed to step 2102. In a preferred embodiment, at step 2102, the blockchain processing/mining computer 35, or each of the blockchain processing/mining computer 35, will automatically connect to, or be connected to and/or with, the blockchain platform or network, or the blockchain platforms or networks, with which the blockchain processing/mining computer 35, or each of the blockchain processing/mining computer 35, will operate and will perform various blockchain and blockchain-related processing routines.

In a preferred embodiment, the blockchain processing/mining computer 35, and/or each of the blockchain processing/mining computers 35, can communicate in a two-way manner, via and using its/their receiver 35G and via and using its/their transmitter 35F, with the blockchain platform or network, or the blockchain platforms or networks, or any nodes, computers, mining computers, or miners, of, on, or associated, therewith.

In a preferred embodiment, at step 2102, the cooling system 36 will also be activated, by the vehicle computer 30 and/or by the blockchain processing/mining computer 35, so as to provide for the cooling of, or so as to perform cooling operations for and/or regarding, the blockchain processing/mining computer 35, and/or each of the blockchain processing/mining computers 35, with and/or using each of, or any one or more of, or any combination of, the liquid cooling system 36A, the air conditioning cooling system 36B, and/or the air cooling system 36C. Thereafter, the operation of the apparatus 300 will proceed to step 2103.

With reference once again to FIG. 21, at step 2103, for each blockchain platform or network for which the blockchain processing/mining computer 35, or for which each of the blockchain processing/mining computers 35, can perform processing operations and/or can process blockchain and/or blockchain-related information, the blockchain processing/mining computer 35, and/or each of the blockchain processing/mining computers 35, can process blockchain transactions, can process information for mining or for minting new blockchain blocks, can process information for verifying blockchain transactions, can process information for verifying or endorsing new blockchain blocks, can process information for creating new blockchain blocks, can process information for adding or inserting new blockchain blocks to a blockchain, can process information for adding or inserting new blockchain blocks to a blockchain, can process information for mining a cryptocurrency or cryptocurrencies, and/or can perform cryptocurrency mining, and/or can perform any blockchain and/or blockchain-related processing routines, functions, or activities.

In a preferred embodiment, at step 2103, the herein-described operation of the blockchain processing/mining computer 35, and/or each of the blockchain processing/mining computers 35, will continue, with the blockchain processing/mining computer 35, and/or with each of the blockchain processing/mining computers 35, continuing to perform any and/or all of the herein-described blockchain and/or blockchain-related processing routines, functions, or activities, and/or operations, until the blockchain processing/mining computer 35, and/or each of the blockchain processing/mining computers 35, is/are deactivated in any appropriate manner, either automatically or manually.

Upon the deactivation of, or the detected activation of, the blockchain processing/mining computer 35, or the last of the plurality of blockchain processing/mining computers 35 which were utilized, the operation of the apparatus 300 will proceed to step 2104 and the apparatus 300, the central processing computer 11, the vehicle computer 30, the blockchain processing/mining computer 35, and/or the last of the blockchain processing/mining computers 35 to be deactivated, can and/or will deactivate the cooling system 36 and/or each of the liquid cooling system 36A, the air conditioning cooling system 36B, and/or the air cooling system 36C. Thereafter, the operation of the apparatus will cease at step 2105.

In the above-described manner, the apparatus 300 of the present invention can be utilized in order to provide and/or to supply electrical power for operating any number of blockchain processing/mining computers 35 or otherwise, in order to perform various blockchain, and/or cryptocurrency mining, processing and/or computational routines, functions, and/or operations.

In a preferred embodiment, as well as in any and/or all of the embodiments described herein, if needed, any direct current (DC) current and voltage, which is supplied from the vehicle battery/batteries 41B, can be converted to the requisite alternating current (AC) current and voltage, for operating the blockchain processing/mining computer 35 and/or each of the blockchain processing/mining computers 35, by using an appropriate DC to AC converter(s) (not shown) and/or equipment as well as by using any voltage step-up or voltage step-down transformer equipment (not shown).

As described herein, the apparatus and methods of the present invention provide a battery power management apparatus and methods for electric vehicles and/or for hybrid vehicles of all kinds or types, which can manage and serve the electrical power needs and requirements of and for any of the herein-described vehicles while also providing these vehicles, and those who own or operate the same, with the ability to operate blockchain processing computers, and/or block mining computers, and/or cryptocurrency mining computers, which can be operated with and using the batteries and other electrical power supplying components of, associated with, and/or utilized, by and/or for the vehicles, and/or by using electrical power supplied by the vehicle.

While the present invention has been described and illustrated in various preferred and alternate embodiments, such descriptions are merely illustrative of the present invention and are not to be construed to be limitations thereof. In this regard, the present invention encompasses all modifications, variations, and/or alternate embodiments, with the scope of the present invention being limited only by the claims which follow.

What is claimed is:

1. An apparatus, comprising:
   a vehicle, wherein the vehicle is an electric vehicle or a hybrid vehicle;
   a vehicle computer, wherein the vehicle computer is located at the vehicle;
   a vehicle battery;
   battery recharging equipment, wherein the battery recharging equipment is located at the vehicle, and further wherein the battery recharging equipment comprises a plug-in recharging system, an electric road inductive charging system or an inductive charging coil, or an electric road electrified contact charging system or a deployable conductor;
   a blockchain processing computer, wherein the blockchain processing computer is specially programmed to process, and processes, information for or regarding a blockchain of a blockchain platform or network, wherein the battery recharging equipment provides electrical power to the blockchain processing computer, and further wherein the blockchain processing computer processes information for processing a transaction on or involving the blockchain or processes information for creating or for mining a new block for, for adding to, or for inserting into, the blockchain, wherein the blockchain processing computer is located in, on, or at, the vehicle, and further wherein the vehicle computer monitors or controls an operation of the blockchain processing computer; and
   a cooling system, wherein the cooling system provides cooled air or liquid, on, at, or in a vicinity of, the blockchain processing computer, and further wherein the vehicle battery supplies electrical power to the cooling system or the battery recharging equipment provides electrical power to the cooling system, and further wherein the vehicle computer monitors or controls an operation of the cooling system.

2. The apparatus of claim 1, further comprising:
   a radio frequency identification (RFID) reader,
   wherein the vehicle computer processes information for determining a battery charge level or a battery charge state for the vehicle battery, wherein the vehicle computer processes information to identify a battery recharging facility, and further wherein the vehicle computer determines a travel route to the battery recharging facility, wherein the vehicle computer provides navigation information or navigation instructions to the battery recharging facility.

3. The apparatus of claim 2, wherein the radio frequency identification (RFID) reader obtains information from a radio frequency identification (RFID) tag of a battery recharging system located at the battery recharging facility, and further wherein the vehicle computer stores the information read by, or obtained by, the radio frequency identification (RFID) reader.

4. The apparatus of claim 3, wherein the vehicle computer receives a recharging account use alert message transmitted from a computer associated with the battery recharging facility, and further wherein the vehicle computer displays the recharging account use alert message via a display device,
   and further wherein the vehicle computer receives an activity report regarding, or containing information regarding, the recharging of the vehicle battery at the battery recharging facility, and further wherein the vehicle computer displays the activity report or information contained in the activity report via the display device,
   wherein the activity report or information contained in the activity report is stored in a distributed ledger and blockchain technology system or in a database of a central processing computer.

5. The apparatus of claim 1, wherein the vehicle further comprises:
   an internal combustion engine, a gasoline engine, or a diesel engine.

6. The apparatus of claim 1, wherein the vehicle is an electric vehicle.

7. The apparatus of claim 1, wherein the vehicle is an autonomous vehicle, a self-driving vehicle, or a self-operating vehicle.

8. The apparatus of claim 1, wherein the blockchain processing computer processes information for processing a transaction or a plurality of transactions on the blockchain or for the blockchain platform or network, and further wherein the blockchain processing computer processes information for mining the new block for addition to, or for inserting into, the blockchain.

9. The apparatus of claim 8, wherein the blockchain processing computer processes information for mining a cryptocurrency.

10. The apparatus of claim 1, wherein the cooling system is a liquid cooling system.

11. The apparatus of claim 1, wherein the cooling system is an air conditioning cooling system.

12. The apparatus of claim 1, wherein the cooling system is an air cooling system.

13. The apparatus of claim 1, further comprising:
    a vehicle fuel cell, wherein the vehicle fuel cell is located in, on, or at, the vehicle, and further wherein the vehicle fuel cell supplies electrical power to the blockchain processing computer.

14. The apparatus of claim 1, further comprising:
    a vehicle fuel cell, wherein the vehicle fuel cell is located in, on, or at, the vehicle, and further wherein the vehicle fuel cell supplies electrical power to the cooling system.

15. The apparatus of claim 1, further comprising:
    a vehicle fuel cell, wherein the vehicle fuel cell is located in, on, or at, the vehicle, wherein the vehicle computer automatically detects that a charge level of the vehicle battery is less than or below a pre-specified battery charge level, and further wherein the vehicle computer automatically activates the vehicle fuel cell to recharge the vehicle battery, and further wherein the vehicle fuel cell recharges the vehicle battery.

16. The apparatus of claim 1, wherein the apparatus detects an activation of an operation of the blockchain processing computer and activates an operation of the cooling system.

17. The apparatus of claim 1, wherein the apparatus detects a deactivation of an operation, or a ceasing of operation of, the blockchain processing computer and deactivates the cooling system.

18. The apparatus of claim 1, wherein the battery recharging equipment comprises a plug-in recharging system.

19. The apparatus of claim 1, wherein the battery recharging equipment comprises an electric road inductive charging system or an inductive charging coil.

20. The apparatus of claim 1, wherein the battery recharging equipment comprises an electric road electrified contact charging system or a deployable conductor.

21. An apparatus, comprising:
a vehicle, wherein the vehicle is an electric vehicle or a hybrid vehicle;
a vehicle computer, wherein the vehicle computer is located at the vehicle;
a vehicle battery and battery recharging equipment, or a vehicle fuel cell;
a blockchain processing computer, wherein the blockchain processing computer processes information for processing a transaction on or involving a blockchain or processes information for creating or for mining a new block for, for adding to, or for inserting into, a blockchain, wherein the blockchain processing computer is located in, on, or at, the vehicle, and further wherein the vehicle computer monitors or controls an operation of the blockchain processing computer; and
a cooling system, wherein the cooling system provides cooled air or liquid, on, at, or in a vicinity of, the blockchain processing computer, and further wherein the vehicle computer monitors or controls an operation of the cooling system.

22. A method, comprising:
providing a vehicle comprising a vehicle computer, a vehicle battery, battery recharging equipment comprising a plug-in recharging system, an electric road inductive charging system or an inductive charging coil, or an electric road electrified contact charging system or a deployable conductor, a blockchain processing computer, and a cooling system, wherein the vehicle is an electric vehicle or a hybrid vehicle;
providing electrical power from the battery recharging equipment to the blockchain processing computer;
processing, with or using the blockchain processing computer, information for processing a transaction on or involving a blockchain, or processing information for creating or for mining a new block for, for adding to, or for inserting into, a blockchain;
monitoring or controlling, with or using the vehicle computer, an operation of the blockchain processing computer;
providing, with or using the cooling system, cooled air or liquid, on, at, or in a vicinity of, the blockchain processing computer;
supplying, from the vehicle battery or from the battery recharging equipment, electrical power to the cooling system; and
monitoring or controlling, with or using the vehicle computer, an operation of the cooling system.

\* \* \* \* \*